US008835098B2

(12) United States Patent
Fukuhara

(10) Patent No.: US 8,835,098 B2
(45) Date of Patent: Sep. 16, 2014

(54) METHOD OF FORMING PATTERN

(75) Inventor: Toshiaki Fukuhara, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/603,042

(22) Filed: Sep. 4, 2012

(65) Prior Publication Data

US 2013/0288184 A1 Oct. 31, 2013

Related U.S. Application Data

(63) Continuation of application No. PCT/JP2011/055571, filed on Mar. 3, 2011.

(30) Foreign Application Priority Data

Mar. 5, 2010 (JP) ................................ 2010-049939

(51) Int. Cl.
*G03F 7/004* (2006.01)
*G03F 7/027* (2006.01)
*G03F 7/34* (2006.01)

(52) U.S. Cl.
USPC ........ 430/270.1; 430/434; 430/435; 430/905; 430/913

(58) Field of Classification Search
USPC ....................... 430/270.1, 905, 913, 434, 435
See application file for complete search history.

(56) References Cited

U.S. PATENT DOCUMENTS

| | | | | |
|---|---|---|---|---|
| 6,403,288 | B1 | 6/2002 | Nishimura et al. | |
| 7,611,820 | B2 * | 11/2009 | Kanda et al. | 430/270.1 |
| 7,645,557 | B2 * | 1/2010 | Mizutani et al. | 430/270.1 |
| 7,700,260 | B2 * | 4/2010 | Kanna et al. | 430/270.1 |
| 7,790,351 | B2 * | 9/2010 | Fukuhara et al. | 430/270.1 |
| 8,017,298 | B2 * | 9/2011 | Tsubaki | 430/270.1 |
| 8,039,197 | B2 * | 10/2011 | Kanda et al. | 430/270.1 |
| 8,088,557 | B2 * | 1/2012 | Tsubaki | 430/270.1 |
| 8,426,109 | B2 * | 4/2013 | Kanda et al. | 430/270.1 |
| 2004/0048190 | A1 | 3/2004 | Momota | |
| 2007/0059639 | A1 | 3/2007 | Kanda et al. | |
| 2007/0065753 | A1 | 3/2007 | Mizutani et al. | |
| 2007/0172769 | A1 | 7/2007 | Kanna et al. | |
| 2008/0118860 | A1 | 5/2008 | Harada et al. | |

(Continued)

FOREIGN PATENT DOCUMENTS

| | | | |
|---|---|---|---|
| CN | 1616501 | A | 5/2005 |
| JP | 8-220762 | A | 8/1996 |

(Continued)

OTHER PUBLICATIONS

Machine translation of JP 2007-219471 (no date).*

(Continued)

*Primary Examiner* — Amanda C. Walke
(74) *Attorney, Agent, or Firm* — Sughrue Mion, PLLC

(57) ABSTRACT

Provided is a pattern forming method making it possible to obtain a pattern with less scums and watermark defects. The pattern forming method includes the steps of forming a film from an actinic-ray- or radiation-sensitive resin composition includes a resin (A) that exhibits an increased solubility in an alkali developer when acted on by an acid, a compound (B) that generates an acid when exposed to actinic rays or radiation, and a resin (C) containing at least one of a fluorine atom and a silicon atom, exposing the film to light, and developing the exposed film using a tetramethylammonium hydroxide solution whose concentration is less than 2.38 mass %.

20 Claims, 1 Drawing Sheet

1 μm

(56) References Cited

U.S. PATENT DOCUMENTS

| | | | |
|---|---|---|---|
| 2008/0187860 | A1 | 8/2008 | Tsubaki et al. |
| 2008/0248425 | A1 | 10/2008 | Nishiyama et al. |
| 2008/0305432 | A1 | 12/2008 | Kanna |
| 2009/0214982 | A1 | 8/2009 | Shimizu et al. |
| 2009/0239179 | A1 | 9/2009 | Kinsho et al. |
| 2012/0058436 | A1 | 3/2012 | Tsubaki et al. |

FOREIGN PATENT DOCUMENTS

| | | | | |
|---|---|---|---|---|
| JP | 2000-258912 | A | | 9/2000 |
| JP | 2001-296662 | A | | 10/2001 |
| JP | 2004-12511 | A | | 1/2004 |
| JP | 2004-078105 | A | | 3/2004 |
| JP | 2007219471 | A | * | 8/2007 |
| JP | 2008-111103 | A | | 5/2008 |
| JP | 2008-242271 | A | | 10/2008 |
| JP | 2008-268915 | A | | 11/2008 |
| JP | 2008-292975 | A | | 12/2008 |
| JP | 2009-223300 | A | | 10/2009 |
| JP | 2009-235118 | A | | 10/2009 |
| JP | 2010-134240 | A | | 6/2010 |
| JP | 2010-256872 | A | | 11/2010 |

OTHER PUBLICATIONS

Ikuo Sakura et al., "Submicron Optical Lithography Using Contrast Enhanced Material with Diazonium Salt as a Photobleachable Material", SPIE, Advances in Resist Technology and Processing V, 1988, pp. 226-232, vol. 920.

Japanese Office Action issued in application No. 2010-049939 dated Feb. 12, 2014.

Chinese Office Action dated Apr. 2, 2014 issued in Application No. 201180012438.6.

* cited by examiner

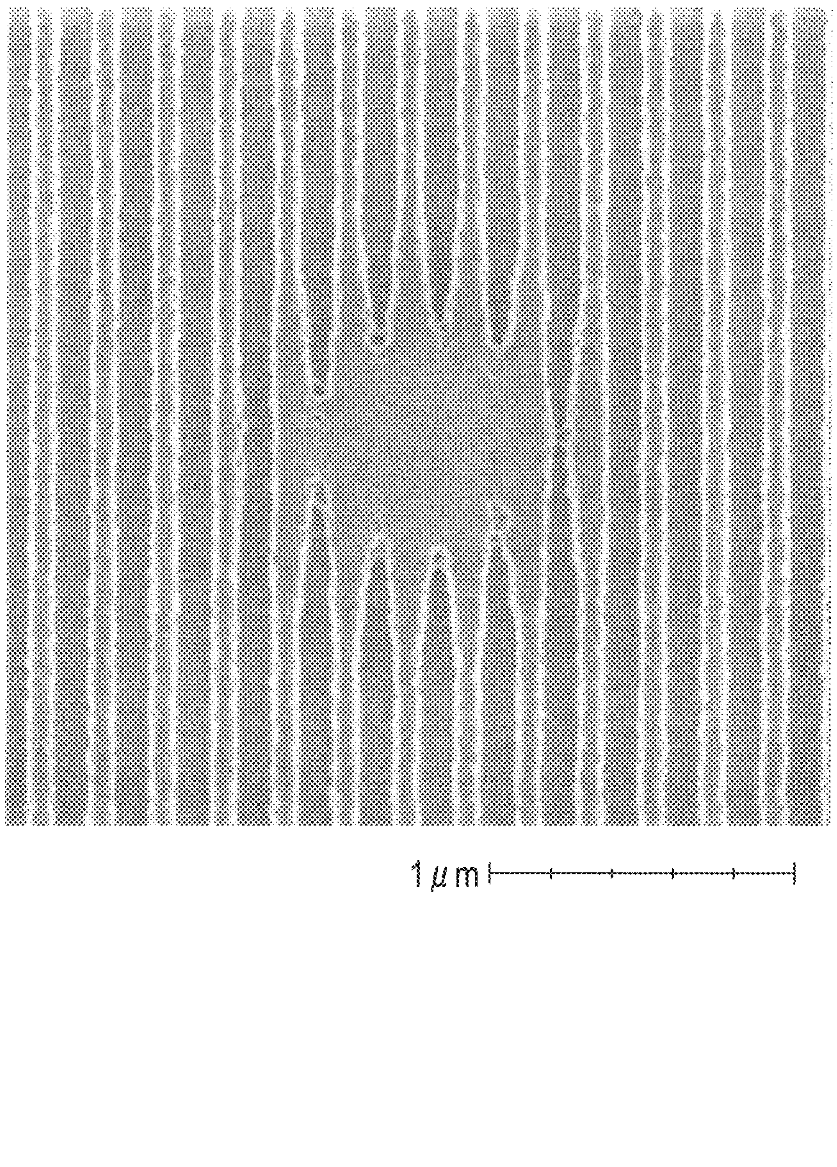
1 μm

METHOD OF FORMING PATTERN

CROSS REFERENCE TO RELATED APPLICATIONS

This application is a Continuation Application of PCT Application No. PCT/JP2011/055571, filed Mar. 3, 2011 and based upon and claiming the benefit of priority from prior Japanese Patent Application No. 2010-049939, filed Mar. 5, 2010, the entire contents of all of which are incorporated herein by reference.

BACKGROUND OF THE INVENTION

1. Field of the Invention

The present invention relates to a method of forming a pattern. More specifically, the present invention relates to a method of forming a pattern that is suitable for use in an ultramicrolithography process applicable to a process for manufacturing a super-LSI or a high-capacity microchip, a process for fabricating a nanoimprint mold, a process for producing a high-density information recording medium, etc. and other photofabrication processes. Particularly, the present invention relates to a method of forming a pattern that is suitable for exposure using a liquid-immersion projection exposure apparatus in which a far-ultraviolet light of wavelength 300 nm or shorter is employed as a light source.

In the present invention, the terms “actinic rays” and “radiation” mean, for example, a mercury lamp bright line spectrum, far ultraviolet rays represented by an excimer laser, extreme ultraviolet rays, X-rays, electron beams and the like. In the present invention, the term “light” means actinic rays or radiation.

The expression “exposure” used herein, unless otherwise noted, means not only light irradiation using a mercury lamp, far ultraviolet, X-rays, EUV light, etc. but also lithography using particle beams, such as an electron beam and an ion beam.

2. Description of the Related Art

Since the emergence of the resist for a KrF excimer laser (248 nm), it has been of common practice to employ a pattern forming method in which chemical amplification is utilized in order to compensate for any sensitivity decrease caused by light absorption. In this method, a photosensitive composition containing a resin that decreases its solubility in an alkali developer when acted on by an acid, and an acid generator that generates ac acid upon an exposure of light is typically employed (see, for example, patent references 1 to 5 and non-patent reference 1).

In a positive chemical amplification method, first, a film is formed by using a photosensitive composition. Subsequently, the film is exposed to light. Thus, at least a part of a photoacid generator contained in exposed areas is decomposed by light irradiation to thereby generate an acid. Then, the generated acid exerts a catalytic action so that the alkali-insoluble group contained in the photosensitive composition is converted to an alkali-soluble group. Thereafter, development is carried out using an alkali solution. Thus, the exposed areas are removed to obtain a desired pattern.

As the alkali developer, an alkali aqueous solution with strong basicity is usually employed. In the process of manufacturing semiconductors, etc., 2.38 mass % TMAH (tetramethylammonium hydroxide) solution is used as a standard alkali developer (see, for example, patent references 1 to 5 and non-patent reference 1). The concentration of 2.38 mass % was fixed for optimizing a dissolution velocity of g-ray or i-ray resist. However, the use of 2.38 mass % TMAH solution has also become a de facto standard in other resists now being investigated.

PRIOR ART LITERATURE

Patent Reference

[Patent reference 1] US 2009/0239179 A1,
[Patent reference 2] Jpn. Pat. Appln. KOKAI Publication No. (hereinafter referred to as JP-A-) 2009-223300,
[Patent reference 3] JP-A-2009-235118,
[Patent reference 4] JP-A-2008-292975, and
[Patent reference 5] JP-A-2008-111103.

Non-Patent Reference

[Non-patent reference 1] SPIE, 1988, Vol. 920, 226-232.

BRIEF SUMMARY OF THE INVENTION

An object of the present invention is to make it possible to form a pattern with less scum and watermark defects.

Some aspects of the present invention are as follows.

[1] A method of forming a pattern, comprising: forming a film from an actinic-ray- or radiation-sensitive resin composition comprising a resin (A) that exhibits an increased solubility in an alkali developer when acted on by an acid, a compound (B) that generates an acid when exposed to actinic rays or radiation, and a resin (C) containing at least one of a fluorine atom and a silicon atom; exposing the film to light; and developing the exposed film using a tetramethylammonium hydroxide solution whose concentration is less than 2.38 mass %.

[2] The method according to [1], the resin (C) comprising a repeating unit containing a group that is decomposed by an action of an alkali developer, resulting in an increase of solubility in the alkali developer.

[3] The method according to [1] or [2], the resin (C) comprising a repeating unit containing two or more groups that is decomposed by an action of an alkali developer, resulting in an increase of solubility in the alkali developer.

[4] The method according to any of [1] to [3], the resin (C) comprising a repeating unit containing at least one of a fluorine atom and a silicon atom and a group that is decomposed by an action of an alkali developer, resulting in an increase of solubility in the alkali developer.

[5] The method according to any of [1] to [3], the resin (C) comprising a repeating unit containing an alkali soluble group.

[6] The method according to any of [1] to [3], the resin (C) comprising a repeating unit containing a group that is decomposed by the action of an acid.

[7] The method according to any of [1] to [6], wherein a content of the resin (C) based on the total solids of the composition falls within the range of 0.01-10 mass %.

[8] The method according to any of [1] to [7], the resin (A) comprising a repeating unit containing a lactone structure.

[9] The method according to any of [1] to [8], the resin (A) comprising a repeating unit containing a monocyclic or polycyclic acid-decomposable group.

[10] The method according to any of [1] to [9], the composition further comprising a basic compound.

[11] The method according to any of [1] to [10], the composition further comprising a surfactant.

[12] The method according to any of [1] to [11], wherein the film is exposed through a liquid for liquid immersion.

The present invention has made it possible to form a pattern with less scum and watermark defects.

BRIEF DESCRIPTION OF THE SEVERAL VIEWS OF THE DRAWING

The single FIGURE is a SEM picture showing an example of watermark defect.

DETAILED DESCRIPTION OF THE INVENTION

The present invention will be described below.

Note that, with respect to the expression of a group (or an atomic group) used in this specification, the expression without explicitly referring to whether the group is substituted or unsubstituted encompasses not only groups with no substituents but also groups having one or more substituents. For example, the expression "alkyl group" encompasses not only alkyl groups having no substituents (viz. unsubstituted alkyl groups) but also alkyl groups having one or more substituents (viz. substituted alkyl groups).

The pattern forming method according to the present invention comprises (1) forming a film from an actinic-ray- or radiation-sensitive resin composition, (2) exposing the film to light, and (3) developing the exposed film using a TMAH solution whose concentration is less than 2.38 mass %.

First, an actinic-ray- or radiation-sensitive resin composition employable for the pattern forming method according to the present invention will be explained. The composition comprises (A) a resin that exhibits an increased solubility in an alkali developer when acted on by an acid [hereinafter also referred to as acid-decomposable resin or resin (A)], (B) a compound that generates an acid when exposed to actinic rays or radiation [hereinafter also referred to as acid generator or compound (B)], and (C) a resin containing at least one of a fluorine atom and a silicon atom [hereinafter also referred to as hydrophobic resin or resin (c)].

(A) Acid-Decomposable Resin

The composition employable for the pattern forming method according to the present invention contains an acid-decomposable resin. The acid-decomposable resin typically contains a group that is decomposed by the action of an acid to thereby generate an alkali-soluble group (hereinafter also referred to as "an acid-decomposable group"). The resin may contain the acid-decomposable group in its principal chain or side chain, or both of its principal chain and side chain. The resin is preferably insoluble or hardly soluble in an alkali developer.

The acid-decomposable resin comprises a repeating unit containing a acid-decomposable group. The acid-decomposable group preferably has a structure in which an alkali-soluble group is protected by a group removable by degradation upon the action of acid.

As the alkali-soluble group, there can be mentioned a phenolic hydroxyl group, a carboxyl group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali-soluble groups, there can be mentioned a carboxyl group, a fluoroalcohol group (preferably hexafluoroisopropanol) and a sulfonate group.

The acid-decomposable group is preferably a group as obtained by substituting the hydrogen atom of any of these alkali-soluble groups with an acid eliminable group.

As the acid eliminable group, there can be mentioned, for example, $-C(R_{36})(R_{37})(R_{38})$, $-C(R_{36})(R_{37})(OR_{39})$, $-C(R_{01})(R_{02})(OR_{39})$ or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded to each other to thereby form a ring structure.

Each of $R_{01}$ to $R_{02}$ independently represents a hydrogen atom, an alkyl group, a cycloalkyl group, an aryl group, an aralkyl group or an alkenyl group.

Preferably, the acid-decomposable group is a cumyl ester group, an enol ester group, an acetal ester group, a tertiary alkyl ester group or the like. A tertiary alkyl ester group is more preferred.

The repeating unit with an acid-decomposable group is preferably any of those of the following general formula (AI).

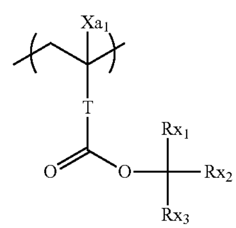

(AI)

In general formula (AI), $Xa_1$ represents a hydrogen atom, an optionally substituted methyl group, or a group represented by $-CH_2-R_9$. $R_9$ represents a hydroxyl group or a monovalent organic group. $R_9$ preferably represents an alkyl or an acyl group having 5 or less carbon atoms, more preferably an alkyl group having 3 or less carbon atoms, and further more preferably a methyl group. $Xa_1$ preferably represents a hydrogen atom, a methyl group, a trifluoromethyl group or a hydroxymethyl group.

T represents a single bond or a bivalent connecting group.

Each of $Rx_1$ to $Rx_3$ independently represents a linear or branched alkyl group or a mono- or polycyclic cycloalkyl group.

At least two of $Rx_1$ to $Rx_3$ may be bonded to each other to thereby form a monocyclic or polycyclic cycloalkyl group.

As the bivalent connecting group represented by T, there can be mentioned, for example, an alkylene group, a group of the formula —(COO-Rt)— or a group of the formula —(O-Rt)—. In the formulae, Rt represents an alkylene group or a cycloalkylene group.

T is preferably a single bond or a group of the formula —(COO-Rt)—. Rt is preferably an alkylene group having 1 to 5 carbon atoms, more preferably a $-CH_2-$ group or $-(CH_2)_3-$ group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a monocyclic cycloalkyl group, such as a cyclopentyl group or a cyclohexyl group, or a polycyclic cycloalkyl group, such as a norbornyl group, a tetracyclodecanyl group, a tetracyclododecanyl group or an adamantyl group.

The cycloalkyl group formed by at least two of $Rx_1$ to $Rx_3$ is preferably a monocyclic cycloalkyl group, such as a cyclopentyl group or a cyclohexyl group, or a polycyclic cycloalkyl group, such as a norbornyl group, a tetracyclodecanyl group, a tetracyclododecanyl group or an adamantyl group.

Monocyclic cycloalkyl groups having 5 or 6 carbon atoms are especially preferred.

In an especially preferred mode, $Rx_1$ is a methyl group or an ethyl group, and $Rx_2$ and $Rx_3$ are bonded to each other to thereby form any of the above-mentioned cycloalkyl groups.

One or more substituents may further be introduced in each of the groups above. As the substituents, there can be mentioned, for example, an alkyl group (preferably having 1 to 4 carbon atoms), a halogen atom, a hydroxy group, an alkoxy group (preferably having 1 to 4 carbon atoms), a carboxyl group, an alkoxycarbonyl group (preferably having 2 to 6 carbon atoms). Preferably, each of the substituents has 8 or less carbon atoms.

The content of the repeating unit containing a acid-decomposable group based on all the repeating units of the resin is preferably in the range of 20 to 70 mol %, and more preferably 30 to 50 mol %.

Preferred examples of the repeating unit containing a acid-decomposable group will be shown below, which however in no way limit the scope of the present invention.

In the specific examples, Rx and Xa1 each represents a hydrogen atom, $CH_3$, $CF_3$, or $CH_2OH$. Each of Rxa and Rxb represents an alkyl group having 1 to 4 carbon atoms. Z or each of Zs independently represents a substituent containing a polar group. P represents 0 or positive integer.

1

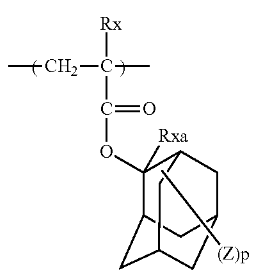

2

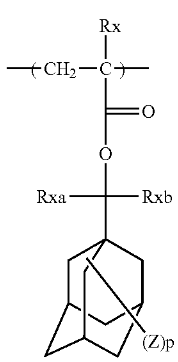

-continued

3

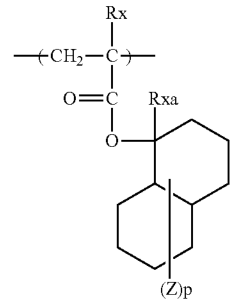

4

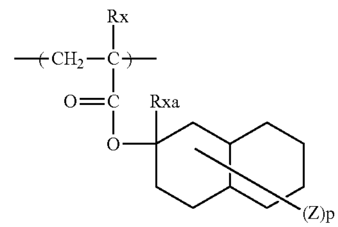

5

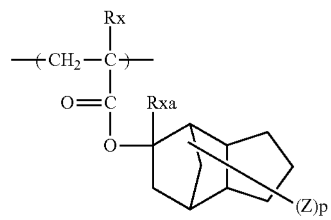

6

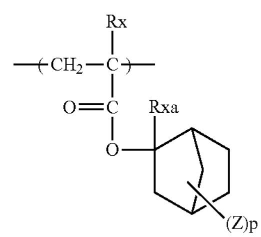

7

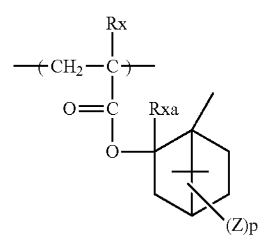

8

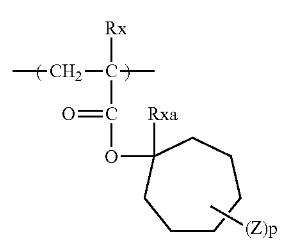

-continued
9
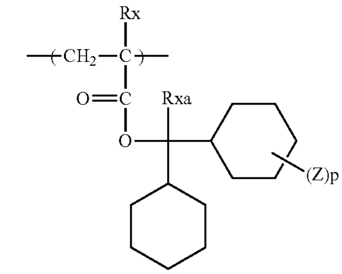
10
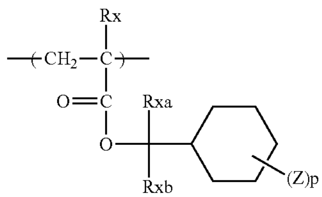
11
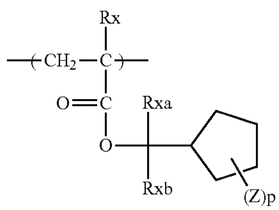
12
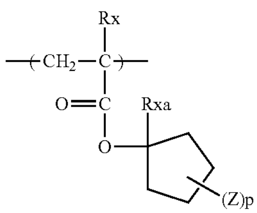
13
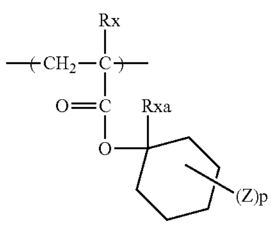
14
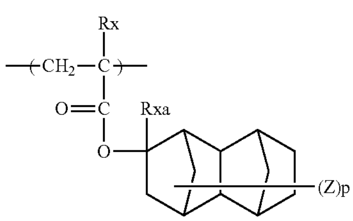
15
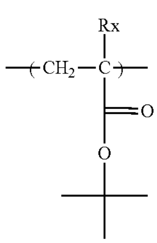
-continued
16
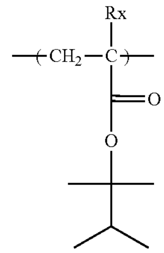
17
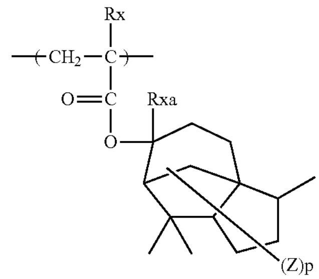
18
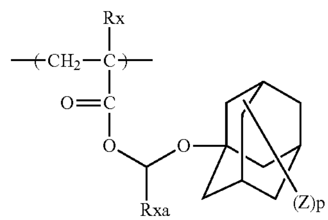
19
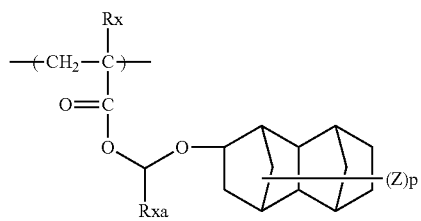
20
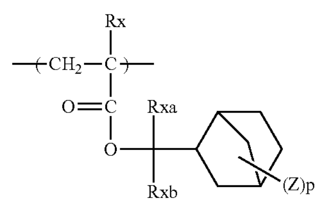
21
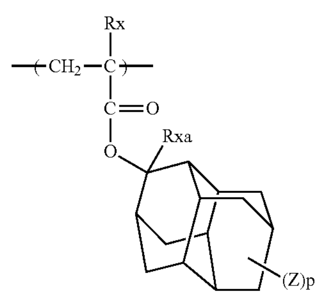

-continued
22
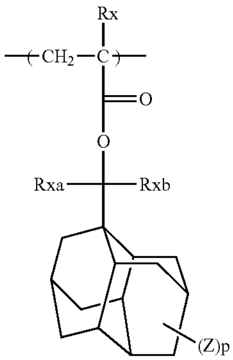
23
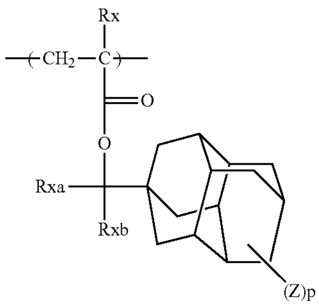
24
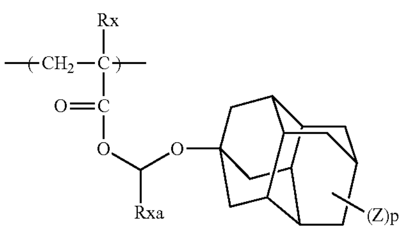
25
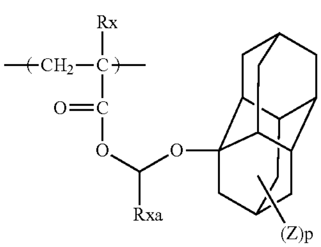
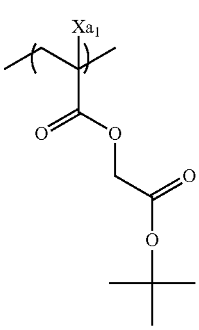
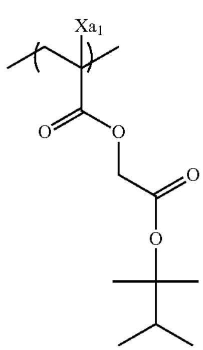
-continued
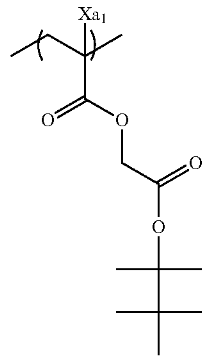
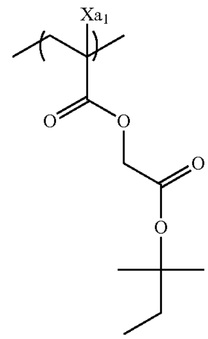
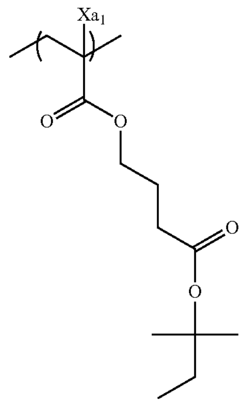
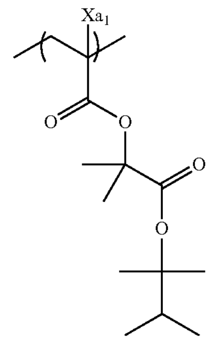
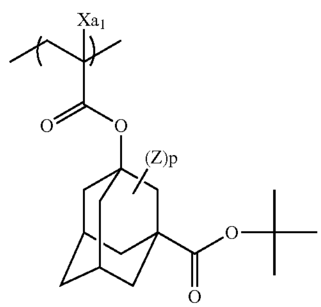
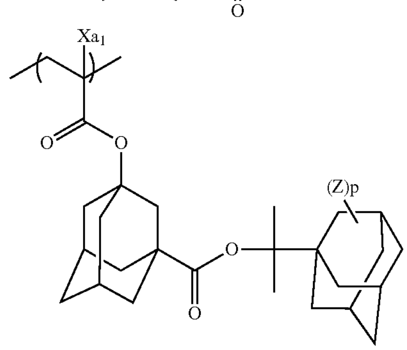
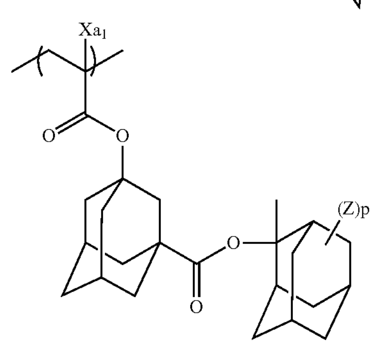

-continued
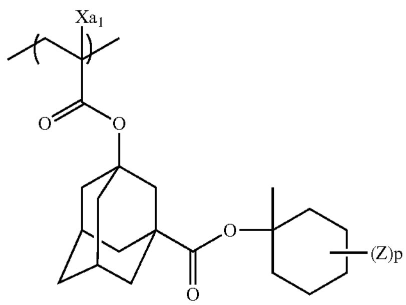
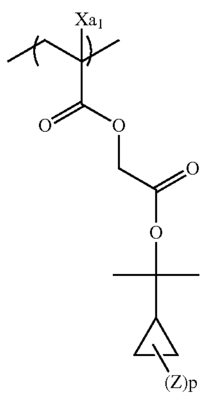
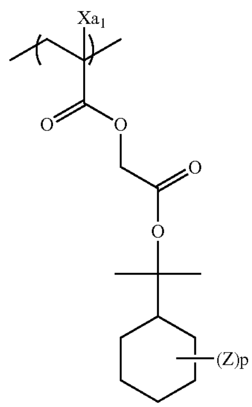
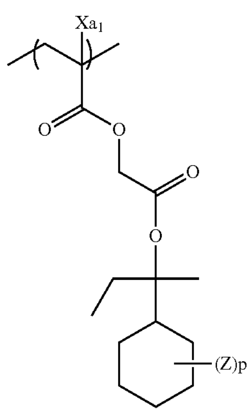
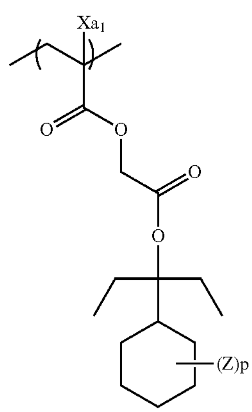
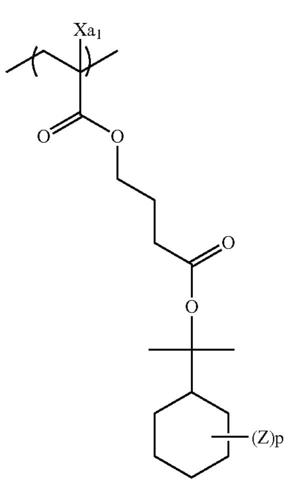
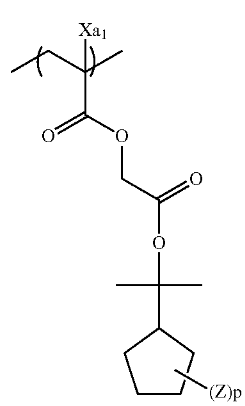
-continued
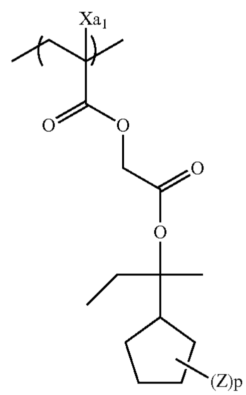
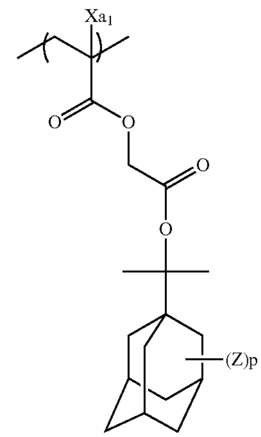
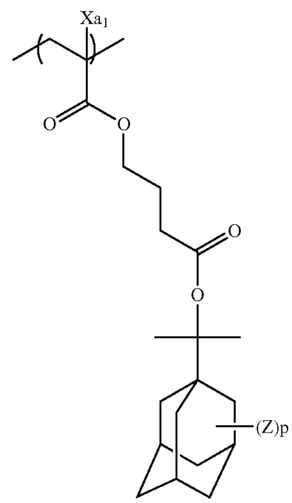
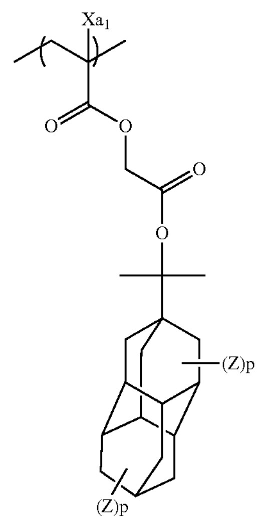
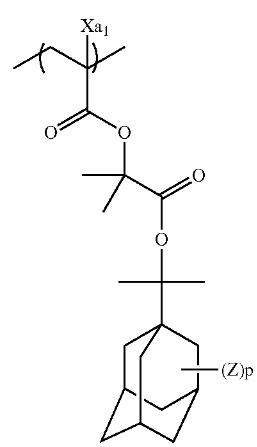
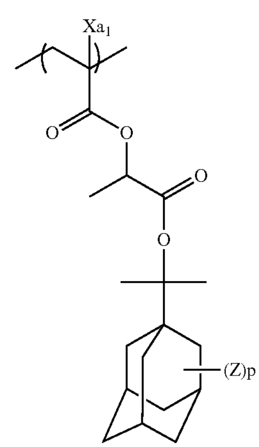

-continued
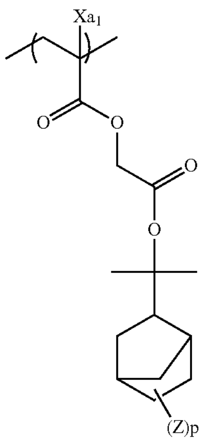
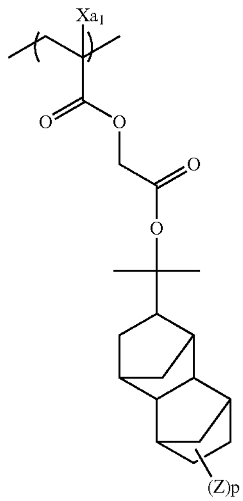
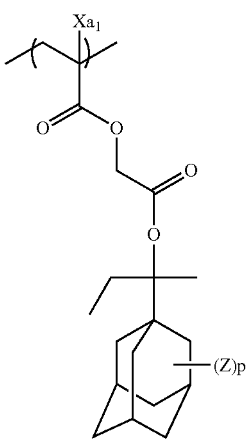
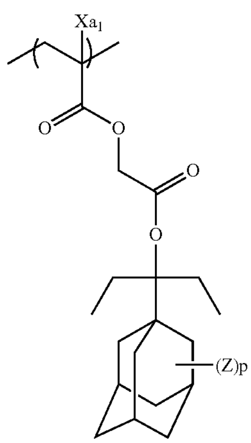
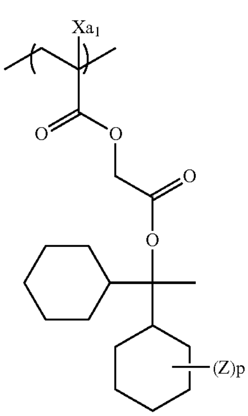
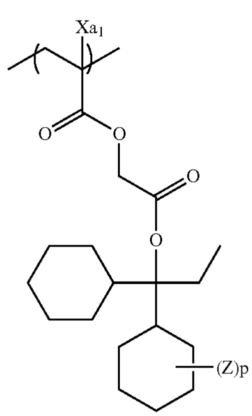
-continued
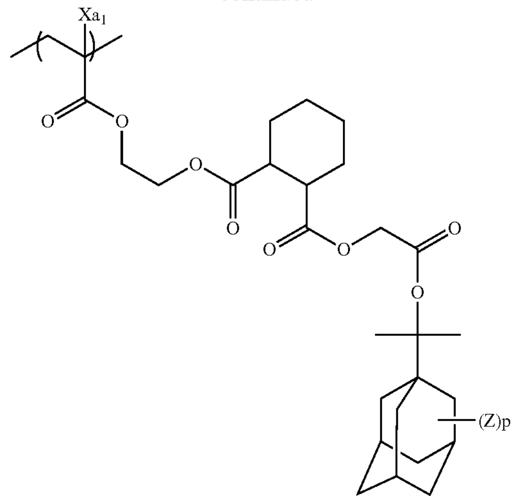
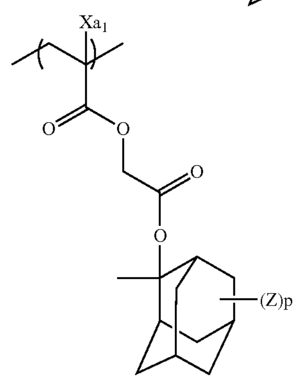
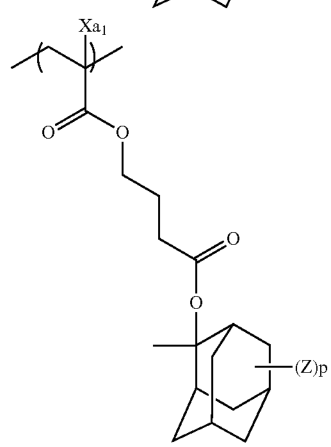
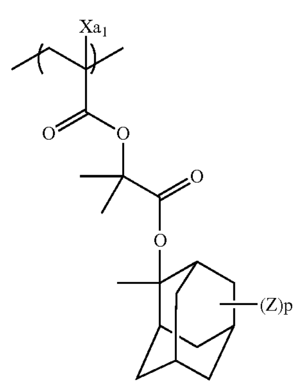

-continued

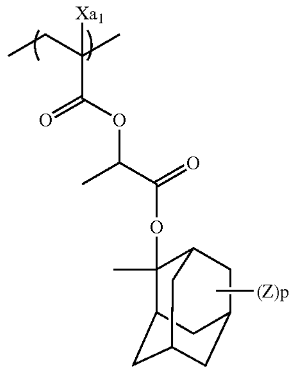

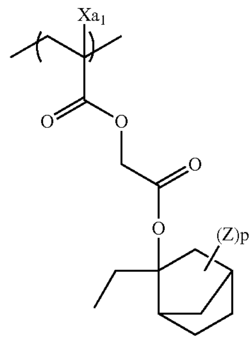

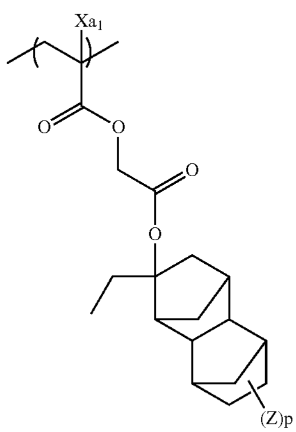

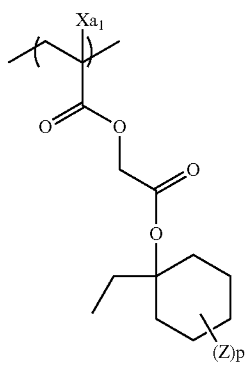

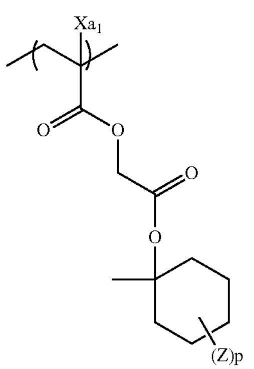

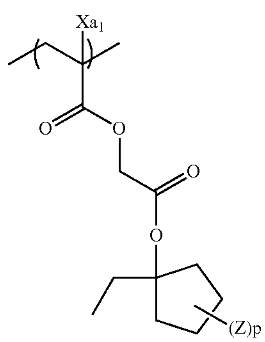

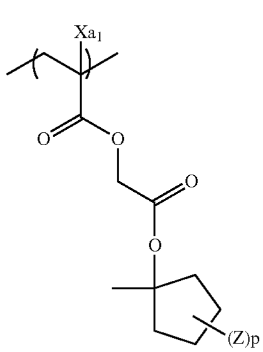

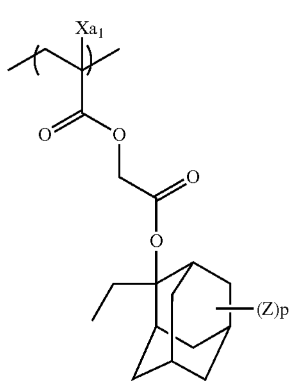

-continued

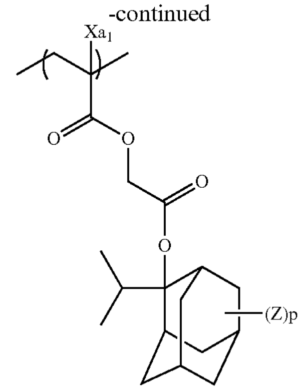

It is more preferred for the acid-decomposable resin to contain, as the repeating units of general formula (AI), any of the repeating units of general formula (I) below and/or any of the repeating units of general formula (II) below.

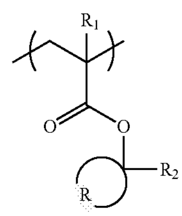

(I)

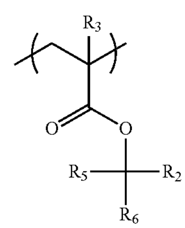

(II)

In the formulae (I) and (II), each of $R_1$ and $R_3$ independently represents a hydrogen atom, an optionally substituted methyl group or any of the groups of the formula —$CH_2$—$R_9$. $R_9$ represents a monovalent organic group.

Each of $R_2$, $R_4$, $R_5$ and $R_6$ independently represents an alkyl group or a cycloalkyl group.

R represents an atomic group required for forming an alicyclic structure in cooperation with a carbon atom.

$R_1$ preferably represents a hydrogen atom, a methyl group, a trifluoromethyl group or a hydroxymethyl group.

The alkyl group represented by $R_2$ may be linear or branched, and one or more substituents may be introduced therein.

The cycloalkyl group represented by R2 may be monocyclic or polycyclic, and a substituent may be introduced therein.

$R_2$ preferably represents an alkyl group, more preferably an alkyl group having 1 to 10 carbon atoms, further more preferably 1 to 5 carbon atoms. As examples thereof, there can be mentioned a methyl group and an ethyl group.

R represents an atomic group required for forming an alicyclic structure in cooperation with a carbon atom. The alicyclic structure formed by R is preferably an alicyclic structure of a single ring, and preferably has 3 to 7 carbon atoms, more preferably 5 or 6 carbon atoms.

$R_3$ preferably represents a hydrogen atom or a methyl group, more preferably a methyl group.

Each of the alkyl groups represented by $R_4$, $R_5$ and $R_6$ may be linear or branched, and one or more substituents may be introduced therein. The alkyl groups are preferably those each having 1 to 4 carbon atoms, such as a methyl group, an ethyl group, an n-propyl group, an isopropyl group, an n-butyl group, an isobutyl group and a t-butyl group.

Each of the cycloalkyl groups represented by $R_4$, $R_5$ and $R_6$ may be monocyclic or polycyclic, and a substituent may be introduced therein. The cycloalkyl groups are preferably a monocyclic cycloalkyl group, such as a cyclopentyl group or a cyclohexyl group, and a polycyclic cycloalkyl group, such as a norbornyl group, a tetracyclodecanyl group, a tetracyclododecanyl group or an adamantyl group.

As the repeating units of general formula (I), there can be mentioned, for example, those of general formula (I-a) below.

(I-a)

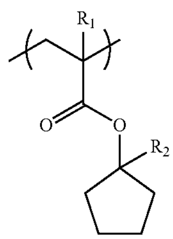

In the formula, $R_1$ and $R_2$ have the same meaning as in general formula (I).

The repeating units of general formula (II) are preferably those of general formula (II-1) below.

(II-1)

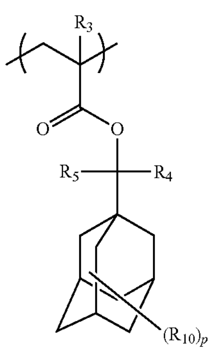

In general formula (II-1), $R_3$ to $R_5$ have the same meaning as in general formula (II).

$R_{10}$ represents a substituent containing a polar group. When a plurality of $R_{10}$s exist, they may be identical to or different from each other. As the substituent containing a polar group, there can be mentioned, for example, a linear or branched alkyl group, or cycloalkyl group, in which a hydroxyl group, a cyano group, an amino group, an alkylamido group or a sulfonamido group is introduced. An alkyl group in which a hydroxyl group is introduced is preferred. An isopropyl group is especially preferred as the branched alkyl group.

In the formula, p is an integer of 0 to 15, preferably in the range of 0 to 2, and more preferably 0 or 1.

It is more preferred for the acid-decomposable resin to be a resin containing, as the repeating units of general formula (AI), at least either any of the repeating units of general formula (I) or any of the repeating units of general formula (II). In another form, it is more preferred for the acid-decomposable resin to be a resin containing, as the repeating units of general formula (AI), at least two types selected from among the repeating units of general formula (I).

When the acid-decomposable resin contains a plurality of acid-decomposable repeating units, the following combinations are preferred. In the following formulae, R each independently represents a hydrogen atom or a methyl group.

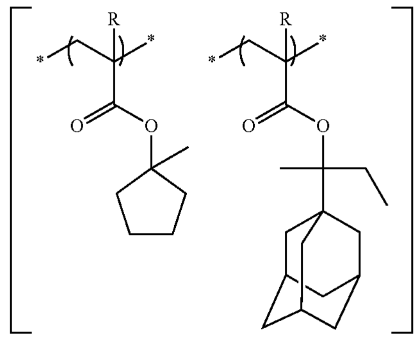

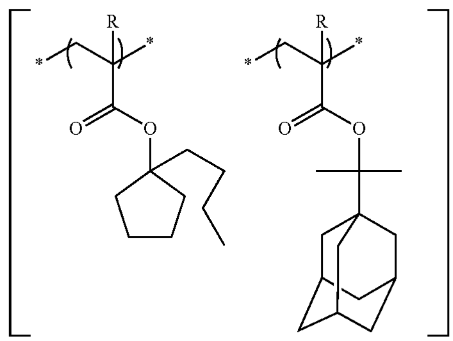

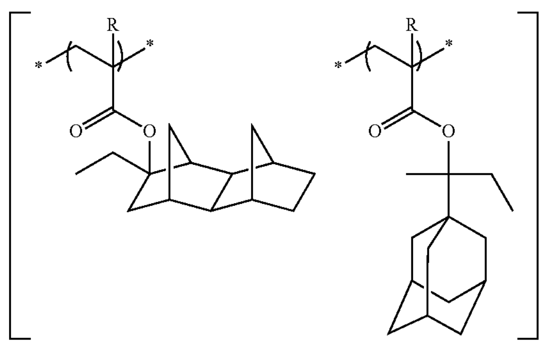

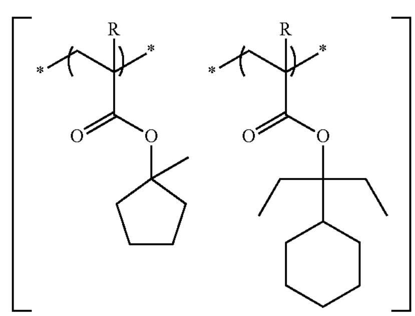

-continued
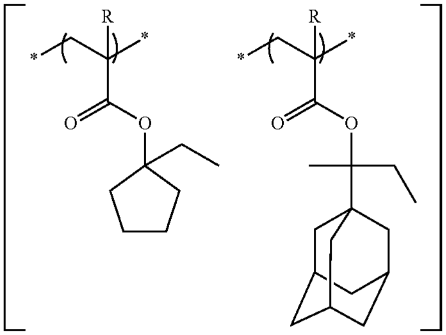
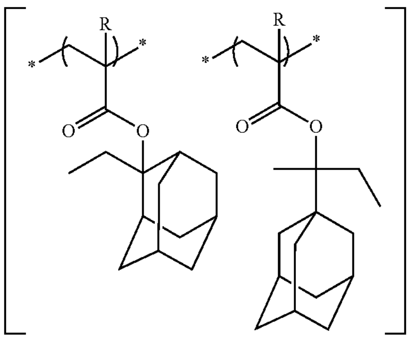
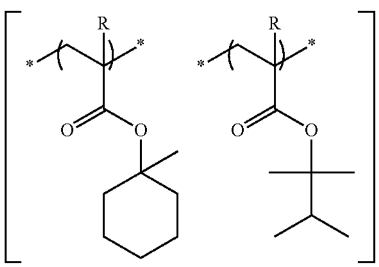
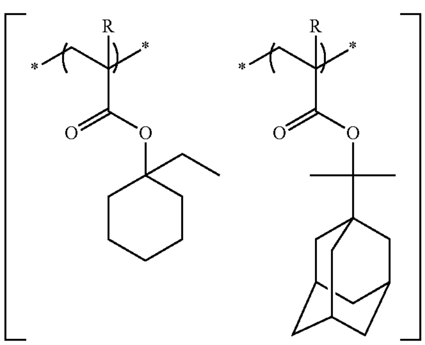
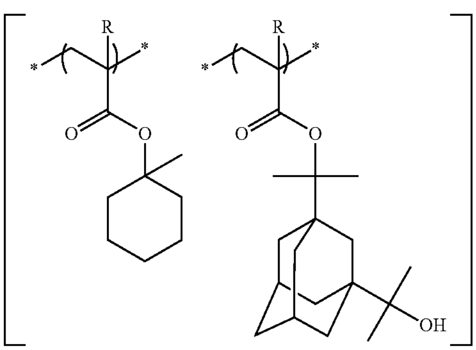
-continued
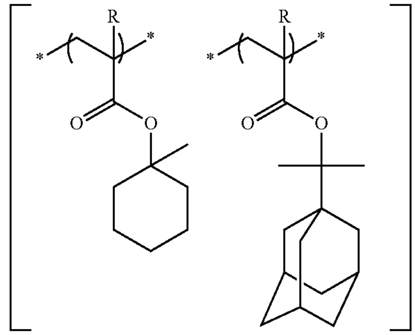
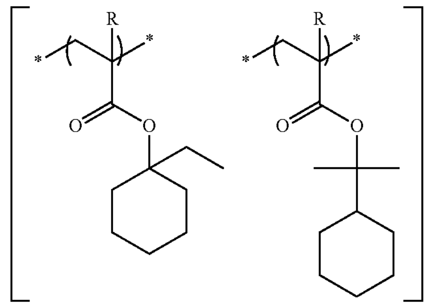
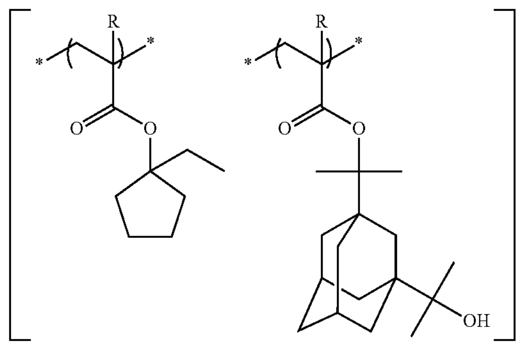
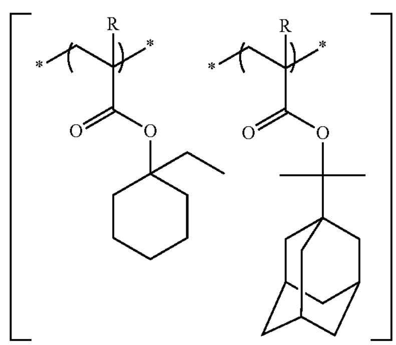
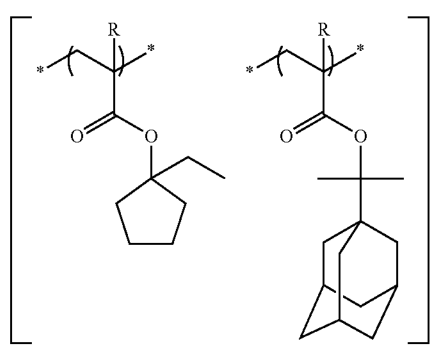

-continued

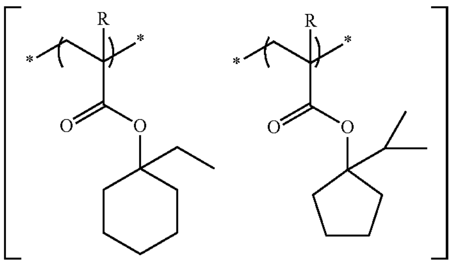

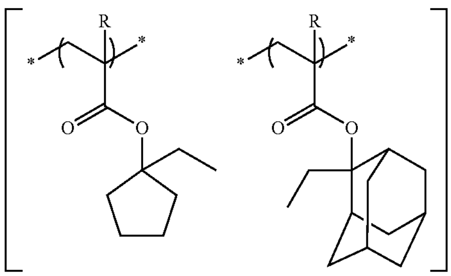

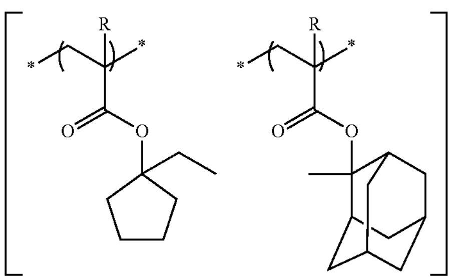

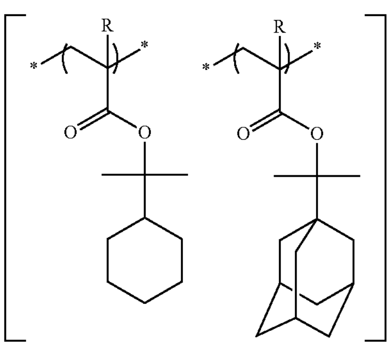

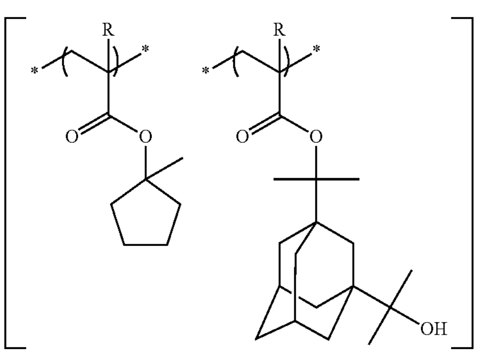

-continued

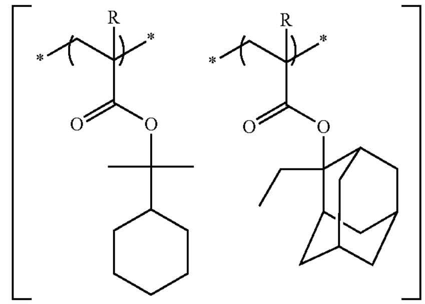

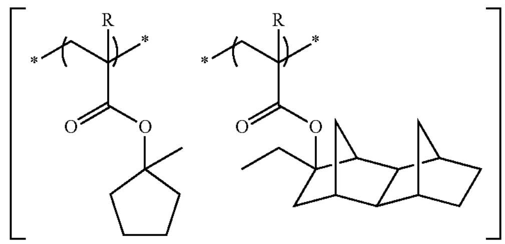

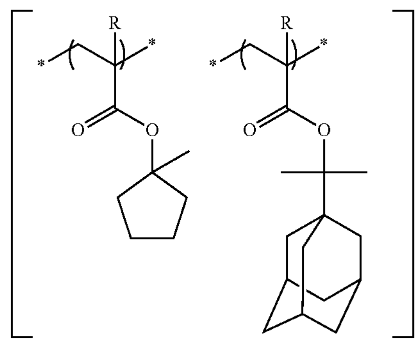

The acid-decomposable resin preferably contains a repeating unit represented by the general formula (1) below.

(1)

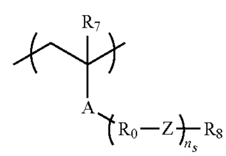

In the general formula (1),

A represents an ester bond or an amido bond.

$R_0$ or each of $R_0$'s when ns≥2 independently represents an alkylene group, a cycloalkylene group, or a combination thereof.

Z or each of Z's when ns≥2 independently represents an ether bond, an ester bond, an amido bond, any of urethane bonds of the formula:

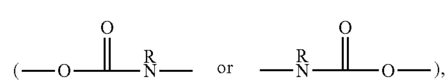

or any of urea bonds of the formula:

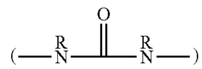

in which R represents, for example, a hydrogen atom, an alkyl group, a cycloalkyl group or an aryl group.

$R_8$ represents a monovalent organic group with a lactone structure.

In the general formula, $n_s$ is an integer of 1 to 5, preferably 1.

$R_7$ represents a hydrogen atom, an alkyl group or a halogen atom. One or more substituents may be introduced in the alkyl group. $R_7$ is preferably a hydrogen atom, a methyl group, a hydroxymethyl group or an acetoxymethyl group.

As mentioned above, $R_0$ represents an alkylene group, a cycloalkylene group or a combination thereof.

The alkylene group represented by $R_0$ may be in the form of a linear chain or a branched chain. The alkylene group preferably has 1 to 6 carbon atoms, more preferably 1 to 3 carbon atoms. As the alkylene group, there can be mentioned, for example, a methylene group, an ethylene group or a propylene group.

The cycloalkylene group represented by $R_0$ preferably has 3 to 10 carbon atoms, more preferably 5 to 7 carbon atoms. As the cycloalkylene group, there can be mentioned, for example, a cyclopropylene group, a cyclobutylene group, a cyclopentylene group or a cyclohexylene group.

One or more substituents may be introduced in these alkylene and cycloalkylene groups. As such substituents, there can be mentioned, for example, a halogen atom, such as a fluorine atom, a chlorine atom or a bromine atom; a mercapto group; a hydroxyl group; an alkoxy group, such as a methoxy group, an ethoxy group, an isopropoxy group, a t-butoxy or a benzyloxy group; a cycloalkyl group, such as a cyclopropyl group, a cyclobutyl group, a cyclopentyl group, a cyclohexyl group or a cycloheptyl group; a cyano group; a nitro group; a sulfonyl group; a silyl group; an ester group; an acyl group; a vinyl group; and an aryl group.

As mentioned above, Z represents an ether bond, an ester bond, an amido bond, a urethane bond or a urea bond. Z is preferably an ether bond or an ester bond. An ester bond is especially preferred.

As mentioned above, $R_8$ is a monovalent organic group with a lactone structure. This organic group has, for example, any of the lactone structures of general formulae (LC1-1) to (LC1-17) below. Of these, the structures of general formulae (LC1-4), (LC1-5) and (LC1-17) are preferred. The structure of general formula (LC1-4) is especially preferred.

LC1-1

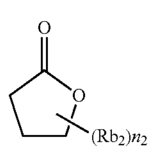

LC1-2

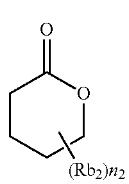

-continued

LC1-3

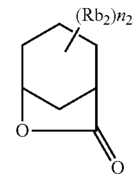

LC1-4

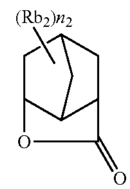

LC1-5

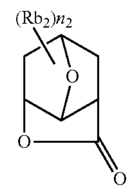

LC1-6

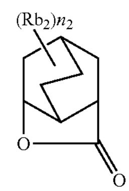

LC1-7

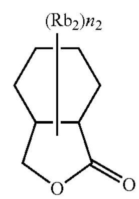

LC1-8

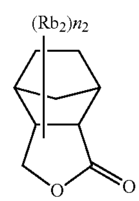

LC1-9

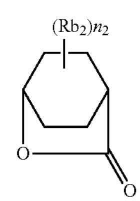

LC1-10

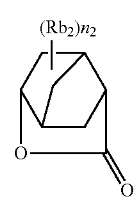

-continued

LC1-11

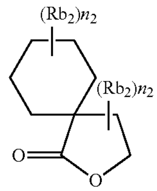

LC1-12

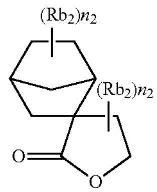

LC1-13

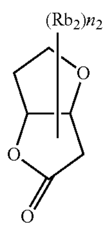

LC1-14

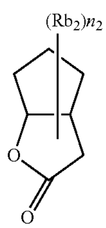

LC1-15

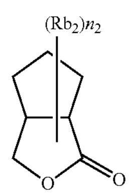

LC1-16

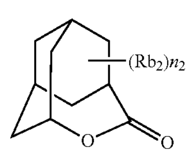

LC1-17

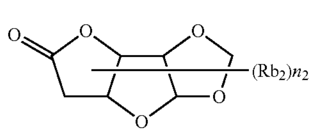

In the formulae, $Rb_2$ represents a substituent, and $n_2$ represents an integer of 0 to 4. Preferably, $n_2$ is an integer of 0 to 2.

As preferred $Rb_2$, there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group which will be described below, and the like. Of these, an alkyl group having 1 to 4 carbon atoms, a cyano group or an acid-decomposable group is particularly preferable. When $n_2 \geq 2$, the plurality of $Rb_2$ may be identical to or different from each other. Further, the plurality of $Rb_2$ may be bonded to each other to thereby form a ring.

It is preferred for $R_8$ to have an unsubstituted lactone structure or a lactone structure in which a methyl group, a cyano group or an alkoxycarbonyl group is introduced as a substituent. Most preferably, $R_8$ is a monovalent organic group with a lactone structure in which one or more cyano groups are introduced as substituents (namely, a cyanolactone structure).

Specific examples of the repeating units of general formula (1) will be shown below. In the specific examples, R represents a hydrogen atom, an alkyl group or a halogen atom. A substituent may be introduced in the alkyl group. R is preferably a hydrogen atom, a methyl group, a hydroxymethyl group or an acetoxymethyl group.

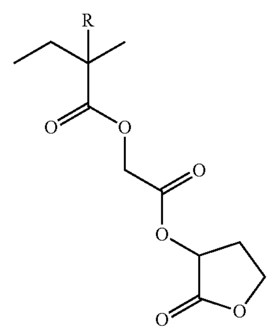

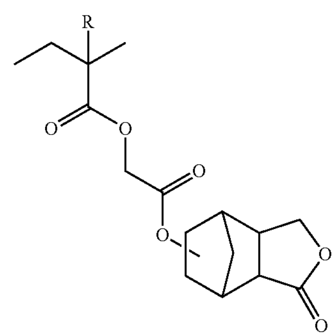

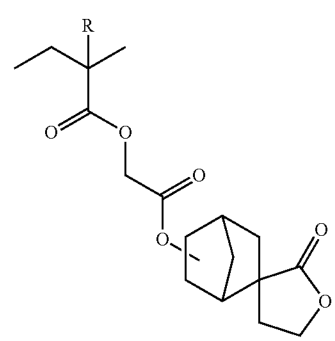

-continued

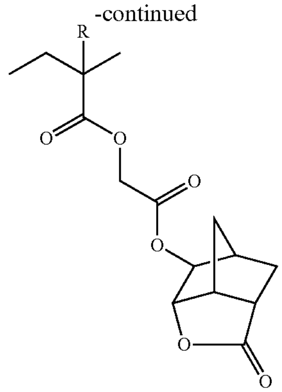

The repeating units of general formula (1) are preferably those of general formula (2) below.

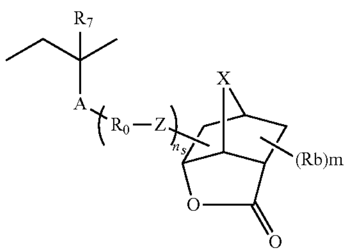

(2)

In general formula (2), $R_7$, A, $R_0$, Z and $n_s$ are as defined in general formula (1) above.

Rb, when m≥2 each of Rb's independently, represents an alkyl group, a cycloalkyl group, an alkoxycarbonyl group, a cyano group, a hydroxyl group or an alkoxy group. When m≥2, two or more Rb's may be bonded to each other to thereby form a ring.

X represents an alkylene group, an oxygen atom or a sulfur atom, and m is an integer of 0 to 5. Preferably, m is 0 or 1.

The alkyl group represented by Rb is preferably an alkyl group having 1 to 4 carbon atoms, more preferably a methyl group or an ethyl group, and most preferably a methyl group. As the cycloalkyl group, there can be mentioned, for example, a cyclopropyl group, a cyclobutyl group, a cyclopentyl group or a cyclohexyl group. As the alkoxycarbonyl group, there can be mentioned, for example, a methoxycarbonyl group, an ethoxycarbonyl group, an n-butoxycarbonyl group or a t-butoxycarbonyl group. As the alkoxy group, there can be mentioned, for example, a methoxy group, an ethoxy group, an n-butoxy group or a t-butoxy group. One or more substituents may be introduced in the alkyl group, cycloalkyl group, alkoxycarbonyl group and alkoxy group represented by Rb. As such substituents, there can be mentioned, for example, a hydroxyl group; an alkoxy group such as a methoxy group or an ethoxy group; a cyano group; and a halogen atom such as a fluorine atom. More preferably, Rb is a methyl group, a cyano group or an alkoxycarbonyl group, further more preferably a cyano group.

When m≥1, it is preferred for the substitution with at least one Rb to take place at the α- or β-position of the carbonyl group of the lactone. The substitution with Rb at the α-position of the carbonyl group of the lactone is especially preferred.

As the alkylene group represented by X, there can be mentioned, for example, a methylene group or an ethylene group. X is preferably an oxygen atom or a methylene group, more preferably a methylene group.

Specific examples of the repeating units of general formula (2) will be shown below. In the specific examples, R represents a hydrogen atom, an alkyl group or a halogen atom. A substituent may be introduced in the alkyl group. R is preferably a hydrogen atom, a methyl group, a hydroxymethyl group or an acetoxymethyl group.

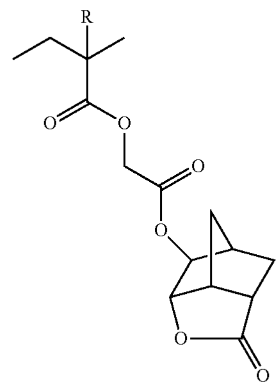

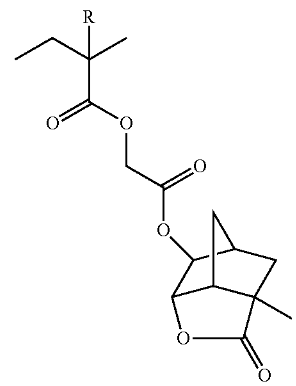

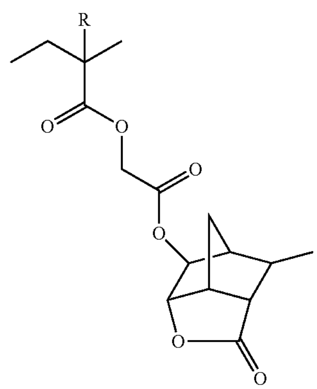

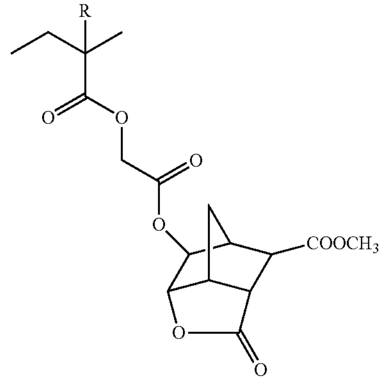

-continued
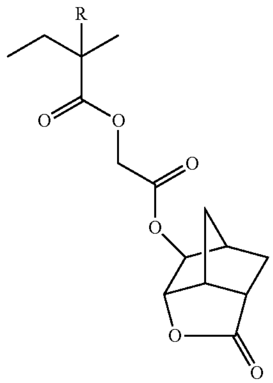
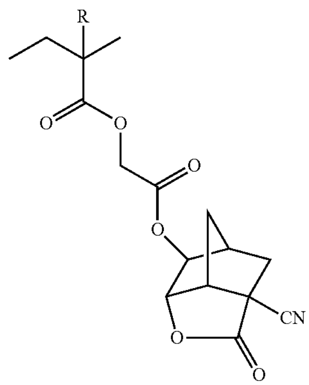
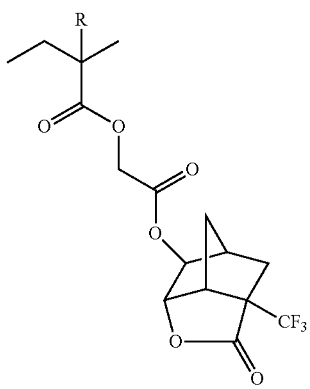
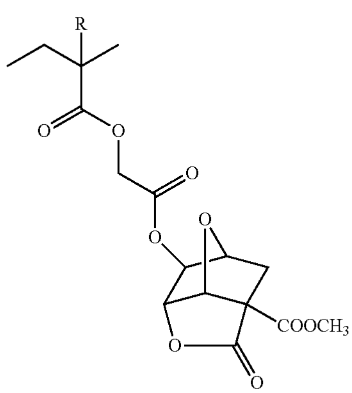
-continued
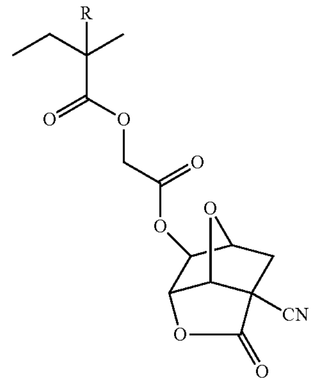
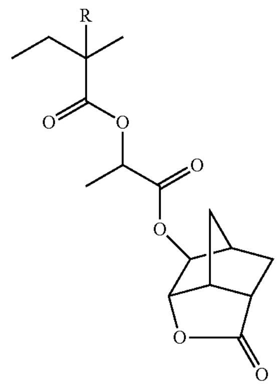
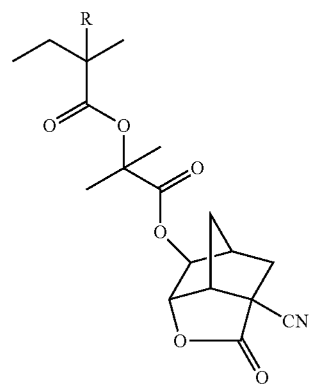
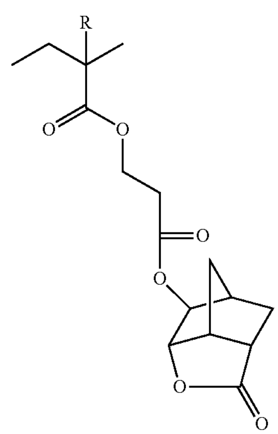

-continued
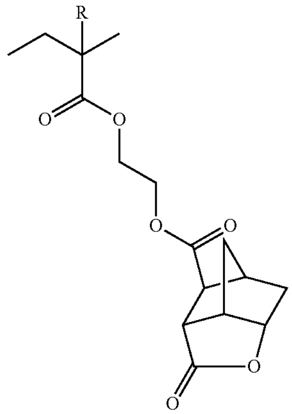
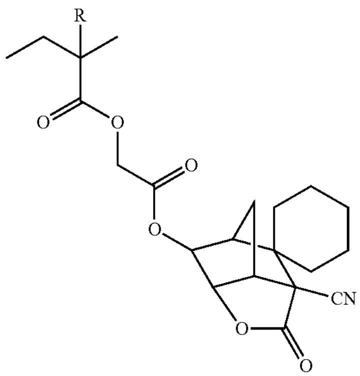
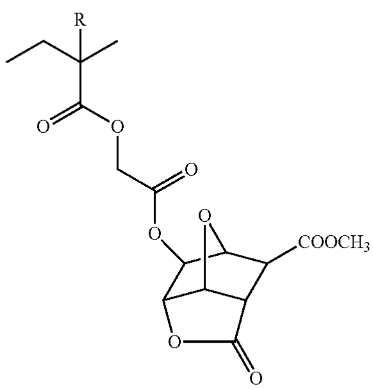
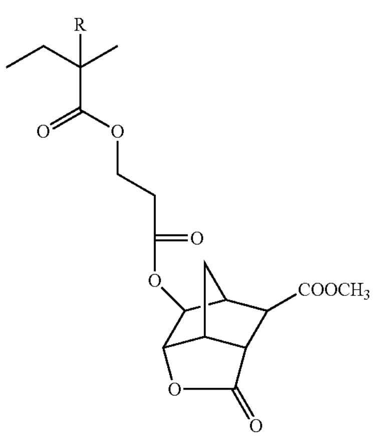
-continued
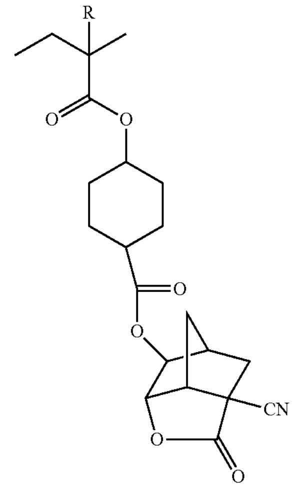
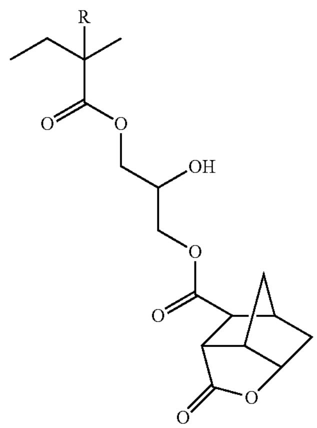
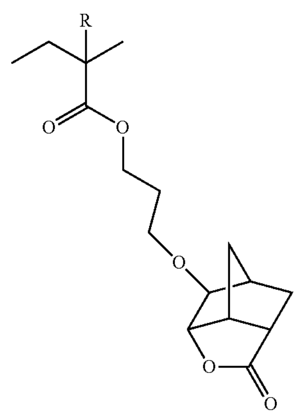
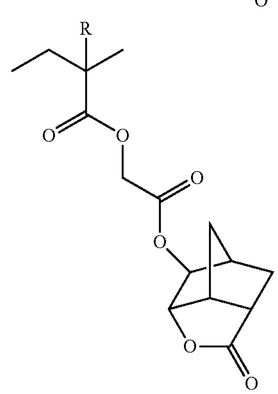

-continued

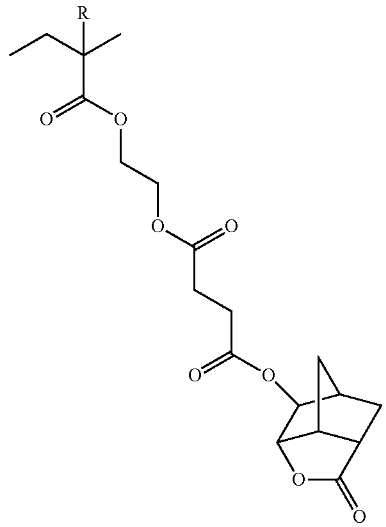

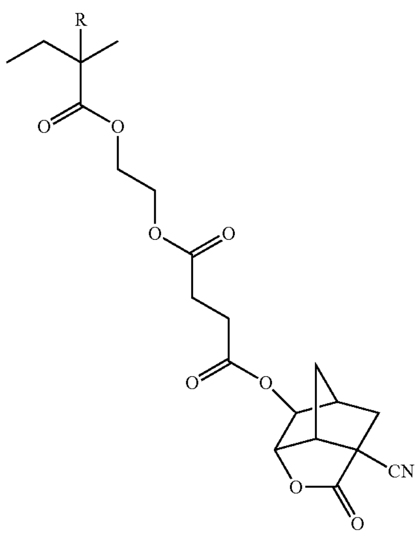

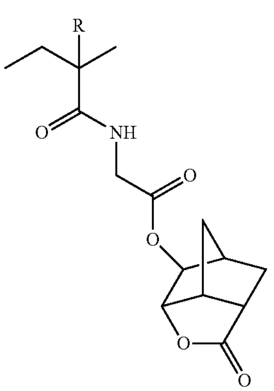

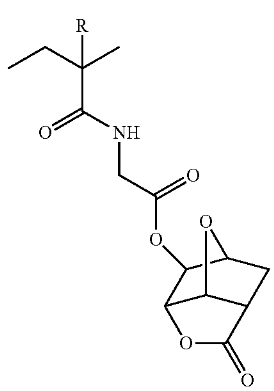

-continued

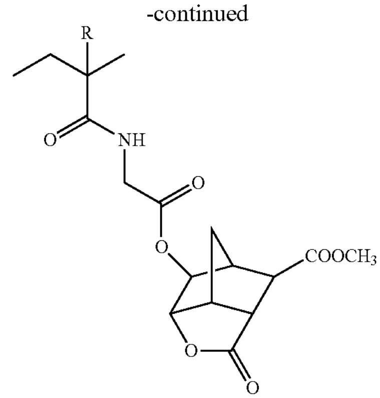

The repeating unit represented by the general formula (1) is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher.

Two or more types of repeating units selected from among those of general formula (1) can be simultaneously used in order to increase the effects of the present invention. In the simultaneous use, it is preferred to select two or more types of repeating units from among those of general formula (1) in which $n_s$ is 1 and simultaneously use the selected repeating units.

The content of the repeating unit represented by the general formulae (1) based on all the repeating units of the resin is preferably in the range of 15 to 60 mol %, more preferably 20 to 50 mol % and further more preferably 30 to 50 mol %.

The acid-decomposable resin may further contain other repeating units containing a lactone structure than those represented by the general formulae (1) and (2).

A repeating unit containing a lactone structure preferably contains the lactone structure having a 5 to 7-membered ring. More preferably, a lactone structure in which another cyclic structure is condensed with this lactone structure having a 5 to 7-membered ring in a fashion to form a bicyclo structure or spiro structure.

More specifically, lactone structures represented by any of general formulae (LC1-1) to (LC1-17) below can be exemplified. Of these, more preferred are those of formulae (LC1-1), (LC1-4), (LC1-5), (LC1-6), (LC1-13), (LC1-14), and (LC1-17). The use of these specified lactone structures would realize improvement in the line edge roughness and development defect.

As other repeating units containing a lactone structure, for example, a repeating unit represented by the general formula (AII') below can be exemplified.

(AII')

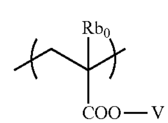

In general formula (AII'), $Rb_0$ represents a hydrogen atom, a halogen atom or an alkyl group having 1 to 4 carbon atoms. As preferred substituents that may be introduced in the alkyl group represented by $Rb_0$, there can be mentioned a hydroxyl group and a halogen atom. As the halogen atom, there can be mentioned a fluorine atom, a chlorine atom, a bromine atom or an iodine atom. Preferably, $Rb_0$ represents a hydrogen atom, a methyl group, a hydroxymethyl group, or a trifluoromethyl group, and more preferably a hydrogen atom or a methyl group.

V represents any of the groups of the general formulae (LC1-1) to (LC1-17).

Specific examples of repeating unit containing a lactone structure will be shown below, which in no way limit the scope of the present invention.

In the formulae, Rx represents H, $CH_3$, $CH_2OH$, or $CF_3$.

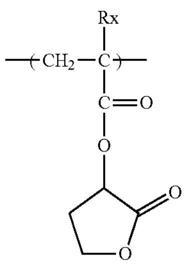
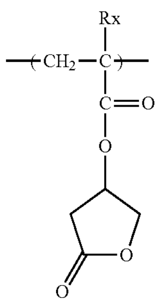
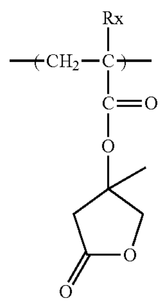
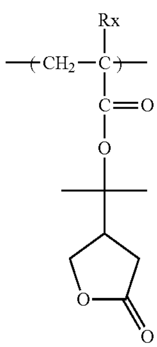
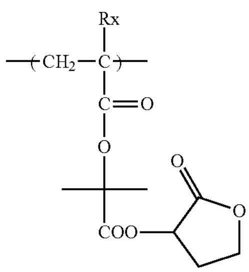
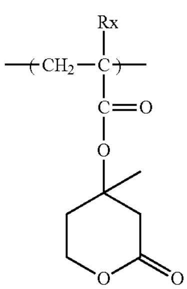
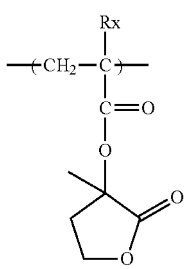
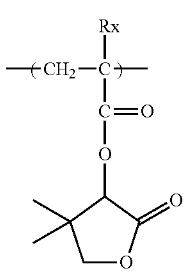
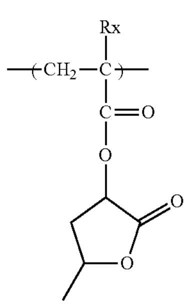

-continued

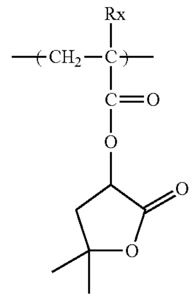
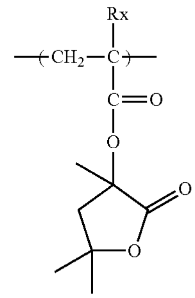
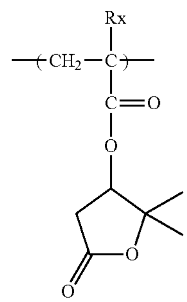
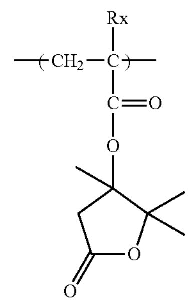
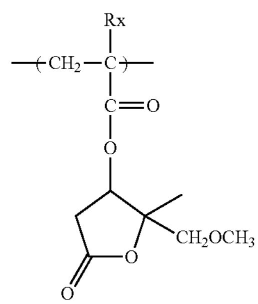
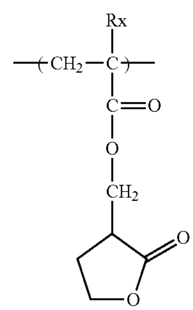
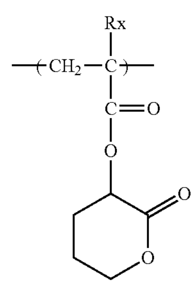
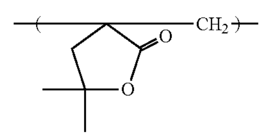
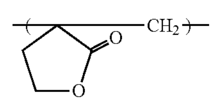
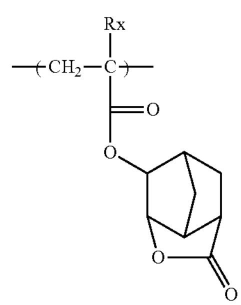

-continued
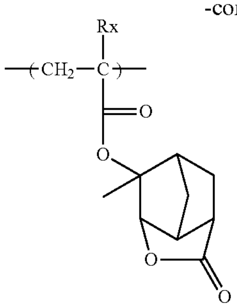
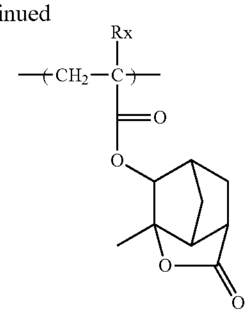
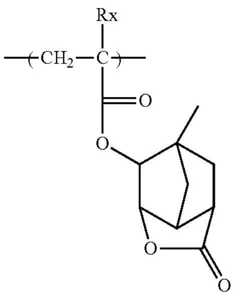
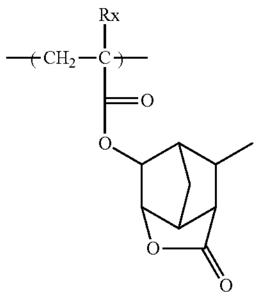
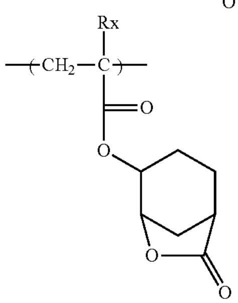
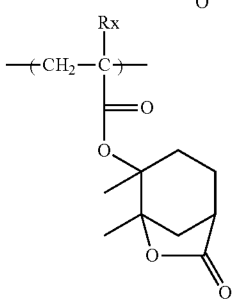
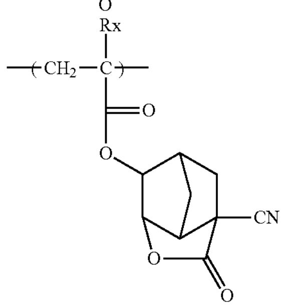
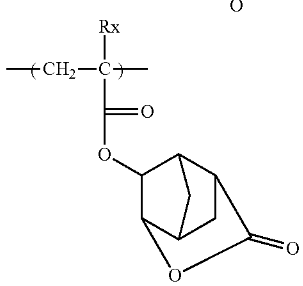
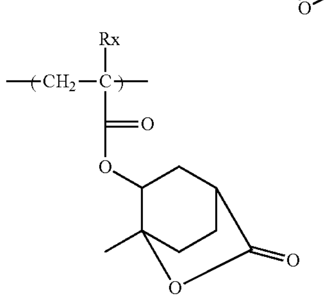
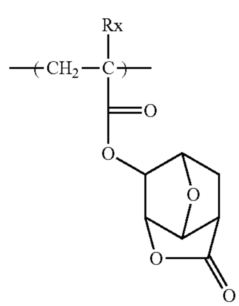
-continued
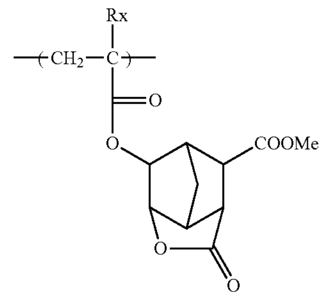
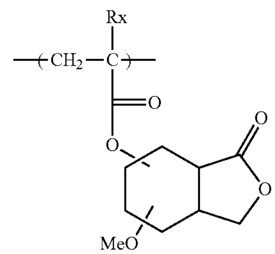
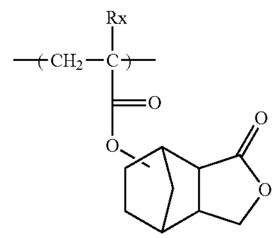
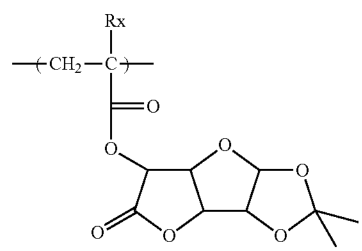
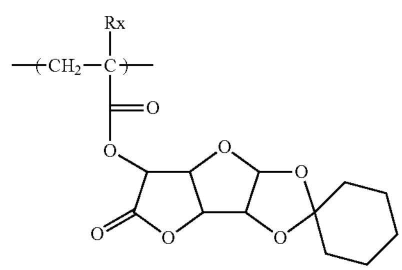
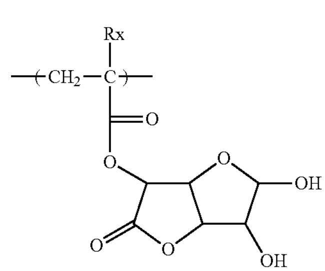

-continued
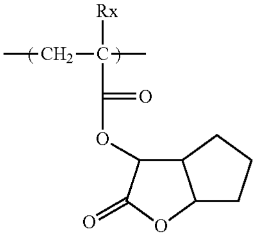
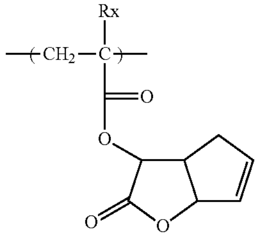
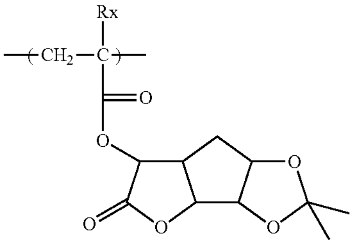
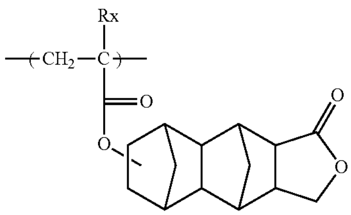
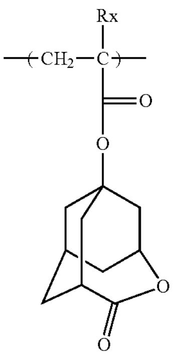
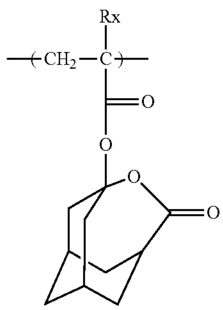
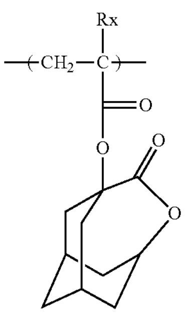
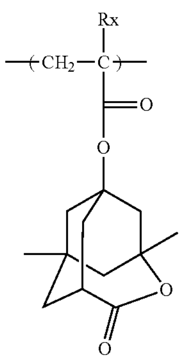
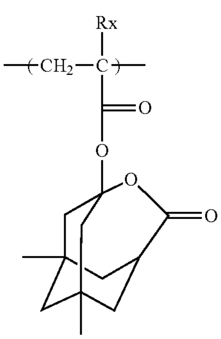
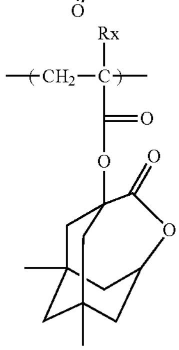
-continued
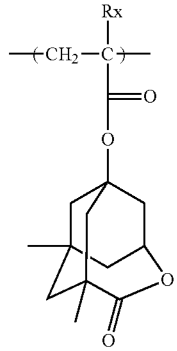
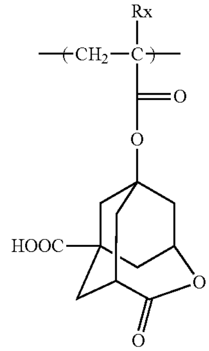
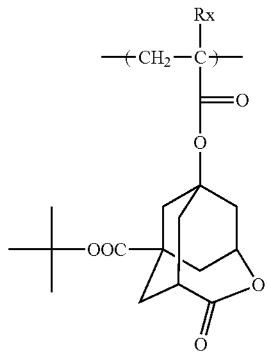
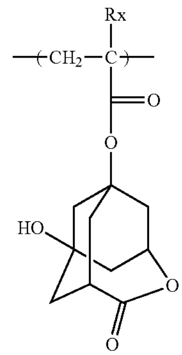
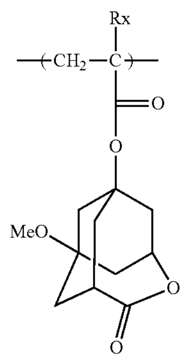
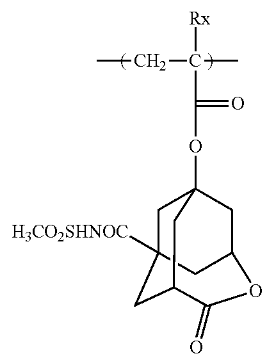
Preferred examples of the repeating units having a lactone structure are those shown below. For example, the pattern profile and/or iso/dense bias can be optimized by selecting the most appropriate lactone group. In the formulae, Rx represents H, $CH_3$, $CH_2OH$, or $CF_3$.
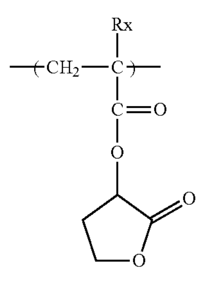
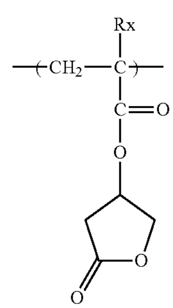

-continued

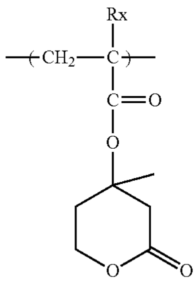

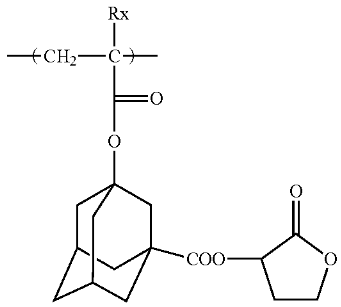

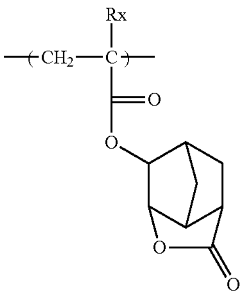

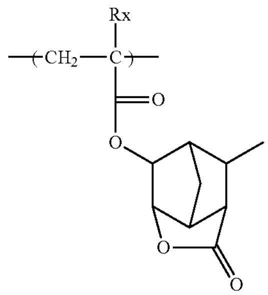

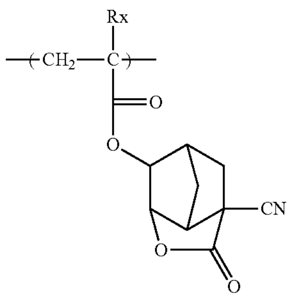

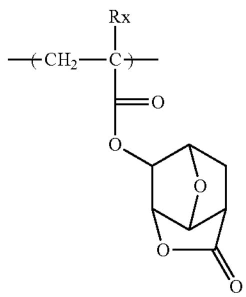

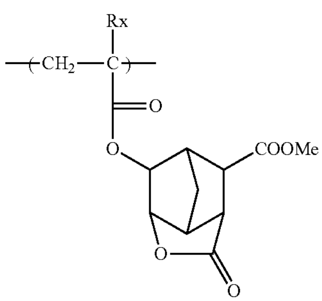

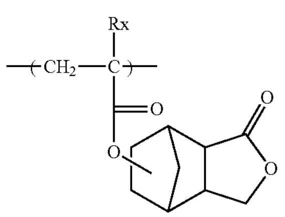

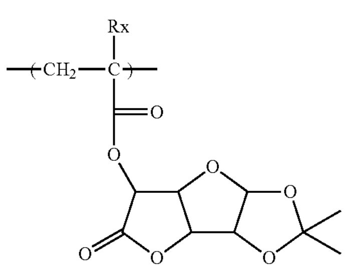

-continued

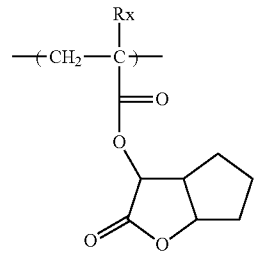

The repeating unit containing a lactone structure is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher.

The content of the repeating unit containing a lactone structure other than the repeating unit represented by the general formula (1) based on all the repeating units of the resin is preferably in the range of 15 to 60 mol %, more preferably 20 to 50 mol % and further more preferably 30 to 50 mol %.

The content of the repeating unit containing a lactone structure other than the repeating unit represented by the general formula (1) is generally 50 mol % or below, and preferably 30 mol % or below based on the content of the repeating unit represented by the general formula (1).

The acid-decomposable resin may further contain a repeating unit containing a hydroxy group or a cyano group other than repeating units represented by the general formulae (AI) and (1). The containment of this repeating unit would realize enhancements of adhesion to substrate and developer affinity.

The repeating unit containing a hydroxy group or a cyano group is preferably a repeating unit having an alicyclic hydrocarbon structure substituted with a hydroxy group or a cyano group. Further, the repeating unit containing a hydroxy group or a cyano group is preferably free from the acid-decomposable group. In the alicyclic hydrocarbon structure substituted with a hydroxy group or a cyano group, the alicyclic hydrocarbon structure preferably consists of an adamantyl group, a diamantyl group or a norbornane group. As preferred alicyclic hydrocarbon structures substituted with a hydroxy group or a cyano group, the partial structures represented by the following general formulae (VIIa) to (VIId) can be exemplified.

(VIIa)

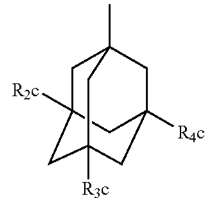

-continued (VIIb)

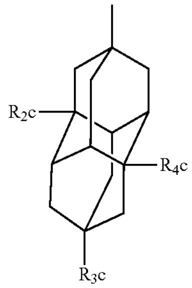

(VIIc)

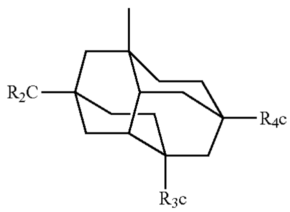

(VIId)

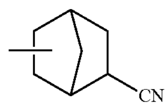

In the general formulae (VIIa) to (VIIc), each of $R_2c$ to $R_4c$ independently represents a hydrogen atom, a hydroxy group or a cyano group, with the proviso that at least one of the $R_2c$ to $R_4c$ represents a hydroxy group or a cyano group. Preferably, one or two of the $R_2c$ to $R_4c$ are hydroxy groups and the remainder is a hydrogen atom. In the general formula (VIIa), more preferably, two of the $R_2c$ to $R_4c$ are hydroxy groups and the remainder is a hydrogen atom.

As the repeating units having any of the partial structures represented by the general formulae (VIIa) to (VIId), those of the following general formulae (AIIa) to (AIId) can be exemplified.

(AIIa)

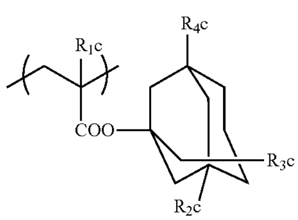

(AIIb)

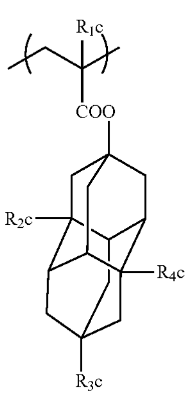

-continued (AIIc)

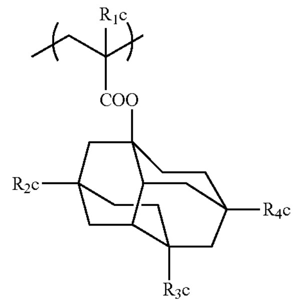

(AIId)

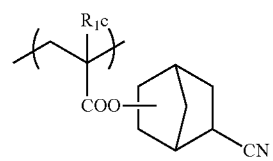

In the general formulae (AIIa) to (AIId), $R_1c$ represents a hydrogen atom, a methyl group, a trifluoromethyl group or a hydroxymethyl group.

$R_2c$ to $R_4c$ have the same meaning as those of the general formulae (VIIa) to (VIIc).

The content of the repeating unit containing a hydroxyl group or a cyano group based on all the repeating units of the resin is preferably in the range of 5 to 40 mol %, more preferably 5 to 30 mol % and further more preferably 10 to 25 mol %.

Specific examples of the repeating units containing a hydroxyl group or a cyano group will be shown below, which however in no way limit the scope of the present invention.

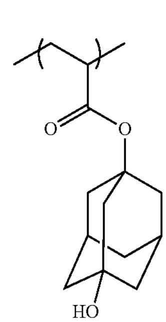

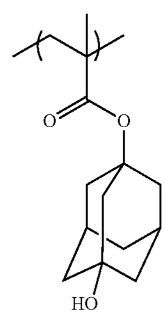

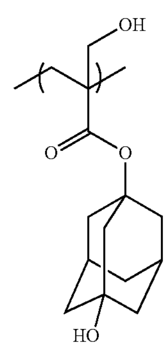

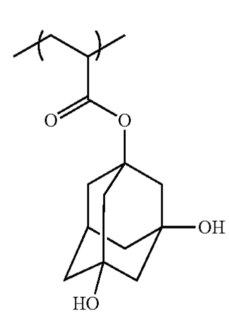

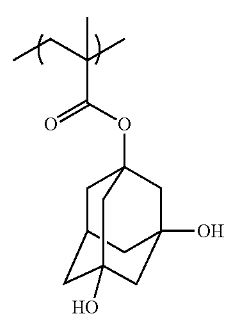

-continued

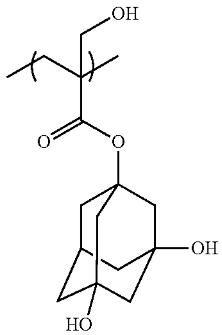

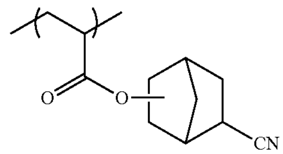

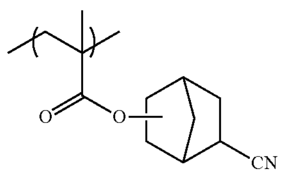

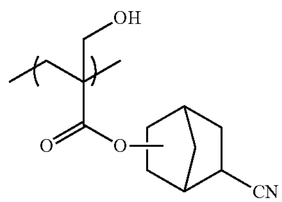

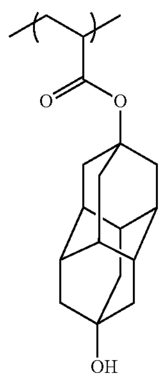

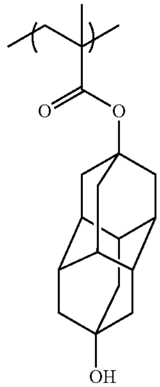

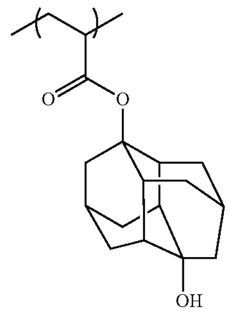

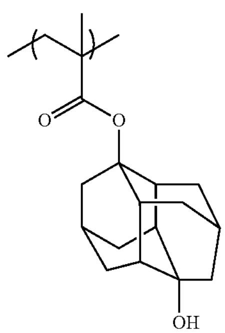

The acid-decomposable resin may contain a repeating unit containing an alkali-soluble group. As the alkali-soluble group, there can be mentioned a phenolic hydroxyl group, a carboxyl group, a sulfonamido group, a sulfonylimido group, a bisulfonylimido group or an aliphatic alcohol substituted at its α-position with an electron withdrawing group (for example, a hexafluoroisopropanol group). It is more preferred to contain a repeating unit containing a carboxyl group. The incorporation of the repeating unit containing an alkali-soluble group increases the resolution in contact hole usage. The repeating unit containing an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a mono- or polycyclohydrocarbon structure. The repeating unit of acrylic acid or methacrylic acid is especially preferred.

The content of the repeating unit containing an alkali-soluble group based on all the repeating units of the resin is preferably in the range of 0 to 20 mol %, more preferably 3 to 15 mol % and further more preferably 2 to 10 mol %.

Specific examples of the repeating units containing an alkali-soluble group will be shown below, which however in no way limit the scope of the present invention.

In the specific examples, Rx represents H, $CH_3$, $CH_2OH$, or $CF_3$.

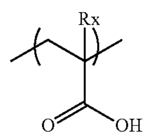

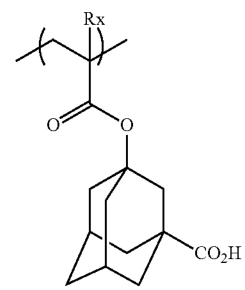

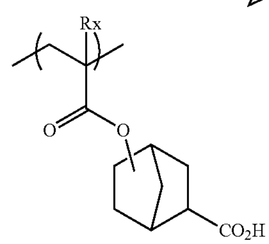

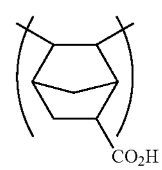

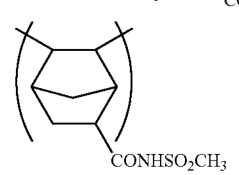

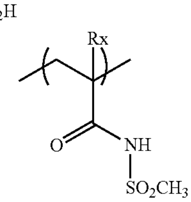

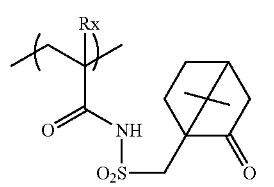

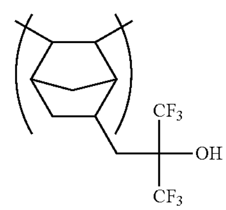

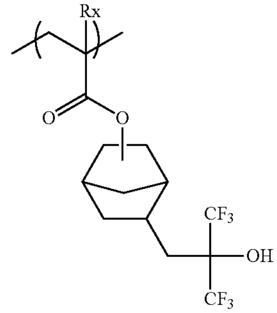

-continued

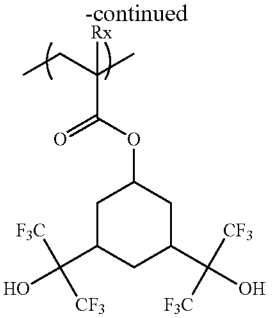

The acid-decomposable resin may further contain a repeating unit having an alicyclic hydrocarbon structure containing no polar group, which repeating unit exhibits no acid decomposability. As the repeating unit, there can be mentioned, for example, any of those of general formula (IV) below.

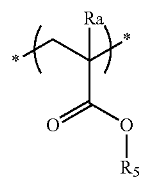

(IV)

In the general formula (IV), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. Ra is preferably a hydrogen atom, a methyl group, a hydroxymethyl group or a trifluoromethyl group, further preferably a hydrogen atom or a methyl group.

The cyclic structures contained in $R_5$ include a monocyclic hydrocarbon group and a polycyclic hydrocarbon group. As the monocyclic hydrocarbon group, a cycloalkyl group having 3 to 12 carbon atoms and a cycloalkenyl group having 3 to 12 carbon atoms can be exemplified. Preferably, the monocyclic hydrocarbon group is a monocyclic hydrocarbon group having 3 to 7 carbon atoms. As such, a cyclopentyl group and a cyclohexyl group can be exemplified.

The polycyclic hydrocarbon groups include ring-assembly hydrocarbon groups and crosslinked-ring hydrocarbon groups.

As the ring-assembly hydrocarbon groups, for example, a bicyclohexyl group and a perhydronaphthalenyl group can be exemplified.

As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo[3.2.1]octane ring); tricyclic hydrocarbon rings, such as adamantane, tricyclo[5.2.1.$0^{2,6}$]decane and tricyclo[4.3.1.$1^{2,5}$]undecane rings; and tetracyclic hydrocarbon rings, such as tetracyclo [4.4.0.$1^{2,5}$. $1^{7,10}$]dodecane and perhydro-1,4-methano-5,8-methanonaphthalene rings.

Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenalene rings.

As preferred crosslinked-ring hydrocarbon rings, there can be mentioned a norbornyl group, an adamantyl group, a bicyclooctanyl group, a tricyclo[5.2.1.$0^{2,6}$]decanyl group and the like. As more preferred crosslinked-ring hydrocarbon rings, there can be mentioned a norbornyl group and an adamantyl group.

These alicyclic hydrocarbon groups may have one or more substituents. As preferred substituents, a halogen atom, an alkyl group, a hydroxyl group protected by a protective group, and an amino group protected by a protective group can be exemplified. The halogen atom is preferably a bromine, chlorine or fluorine atom. The alkyl group is preferably a methyl, ethyl, butyl or t-butyl group. The alkyl group may further have one or more substituents. As the optional substituent, a halogen atom, an alkyl group, a hydroxyl group protected by a protective group, and an amino group protected by a protective group can be exemplified.

As the protective group, an alkyl group, a cycloalkyl group, an aralkyl group, a substituted methyl group, a substituted ethyl group, an alkoxycarbonyl group and an aralkyloxycarbonyl group can be exemplified. Preferred alkyl groups include alkyl groups having 1 to 4 carbon atoms. Preferred substituted methyl groups include methoxymethyl, methoxythiomethyl, benzyloxymethyl, t-butoxymethyl and 2-methoxyethoxymethyl groups. Preferred substituted ethyl groups include 1-ethoxyethyl and 1-methyl-1-methoxyethyl groups. Preferred acyl groups include aliphatic acyl groups having 1 to 6 carbon atoms, such as formyl, acetyl, propionyl, butyryl, isobutyryl, valeryl and pivaloyl groups. Preferred alkoxycarbonyl groups include alkoxycarbonyl groups having 1 to 4 carbon atoms and the like.

When the acid-decomposable resin contains the repeating unit having an alicyclic hydrocarbon structure containing no polar group, which repeating unit exhibits no acid decomposability, the content thereof based on all the repeating units of the acid-composable resin is preferably in the range of 1 to 40 mol %, more preferably 1 to 20 mol %.

Specific examples of the repeating unit having an alicyclic hydrocarbon structure containing no polar group, which repeating unit exhibits no acid decomposability will be shown below, which however in no way limit the scope of the present invention. In the formulae, Ra represents H, $CH_3$, $CH_2OH$ or $CF_3$.

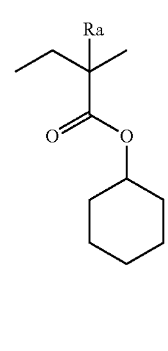

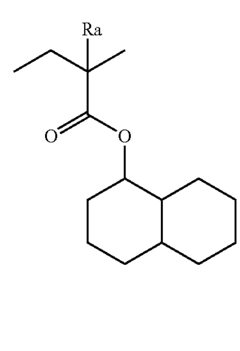

-continued

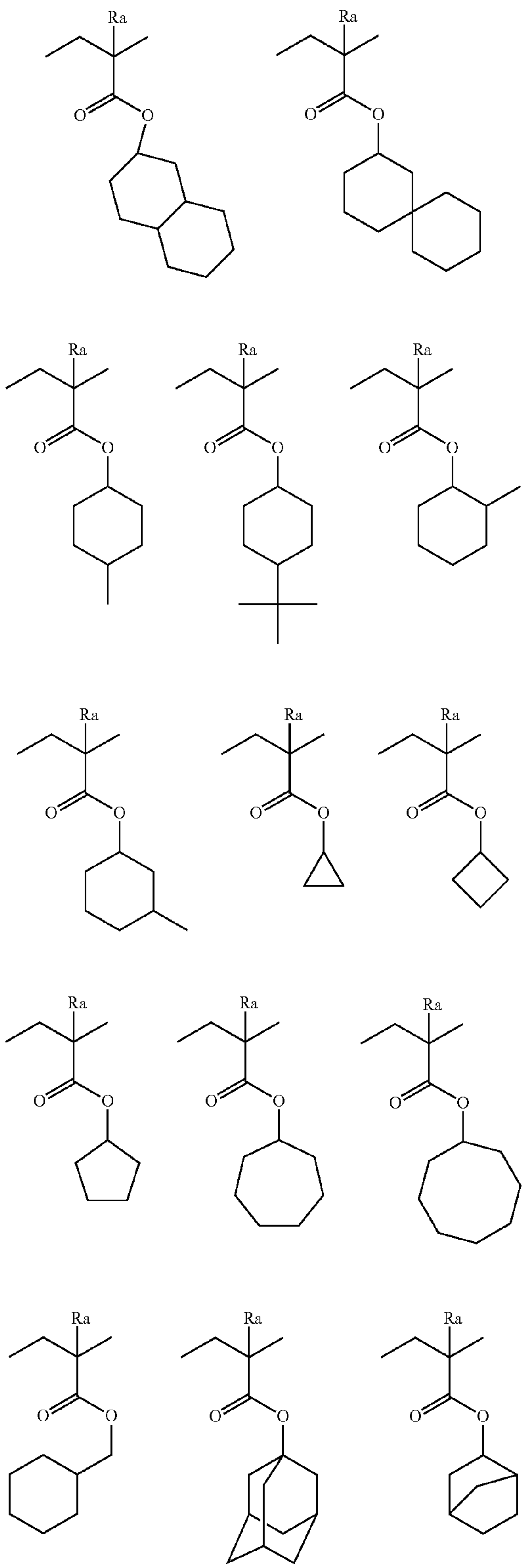

-continued

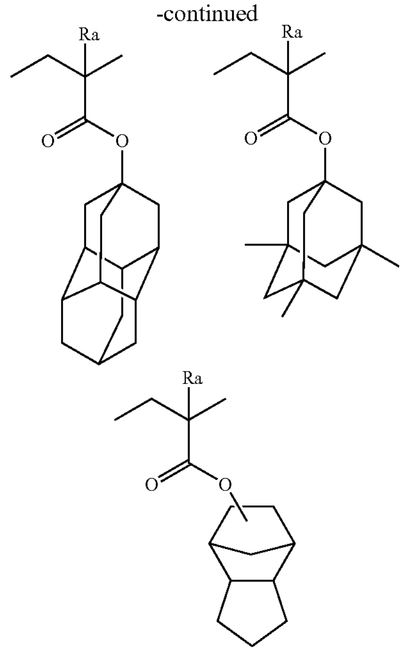

Various repeating structural units other than those mentioned hereinbefore can be introduced in the acid-decomposable resin in order to regulate the dry etching resistance, standard developer adaptability, adherence to substrates, resist profile, and generally required properties for resist, such as resolving power, heat resistance, sensitivity, and the like.

As such other repeating structural units, those corresponding to the following monomers can be exemplified, which however are nonlimiting.

Such other repeating structural units would permit fine regulation of the properties required to have by the resin for use in the composition of the present invention, especially, (1) solubility in applied solvents, (2) film forming easiness (glass transition temperature), (3) alkali developability, (4) film thinning (selection of hydrophilicity/hydrophobicity and alkali soluble group), (5) adhesion of unexposed areas to substrate, and (6) dry etching resistance, etc.

As the above-mentioned monomers, compounds having an unsaturated bond capable of addition polymerization, selected from among acrylic esters, methacrylic esters, acrylamides, methacrylamides, allyl compounds, vinyl ethers, vinyl esters and the like can be exemplified.

The monomers are not limited to the above, and unsaturated compounds capable of addition polymerization that are copolymerizable with the monomers corresponding to the above various repeating structural units can be used in the copolymerization.

The molar ratios of individual repeating structural units contained in the resin for use in the composition of the present invention are appropriately determined from the viewpoint of regulation of not only the resist dry etching resistance but also the standard developer adaptability, substrate adhesion, resist profile and generally required properties of resists such as resolving power, heat resistance and sensitivity.

When the composition of the present invention is used in ArF exposure, it is preferred for the acid-decomposable resin to contain no aromatic group from the viewpoint of transparency to ArF light. It is especially preferred for the acid-decomposable resin to contain an alicyclic hydrocarbon structure of a single ring or multiple rings.

Further, it is preferred for the acid-decomposable resin to contain neither a fluorine atom nor a silicon atom from the viewpoint of compatibility with hydrophobic resins to be described hereinafter.

Preferred acid-decomposable resin is that whose repeating units consisting of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units. Further, a copolymer containing 20 to 50 mol % of (meth)acrylate repeating unit having an acid-decomposable group; 20 to 50 mol % of (meth)acrylate repeating unit having a lactone structure; 5 to 30 mol % of (meth)acrylate repeating unit containing a hydroxy group or a cyano group; and 0 to 20 mol % of other (meth)acrylate repeating units is also preferred.

In the event of exposing the composition of the present invention to KrF excimer laser beams, electron beams, X-rays or high-energy light rays of wavelength 50 nm or less (EUV, etc.), it is preferred for the resin to further have hydroxystyrene repeating units. More preferably, the resin has hydroxystyrene repeating units, hydroxystyrene repeating units protected by an acid-decomposable group and acid-decomposable repeating units of a (meth)acrylic acid tertiary alkyl ester, etc.

As preferred hydroxystyrene repeating units having an acid-decomposable group, there can be mentioned, for example, repeating units derived from t-butoxycarbonyloxystyrene, a 1-alkoxyethoxystyrene and a (meth)acrylic acid tertiary alkyl ester. Repeating units derived from a 2-alkyl-2-adamantyl(meth)acrylate and a dialkyl(1-adamantyl)methyl (meth)acrylate are more preferred.

The acid-decomposable resin of the present invention can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or the solvent capable of dissolving the composition of the present invention, such as propylene glycol monomethyl ether acetate, propylene glycol monomethyl ether or cyclohexanone, to be described hereinafter. It is preferred to perform the polymerization with the use of the same solvent as employed in the actinic-ray- or radiation-sensitive resin composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° to 150° C., preferably 30° to 120° C. and more preferably 60° to 100° C.

The weight average molecular weight of the acid-decomposable resin in terms of polystyrene molecular weight as measured by GPC is preferably in the range of 1000 to 200,000, more preferably 2000 to 20,000, still more preferably 3000 to 15,000 and further preferably 5000 to 13,000. The regulation of the weight average molecular weight to 1000 to 200,000 would prevent deteriorations of heat resistance and dry etching resistance and also prevent deterioration of developability and increase of viscosity leading to poor film forming property.

Use is made of the resin whose dispersity (molecular weight distribution) is usually in the range of 1 to 3, preferably 1 to 2.6, more preferably 1 to 2 and most preferably 1.4 to 2.0. The lower the molecular weight distribution, the more excellent the resolving power and resist profile and the smoother the side wall of the resist pattern to thereby attain an excellence in roughness.

In the present invention, the content ratio of the acid-decomposable resin based on the total solid content of the whole composition is preferably in the range of 30 to 99 mass %, and more preferably 60 to 95 mass %.

The acid-decomposable resin may be used either individually or in combination. Moreover, the acid-decomposable resin may be used in combination with resins other than the foregoing acid-decomposable resins to an extent not detrimental to the effects of the present invention. As the other repeating units, the acid-decomposable resin not containing a repeating unit represented by the general formula (1) or other known acid-decomposable resins can be exemplified.

(B) Acid Generator

The composition employable for the pattern forming method according to the present invention contains an acid generator.

As the acid generator, use can be made of a member appropriately selected from among a photoinitiator for photocationic polymerization, a photoinitiator for photoradical polymerization, a photo-achromatic agent and photo-discoloring agent for dyes, any of publicly known compounds that generate an acid when exposed to actinic rays or radiation employed in microresists, etc., and mixtures thereof.

As the acid generator, a diazonium salt, a phosphonium salt, a sulfonium salt, an iodonium salt, an imide sulfonate, an oxime sulfonate, diazosulfone, disulfone and o-nitrobenzyl sulfonate can be exemplified.

Further, use can be made of compounds obtained by introducing any of the above groups or compounds that generate an acid when exposed to actinic rays or radiation in a polymer principal chain or side chain, for example, compounds described in U.S. Pat. No. 3,849,137, DE 3914407, JP-A's-63-26653, 55-164824, 62-69263, 63-146038, 63-163452, 62-153853, 63-146029, etc.

Furthermore, use can be made of compounds that generate an acid when exposed to light described in U.S. Pat. No. 3,779,778, EP 126,712, etc.

As preferred compounds among the acid generators, those represented by the following general formulae (ZI), (ZII) and (ZIII) can be exemplified.

ZI

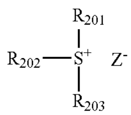

ZII

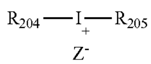

ZIII

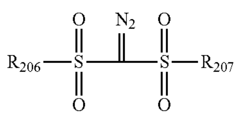

In the above general formula (ZI), each of $R_{201}$, $R_{202}$ and $R_{203}$ independently represents an organic group.

The number of carbon atoms in the organic group represented by $R_{201}$, $R_{202}$ and $R_{203}$ is generally in the range of 1 to 30, preferably 1 to 20.

Two of $R_{201}$ to $R_{203}$ may be bonded to each other via a single bond or a connecting group to thereby form a ring structure. As the connecting group, there can be mentioned, for example, an ether bond, a thioether bond, an ester bond, an amido bond, a carbonyl group, a methylene group or an ethylene group. As the group formed by the mutual bonding of two of $R_{201}$ to $R_{203}$, there can be mentioned, for example, an alkylene group, such as a butylene group or a pentylene group.

$Z^-$ represents a nonnucleophilic anion.

As the nonnucleophilic anion represented by $Z^-$, a sulfonate anion, a carboxylate anion, a sulfonylimido anion, a bis(alkylsulfonyl)imido anion, and a tris(alkylsulfonyl)methyl anion can be exemplified.

The nonnucleophilic anion means an anion whose capability of inducing a nucleophilic reaction is extremely low. Any decomposition over time attributed to an intramolecular nucleophilic reaction can be suppressed by the use of this anion. Therefore, when this anion is used, the stability over time of the relevant composition and the film formed therefrom can be enhanced.

As the sulfonate anion, an aliphatic sulfonate anion, an aromatic sulfonate anion, and a camphor sulfonate anion can be exemplified.

As the carboxylate anion, an aliphatic carboxylate anion, an aromatic carboxylate anion, and an aralkyl carboxylate anion can be exemplified.

The aliphatic moiety of the aliphatic sulfonate anion may be an alkyl group or a cycloalkyl group, being preferably an alkyl group having 1 to 30 carbon atoms or a cycloalkyl group having 3 to 30 carbon atoms. As such, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group can be exemplified.

As a preferred aromatic group of the aromatic sulfonate anion, an aryl group having 6 to 14 carbon atoms, such as a phenyl group, a tolyl group and a naphthyl group can be exemplified.

The alkyl group, cycloalkyl group and aryl group of the aliphatic sulfonate anion and aromatic sulfonate anion may have one or more substituents. As the substituent of the alkyl group, cycloalkyl group and aryl group of the aliphatic sulfonate anion and aromatic sulfonate anion, a nitro group, a halogen atom (fluorine atom, chlorine atom, bromine atom or iodine atom), a carboxy group, a hydroxy group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms) can be exemplified. The aryl group or ring structure of these groups may further have an alkyl group (preferably having 1 to 15 carbon atoms) as its substituent.

As the aliphatic moiety of the aliphatic carboxylate anion, the same alkyl groups and cycloalkyl groups as mentioned with respect to the aliphatic sulfonate anion can be exemplified.

As the aromatic group of the aromatic carboxylate anion, the same aryl groups as mentioned with respect to the aromatic sulfonate anion can be exemplified.

As a preferred aralkyl group of the aralkyl carboxylate anion, an aralkyl group having 6 to 12 carbon atoms, such as a benzyl group, a phenethyl group, a naphthylmethyl group, a naphthylethyl group, and a naphthylbutyl group can be exemplified.

The alkyl group, cycloalkyl group, aryl group and aralkyl group of the aliphatic carboxylate anion, aromatic carboxylate anion and aralkyl carboxylate anion may have one or more substituents. As the substituent of the alkyl group, cycloalkyl group, aryl group and aralkyl group of the aliphatic carboxylate anion, aromatic carboxylate anion and aralkyl carboxylate anion, the same halogen atom, alkyl group, cycloalkyl group, alkoxy group, and alkylthio group, etc. as mentioned with respect to the aromatic sulfonate anion can be exemplified.

As the sulfonylimido anion, a saccharin anion can be exemplified.

The alkyl group of the bis(alkylsulfonyl)imido anion and tris(alkylsulfonyl)methyl anion is preferably an alkyl group having 1 to 5 carbon atoms. As such, a methyl group, an ethyl group, a propyl group, an isopropyl group, an n-butyl group, an isobutyl group, a sec-butyl group, a pentyl group, and a neopentyl group can be exemplified. As a substituent of these alkyl groups, a halogen atom, an alkyl group substituted with a halogen atom, an alkoxy group, an alkylthio group, an alkyloxysulfonyl group, an aryloxysulfonyl group, and a cycloalkylaryloxysulfonyl group can be exemplified. An alkyl group substituted with one or more fluorine atoms is preferred.

As the other nonnucleophilic anions, $PF_6^-$, $BF_4^-$, and $SbF_6^-$ can be exemplified.

The nonnucleophilic anion represented by $Z^-$ is preferably selected from among an aliphatic sulfonate anion substituted at its α-position of sulfonic acid with a fluorine atom, an aromatic sulfonate anion substituted with one or more fluorine atoms or a group having a fluorine atom, a bis(alkylsulfonyl)imido anion whose alkyl group is substituted with one or more fluorine atoms and a tris(alkylsulfonyl)methide anion whose alkyl group is substituted with one or more fluorine atoms. More preferably, the nonnucleophilic anion is a perfluorinated aliphatic sulfonate anion having 4 to 8 carbon atoms or a benzene sulfonate anion having a fluorine atom. Still more preferably, the nonnucleophilic anion is a nonafluorobutane sulfonate anion, a perfluorooctane sulfonate anion, a pentafluorobenzene sulfonate anion or a 3,5-bis(trifluoromethyl)benzene sulfonate anion.

As the organic groups represented by $R_{201}$, $R_{202}$ and $R_{203}$, there can be mentioned, for example, the corresponding groups of compounds (ZI-1), (ZI-2), (ZI-3) or (ZI-4) to be described hereinafter.

Compounds having two or more of the structures of the general formula (ZI) may be used as the acid generator. For example, use may be made of a compound having a structure in which at least one of the $R_{201}$ to $R_{203}$ of one of the compounds of the general formula (ZI) is bonded to at least one of the $R_{201}$ to $R_{203}$ of another of the compounds of the general formula (ZI).

As preferred (ZI) components, the following compounds (ZI-1) to (ZI-4) can be exemplified.

The compounds (ZI-1) are arylsulfonium compounds of the general formula (ZI) wherein at least one of $R_{201}$ to $R_{203}$ is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

As the arylsulfonyl compound, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. As the aryl group having a heterocyclic structure, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), and a benzothiophene residue (group formed by loss of one hydrogen atom from benzothiophene) can be exemplified. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, a methyl group, an ethyl group, a propyl group, an n-butyl group, a sec-butyl group, a t-butyl group, a cyclopropyl group, a cyclobutyl group, and a cyclohexyl group can be exemplified.

The aryl group, alkyl group or cycloalkyl group represented by $R_{201}$ to $R_{203}$ may have one or more substituents. As the substituent, an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxy group, and a phenylthio group can be exemplified. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 6 carbon atoms and an alkoxy group having 1 to 6 carbon atoms. The substituents may be contained in any one of the three $R_{201}$ to $R_{203}$, or alternatively may be contained in all three of $R_{201}$ to $R_{203}$. When $R_{201}$ to $R_{203}$ represent a phenyl group, the substituent preferably lies at the p-position of the phenyl group.

Now, the compounds (ZI-2) will be described.

The compounds (ZI-2) are compounds represented by the formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a 2-oxoalkyl group, an alkoxycarbonylmethyl group, an allyl group, and a vinyl group. More preferred groups include a linear or branched 2-oxoalkyl group and an alkoxycarbonylmethyl group. Especially preferred is a linear or branched 2-oxoalkyl group.

As preferred alkyl groups and cycloalkyl groups represented by $R_{201}$ to $R_{203}$, a linear or branched alkyl group having 1 to 10 carbon atoms (for example, a methyl group, an ethyl group, a propyl group, a butyl group or a pentyl group) and a cycloalkyl group having 3 to 10 carbon atoms (for example, a cyclopentyl group, a cyclohexyl group or a norbornyl group) can be exemplified. As more preferred alkyl groups, a 2-oxoalkyl group and an alkoxycarbonylmethyl group can be exemplified. As more preferred cycloalkyl group, a 2-oxocycloalkyl group can be exemplified.

The 2-oxoalkyl group may be linear or branched. A group having >C═O at the 2-position of the above-described alkyl group can be preferably exemplified.

The 2-oxocycloalkyl group is preferably a group having >C═O at the 2-position of the above-described cycloalkyl group.

As preferred alkoxy groups of the alkoxycarbonylmethyl group, alkoxy groups having 1 to 5 carbon atoms can be exemplified. As such, there can be mentioned, for example, a methoxy group, an ethoxy group, a propoxy group, a butoxy group and a pentoxy group.

The organic groups containing no aromatic ring represented by $R_{201}$ to $R_{203}$ may further have one or more substituents. As the substituents, a halogen atom, an alkoxy group (having, for example, 1 to 5 carbon atoms), a hydroxy group, a cyano group and a nitro group can be exemplified.

Now the compounds (ZI-3) will be described. The compounds (ZI-3) are those represented by the following general formula (ZI-3) which have a phenacylsulfonium salt structure.

(ZI-3)

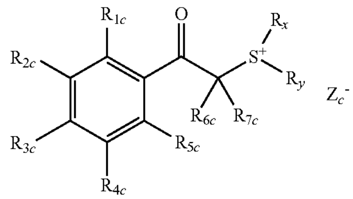

In the formula (ZI-3), each of $R_{1c}$ to $R_{5c}$ independently represents a hydrogen atom, an alkyl group, a cycloalkyl group, an alkoxy group, a halogen atom, or a phenylthio group.

Each of $R_{6c}$ and $R_{7c}$ independently represents a hydrogen atom, an alkyl group, a cycloalkyl group, halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a nonnucleophilic anion. There can be mentioned the same nonnucleophilic anions as mentioned with respect to the $Z^-$ of the general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

Each of the aryl groups represented by $R_{6c}$ and $R_{7c}$ preferably has 5 to 15 carbon atoms. As such, there can be mentioned, for example, a phenyl group or a naphthyl group.

When $R_{6c}$ and $R_{7c}$ are bonded to each other to thereby form a ring, the group formed by the bonding of $R_{6c}$ and $R_{7c}$ is preferably an alkylene group having 2 to 10 carbon atoms. As such, there can be mentioned, for example, an ethylene group, a propylene group, a butylene group, a pentylene group, a hexylene group or the like. Further, the ring formed by the bonding of $R_{6c}$ and $R_{7c}$ may have a heteroatom, such as an oxygen atom, in the ring.

As the alkyl groups and cycloalkyl groups represented by $R_x$ and $R_y$, there can be mentioned the same alkyl groups and cycloalkyl groups as set forth above with respect to $R_{1c}$ to $R_{7c}$.

As the 2-oxoalkyl group and 2-oxocycloalkyl group, there can be mentioned the alkyl group and cycloalkyl group represented by $R_{1c}$ to $R_{7c}$ having >C═O at the 2-position thereof.

With respect to the alkoxy group of the alkoxycarbonylalkyl group, there can be mentioned the same alkoxy groups as mentioned above with respect to $R_{1c}$ to $R_{5c}$. As the alkyl group thereof, there can be mentioned, for example, an alkyl group having 1 to 12 carbon atoms, preferably a linear alkyl group having 1 to 5 carbon atoms (e.g., a methyl group or an ethyl group).

The allyl groups are not particularly limited. However, preferred use is made of an unsubstituted allyl group or an allyl group substituted with a cycloalkyl group of a single ring or multiple rings.

The vinyl groups are not particularly limited. However, preferred use is made of an unsubstituted vinyl group or a vinyl group substituted with a cycloalkyl group of a single ring or multiple rings.

As the ring structure that may be formed by the mutual bonding of $R_x$ and $R_y$, there can be mentioned a 5-membered or 6-membered ring, especially preferably a 5-membered ring (namely, a tetrahydrothiophene ring), formed by bivalent $R_x$ and $R_y$ (for example, a methylene group, an ethylene group, a propylene group or the like) in cooperation with the sulfur atom of general formula (ZI-3).

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

Specific examples of the cation part in the compound (ZI-3) will be described below.

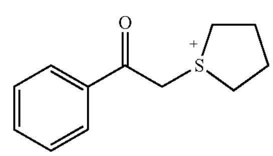

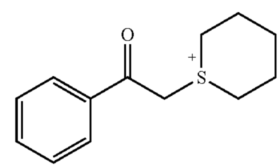

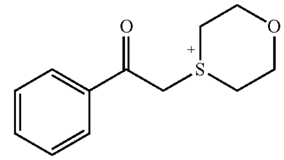

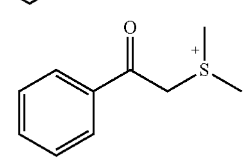

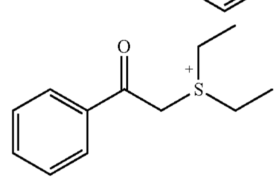

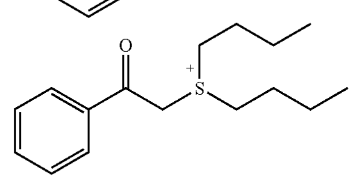

-continued
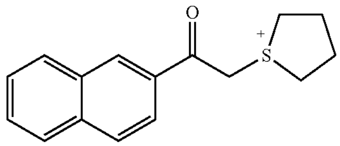
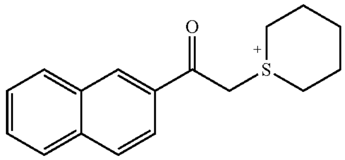
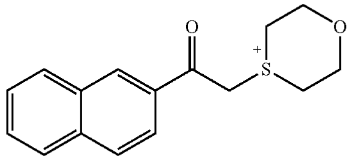
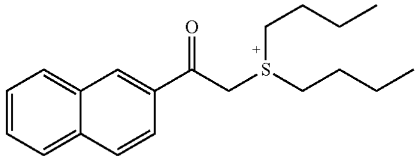
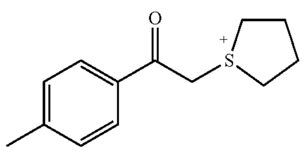
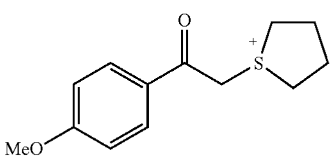
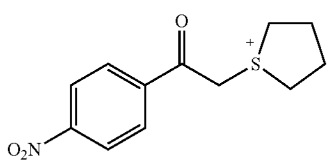
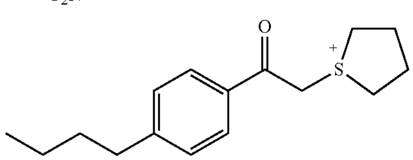
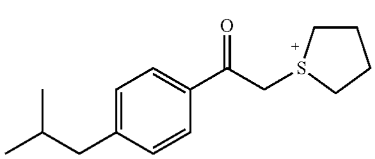
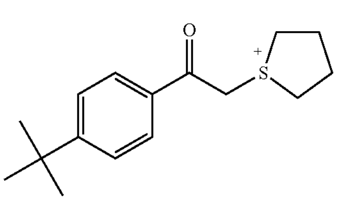
-continued
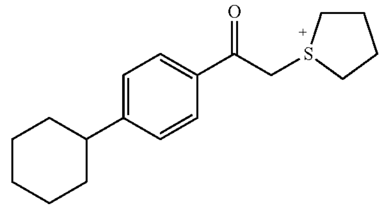
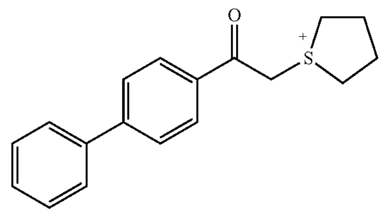
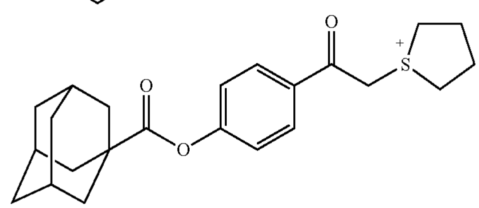
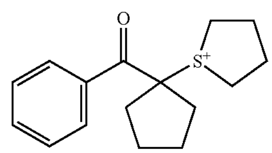
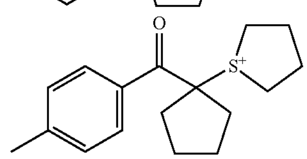
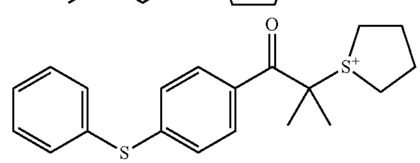
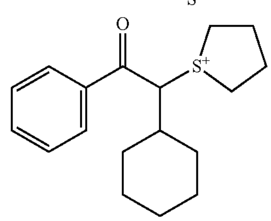
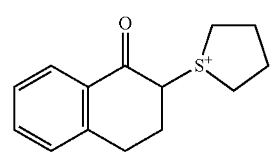
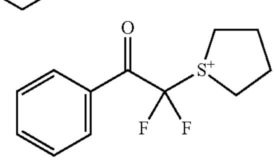
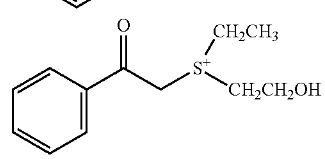
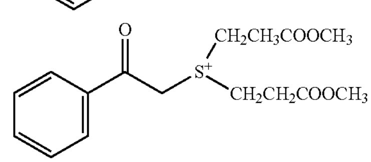

-continued

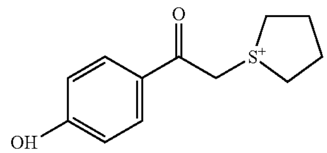

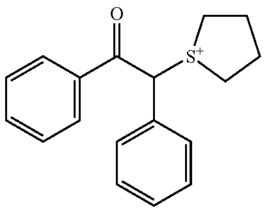

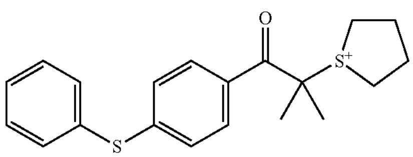

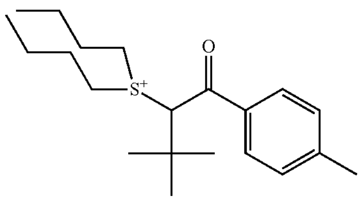

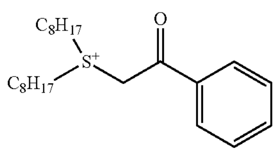

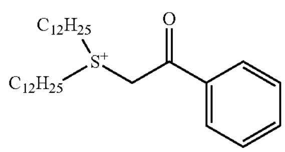

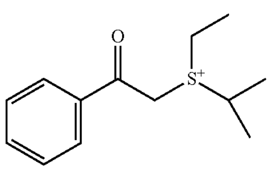

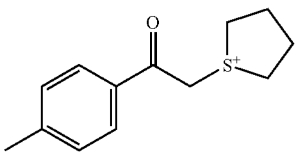

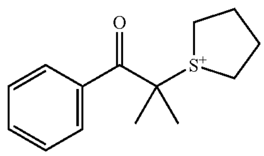

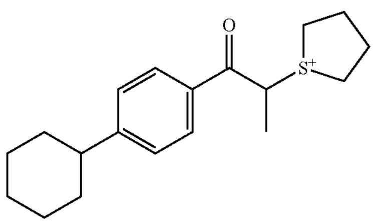

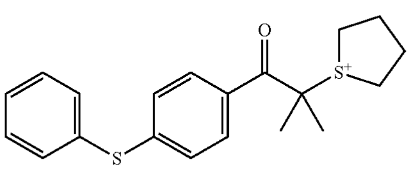

-continued

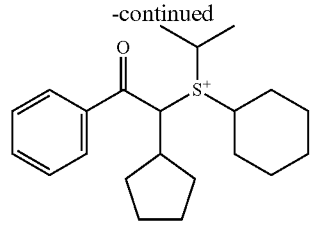

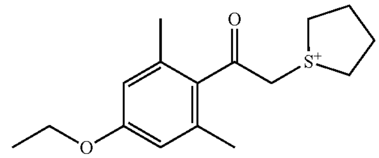

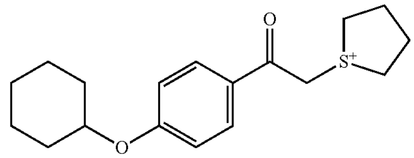

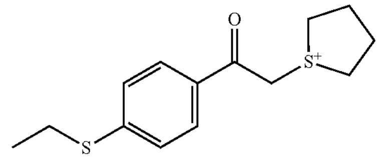

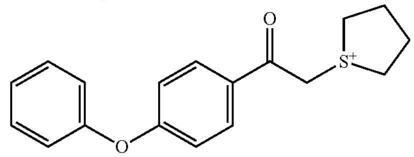

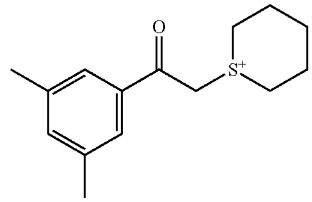

The compounds (ZI-4) are those of general formula (ZI-4) below.

(ZI-4)

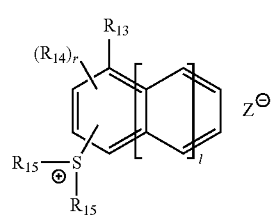

In general formula (ZI-4), $R_{13}$ represents any of a hydrogen atom, a fluorine atom, a hydroxyl group, an alkyl group, a cycloalkyl group, an alkoxy group, an alkoxycarbonyl group and a group with a cycloalkyl skeleton of a single ring or multiple rings. These groups may have one or more substituents.

$R_{14}$, each independently in the instance of $R_{14}$s, represents any of an alkyl group, a cycloalkyl group, an alkoxy group, an alkoxycarbonyl group, an alkylcarbonyl group, an alkylsulfonyl group, a cycloalkylsulfonyl group and a group with a cycloalkyl skeleton of a single ring or multiple rings. These groups may have one or more substituents.

Each of $R_{15}$s independently represents an alkyl group, a cycloalkyl group or a naphthyl group, provided that the two $R_{15}$s may be bonded to each other to thereby form a ring. These groups may have one or more substituents.

In the formula, 1 is an integer of 0 to 2, and r is an integer of 0 to 8.

$Z^-$ represents a nonnucleophilic anion. As such, there can be mentioned any of the same nonnucleophilic anions as mentioned with respect to the $Z^-$ of the general formula (ZI).

In general formula (ZI-4), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

As the cycloalkyl groups represented by $R_{13}$, $R_{14}$ and $R_{15}$, there can be mentioned cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ and $R_{14}$ may be linear or branched and preferably has 2 to 11 carbon atoms. As such, there can be mentioned, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have one or more substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof, including those of any optional substituent introduced in the cycloalkyl group, is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group or the like.

With respect to each of the alkyloxy groups having a cycloalkyl skeleton of a single ring or multiple rings represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof, including those of the substituents, is 7 or greater. For example, there can be mentioned a cyclohexylmethoxy group, a cyclopentylethoxy group, a cyclohexylethoxy group or the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

With respect to the alkyl group of the alkylcarbonyl group represented by $R_{14}$, there can be mentioned the same specific examples as mentioned above with respect to the alkyl groups represented by $R_{13}$ to $R_{15}$.

The alkylsulfonyl and cycloalkylsulfonyl groups represented by $R_{14}$ may be linear, branched or cyclic and preferably each have 1 to 10 carbon atoms. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

Each of the groups may have one or more substituents. As such substituents, there can be mentioned, for example, a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-4). The cyclic structure may condense with an aryl group or a cycloalkyl group. The bivalent $R_{15}$s may have substituents. As such substituents, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like as mentioned above. It is especially preferred for the $R_{15}$ of general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

Each of $R_{13}$ and $R_{14}$ may have one or more substituents. As such substituents, there can be mentioned, for example, a hydroxyl group, an alkoxy group, an alkoxycarbonyl group, a halogen atom (especially, a fluorine atom) or the like.

In the formula, 1 is preferably 0 or 1, more preferably 1, and r is preferably 0 to 2.

Specific examples of the cation part in the compound (ZI-4) will be shown below.

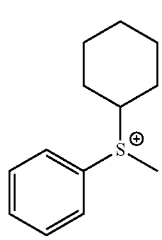

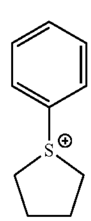

-continued

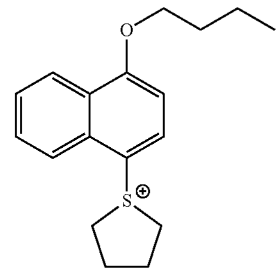

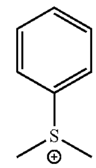

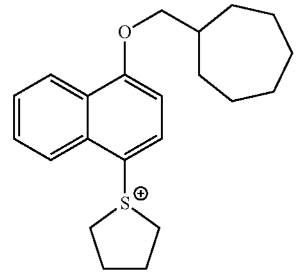

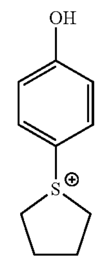

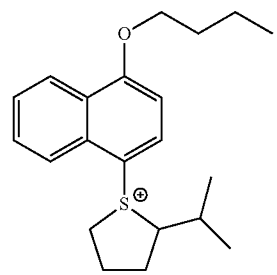

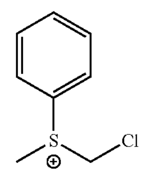

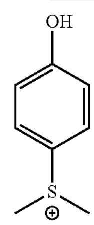

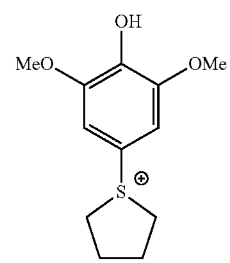

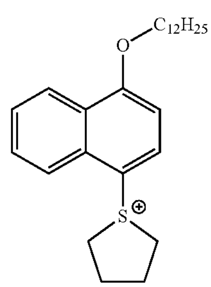

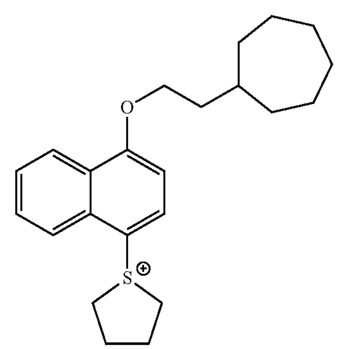

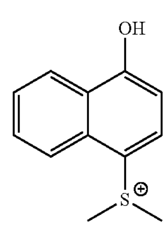

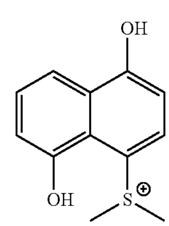

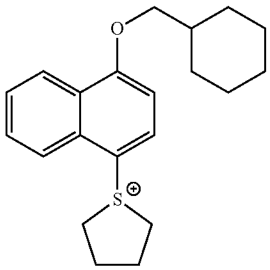
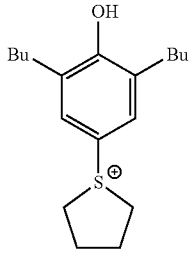
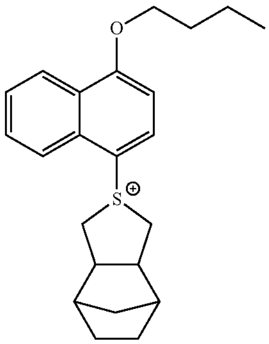
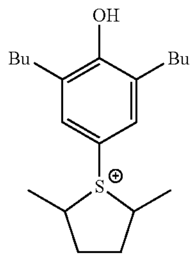
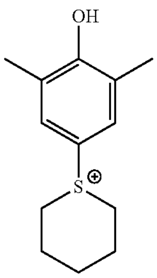
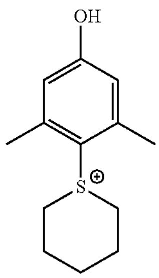
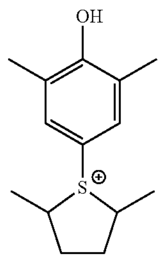
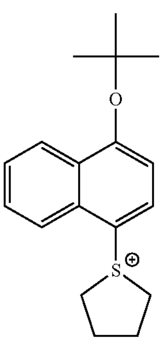
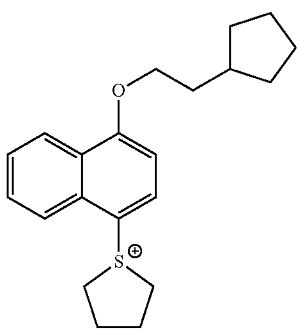
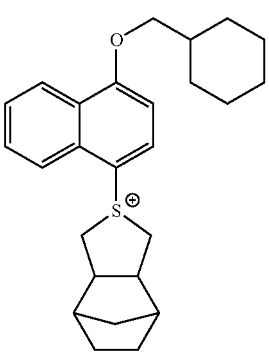
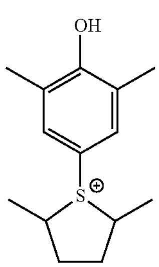
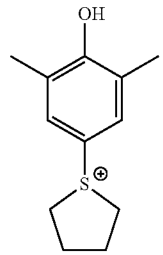
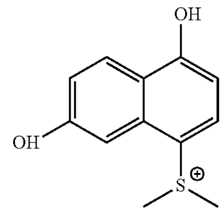
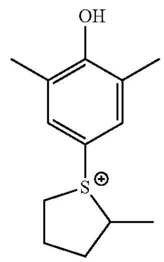
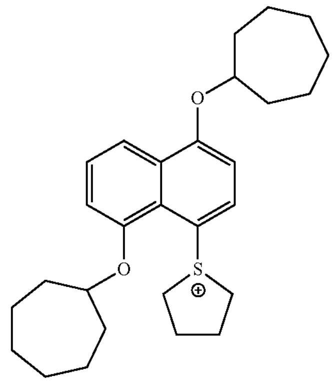
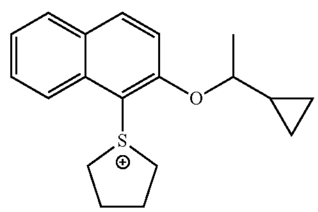
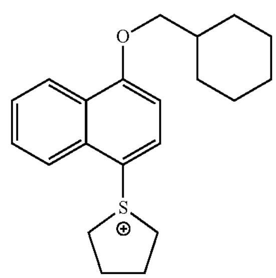
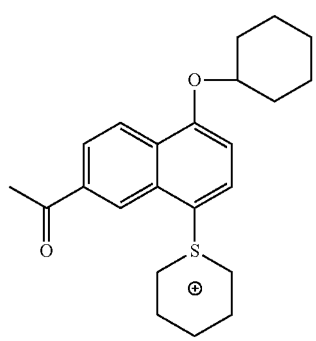

-continued
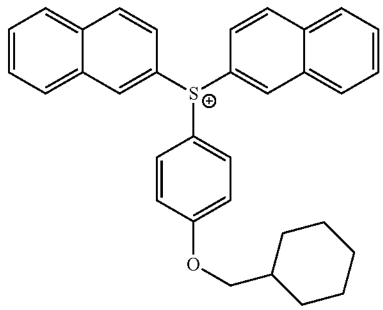
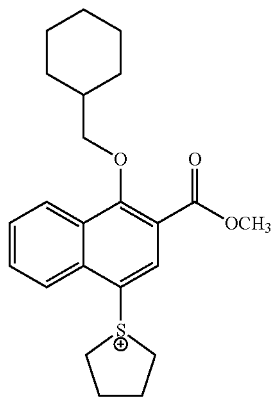
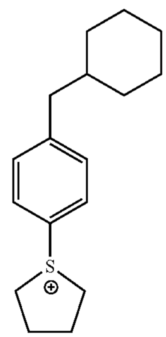
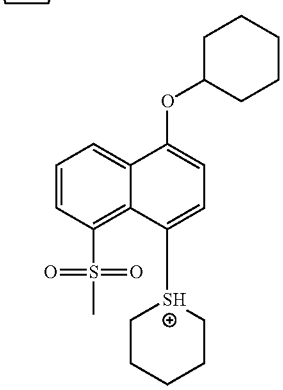
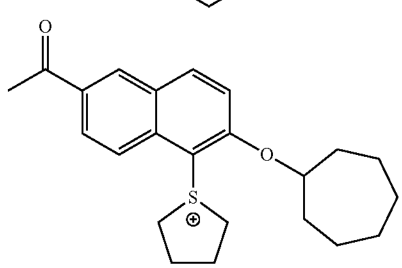
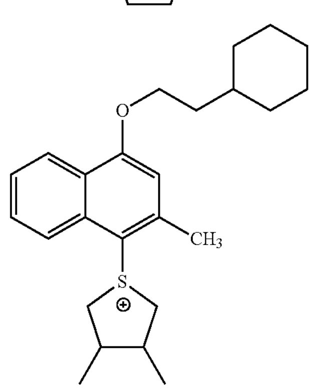
-continued
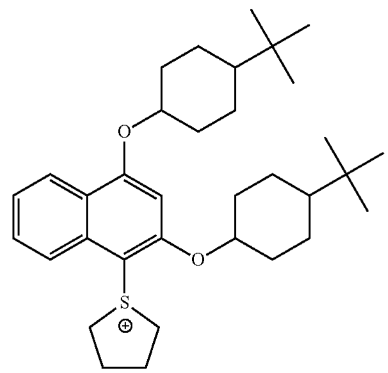
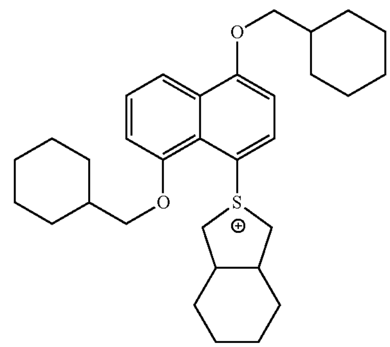
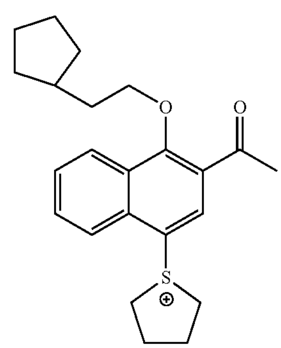
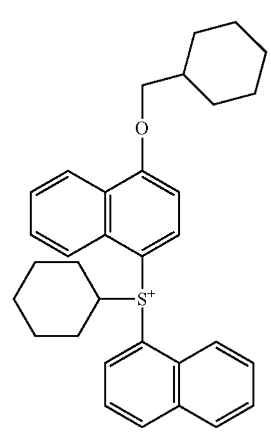
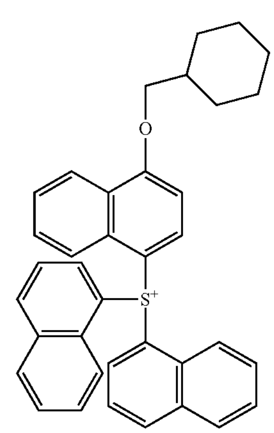

-continued

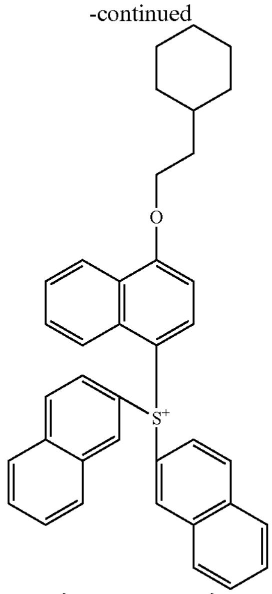

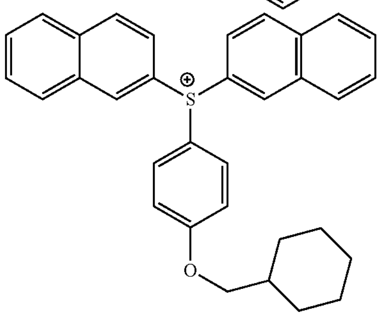

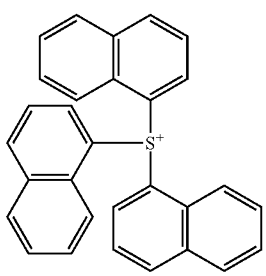

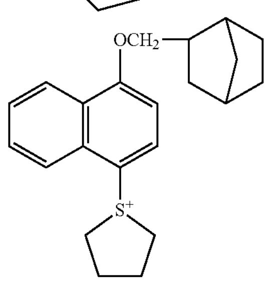

Now, general formulae (ZII) and (ZIII) will be described.

In general formulae (ZII) and (ZIII), each of $R_{204}$ to $R_{207}$ independently represents an aryl group, an alkyl group or a cycloalkyl group.

The aryl group represented by each of $R_{204}$ to $R_{207}$ is preferably a phenyl group or a naphthyl group, more preferably a phenyl group. The aryl group may be one having a heterocyclic structure containing an oxygen atom, nitrogen atom, sulfur atom, etc. As the aryl group having a heterocyclic structure, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), and a benzothiophene residue (group formed by loss of one hydrogen atom from benzothiophene) can be exemplified.

As preferred alkyl groups and cycloalkyl groups represented by $R_{204}$ to $R_{207}$, a linear or branched alkyl group having 1 to 10 carbon atoms and a cycloalkyl group having 3 to 10 carbon atoms can be exemplified. As the alkyl group, for example, a methyl group, an ethyl group, a propyl group, a butyl group and a pentyl group can be exemplified. As the cycloalkyl group, for example, a cyclopentyl group, a cyclohexyl group and a norbornyl group can be exemplified.

The aryl group, alkyl group and cycloalkyl group represented by $R_{204}$ to $R_{207}$ may have one or more substituents. As a possible substituent on the aryl group, alkyl group and cycloalkyl group represented by $R_{204}$ to $R_{207}$, an alkyl group (having, for example, 1 to 15 carbon atoms), a cycloalkyl group (having, for example, 3 to 15 carbon atoms), an aryl group (having, for example, 6 to 15 carbon atoms), an alkoxy group (having, for example, 1 to 15 carbon atoms), a halogen atom, a hydroxy group, and a phenylthio group can be exemplified.

$Z^-$ represents a nonnucleophilic anion. As such, the same nonnucleophilic anions as mentioned with respect to the $Z^-$ in the general formula (ZI) can be exemplified.

As the acid generators, the compounds represented by the following general formulae (ZIV), (ZV) and (ZVI) can further be exemplified.

$$Ar_3—SO_2—SO_2—Ar_4 \quad \text{ZIV}$$

ZV

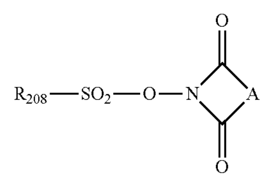

ZVI

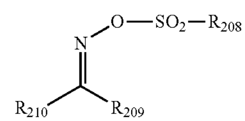

In the general formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Among the acid generators, the compounds represented by the general formulae (ZI) to (ZIII) are more preferred.

As a preferred acid generator, a compound that generates an acid having one sulfonate group or imido group. As a more preferred acid generator, a compound that generates a monovalent perfluoroalkanesulfonic acid, a compound that generates a monovalent aromatic sulfonic acid substituted with one or more fluorine atoms or fluorine-atom-containing group, and a compound that generates a monovalent imidic acid substituted with one or more fluorine atoms or fluorine-atom-containing group can be exemplified. As a still more preferred acid generator, any of sulfonium salts of fluorinated alkanesulfonic acid, fluorinated benzenesulfonic acid, fluorinated imidic acid and fluorinated methide acid can be exemplified. As acid generators, it is especially preferred for the generated acid to be a fluorinated alkanesulfonic acid, fluorinated benzenesulfonic acid or fluorinated imidic acid, each of which having pKa's of −1 or below in order to improve the sensitivity.

Especially preferred examples of the acid generators will be shown below.

(b1)
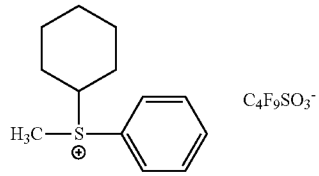
(b2)
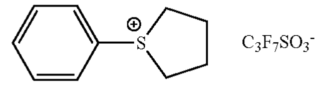
(b3)
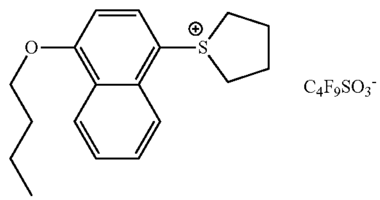
(b4)
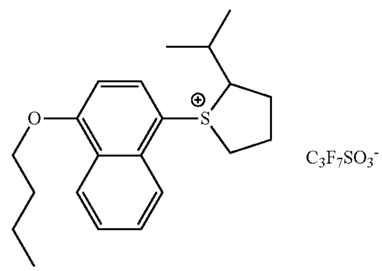
(b5)
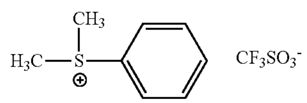
(b6)
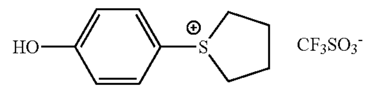
(b7)
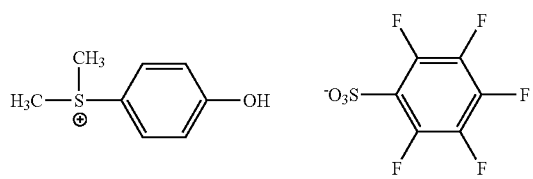
(b8)
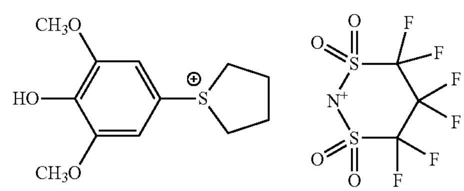
(b9)
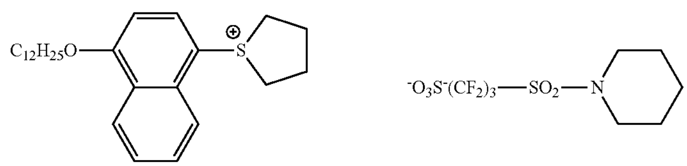
(b10)
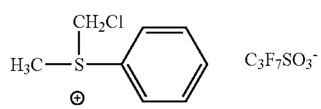
(b11)
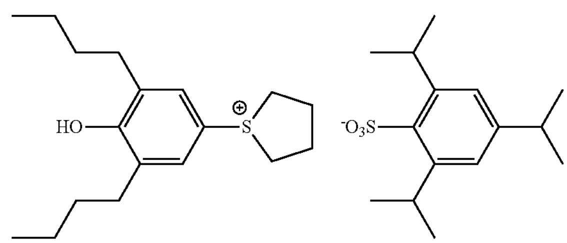
(b12)
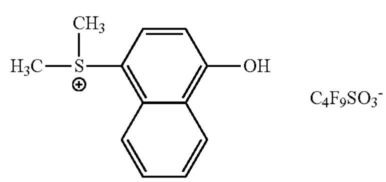
(b14)
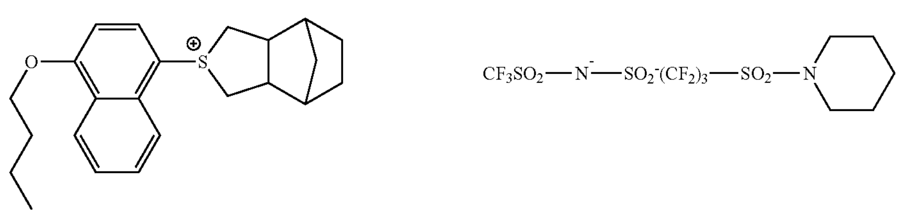

-continued
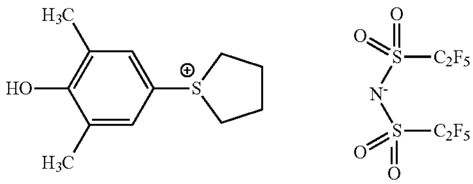
(b15)
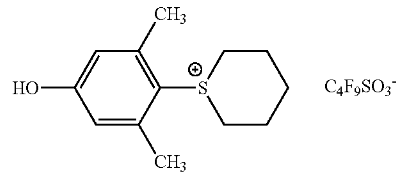
(b16)
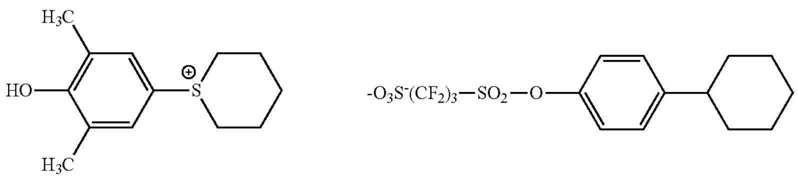
(b17)
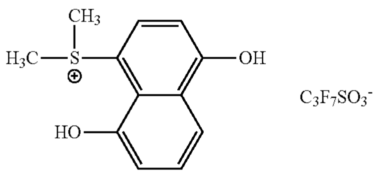
(b18)
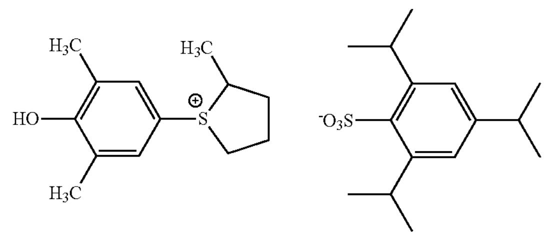
(b19)
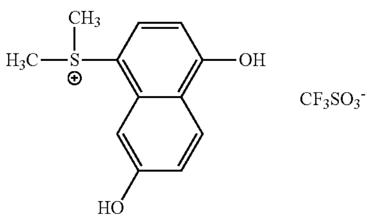
(b20)
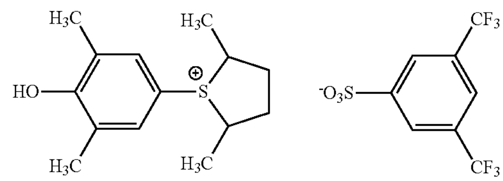
(b21)
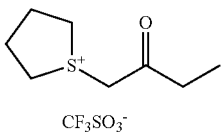
(b23)
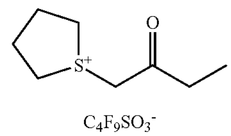
(b24)
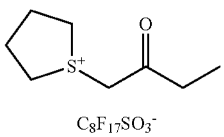
(b25)
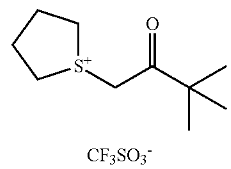
(b26)
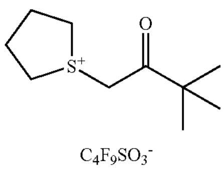
(b27)
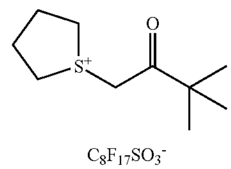
(b28)
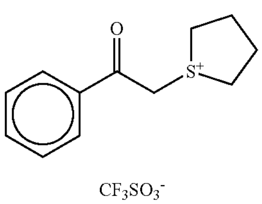
(b29)
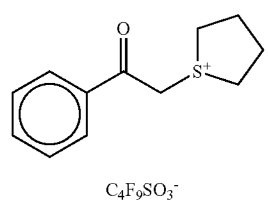
(b30)

-continued
(b31)
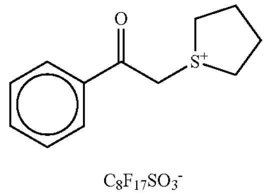
(b32)
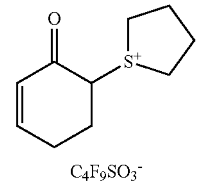
(b33)
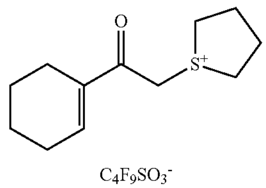
(b34)
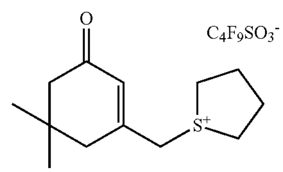
(z1)
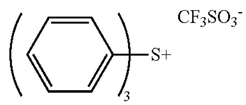
(z2)
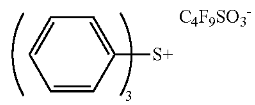
(z3)
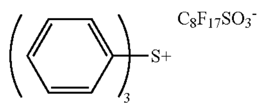
(z4)
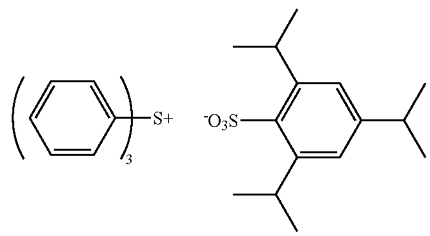
(z5)
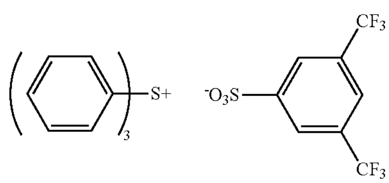
(z6)
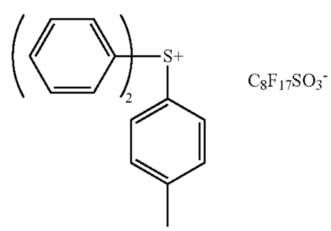
(z7)
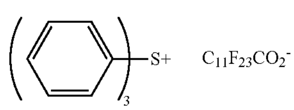
(z8)
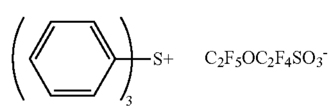
(z9)
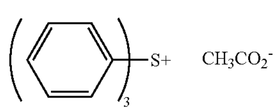
(z10)
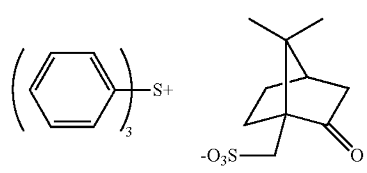
(z11)
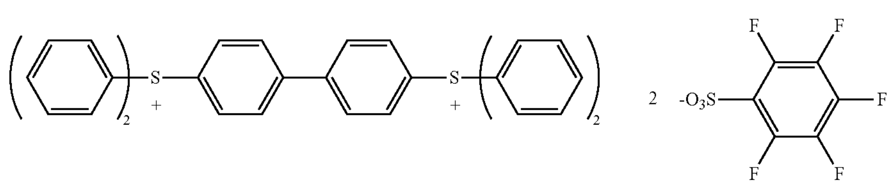
(z12)
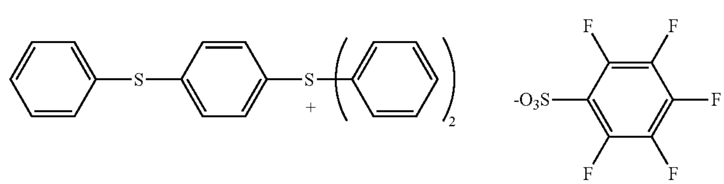

-continued
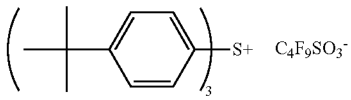
(z13)
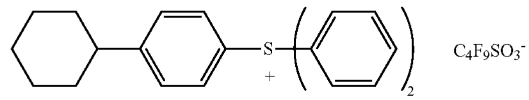
(z14)
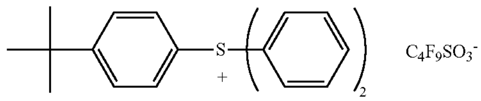
(z15)
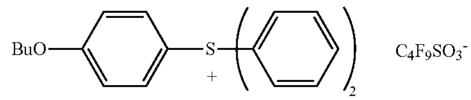
(z16)
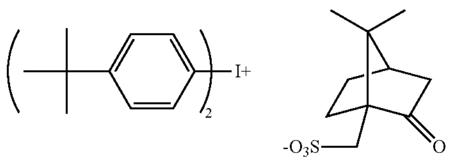
(z17)
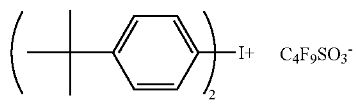
(z18)
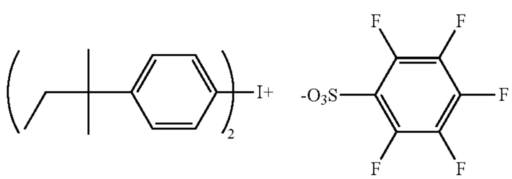
(z19)
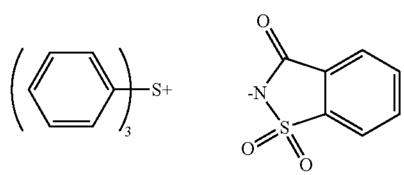
(z20)
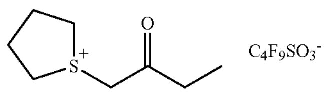
(z21)
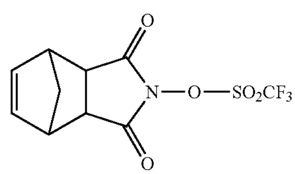
(z23)
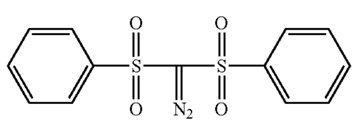
(z24)
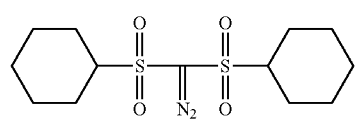
(z25)
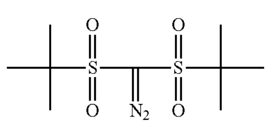
(z26)
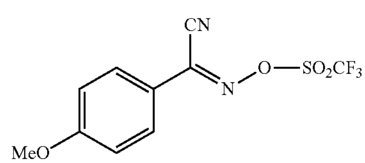
(z27)
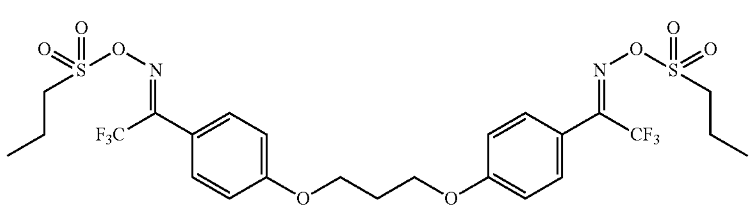
(z28)
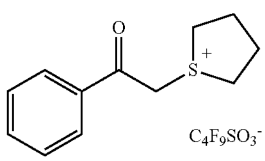
(z29)
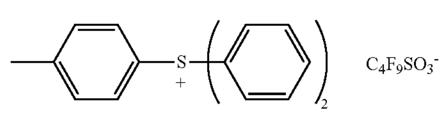
(z30)

-continued
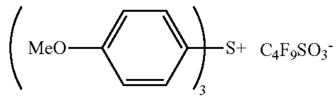
(z31)
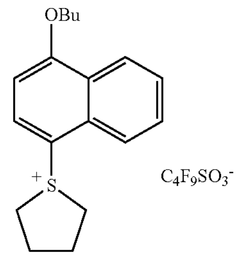
(z32)
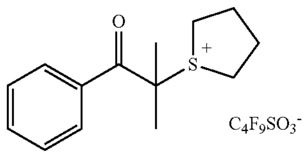
(z33)
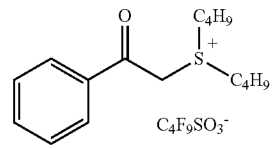
(z34)
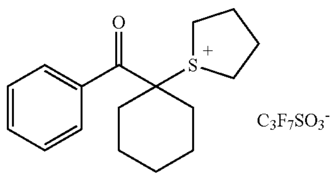
(z35)
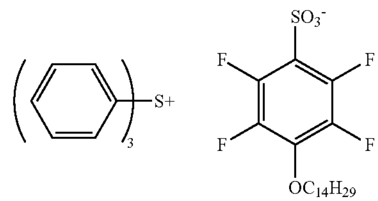
(z36)
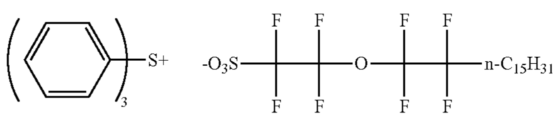
(z37)
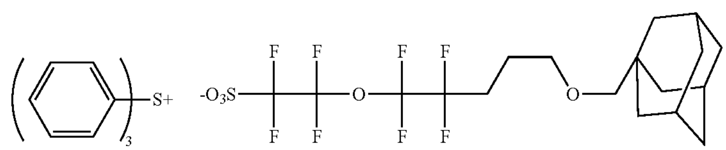
(z38)
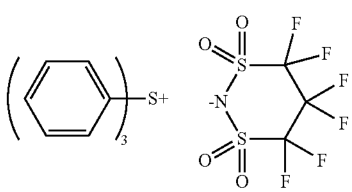
(z39)
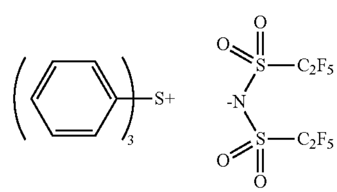
(z40)
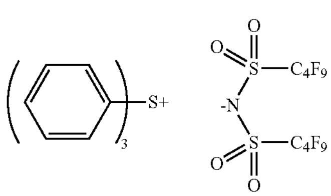
(z41)
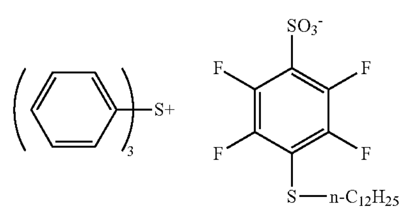
(z42)
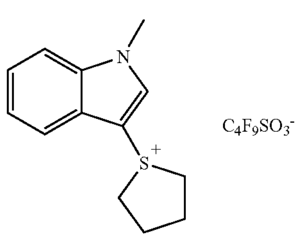
(z43)
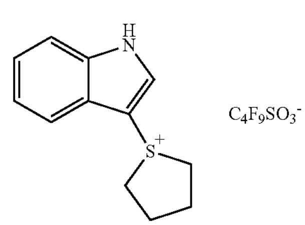
(z44)

-continued
(z45)
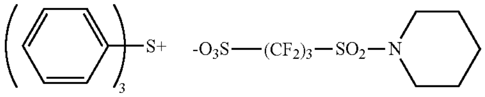
(z46)
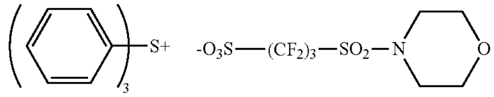
(z47)
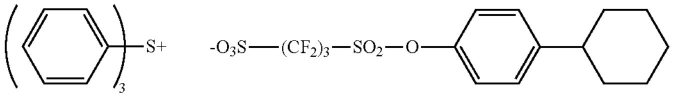
(z48)
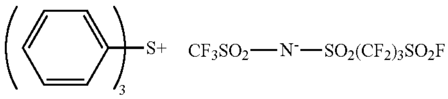
(z49)
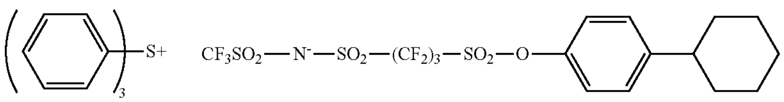
(z50)
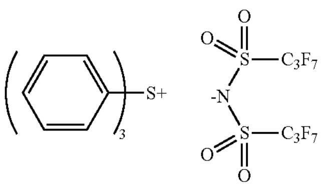
(z51)
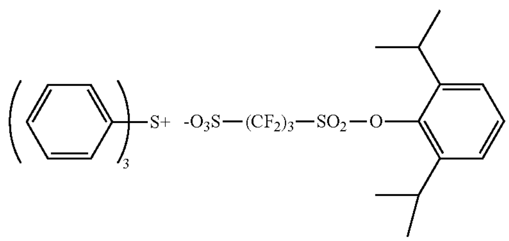
(z52)
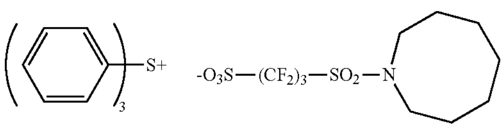
(z53)
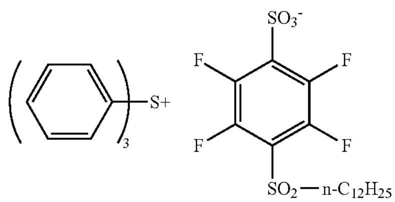
(z54)
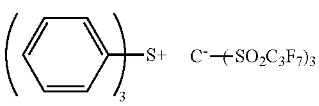
(z55)
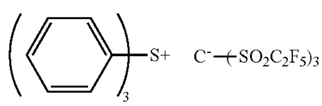
(z56)
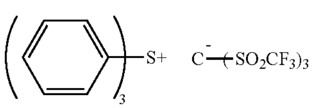
(z57)
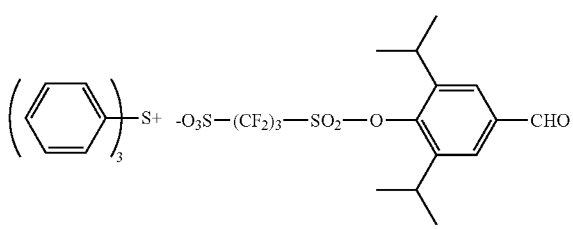
(z58)
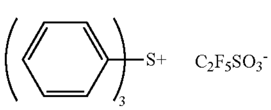
(z59)
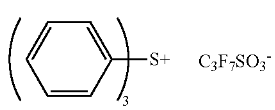
(z60)
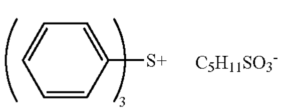
(z61)
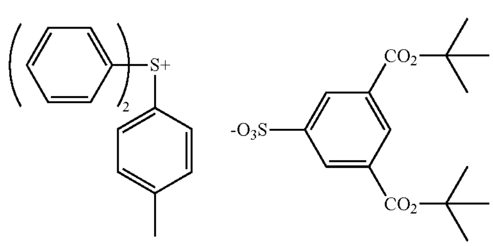

-continued (z62)

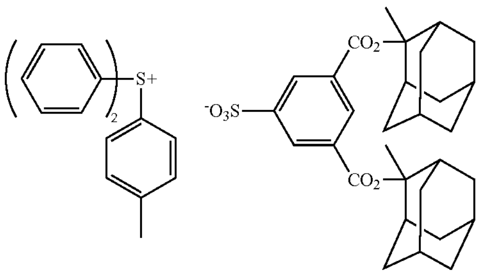

(z63)

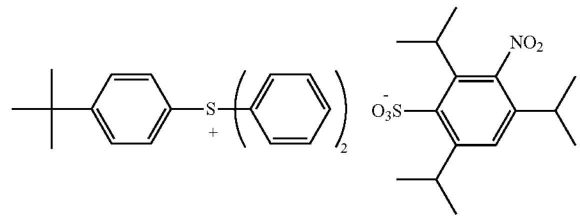

(z64)

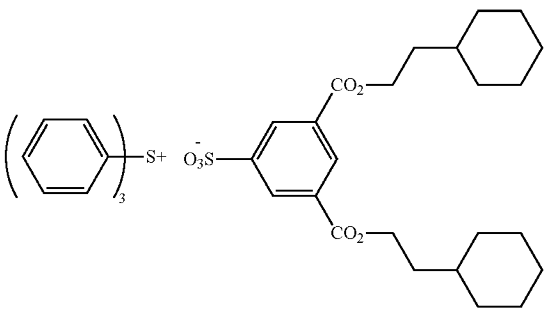

(z65)

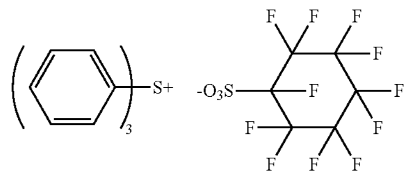

(z66)

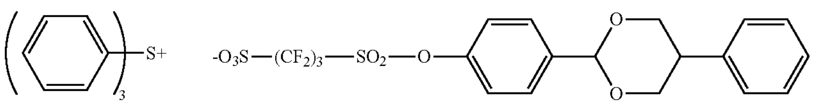

(z67)

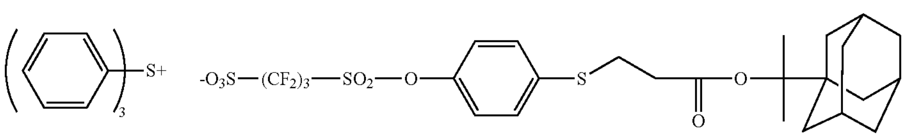

(z68)

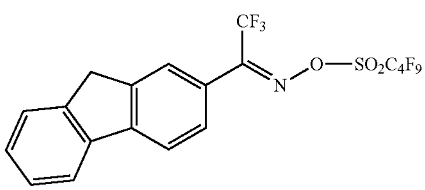

(z69)

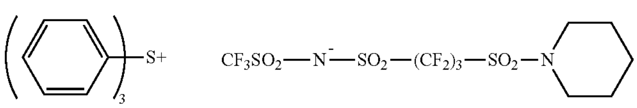

(z70)

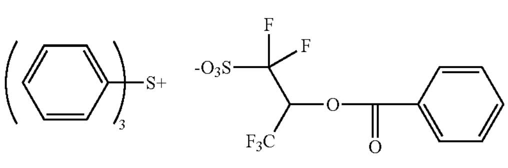

The acid generators can be used either individually or in combination of two or more kinds.

When the composition of the present invention contains an acid generator, the content thereof based on the total solids of the composition is preferably in the range of 0.1 to 30 mass %, more preferably 0.5 to 25 mass %, further more preferably 3 to 20 mass %, and particularly preferably 3 to 15 mass %.

When the acid generator is represented by the general formulae (ZI-3) or (ZI-4), the content thereof based on the total solids of the composition is preferably in the range of 5 to 20 mass %, more preferably 8 to 20 mass %, further more preferably 10 to 20 mass %, and particularly preferably 10 to 15 mass %.

(C) Hydrophobic Resin

The composition employable for the pattern forming method according to the present invention contains a hydrophobic resin. When a hydrophobic resin is contained, the hydrophobic resin is unevenly localized in the surface layer of the film of the actinic-ray- or radiation-sensitive resin. Thus, when water is used as a liquid immersion medium, there can be increased the receding contact angle of the film with reference to the immersion liquid. Accordingly, the immersion liquid tracking property of the film can be enhanced.

The receding contact angle of the film after bake but before exposure is preferably in the range of 60° to 90°, more preferably 65° or greater, further more preferably 70° or greater and most preferably 75° or greater at 23±3° C. in a humidity of 45±5%.

Although the hydrophobic resin is unevenly localized on the interface as aforementioned, differing from the surfactant, the hydrophobic resin does not necessarily have to have a hydrophilic group in its molecule and does not need to contribute toward uniform mixing of polar/nonpolar substances.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the film in dynamic condition is important, and it is required for the actinic-ray- or radiation-sensitive resin composition to be capable of tracking the high-speed scanning of the exposure head without leaving any droplets.

It is preferred for the hydrophobic resin (HR) to be a resin containing at least either a fluorine atom or a silicon atom. In the hydrophobic resin (HR), the fluorine atom or silicon atom may be introduced in the principal chain of the resin or in the side chain thereof as a substituent. When the hydrophobic resin contains at least either a fluorine atom or a silicon atom, the hydrophobicity (water tracking property) of the film surface is increased, thereby attaining a reduction of development residue (scum).

The hydrophobic resin (HR) is preferably a resin having an alkyl group containing a fluorine atom, a cycloalkyl group containing a fluorine atom or an aryl group containing a fluorine atom as a partial structure containing a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a cycloalkyl group of a single ring or multiple rings having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing a fluorine atom, cycloalkyl groups containing a fluorine atom and aryl groups containing a fluorine atom, there can be mentioned groups of the following general formulae (F2) to (F4), which however in no way limit the scope of the present invention.

(F2)

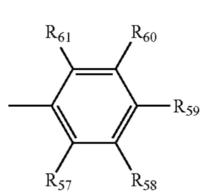

-continued (F3)

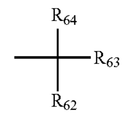

(F4)

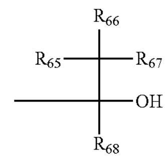

In the general formulae (F2) to (F4), each of $R_{57}$ to $R_{68}$ independently represents a hydrogen atom, a fluorine atom or an alkyl group, provided that at least one of each of $R_{57}$-$R_{61}$, $R_{62}$-$R_{64}$ and $R_{65}$-$R^{68}$ represents a fluorine atom or an alkyl group (preferably having 1 to 4 carbon atoms) having at least one hydrogen atom thereof substituted with a fluorine atom. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group (especially having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded with each other to thereby form a ring.

Specific examples of the groups of the general formula (F2) include a p-fluorophenyl group, a pentafluorophenyl group, a 3,5-di(trifluoromethyl)phenyl group and the like.

Specific examples of the groups of the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of the general formula (F4) include —$C(CF_3)_2OH$, —$C(C_2F_5)_2OH$, —$C(CF_3)(CF_3)OH$, —$CH(CF_3)OH$ and the like. —$C(CF_3)_2OH$ is preferred.

As preferred repeating units having a fluorine atom, there can be mentioned the repeating units represented by the general formulae below.

(C-Ia)

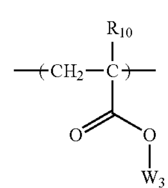

-continued (C-1b)

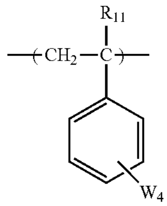

(C-1c)

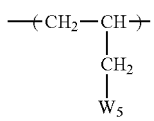

(C-Id)

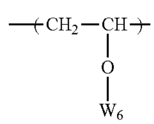

In the formulae, each of $R_{10}$ and $R_{11}$ independently represents a hydrogen atom, a fluorine atom or an alkyl group (preferably a linear or branched alkyl group having 1 to 4 carbon atoms; as a substituted alkyl group, there can be mentioned, in particular, a fluorinated alkyl group).

Each of $W_3$ to $W_6$ independently represents an organic group containing at least one fluorine atom. As such, for example, there can be mentioned the groups of general formulae (F2) to (F4) above.

Further, besides these, the following units may be introduced as the repeating unit containing a fluorine atom.

(C-II)

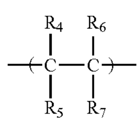

(C-III)

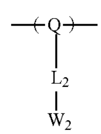

In the formulae, each of $R_4$ to $R_7$ independently represents a hydrogen atom, a fluorine atom or an alkyl group (preferably a linear or branched alkyl group having 1 to 4 carbon atoms; as a substituted alkyl group, there can be mentioned, in particular, a fluorinated alkyl group), provided that at least one of $R_4$ to $R_7$ represents a fluorine atom. $R_4$ and $R_5$, or $R_6$ and $R_7$ may cooperate with each other to thereby form a ring.

$W_2$ represents an organic group containing at least one fluorine atom. As such, for example, there can be mentioned the atomic groups of general formulae (F2) to (F4) above.

Q represents an alicyclic structure. The alicyclic structure may have a substituent, and may be monocyclic or polycyclic. The alicyclic structure when being polycyclic may be a bridged one. The alicyclic structure when being monocyclic is preferably a cycloalkyl group having 3 to 8 carbon atoms. As such, there can be mentioned, for example, a cyclopentyl group, a cyclohexyl group, a cyclobutyl group, a cyclooctyl group or the like. As the polycyclic one, there can be mentioned a group with, for example, a bicyclo, tricyclo or tetracyclo structure having 5 or more carbon atoms. A cycloalkyl group having 6 to 20 carbon atoms is preferred. As such, there can be mentioned, for example, an adamantyl group, a norbornyl group, a dicyclopentyl group, a tricyclodecanyl group, a tetracyclododecyl group or the like. The carbon atoms of the cycloalkyl group may be partially replaced with a heteroatom, such as an oxygen atom.

$L_2$ represents a single bond or a bivalent connecting group. As the bivalent connecting group, there can be mentioned a substituted or unsubstituted arylene group, a substituted or unsubstituted alkylene group, a substituted or unsubstituted cycloalkylene group, —O—, —$SO_2$—, —CO—, —N(R)— (in the formula, R is a hydrogen atom or an alkyl group), —$NHSO_2$— or a bivalent connecting group consisting of a combination of two or more of these.

The hydrophobic resin (HR) may contain a silicon atom. It is preferred for the resin to have an alkylsilyl structure (preferably a trialkylsilyl group) or a cyclosiloxane structure as a partial structure having a silicon atom.

As the alkylsilyl structure or cyclosiloxane structure, there can be mentioned, for example, any of the groups of the following general formulae (CS-1) to (CS-3) or the like.

(CS-1)

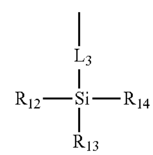

(CS-2)

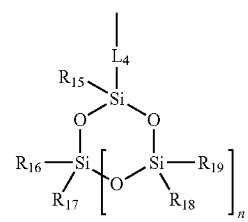

(CS-3)

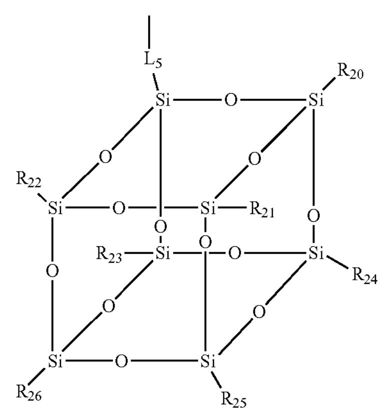

In general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group.

In the formulae, n is an integer of 1 to 5. n is preferably an integer of 2 to 4.
Particular examples of the repeating units containing a fluorine atom or silicon atom will be shown below. In particular examples, $X_1$ represents a hydrogen atom, —$CH_3$, —F or —$CF_3$, and $X_2$ represents —F or —$CF_3$.
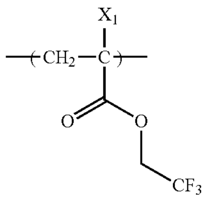
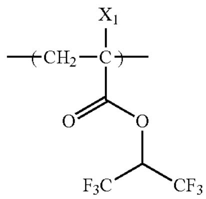
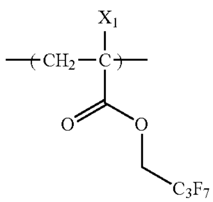
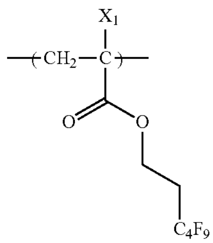
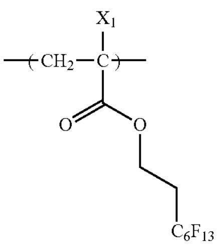
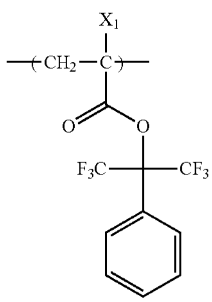
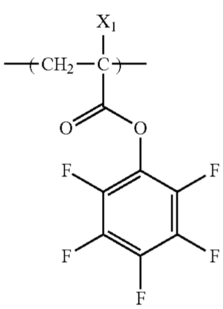
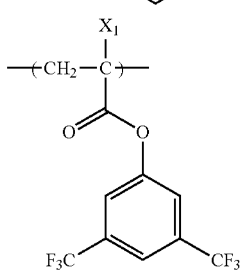
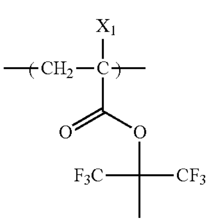
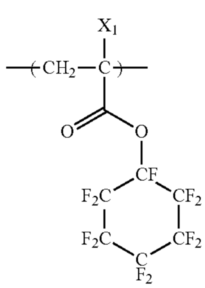
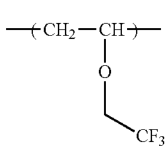
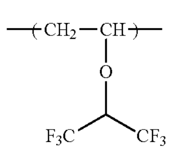
-continued
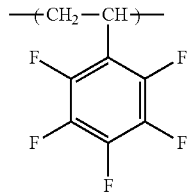
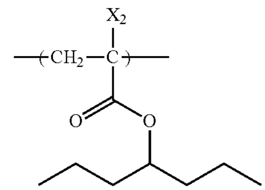
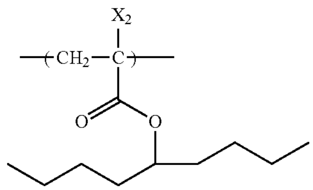
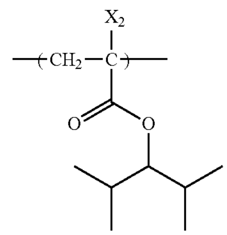
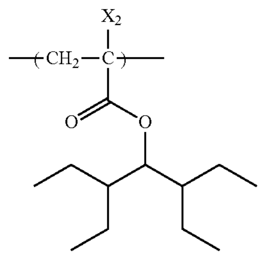
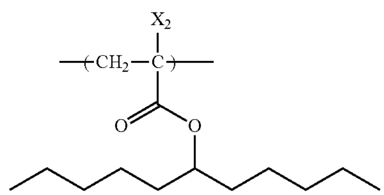
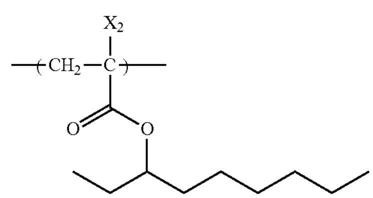
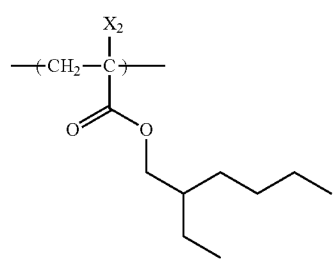
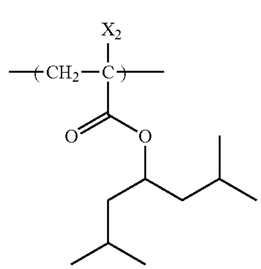

-continued
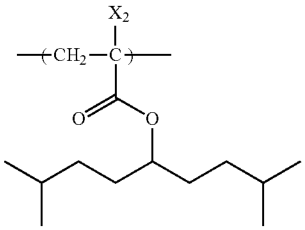
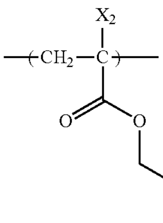
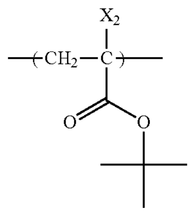
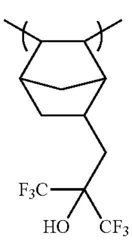
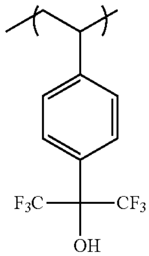
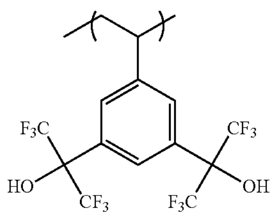
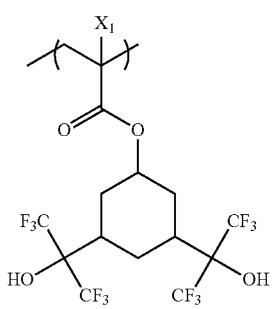
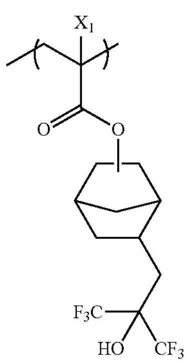
-continued
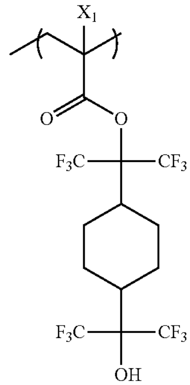
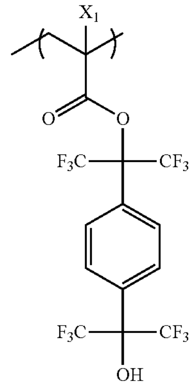
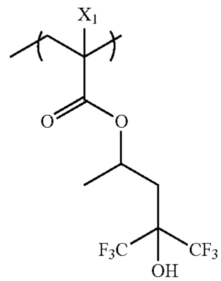
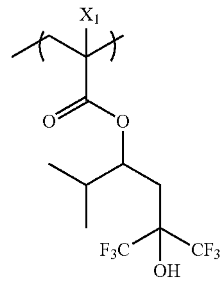
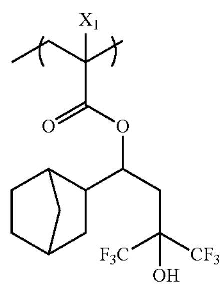
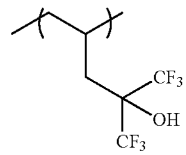
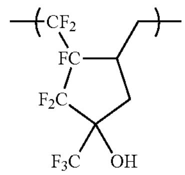
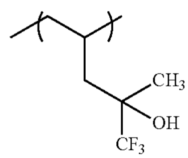
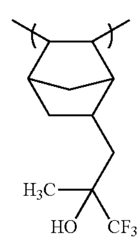
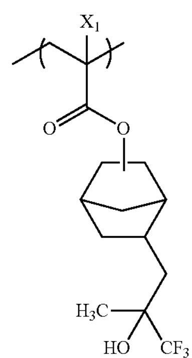
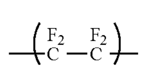
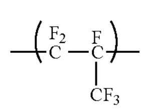
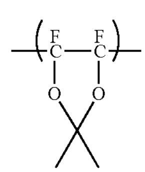

-continued
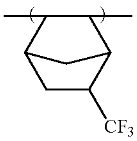
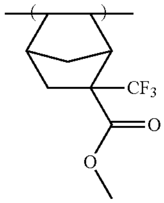
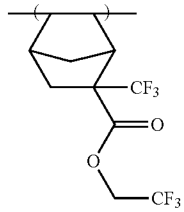
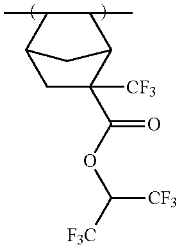
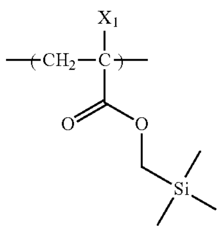
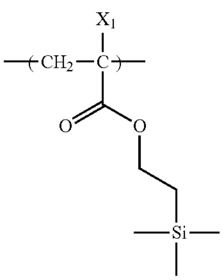
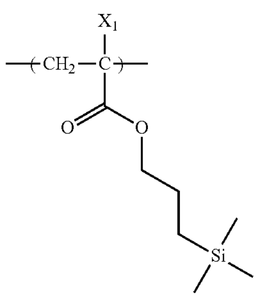
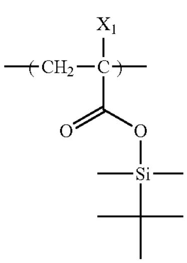
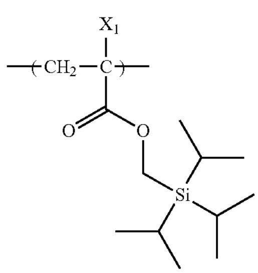
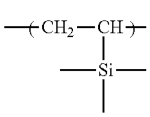
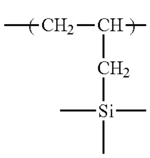
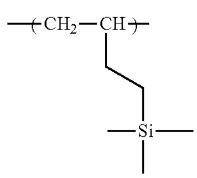
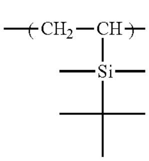
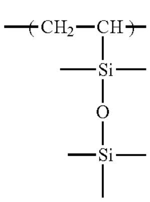
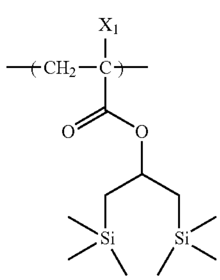
-continued
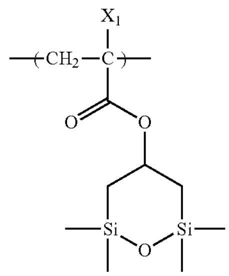
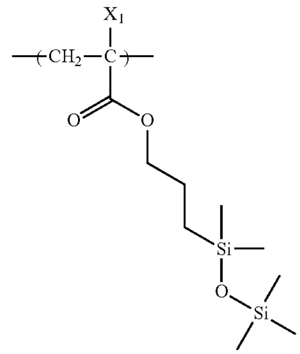
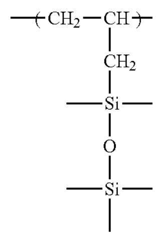
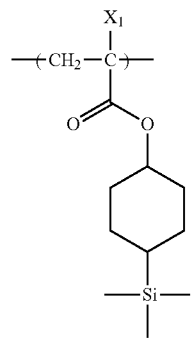
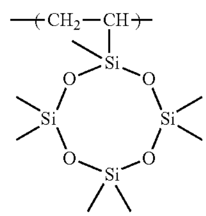
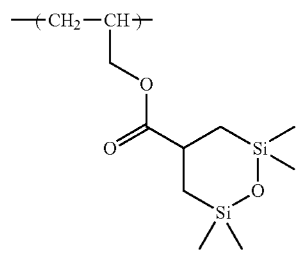
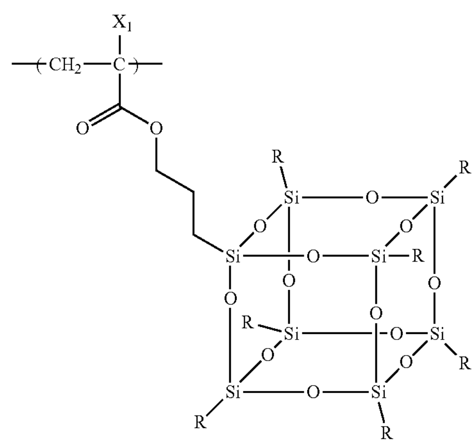
R = $CH_3$, $C_2H_5$, $C_2H_7$, $C_4H_9$
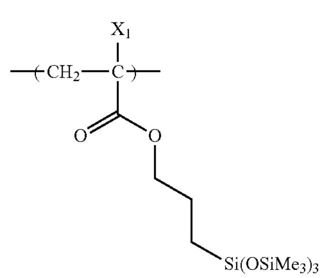

Moreover, the hydrophobic resin (HR) may have at least one group selected from among the following groups (x) to (z):

(x) an alkali soluble group, (y) a group that is decomposed by the action of an alkali developer, resulting in an increase of solubility in the alkali developer, and (z) a group that is decomposed by the action of an acid.

As the alkali soluble group (x), there can be mentioned a phenolic hydroxyl group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali soluble groups, there can be mentioned a fluoroalcohol group (preferably hexafluoroisopropanol), a sulfonimido group and a bis(carbonyl)methylene group.

As the repeating unit having an alkali soluble group (x), preferred use is made of any of a repeating unit resulting from direct bonding of an alkali soluble group to the principal chain of a resin like a repeating unit of acrylic acid or methacrylic acid, a repeating unit resulting from bonding, via a connecting group, of an alkali soluble group to the principal chain of a resin and a repeating unit resulting from polymerization with the use of a chain transfer agent or polymerization initiator having an alkali soluble group to thereby introduce the same in a polymer chain terminal.

The content ratio of repeating units having an alkali soluble group (x) is preferably in the range of 1 to 50 mol %, more preferably 3 to 35 mol % and still more preferably 5 to 20 mol % based on all the repeating units of the hydrophobic resin.

Specific examples of the repeating units having an alkali soluble group (x) will be shown below.

In the formulae, Rx represents H, $CH_3$, $CH_2OH$ or $CF_3$.

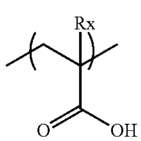

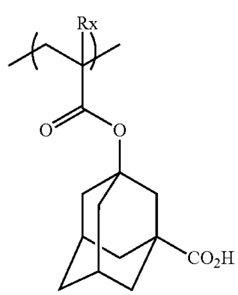

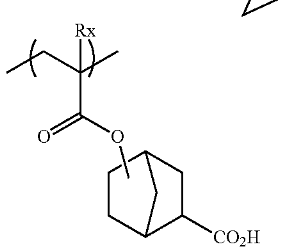

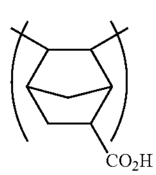

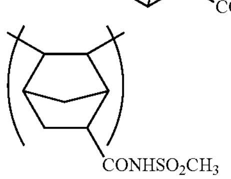

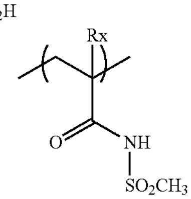

-continued

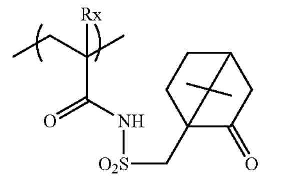

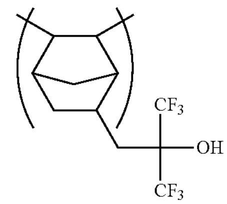

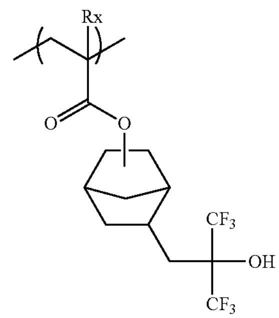

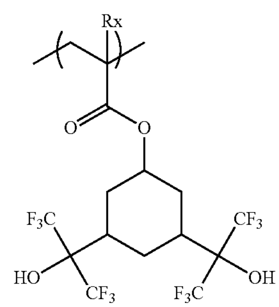

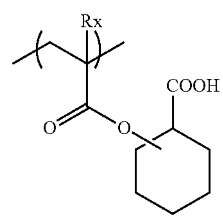

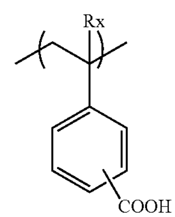

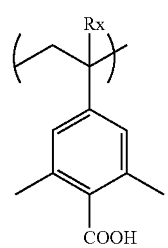

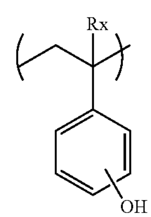

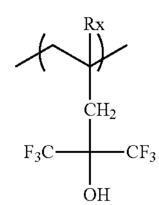

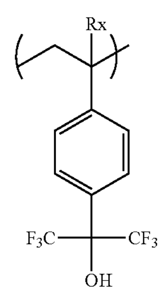

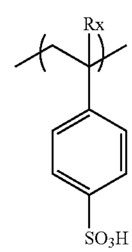

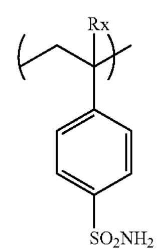

-continued

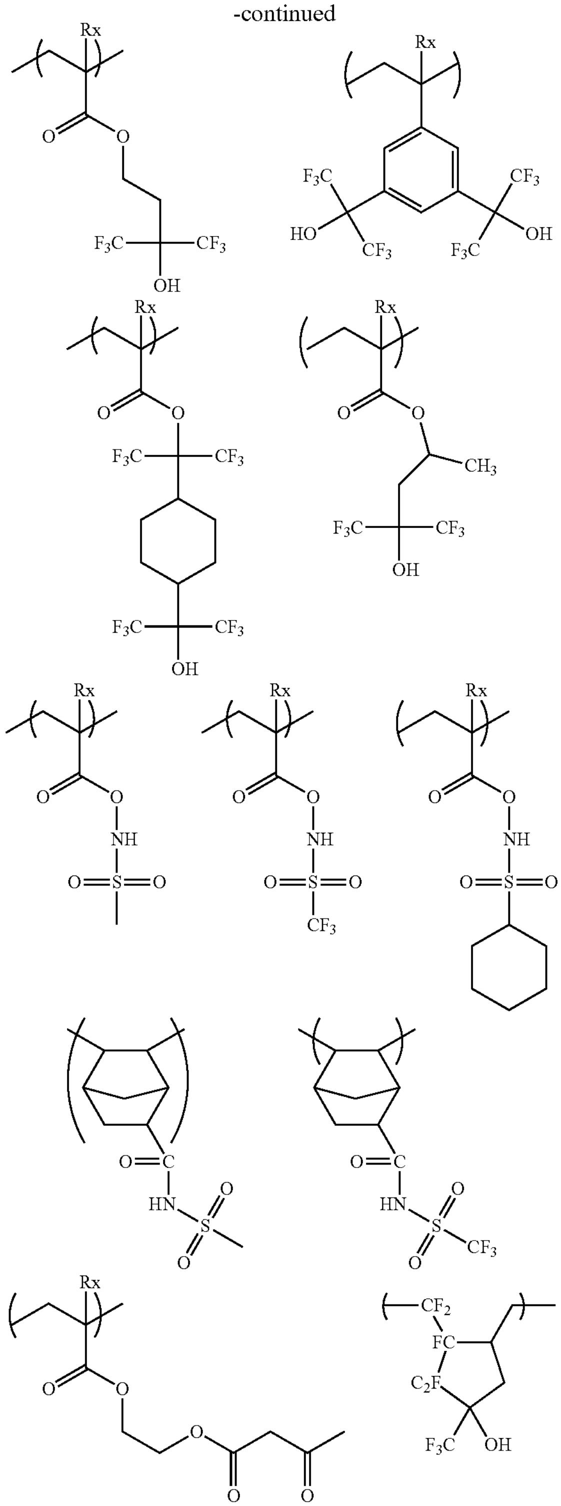

As the group (y) that is decomposed by the action of an alkali developer, resulting in an increase of solubility in the alkali developer, there can be mentioned, for example, a group having a lactone structure, an acid anhydride group, an acid imide group or the like. A group having a lactone structure is preferred.

As the repeating unit having a group (y) that is decomposed by the action of an alkali developer, resulting in an increase of solubility in the alkali developer, preferred use is made of both of a repeating unit resulting from bonding of a group (y) that is decomposed by the action of an alkali developer, resulting in an increase of solubility in the alkali developer, to the principal chain of a resin such as a repeating unit of acrylic ester or methacrylic ester, and a repeating unit resulting from polymerization with the use of a chain transfer agent or polymerization initiator having a group (y) resulting in an increase of solubility in an alkali developer to thereby introduce the same in a polymer chain terminal.

The content ratio of repeating units having a group (y) resulting in an increase of solubility in an alkali developer is preferably in the range of 1 to 40 mol %, more preferably 3 to 30 mol % and still more preferably 5 to 15 mol % based on all the repeating units of the hydrophobic resin.

As specific examples of the repeating units having a group (y) resulting in an increase of solubility in an alkali developer, there can be mentioned those similar to the repeating units having a lactone structure set forth with respect to the above-mentioned acid-decomposable resin such as the ones shown as specific examples of the general formulae (1) or (AII').

As the repeating unit having a group (z) that is decomposed by the action of an acid in the hydrophobic resin (HR), there can be mentioned those similar to the repeating units having an acid decomposable group set forth with respect to above-mentioned acid-decomposable resin.

The content ratio of repeating units having a group (z) that is decomposed by the action of an acid in the hydrophobic resin (HR) is preferably in the range of 1 to 80 mol %, more preferably 10 to 80 mol % and still more preferably 20 to 60 mol % based on all the repeating units of the hydrophobic resin.

The hydrophobic resin (HR) may further have any of the repeating units of general formula (VI) below.

(VI)

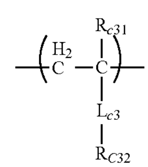

In general formula (VI), $R_{c31}$ represents a hydrogen atom, an alkyl group, an alkyl group substituted with a fluorine atom, a cyano group or —$CH_2$—O—$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, especially preferably a hydrogen atom or a methyl group.

$R_{c32}$ represents a group having any of an alkyl group, a cycloalkyl group, an alkenyl group, a cycloalkenyl group and an aryl group. These groups may optionally be substituted with a fluorine atom or a silicon atom.

$L_{c3}$ represents a single bond or a bivalent connecting group.

In general formula (VI), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms. The aryl group is preferably an aryl group having 6 to 20 carbon atoms. As such, there can be mentioned a phenyl group or a naphthyl group.

Each of these groups may have a substituent.

Preferably, $R_{c32}$ represents an unsubstituted alkyl group or an alkyl group substituted with a fluorine atom.

The bivalent connecting group represented by $L_{c3}$ is preferably an alkylene group (preferably having 1 to 5 carbon atoms), an oxy group, a phenylene group or an ester bond (group of the formula —COO—).

The repeating units of general formula (VI) may be those of general formula (VII) or (VIII) below.

(VII)

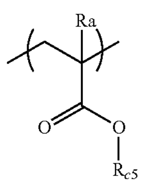

(VIII)

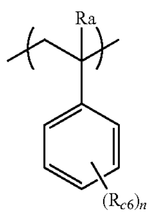

In general formula (VII), $R_{c5}$ represents a hydrocarbon group having at least one cyclic structure in which neither a hydroxyl group nor a cyano group is contained.

Ra represents a hydrogen atom, an alkyl group that may be substituted with a fluorine atom, a cyano group or a group of the formula $—CH_2—O—Rac_2$ in which $Rac_2$ represents a hydrogen atom, an alkyl group or an acyl group. Ra is preferably a hydrogen atom, a methyl group, a hydroxymethyl group and a trifluoromethyl group, especially preferably a hydrogen atom and a methyl group.

The cyclic structures contained in $R_{c5}$ include a monocyclic hydrocarbon group and a polycyclic hydrocarbon group. As the monocyclic hydrocarbon group, there can be mentioned, for example, a cycloalkyl group having 3 to 12 carbon atoms or a cycloalkenyl group having 3 to 12 carbon atoms. Preferably, the monocyclic hydrocarbon group is a monocyclic hydrocarbon group having 3 to 7 carbon atoms.

The polycyclic hydrocarbon groups include ring-assembly hydrocarbon groups and crosslinked-ring hydrocarbon groups. As the crosslinked-ring hydrocarbon rings, there can be mentioned, for example, bicyclic hydrocarbon rings, tricyclic hydrocarbon rings and tetracyclic hydrocarbon rings. Further, the crosslinked-ring hydrocarbon rings include condensed-ring hydrocarbon rings, for example, condensed rings resulting from condensation of multiple 5- to 8-membered cycloalkane rings. As preferred crosslinked-ring hydrocarbon rings, there can be mentioned, for example, a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

In general formula (VIII), $R_{c6}$ represents an alkyl group, a cycloalkyl group, an alkenyl group, a cycloalkenyl group, an alkoxycarbonyl group or an alkylcarbonyloxy group. These groups may be substituted with a fluorine atom or a silicon atom.

The alkyl group represented by $R_{c6}$ is preferably a linear or branched alkyl group having 1 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The alkoxycarbonyl group is preferably an alkoxycarbonyl group having 2 to 20 carbon atoms.

The alkylcarbonyloxy group is preferably an alkylcarbonyloxy group having 2 to 20 carbon atoms.

In the formula, n is an integer of 0 to 5. When n is 2 or greater, the plurality of $R_{c6}$s may be identical to or different from each other.

It is preferred for $R_{c6}$ to represent an unsubstituted alkyl group or an alkyl group substituted with a fluorine atom. A trifluoromethyl group and a t-butyl group are especially preferred.

Further, the hydrophobic resin (HR) may preferably have any of the repeating units of general formula (CII-AB) below.

(CII-AB)

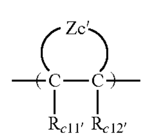

In general formula (CII-AB), each of $R_{c11'}$ and $R_{c12'}$ independently represents a hydrogen atom, a cyano group, a halogen atom or an alkyl group.

Zc' represents an atomic group for forming an alicyclic structure which contains two bonded carbon atoms (C—C).

Further preferably, general formula (CII-AB) is either general formula (CII-AB1) or general formula (CII-AB2) below.

CII-AB1

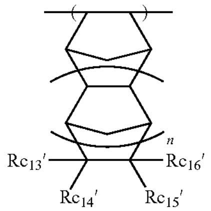

CII-AB2

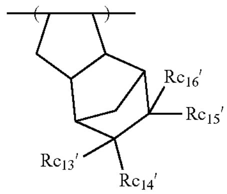

In general formulae (CII-ABM) and (CII-AB2), each of $Rc_{13}$' to $Rc_{16}$' independently represents a hydrogen atom, a halogen atom, an alkyl group or a cycloalkyl group.

At least two of $Rc_{13}$' to $Rc_{16}$' may be bonded to each other to thereby form a ring.

n is 0 or 1.

Specific examples of repeating units of general formulae (VI) and (CII-AB) will be shown below, which however in no way limit the scope of the present invention. In the formulae, Ra represents H, $CH_3$, $CH_2OH$, $CF_3$ or CN.

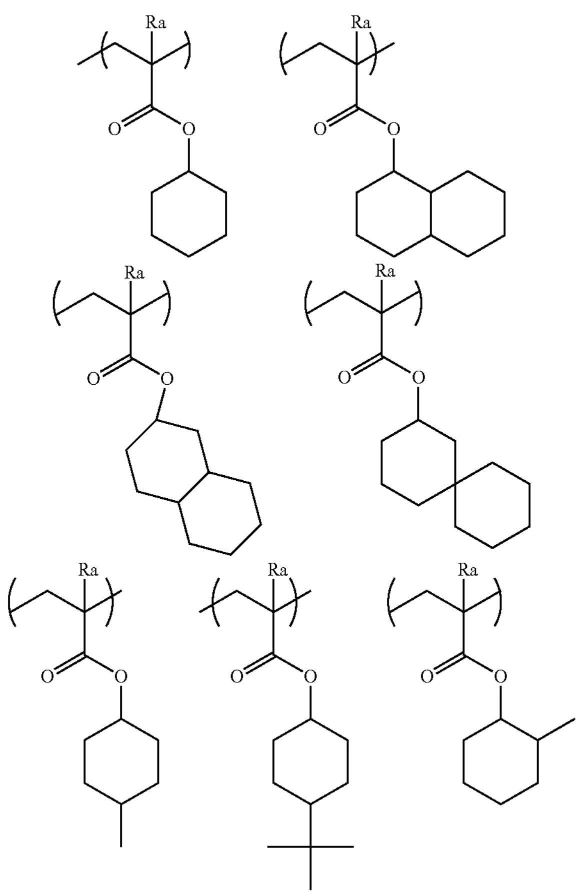

-continued

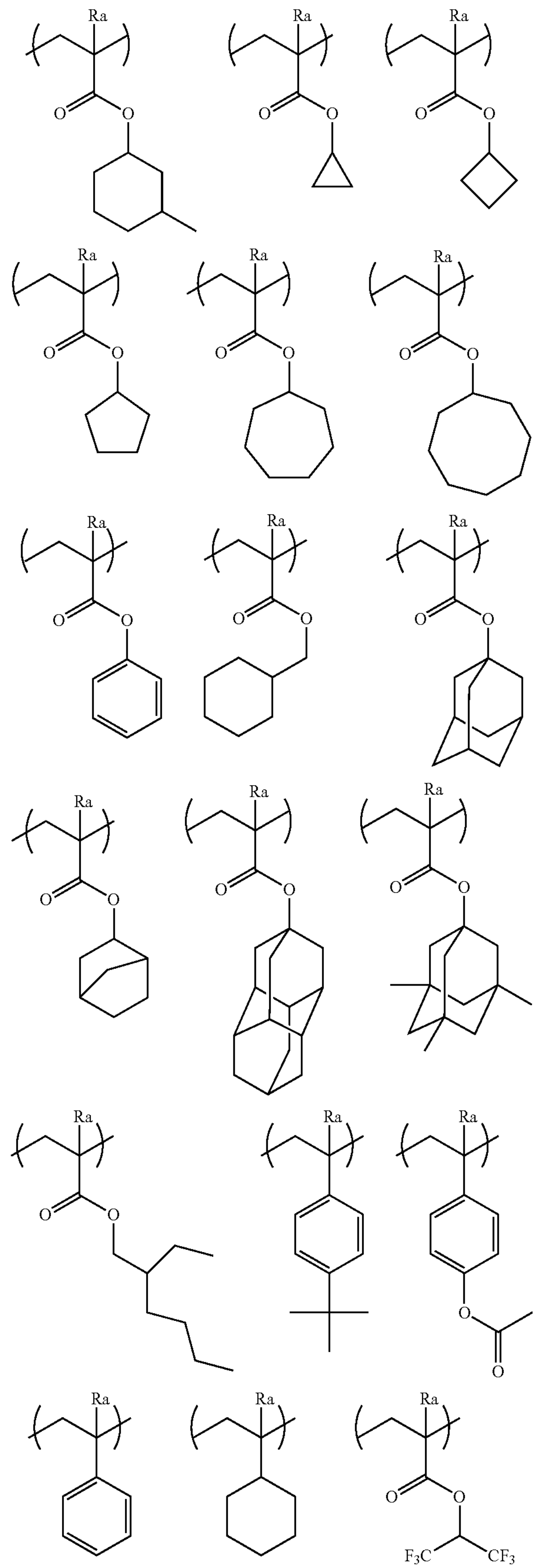

-continued
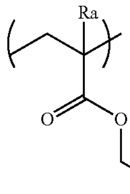
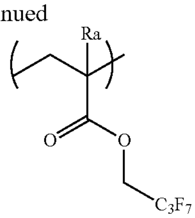
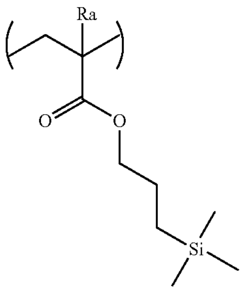
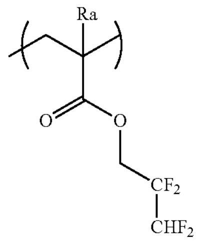
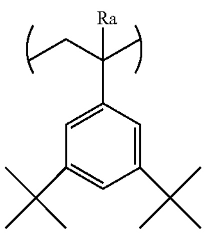
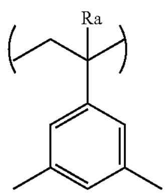
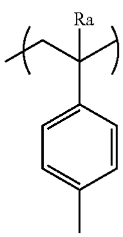
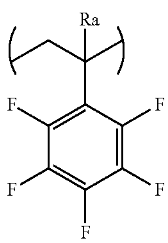
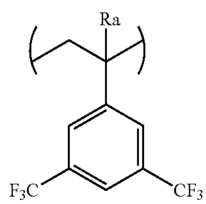
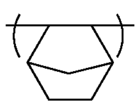
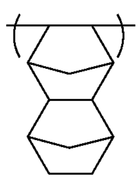
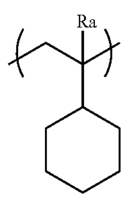
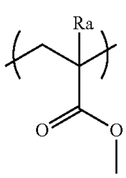
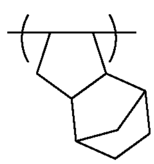
Specific examples of the hydrophobic resins (HR) will be shown below. The following Table 1 shows the molar ratio of individual repeating units (corresponding to individual repeating units in order from the left), weight average molecular weight and degree of dispersal with respect to each of the resins.
(HR-1)
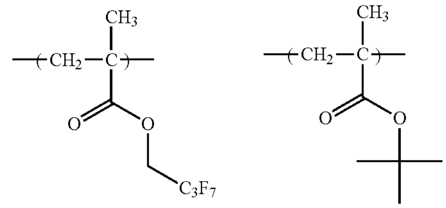
(HR-2)
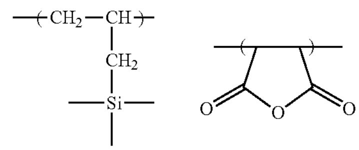
(HR-3)
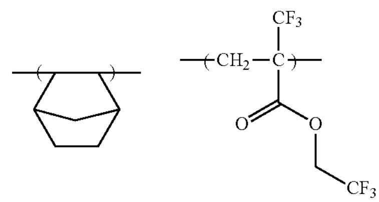
(HR-4)
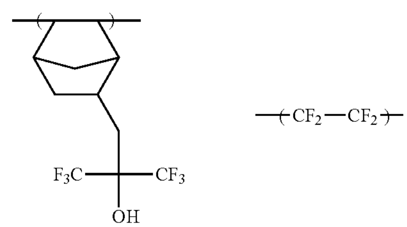
(HR-5)
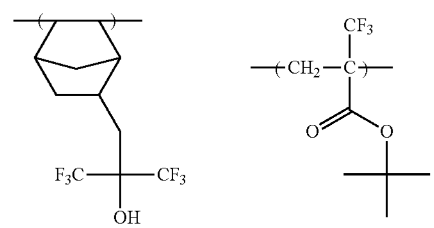
(HR-6)
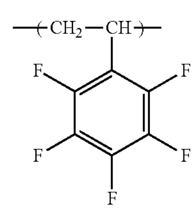
(HR-7)
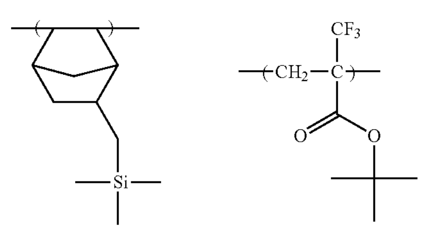

-continued
(HR-8)
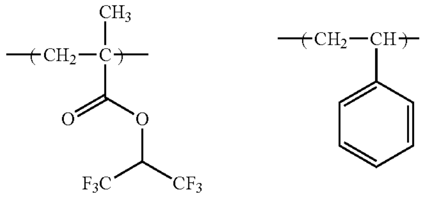
(HR-9)
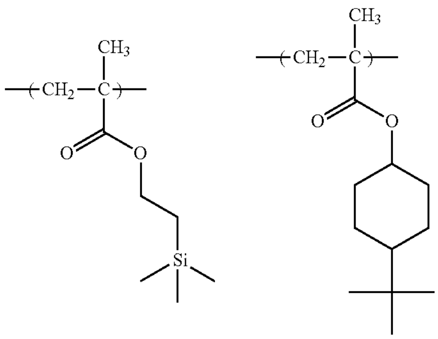
(HR-10)
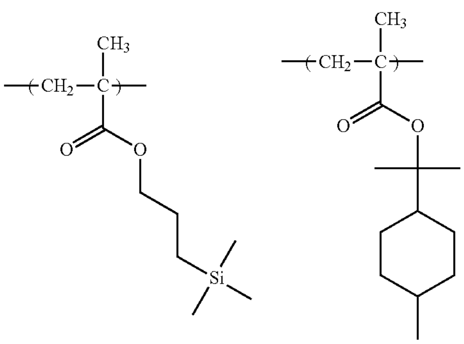
(HR-11)
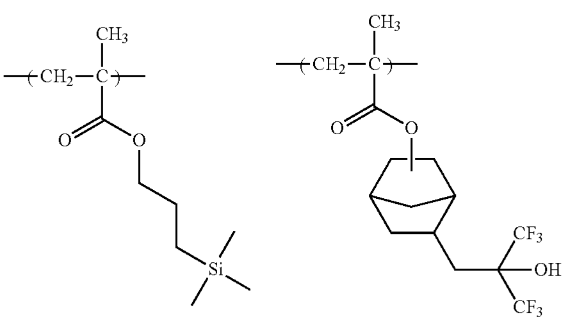
(HR-12)
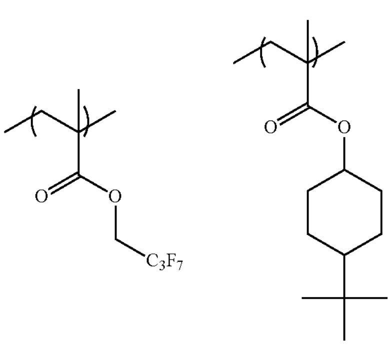
-continued
(HR-13)
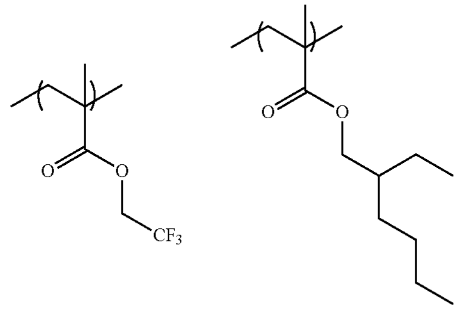
(HR-14)
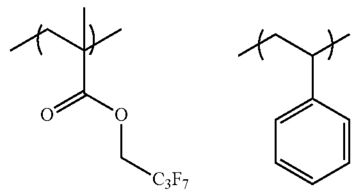
(HR-15)
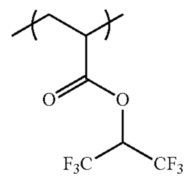
(HR-16)
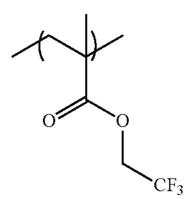
(HR-17)
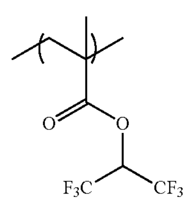
(HR-18)
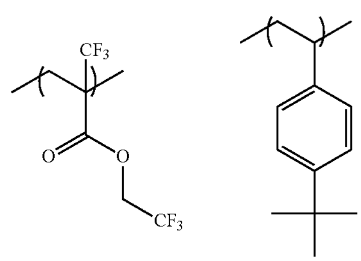

-continued
(HR-19)
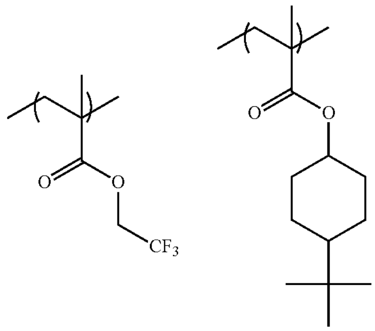
(HR-20)
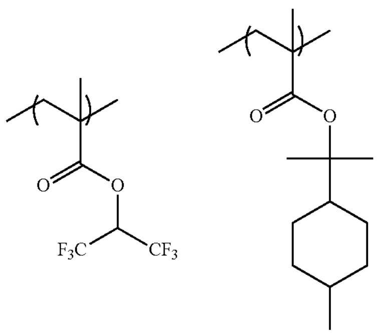
(HR-21)
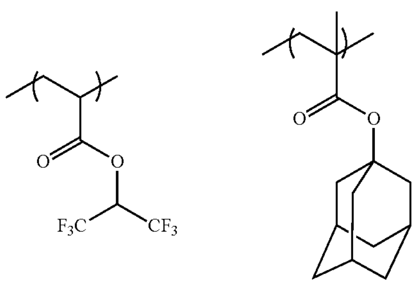
(HR-22)
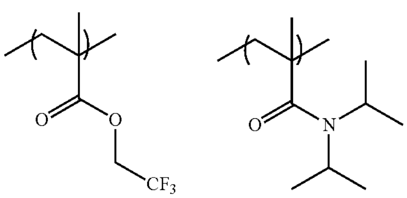
(HR-23)
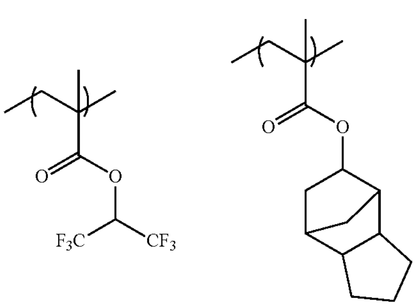
-continued
(HR-24)
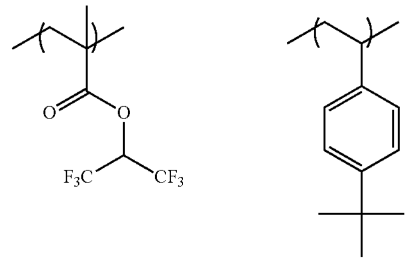
(HR-25)
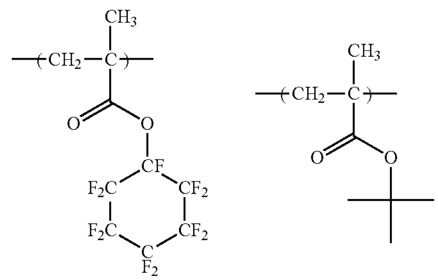
(HR-26)
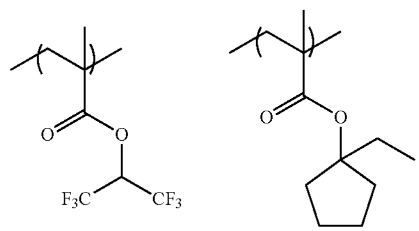
(HR-27)
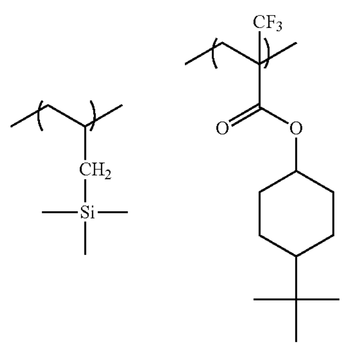
(HR-28)
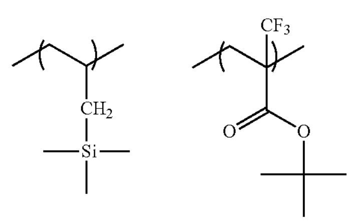
(HR-29)
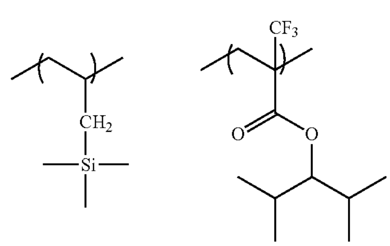

-continued
(HR-30)
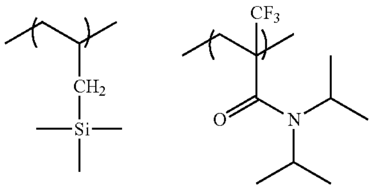
(HR-31)
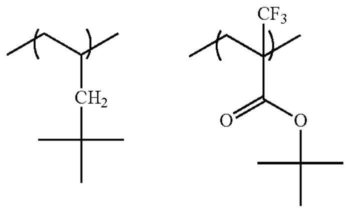
(HR-32)
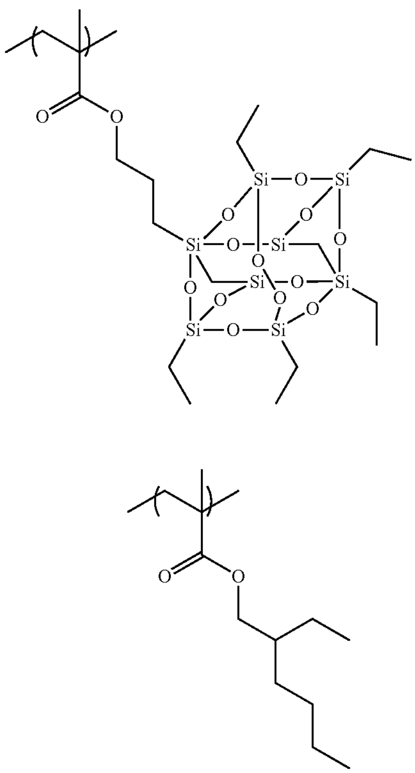
(HR-33)
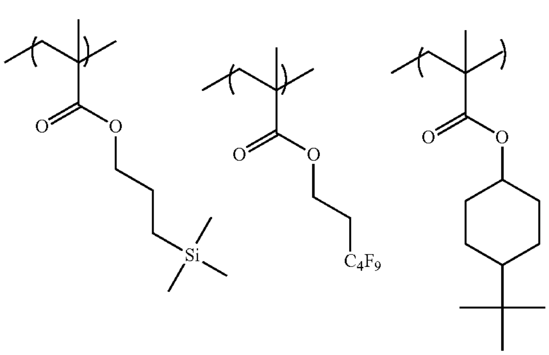
-continued
(HR-34)
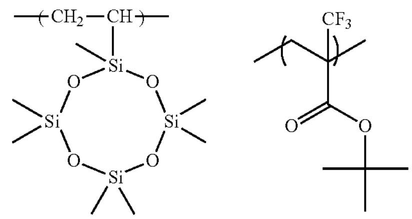
(HR-35)
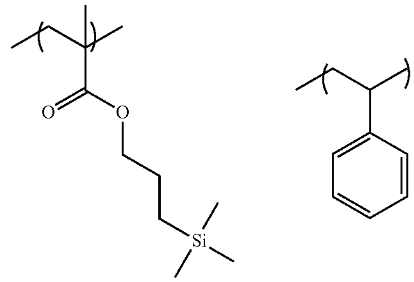
(HR-36)
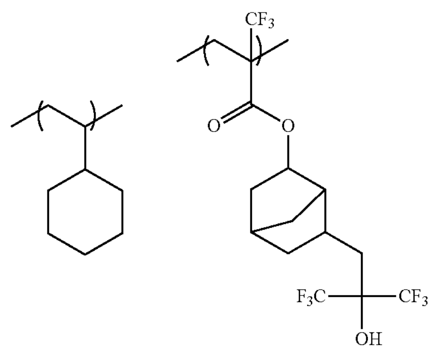
(HR-37)
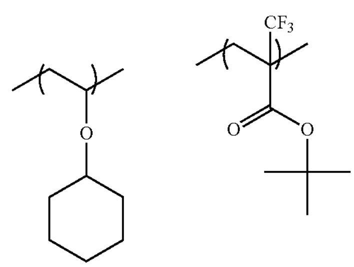
(HR-38)
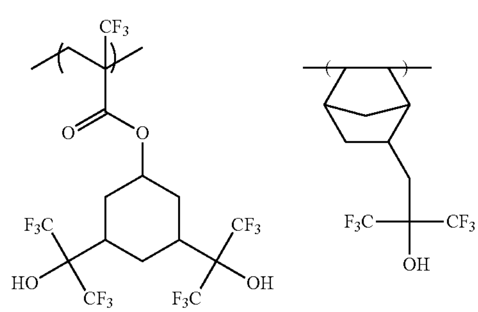

-continued
(HR-39)
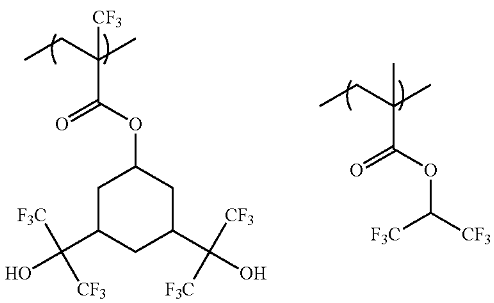
(HR-40)
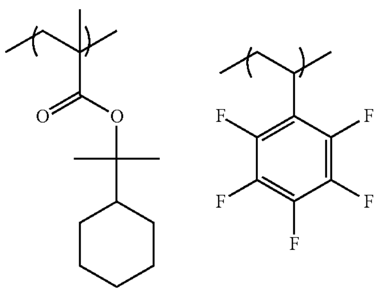
(HR-41)
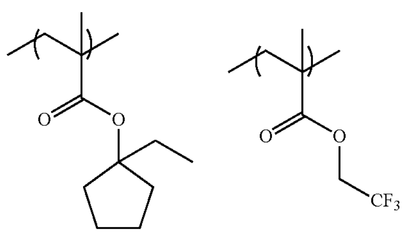
(HR-42)
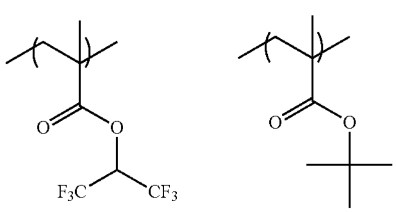
(HR-43)
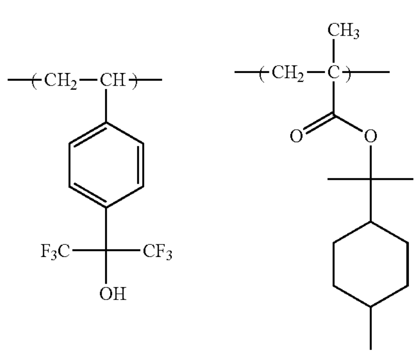
-continued
(HR-44)
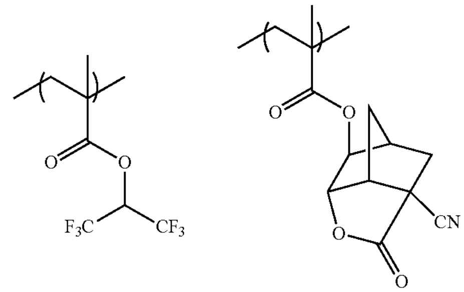
(HR-45)
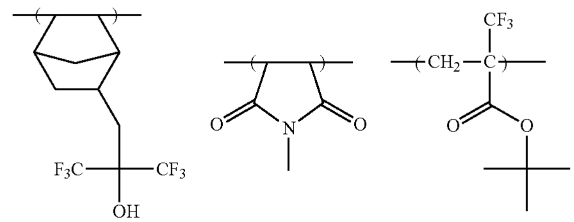
(HR-46)
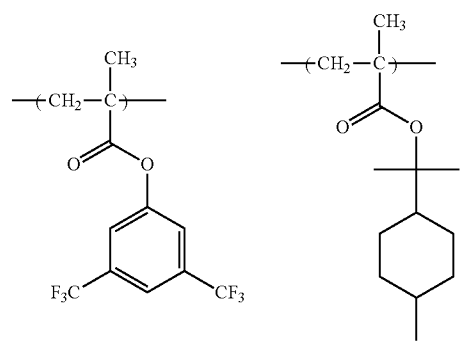
(HR-47)
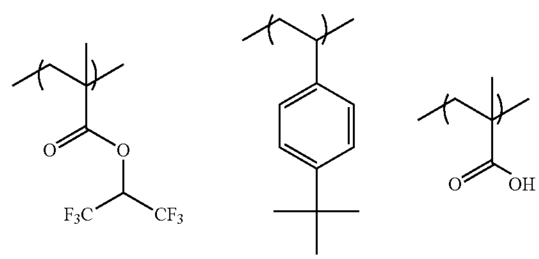
(HR-48)
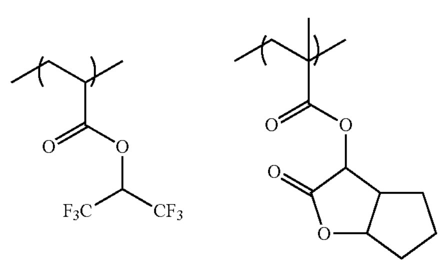

(HR-49)
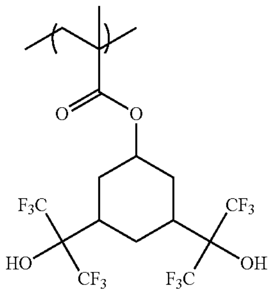
(HR-50)
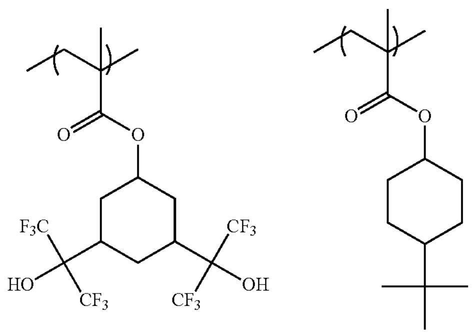
(HR-51)
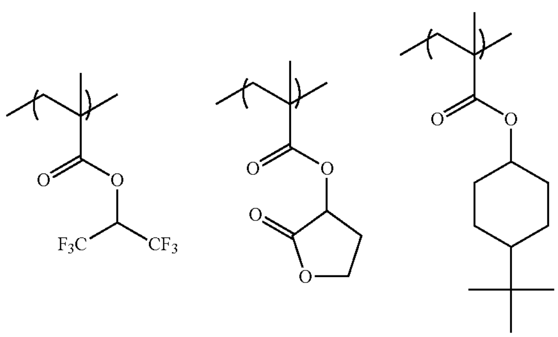
(HR-52)
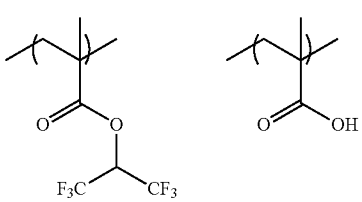
(HR-53)
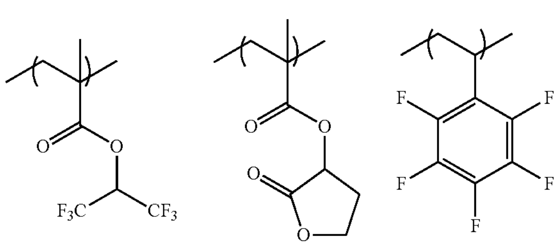
(HR-54)
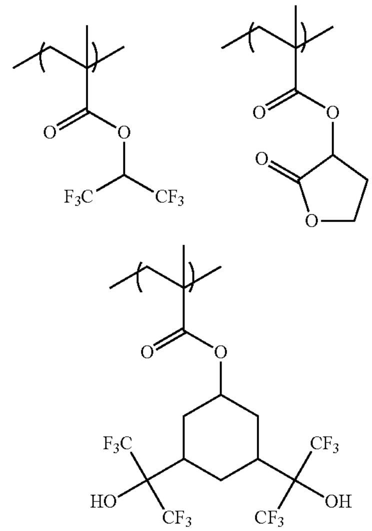
(HR-55)
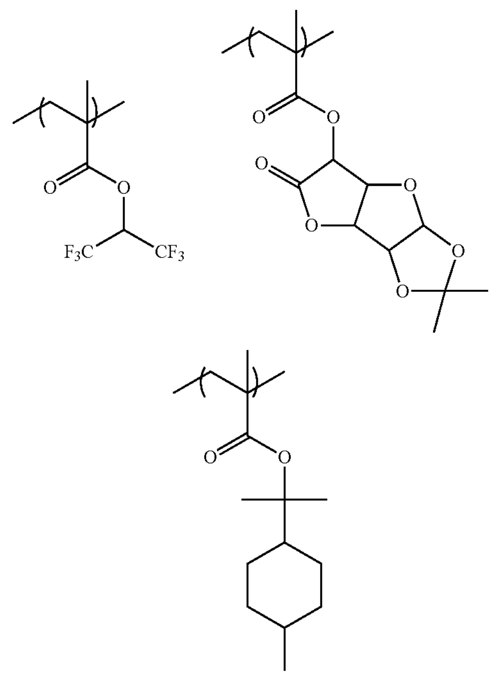
(HR-56)
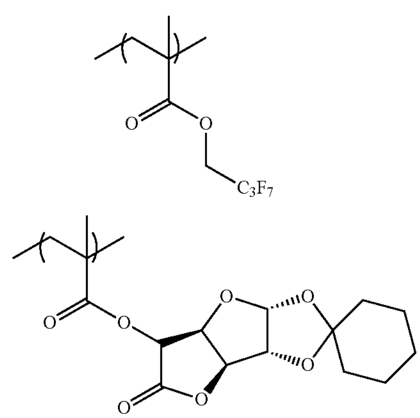

-continued
(HR-57)
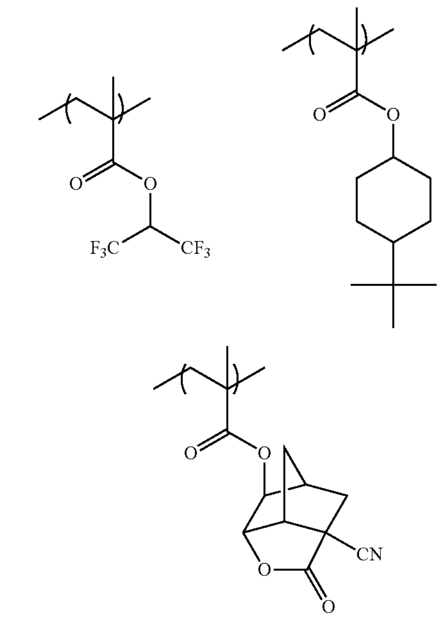
(HR-58)
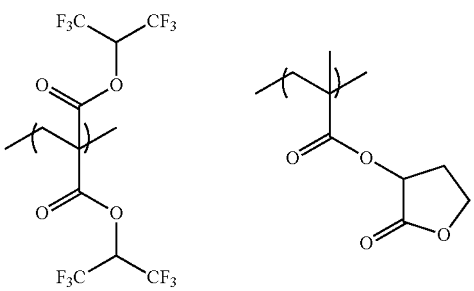
(HR-59)
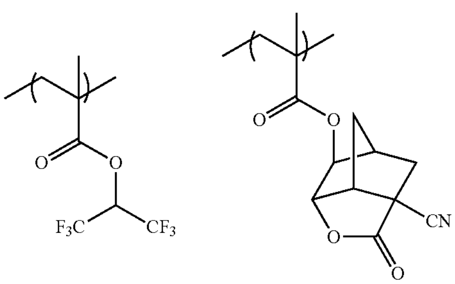
(HR-60)
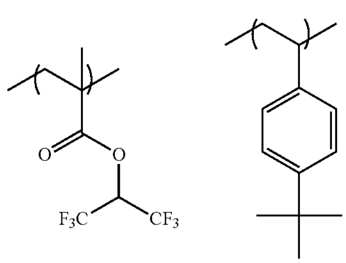
-continued
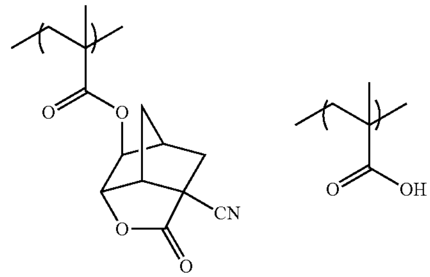
(HR-61)
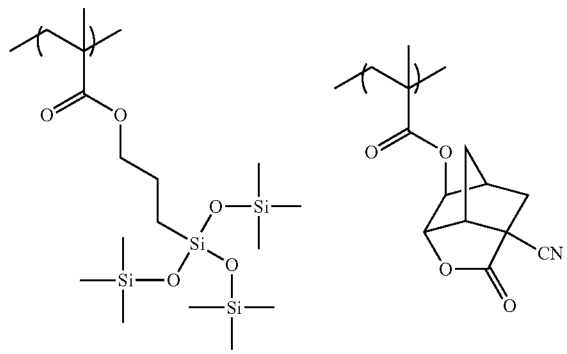
(HR-62)
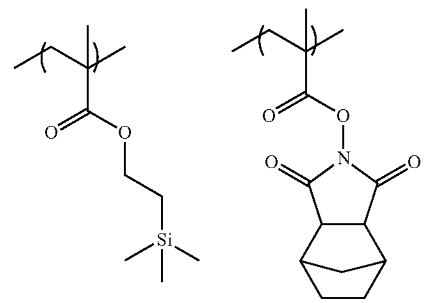
(HR-63)
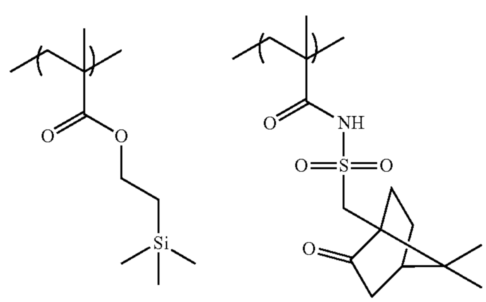
(HR-64)
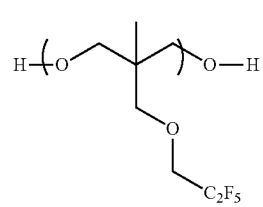

-continued (HR-65)

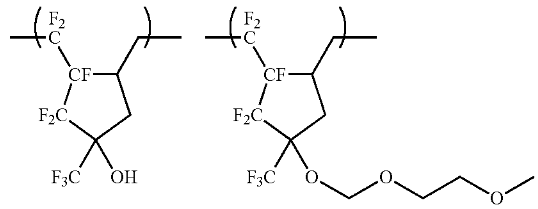

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |

TABLE 1-continued

| Resin | Composition | Mw | Mw/Mn |
|---|---|---|---|
| HR-63 | 80/20 | 7000 | 1.7 |
| HR-64 | 100 | 5500 | 1.8 |
| HR-65 | 50/50 | 9500 | 1.9 |

It is preferred for the above hydrophobic resin (HR) to comprise a repeating unit (c) containing at least one polarity conversion group and further comprise at least either a fluorine atom or a silicon atom. The addition of a hydrophobic resin containing a polarity conversion group is especially preferred from the viewpoint of the suppression of development defect. The above fluorine atom may be one as an electron withdrawing group contained in the polarity conversion group, or may be another fluorine atom.

Herein, the polarity conversion group refers to a group that is decomposed by the action of an alkali developer to thereby increase its solubility in the alkali developer. As such, there can be mentioned, for example, a lactone group, a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—$OSO_2O$—), a sulfonic ester group (—$SO_2O$—) or the like.

In this connection, the ester group directly bonded to the principal chain of a repeating unit, such as that of an acrylate, is poor in the capability of being decomposed by the action of an alkali developer to thereby increase its solubility in the alkali developer, so that the ester group is not included in the polarity conversion groups used in the present invention.

The polarity conversion group is decomposed by the action of an alkali developer to thereby change its polarity. Thus, the receding contact angle between the film after alkali development and water as an immersion liquid can be decreased.

The receding contact angle between the film after alkali development and water is preferably 50° or less, more preferably 40° or less, further more preferably 35° or less and most preferably 30° or less at 23±3° C. in a humidity of 45±5%.

The receding contact angle refers to a contact angle determined when the contact line at a droplet-substrate interface draws back. It is generally known that the receding contact angle is useful in the simulation of droplet mobility in a dynamic condition. In brief, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

When the hydrophobic resin is a resin comprising not only a repeating unit containing at least one polarity conversion group but also at least either a fluorine atom or a silicon atom, it is preferred for this resin to contain a repeating unit (c') simultaneously containing on its one side chain at least one polarity conversion group and at least either a fluorine atom or a silicon atom. Namely, preferably, this hydrophobic resin comprises a repeating unit containing at least either a fluorine atom or a silicon atom on its side chain having at least one polarity conversion group.

Alternatively, in such an instance, the hydrophobic resin may contain both a repeating unit (c*) containing at least one polarity conversion group but containing neither a fluorine atom nor a silicon atom and a repeating unit containing at least either a fluorine atom or a silicon atom.

Further alternatively, in such an instance, the hydrophobic resin may contain a repeating unit (c") in which at least one polarity conversion group is introduced in its one side chain while at least either a fluorine atom or a silicon atom is introduced in its another side chain within the same repeating unit. In this hydrophobic resin, it is preferred for the side chain having a polarity conversion group introduced therein and the side chain having at least either a fluorine atom or a silicon atom introduced therein to have a positional relationship such that the one lies on the α-position to the other via a carbon atom of the principal chain. That is, it is preferred for these side chains to have a positional relationship shown in formula (4) below. In the formula, B1 represents a side chain containing a polarity conversion group, and B2 represents a side chain containing at least either a fluorine atom or a silicon atom.

(4)

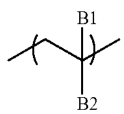

It is preferred for the polarity conversion group to be a group represented by X in the partial structure of general formula (KA-1) or (KB-1) below.

(KA-1)

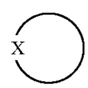

(KB-1)

$$Y^1—X—Y^2$$

In general formula (KA-1) or (KB-1), X represents a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—$OSO_2O$—) or a sulfonic ester group (—$SO_2O$—).

$Y^1$ and $Y^2$ may be identical to or different from each other, and each thereof represents an electron withdrawing group.

The repeating unit (c) can have a preferred polarity conversion group through the introduction therein of any of groups with the partial structures of general formula (KA-1) or (KB-1). When the partial structures have no bonding hand as in the case of the partial structures of general formula (KA-1) or the partial structures of general formula (KB-1) in which $Y^1$ and $Y^2$ are monovalent, the groups with the above partial structures refer to those containing a monovalent or higher-valent group resulting from the deletion of at least one arbitrary hydrogen atom from the partial structures. The partial structures of general formula (KA-1) or (KB-1) are linked at an arbitrary position to the principal chain of the hydrophobic resin via a substituent.

First, the partial structures of general formula (KA-1) will be described in detail below.

The partial structures of general formula (KA-1) are each arranged so as to form a ring structure in cooperation with a group represented by X.

In general formula (KA-1), X is preferably a carboxylic ester group (namely, in the case of the formation of a lactone ring structure as KA-1), an acid anhydride group or a carbonic ester group. More preferably, X is a carboxylic ester group.

A substituent may be introduced in any of the ring structures of general formula (KA-1). For example, nka substituents, the substituent referred to as $Z_{ka1}$, may be introduced in any of the ring structures.

$Z_{ka1}$, or each of a plurality of $Z_{ka1}$s independently, represents an alkyl group, a cycloalkyl group, an ether group, a hydroxyl group, an amido group, an aryl group, a lactone ring group, a halogen atom or an electron withdrawing group.

$Z_{ka1}$s may be linked to each other to thereby form a ring. As the ring formed by the mutual linkage of $Z_{ka1}$s, there can be mentioned, for example, a cycloalkyl ring or a heterocycle (for example, a cycloether ring or a lactone ring).

The above nka is an integer of 0 to 10, preferably 0 to 8, more preferably 0 to 5, further more preferably 1 to 4 and most preferably 1 to 3.

$Z_{ka1}$ is preferably an alkyl group, a cycloalkyl group, an ether group, a hydroxyl group or an electron withdrawing group. $Z_{ka1}$ is more preferably an alkyl group, a cycloalkyl group or an electron withdrawing group. It is preferred for the ether group to be one substituted with, for example, an alkyl group or a cycloalkyl group, namely, to be an alkyl ether group or the like.

As the halogen atom represented by $Z_{ka1}$, there can be mentioned a fluorine atom, a chlorine atom, a bromine atom, an iodine atom or the like. Among these, a fluorine atom is preferred.

The alkyl group represented by $Z_{ka1}$ may contain a substituent, and may be linear or branched. The linear alkyl group preferably has 1 to 30 carbon atoms, more preferably 1 to 20 carbon atoms. As the linear alkyl group, there can be mentioned, for example, a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, an n-decanyl group or the like. The branched alkyl group preferably has 3 to 30 carbon atoms, more preferably 3 to 20 carbon atoms. As the branched alkyl group, there can be mentioned, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, a t-decanyl group or the like. It is preferred for the alkyl group represented by $Z_{ka1}$ to be one having 1 to 4 carbon atoms, such as a methyl group, an ethyl group, an n-propyl group, an i-propyl group, an n-butyl group, an i-butyl group or a t-butyl group.

The cycloalkyl group represented by $Z_{ka1}$ may contain a substituent and may be monocyclic or polycyclic. When polycyclic, the cycloalkyl group may be a bridged one. Namely, in that case, the cycloalkyl group may have a bridged structure. The monocycloalkyl group is preferably one having 3 to 8 carbon atoms. As such a cycloalkyl group, there can be mentioned, for example, a cyclopropyl group, a cyclopentyl group, a cyclohexyl group, a cyclobutyl group, a cyclooctyl group or the like. As the polycycloalkyl group, there can be mentioned a group with, for example, a bicyclo, tricyclo or tetracyclo structure having 5 or more carbon atoms. This polycycloalkyl group is preferably one having 6 to 20 carbon atoms. As such, there can be mentioned, for example, an adamantyl group, a norbornyl group, an isobornyl group, a camphoryl group, a bicyclopentyl group, an α-pinel group, a tricyclodecanyl group, a tetracyclododecyl group, an androstanyl group or the like. The carbon atoms of each of the cycloalkyl groups may be partially replaced with a heteroatom, such as an oxygen atom.

As these cycloalkyl groups, there can be mentioned, for example, those of the following formulae.

(1)
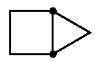
(2)
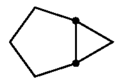
(3)
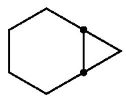
(4)
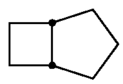
(5)
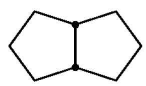
(6)
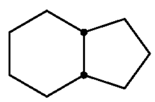
(7)
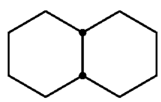
(8)
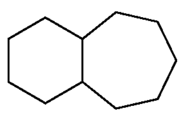
(9)
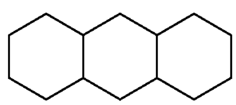
(10)
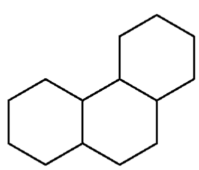
(11)
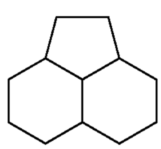
(12)
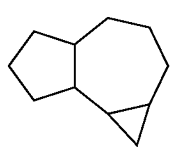
(13)
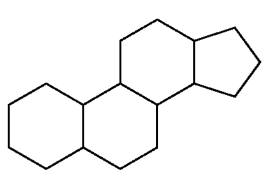
-continued
(14)
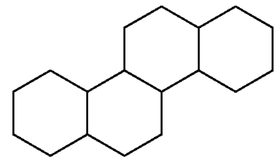
(15)
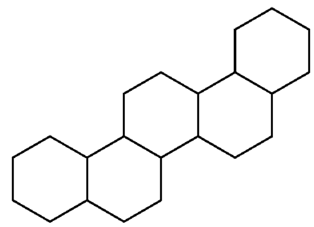
(16)
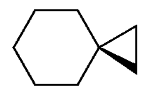
(17)
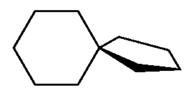
(18)
(19)
(20)
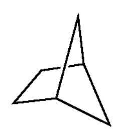
(21)
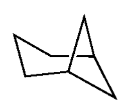
(22)
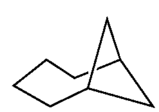
(23)
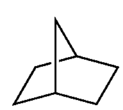
(24)
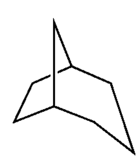
(25)

-continued
(26)
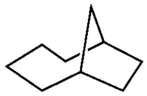
(27)
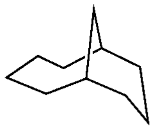
(28)
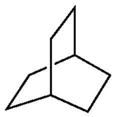
(29)
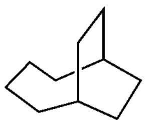
(30)
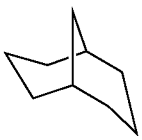
(31)
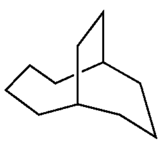
(32)
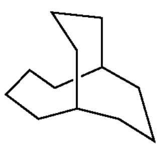
(33)
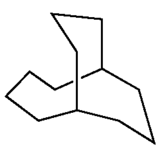
(34)
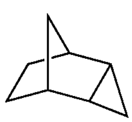
(35)
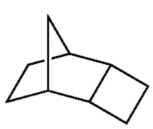
(36)
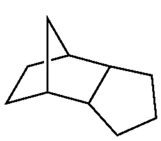
(37)
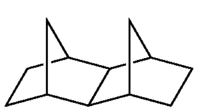
-continued
(38)
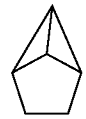
(39)
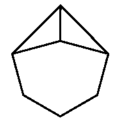
(40)
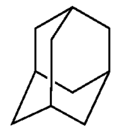
(41)
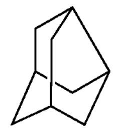
(42)
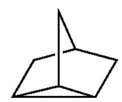
(43)
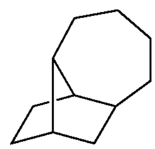
(44)
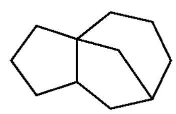
(45)
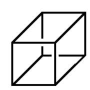
(46)
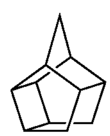
(47)
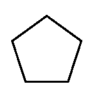
(48)
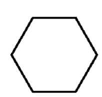
(49)
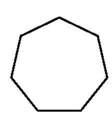
(50)
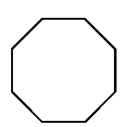

As preferred alicyclic moieties among the above, there can be mentioned an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. As more preferred alicyclic moieties, there can be mentioned an adamantyl group, a decalin group, a norbornyl group, a cedrol group, a cyclohexyl group, a cycloheptyl group, a cyclooctyl group, a cyclodecanyl group, a cyclododecanyl group and a tricyclodecanyl group.

As a substituent that can be introduced in these alicyclic structures, there can be mentioned an alkyl group, a halogen atom, a hydroxyl group, an alkoxy group, a carboxyl group or an alkoxycarbonyl group. The alkyl group is preferably a lower alkyl group, such as a methyl group, an ethyl group, a propyl group, an isopropyl group or a butyl group. More preferably, the alkyl group is a methyl group, an ethyl group, a propyl group or an isopropyl group. As preferred alkoxy groups, there can be mentioned those each having 1 to 4 carbon atoms, such as a methoxy group, an ethoxy group, a propoxy group and a butoxy group. As a substituent that may be introduced in these alkyl and alkoxy groups, there can be mentioned a hydroxyl group, a halogen atom, an alkoxy group (preferably having 1 to 4 carbon atoms) or the like.

As further substituents that may be introduced in the above groups, there can be mentioned a hydroxyl group; a halogen atom (fluorine, chlorine, bromine or iodine); a nitro group; a cyano group; the above alkyl groups; an alkoxy group, such as a methoxy group, an ethoxy group, a hydroxyethoxy group, a propoxy group, a hydroxypropoxy group, an n-butoxy group, an isobutoxy group, a sec-butoxy group or a t-butoxy group; an alkoxycarbonyl group, such as a methoxycarbonyl group or an ethoxycarbonyl group; an aralkyl group, such as a benzyl group, a phenethyl group or a cumyl group; an aralkyloxy group; an acyl group, such as a formyl group, an acetyl group, a butyryl group, a benzoyl group, a cianamyl group or a valeryl group; an acyloxy group, such as a butyryloxy group; the above alkenyl groups; an alkenyloxy group, such as a vinyloxy group, a propenyloxy group, an allyloxy group or a butenyloxy group; the above aryl groups; an aryloxy group, such as a phenoxy group; an aryloxycarbonyl group, such as a benzoyloxy group; and the like.

Preferably, X of general formula (KA-1) represents a carboxylic ester group and the partial structures of general formula (KA-1) are lactone rings. A 5- to 7-membered lactone ring is preferred.

Further, as shown in formulae (KA-1-1) to (KA-1-17) below, each of 5- to 7-membered lactone rings as the partial structures of general formula (KA-1) is preferably condensed with another ring structure in such a fashion that a bicyclo structure or a spiro structure is formed.

The adjacent ring structures to which the ring structures of general formula (KA-1) may be bonded can be, for example, those shown in formulae (KA-1-1) to (KA-1-17) below, or those similar to the same.

It is preferred for the structures containing a lactone ring structure of general formula (KA-1) to be those of any of formulae (KA-1-1) to (KA-1-17) below. The lactone structures may be directly bonded to the principal chain. As preferred structures, there can be mentioned those of formulae (KA-1-1), (KA-1-4), (KA-1-5), (KA-1-6), (KA-1-13), (KA-1-14) and (KA-1-17).

KA-1-1

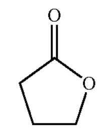

KA-1-2

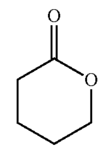

KA-1-3

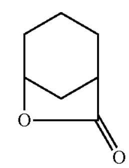

KA-1-4

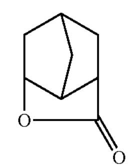

KA-1-5

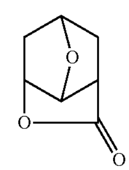

KA-1-6

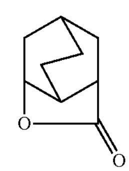

KA-1-7

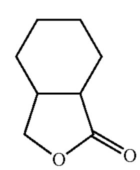

KA-1-8

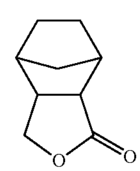

KA-1-9

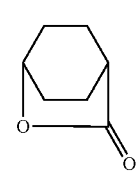

-continued

KA-1-10

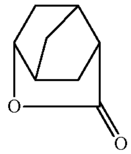

KA-1-11

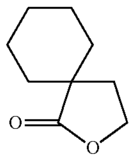

KA-1-12

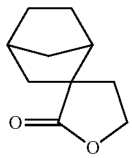

KA-1-13

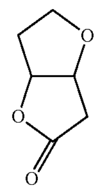

KA-1-14

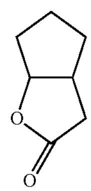

KA-1-15

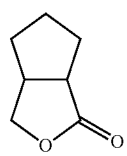

KA-1-16

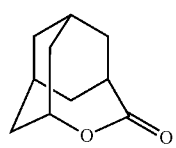

KA-1-17

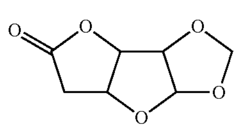

It is optional for the above structures containing a lactone ring structure to contain or not to contain a substituent. Preferred substituents are the same as those that may be introduced in the ring structures of general formula (KA-1) above.

For each of the lactone structures, there may be optically active substances. Any of the optically active substances may be used. It is both appropriate to use a single type of optically active substance alone and to use a plurality of optically active substances in the form of a mixture. When a single type of optically active substance is mainly used, the optical purity (ee) thereof is preferably 90 or higher, more preferably 95 or higher and most preferably 98 or higher.

Now, the partial structure of general formula (KB-1) will be described in detail.

In general formula (KB-1), X is preferably a carboxylic ester group (—COO—).

Each of the electron withdrawing groups represented by $Y^1$ and $Y^2$ has any of the partial structures of formula (EW) below. In formula (EW), * represents either a bonding hand directly bonded to the structures of general formula (KA-1) or a bonding hand directly bonded to X of general formula (KB-1).

(EW)

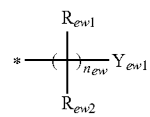

In formula (EW), $n_{ew}$ is the number of repetitions of each of the connecting groups of the formula —C($R_{ew1}$)($R_{ew2}$)—, being an integer of 0 or 1. When $n_{ew}$ is 0, a single bond is represented, indicating the direct bonding of $Y_{ew1}$.

$Y_{ew1}$ can be any of a halogen atom, a cyano group, a nitrile group, a nitro group, any of the halo(cyclo)alkyl groups or haloaryl groups of the formula —C($R_{f1}$)($R_{f2}$)—$R_{f3}$, an oxy group, a carbonyl group, a sulfonyl group, a sulfinyl group and a combination thereof. The electron withdrawing groups may have, for example, the following structures. Herein, the "halo(cyclo)alkyl group" refers to an at least partially halogenated alkyl group or cycloalkyl group. Each of $R_{ew3}$ and $R_{ew4}$ independently represents an arbitrary structure. Regardless of the types of the structures of $R_{ew3}$ and $R_{ew4}$, the partial structures of formula (EW) exhibit electron withdrawing properties, and may be linked to, for example, the principal chain of the resin. Preferably, each of $R_{ew3}$ and $R_{ew4}$ is an alkyl group, a cycloalkyl group or a fluoroalkyl group.

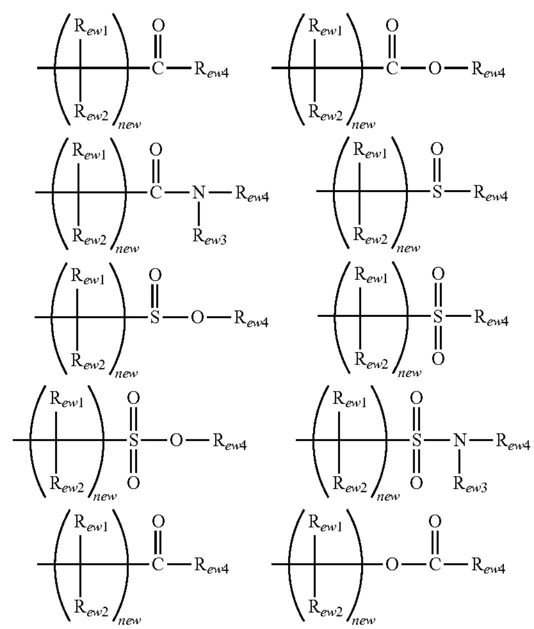

-continued

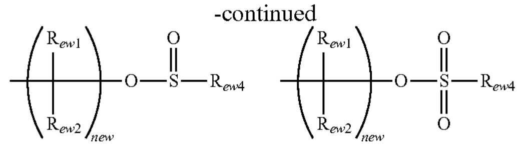

When $Y_{ew1}$ is a bivalent or higher-valent group, the remaining bonding hand or hands form a bond with an arbitrary atom or substituent. At least any of the groups represented by $Y_{ew1}$, $R_{ew1}$ and $R_{ew2}$ may be linked via a further substituent to the principal chain of the hydrophobic resin.

$Y_{ew1}$ is preferably a halogen atom or any of the halo(cyclo)alkyl groups or haloaryl groups of the formula —C($R_{f1}$)($R_{f2}$)—$R_{f3}$.

Each of $R_{ew1}$ and $R_{ew2}$ independently represents an arbitrary substituent, for example, a hydrogen atom, an alkyl group, a cycloalkyl group or an aryl group.

At least two of $R_{ew1}$, $R_{ew2}$ and $Y_{ew1}$ may be linked to each other to thereby form a ring.

In the above formula, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

Each of $R_{f2}$ and $R_{f3}$ independently represents a hydrogen atom, a halogen atom or an organic group. $R_{f2}$ and $R_{f3}$ may be linked to each other to thereby form a ring. As the organic group, there can be mentioned, for example, an alkyl group, a cycloalkyl group, an alkoxy group or the like. It is preferred for $R_{f2}$ to represent the same groups as by $R_{f1}$ or to be linked to $R_{f3}$ to thereby form a ring.

$R_{f1}$ to $R_{f3}$ may be linked to each other to thereby form a ring. As the formed ring, there can be mentioned a (halo)cycloalkyl ring, a (halo)aryl ring or the like.

As the (halo)alkyl groups represented by $R_{f1}$ to $R_{f3}$, there can be mentioned, for example, the alkyl groups mentioned above as being represented by $Z_{ka1}$ and structures resulting from halogenation thereof.

As the (per)halocycloalkyl groups and (per)haloaryl groups represented by $R_{f1}$ to $R_{f3}$ or contained in the ring formed by the mutual linkage of $R_{f2}$ and $R_{f3}$, there can be mentioned, for example, structures resulting from halogenation of the cycloalkyl groups as mentioned above with respect to $Z_{ka1}$, preferably fluorocycloalkyl groups of the formula —$C_{(n)}F_{(2n-2)}H$ and perfluoroaryl groups of the formula —$C_{(n)}F_{(n-1)}$. The number of carbon atoms, n, is not particularly limited. Preferably, it is in the range of 5 to 13, more preferably 6.

As preferred rings that may be formed by the mutual linkage of at least two of $R_{ew1}$, $R_{ew2}$ and $Y_{ew1}$, there can be mentioned cycloalkyl groups and heterocyclic groups. Preferred heterocyclic groups are lactone ring groups. As the lactone rings, there can be mentioned, for example, the structures of formulae (KA-1-1) to (KA-1-17) above.

The repeating unit (c) may contain two or more of the partial structures of general formula (KA-1), or two or more of the partial structures of general formula (KB-1), or both any one of the partial structures of general formula (KA-1) and any one of the partial structures of general formula (KB-1).

A part or the whole of any of the partial structures of general formula (KA-1) may double as the electron withdrawing group represented by $Y^1$ or $Y^2$ of general formula (KB-1). For example, when X of general formula (KA-1) is a carboxylic ester, the carboxylic ester can function as the electron withdrawing group represented by $Y^1$ or $Y^2$ of general formula (KB-1).

When the repeating unit (c) is the repeating unit (c*) containing at least one polarity conversion group but containing neither a fluorine atom nor a silicon atom, or the repeating unit (c") in which at least one polarity conversion group is introduced in its one side chain while at least either a fluorine atom or a silicon atom is introduced in its another side chain within the same repeating unit, it is preferred for the polarity conversion group to be the partial structure of —COO— contained in the structures of general formula (KA-1).

Preferably, the hydrophobic resin for use in the present invention contains the repeating unit (c) containing at least two polarity conversion groups and also contains at least either a fluorine atom or a silicon atom.

When the repeating unit (c) contains at least two polarity conversion groups, it is preferred for the repeating unit to contain a group with any of the partial structures having two polarity conversion groups of general formula (KY-1) below. When any of the structures of general formula (KY-1) has no bonding hand, it is a group with a mono- or higher-valent group resulting from the removal of at least any one of the hydrogen atoms contained in the structure.

(KY-1)

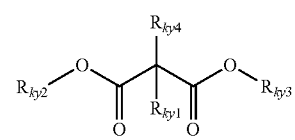

In general formula (KY-1), each of $R_{ky1}$ and $R_{ky4}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group. Alternatively, both $R_{ky1}$ and $R_{ky4}$ may be bonded to the same atom to thereby form a double bond. For example, both $R_{ky1}$ and $R_{ky4}$ may be bonded to the same oxygen atom to thereby form a part (=O) of a carbonyl group.

Each of $R_{ky2}$ and $R_{ky3}$ independently represents an electron withdrawing group. Alternatively, $R_{ky1}$ and $R_{ky2}$ are linked to each other to thereby form a lactone structure, while $R_{ky3}$ is an electron withdrawing group. The formed lactone structure is preferably any of the above-mentioned structures (KA-1-1) to (KA-1-17). As the electron withdrawing group, there can be mentioned any of the same groups as mentioned above with respect to $Y^1$ and $Y^2$ of general formula (KB-1). This electron withdrawing group is preferably a halogen atom, or any of the halo(cyclo)alkyl groups or haloaryl groups of the formula —C($R_{f1}$)($R_{f2}$)—$R_{f3}$. Preferably, $R_{ky3}$ is a halogen atom, or any of the halo(cyclo)alkyl groups or haloaryl groups of the formula —C($R_{f1}$)($R_{f2}$)—$R_{f3}$, while $R_{ky2}$ is either linked to $R_{ky1}$ to thereby form a lactone ring, or an electron withdrawing group containing no halogen atom.

$R_{ky1}$, $R_{ky2}$ and $R_{ky4}$ may be linked to each other to thereby form a monocyclic or polycyclic structure.

As $R_{ky1}$ and $R_{ky4}$, there can be mentioned, for example, the same groups as set forth above with respect to $Z_{ka1}$ of general formula (KA-1).

The lactone rings formed by the mutual linkage of $R_{ky1}$ and $R_{ky2}$ preferably have the structures of formulae (KA-1-1) to (KA-1-17) above. As the electron withdrawing groups, there can be mentioned those mentioned above as being represented by $Y^1$ and $Y^2$ of general formula (KB-1).

It is more preferred for the structures of general formula (KY-1) to be the structures of general formula (KY-2) below. Each of the structures of general formula (KY-2) is a group with a mono- or higher-valent group resulting from the removal of at least any one of the hydrogen atoms contained in the structure.

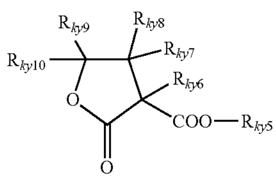

(KY-2)

In formula (KY-2), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group.

At least two of $R_{ky6}$ to $R_{ky10}$ may be linked to each other to thereby form a monocyclic or polycyclic ring.

$R_{ky5}$ represents an electron withdrawing group. As the electron withdrawing group, there can be mentioned any of the same groups as set forth above with respect to $Y^1$ and $Y^2$. This electron withdrawing group is preferably a halogen atom, or any of the halo(cyclo)alkyl groups or haloaryl groups of the formula —C($R_{f1}$)($R_{f2}$)—$R_{f3}$.

As $R_{ky5}$ to $R_{ky10}$, there can be mentioned, for example, the same groups as set forth above with respect to $Z_{ka1}$ of general formula (KA-1).

It is more preferred for the structures of general formula (KY-2) to be the partial structures of general formula (KY-3) below.

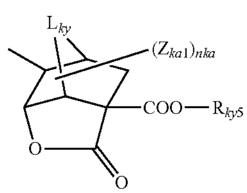

(KY-3)

In general formula (KY-3), $Z_{ka1}$ and nka are as defined above in connection with general formula (KA-1). $R_{ky5}$ is as defined above in connection with general formula (KY-2).

$L_{ky}$ represents an alkylene group, an oxygen atom or a sulfur atom. As the alkylene group represented by $L_{ky}$, there can be mentioned a methylene group, an ethylene group or the like. $L_{ky}$ is preferably an oxygen atom or a methylene group, more preferably a methylene group.

The repeating units (c) are not limited as long as they are derived by polymerization, such as addition polymerization, condensation polymerization or addition condensation. Preferred repeating units are those obtained by the addition polymerization of a carbon to carbon double bond. As such repeating units, there can be mentioned, for example, acrylate repeating units (including the family having a substituent at the α- and/or β-position), styrene repeating units (including the family having a substituent at the α- and/or β-position), vinyl ether repeating units, norbornene repeating units, repeating units of maleic acid derivatives (maleic anhydride, its derivatives, maleimide, etc.) and the like. Of these, acrylate repeating units, styrene repeating units, vinyl ether repeating units and norbornene repeating units are preferred. Acrylate repeating units, vinyl ether repeating units and norbornene repeating units are more preferred. Acrylate repeating units are most preferred.

The repeating unit (c) can be any of the repeating units with the following partial structures.

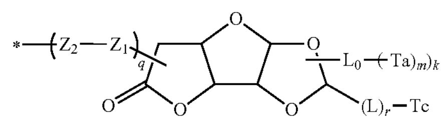

(cc)

In general formula (cc), $Z_1$, or each of $Z_1$s independently, represents a single bond, an ether bond, an ester bond, an amido bond, a urethane bond or a urea bond. An ester bond is preferred.

$Z_2$, or each of $Z_2$s independently, represents a chain- or cycloalkylene group. An alkylene group having 1 or 2 carbon atoms and a cycloalkylene group having 5 to 10 carbon atoms are preferred.

Ta, or each of Tas independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1)). An alkyl group, a cycloalkyl group and an electron withdrawing group are preferred. An electron withdrawing group is more preferred. Two or more Tas may be bonded to each other to thereby form a ring.

$L_0$ represents a single bond or a hydrocarbon group with a valence of m+1 (preferably having 20 or less carbon atoms). A single bond is preferred. $L_0$ is a single bond when m is 1. The hydrocarbon group with a valence of m+1 represented by $L_0$ is, for example, one resulting from the removal of any m−1 hydrogen atoms from an alkylene group, a cycloalkylene group, a phenylene group or a combination thereof. When k is 2, two $L_0$s may be bonded to each other to thereby form a ring.

L, or each of Ls independently, represents a carbonyl group, a carbonyloxy group or an ether group.

Tc represents a hydrogen atom, an alkyl group, cycloalkyl group, a nitrile group, a hydroxyl group, an amido group, an aryl group or an electron withdrawing group (having the same meaning as that of the electron withdrawing group represented by $Y^1$ or $Y^2$ of general formula (KB-1)).

In the formula, * represents the bonding hand to the principal chain or a side chain of the resin. Specifically, any of the partial structures of formula (cc) may be directly bonded to the principal chain, or may be bonded to a side chain of the resin. The bonding hand to the principal chain is one to an atom contained in the bonds as constituents of the principal chain. The bonding hand to a side chain is one to an atom being present outside the bonds as constituents of the principal chain.

In the general formula, m is an integer of 0 to 28, preferably an integer of 1 to 3, more preferably 1;

k is an integer of 0 to 2, preferably 1;

q is an integer of 0 to 5, preferably 0 to 2; and r is an integer of 0 to 5.

The moiety $-(L)_r-Tc$ may be replaced with $-L_0-(Ta)_m$.

It is also preferred to contain a fluorine atom at an end of a sugar lactone and further contain a fluorine atom on a side chain different from the side chain on the side of the sugar lactone within the same repeating unit (repeating unit (c")).

As particular structures of the repeating units (c), the repeating units with the following partial structures are preferred.

(ca-2)

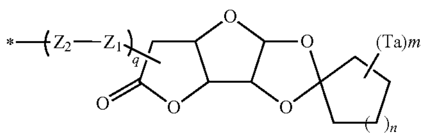

(cb-2)

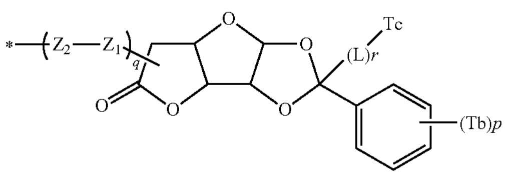

In general formulae (ca-2) and (cb-2), $Z_1$, $Z_2$, Tc, Ta, L, q and r are as defined above in connection with general formula (cc).

Tb, or each of Tbs independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1)).

In the formulae, * represents the bonding hand to the principal chain or a side chain of the resin. Specifically, any of the partial structures of general formulae (ca-2) and (cb-2) may be directly bonded to the principal chain, or may be bonded to a side chain of the resin.

In the general formulae, m is an integer of 0 to 28, preferably an integer of 1 to 3, more preferably 1;

n is an integer of 0 to 11, preferably an integer of 0 to 5, more preferably 1 or 2; and p is an integer of 0 to 5, preferably an integer of 0 to 3, more preferably 1 or 2.

The repeating unit (c) can have any of the partial structures of general formula (2) below.

(2)

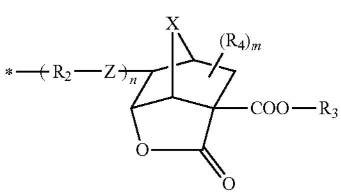

In general formula (2), $R_2$ represents a chain- or cycloalkylene group, provided that two or more $R_{2s}$ may be identical to or different from each other.

$R_3$ represents a linear, branched or cyclic hydrocarbon group whose hydrogen atoms on constituent carbons are partially or entirely substituted with fluorine atoms.

$R_4$ represents a halogen atom, a cyano group, a hydroxyl group, an amido group, an alkyl group, a cycloalkyl group, an alkoxy group, a phenyl group, an acyl group, an alkoxycarbonyl group or any of the groups of formula R—C(=O)— or R—C(=O)O— in which R is an alkyl group or a cycloalkyl group. Two or more $R_4$s may be identical to or different from each other, and may be bonded to each other to thereby form a ring.

X represents an alkylene group, an oxygen atom or a sulfur atom.

Z represents a single bond, an ether bond, an ester bond, an amido bond, a urethane bond or a urea bond. When there are a plurality of Zs, they may be identical to or different from each other.

In the formula, * represents the bonding hand to the principal chain of the resin;

n is the number of repetitions, being an integer of 0 to 5; and m is the number of substituents, being an integer of 0 to 7.

The structure $—R_2—Z$ is preferably any of the structures of formula $—(CH_2)_1—COO—$ in which 1 is an integer of 1 to 5.

It is preferred for the hydrophobic resin to contain, as the repeating unit (c), any of the repeating units of general formula (K0) below.

(K0)

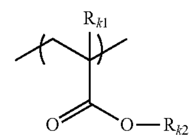

In the formula, $R_{k1}$ represents a hydrogen atom, a halogen atom, a hydroxyl group, an alkyl group, a cycloalkyl group, an aryl group or a group containing a polarity conversion group; and $R_{k2}$ represents an alkyl group, a cycloalkyl group, an aryl group or a group containing a polarity conversion group;

provided that at least one of $R_{k1}$ and $R_{k2}$ is a group containing a polarity conversion group. It is more preferred for the sum of polarity conversion groups to be 2 or greater.

As generally mentioned above, the ester group directly bonded to the principal chain of the repeating units of general formula (K0) is not included in the category of polarity conversion groups according to the present invention.

Specific examples of the repeating units (c) containing polarity conversion groups will be shown below, which in no way limit the scope of the appropriate repeating units. In the following specific examples, Ra represents a hydrogen atom, a fluorine atom, a methyl group or a trifluoromethyl group.

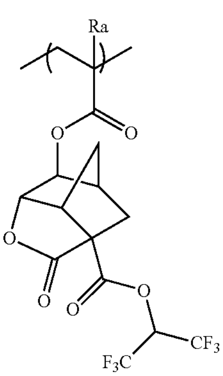

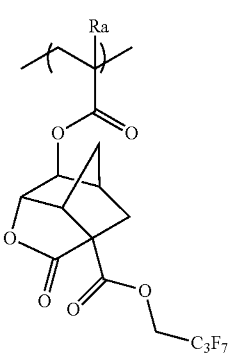

-continued
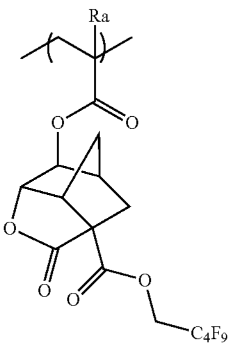
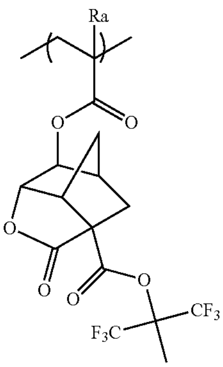
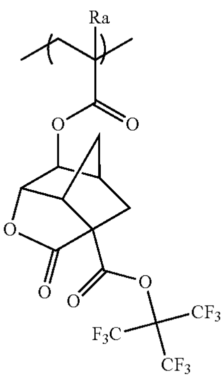
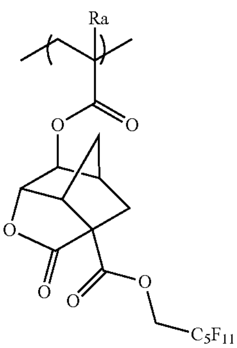
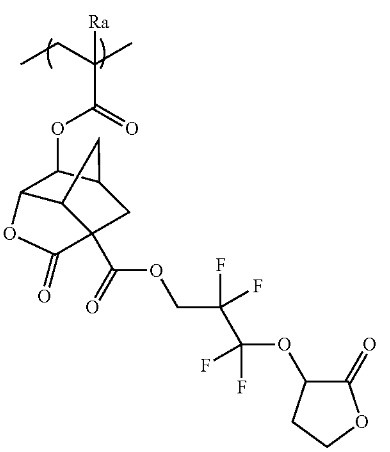
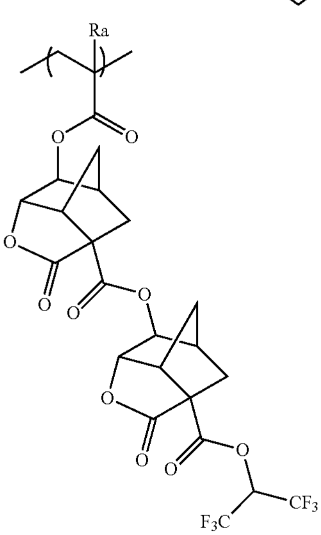
-continued
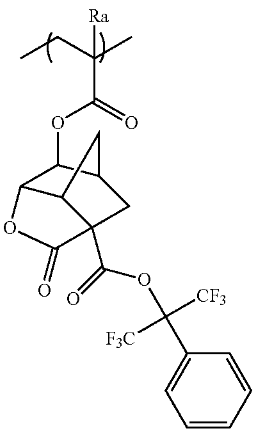
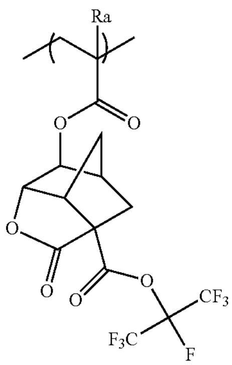
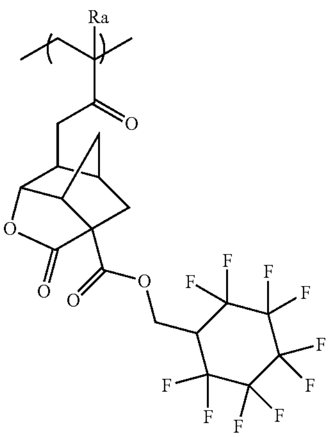
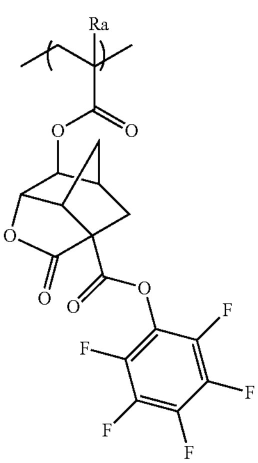
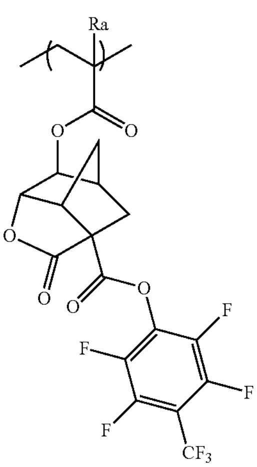
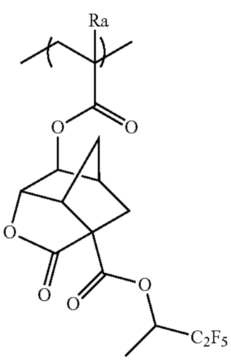
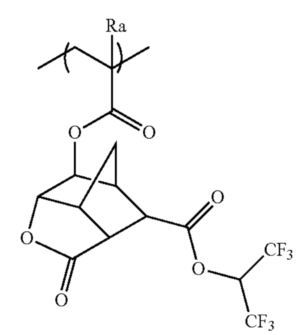

-continued
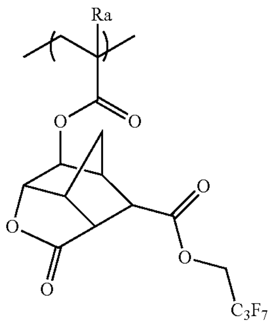
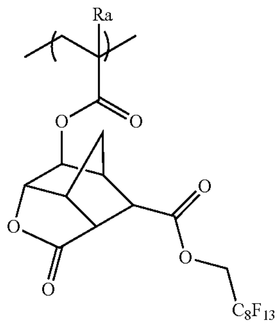
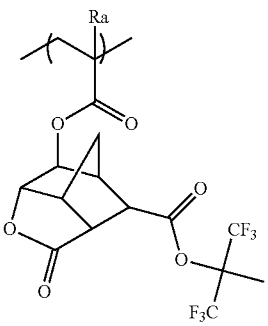
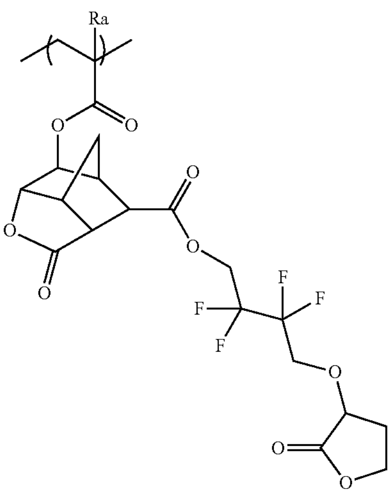
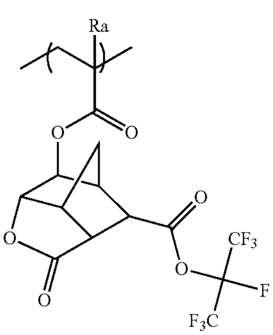
-continued
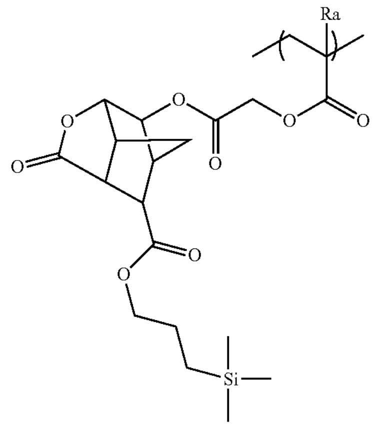
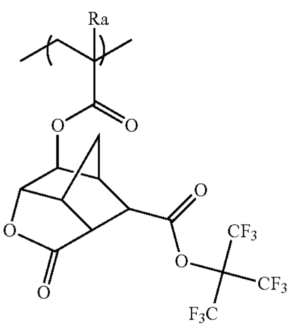
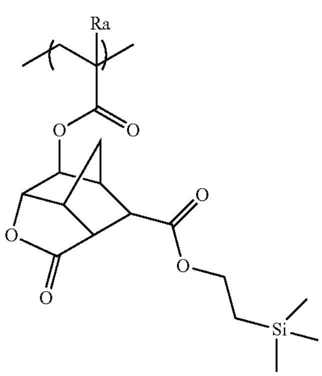
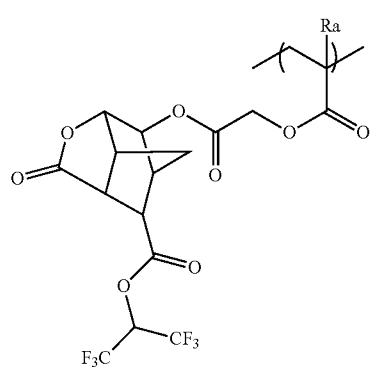

-continued
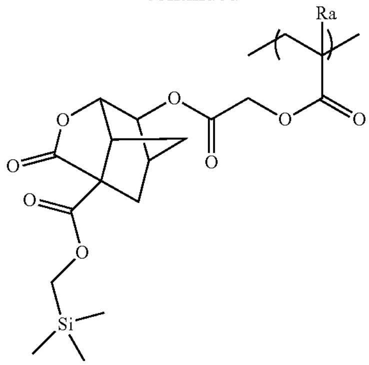
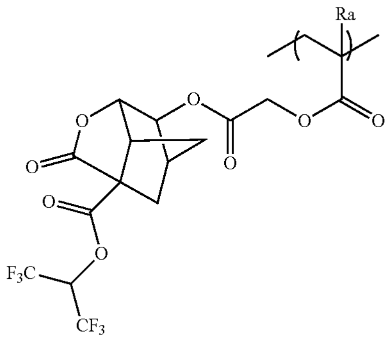
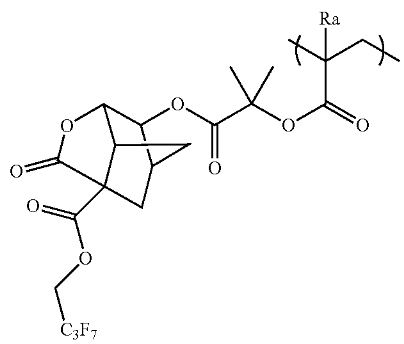
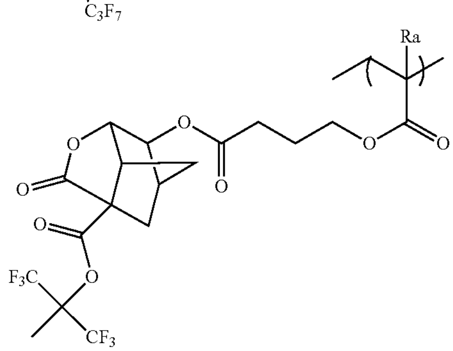
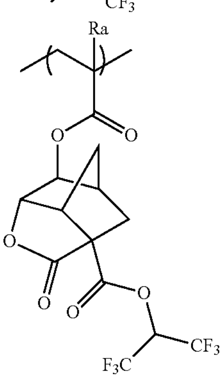
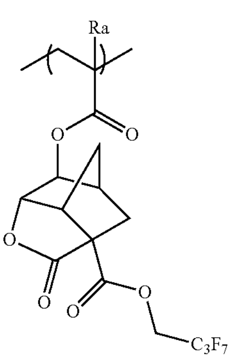
-continued
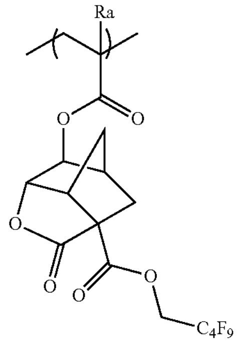
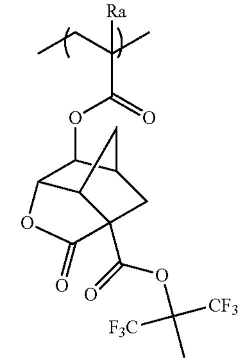
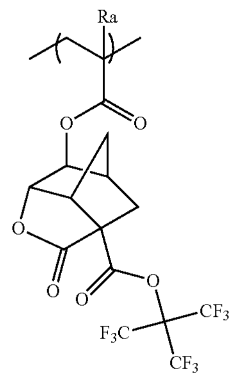
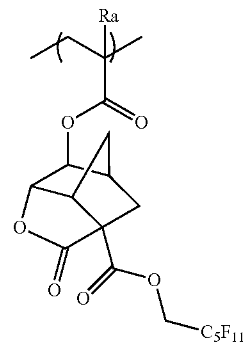
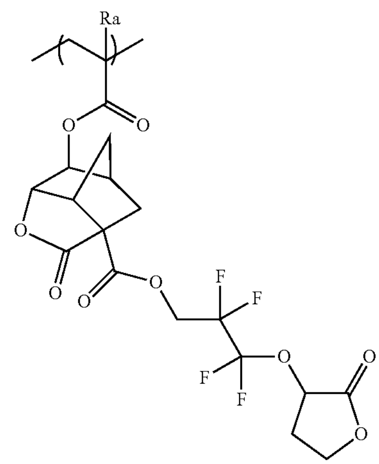
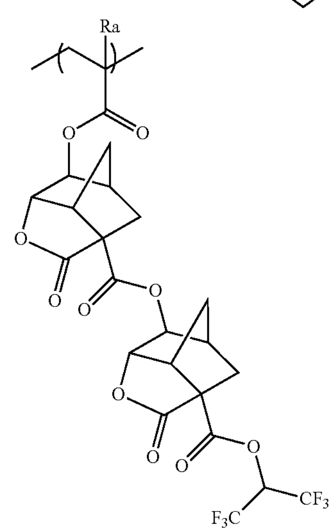

-continued
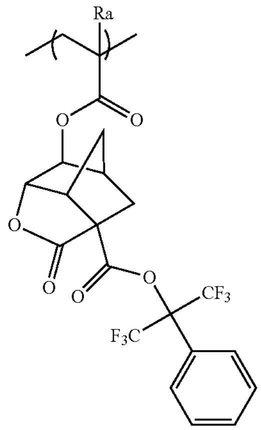
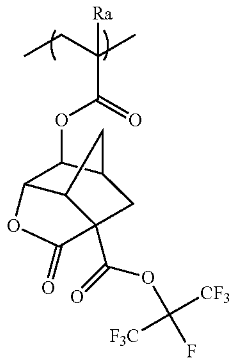
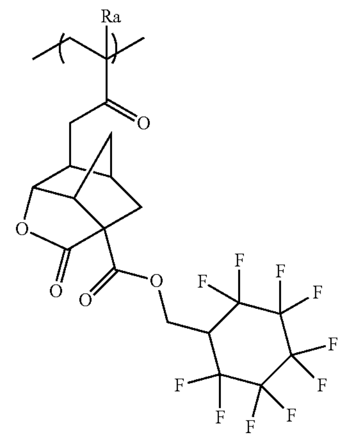
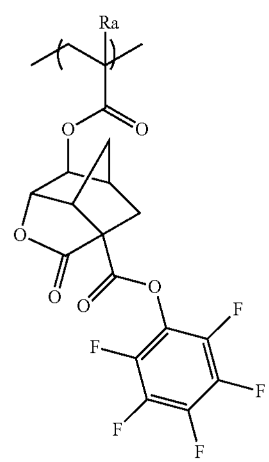
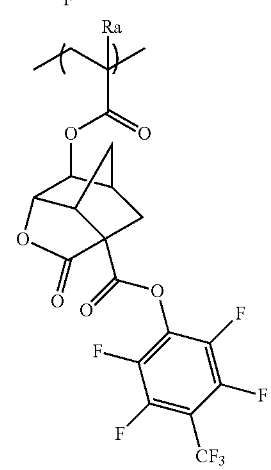
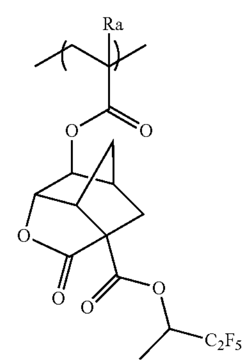
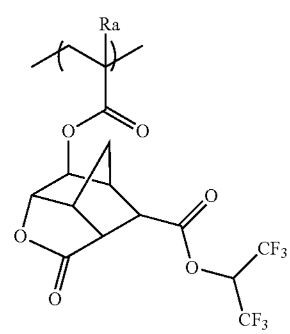
-continued
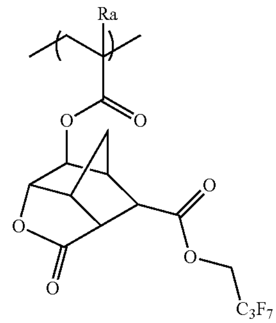
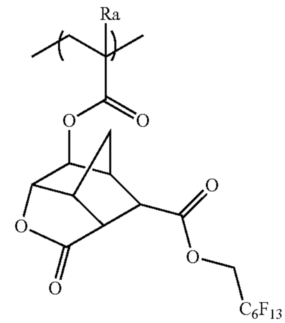
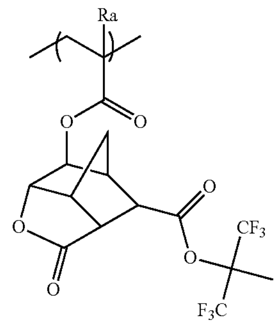
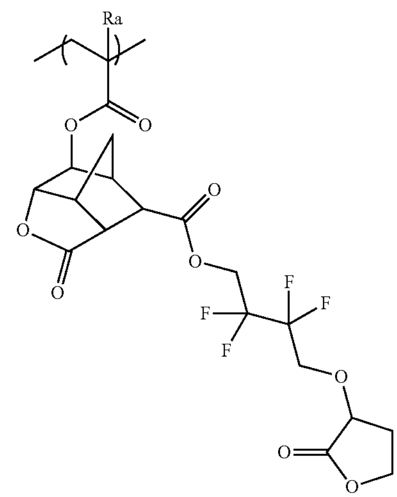
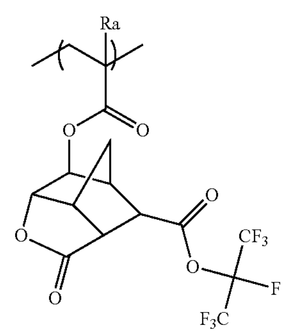

-continued
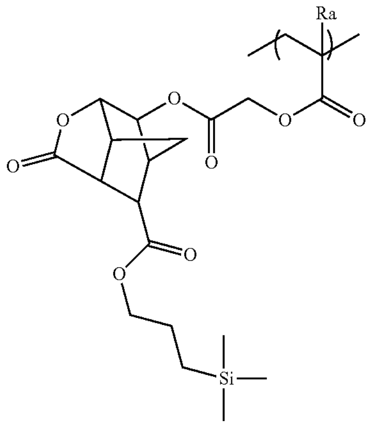
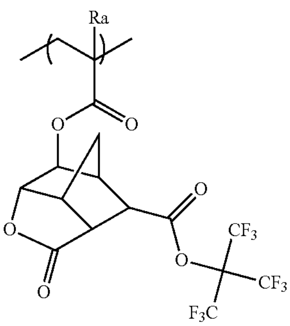
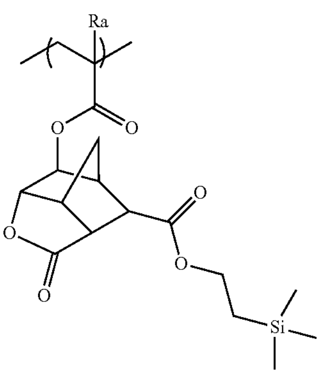
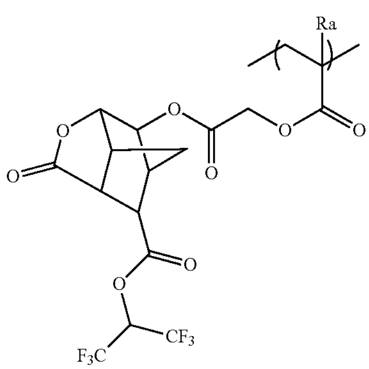
-continued
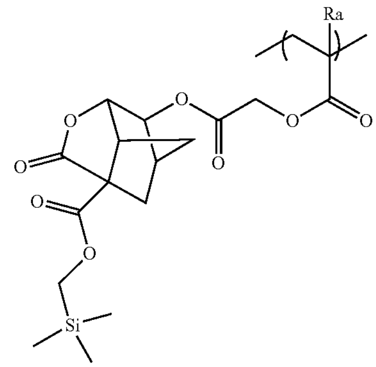
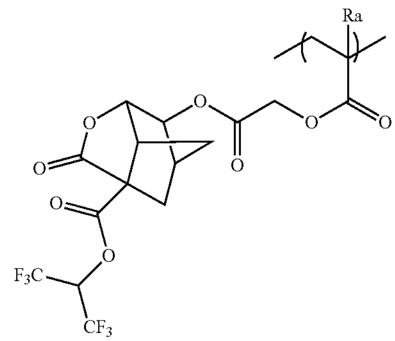
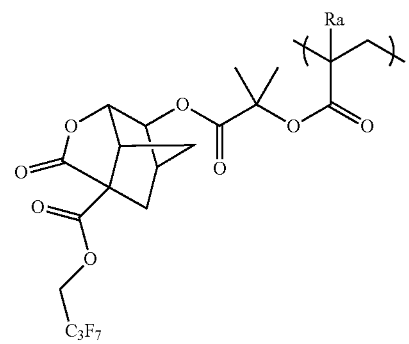
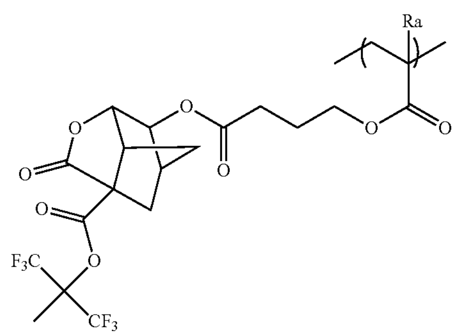
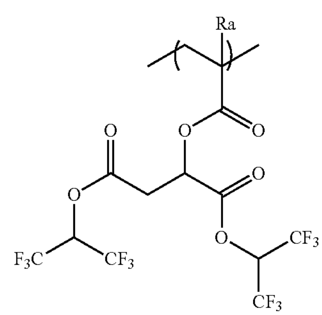

-continued
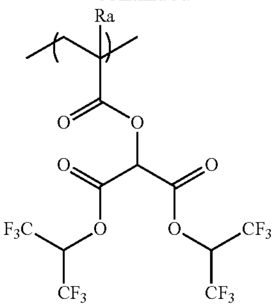
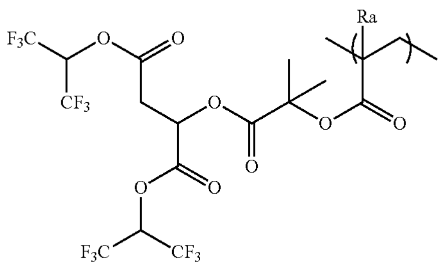
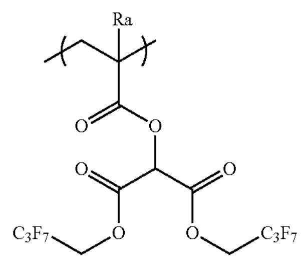
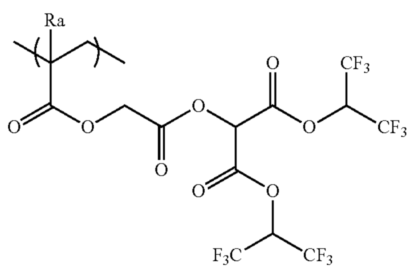
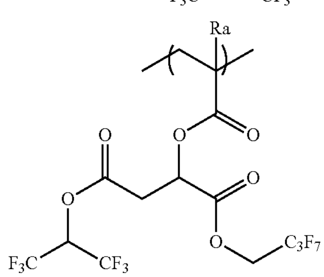
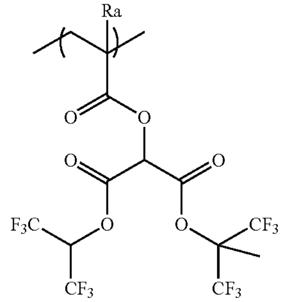
-continued
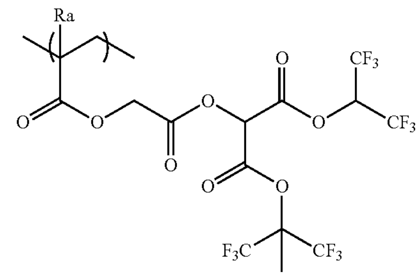
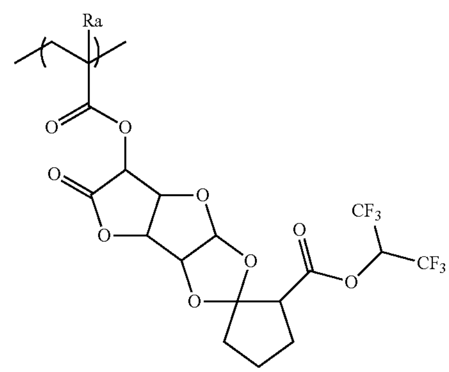
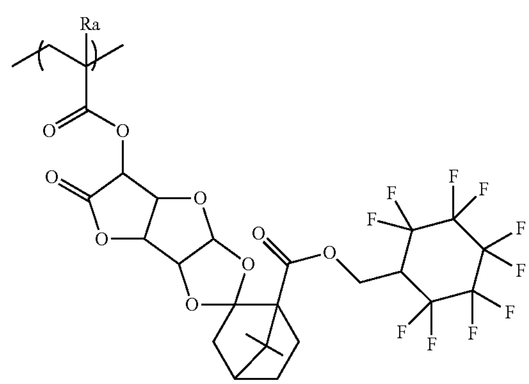
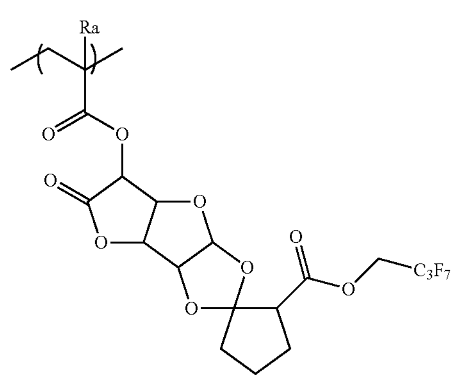

-continued
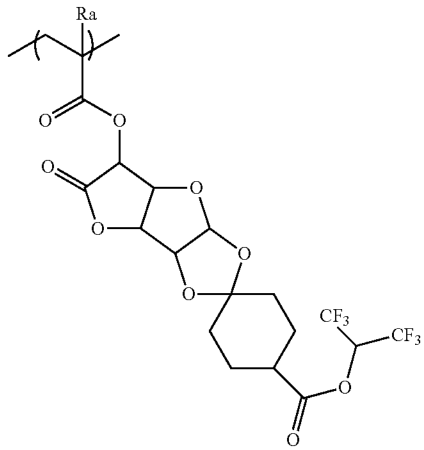
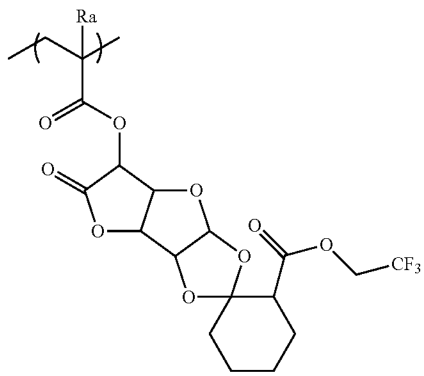
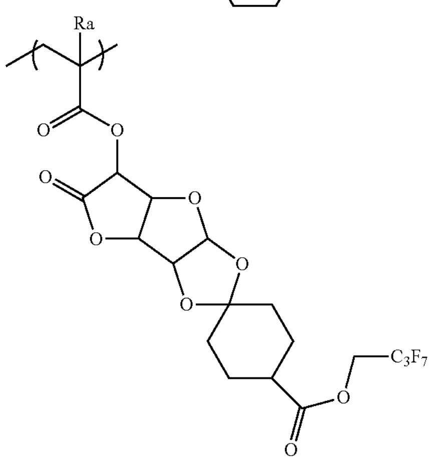
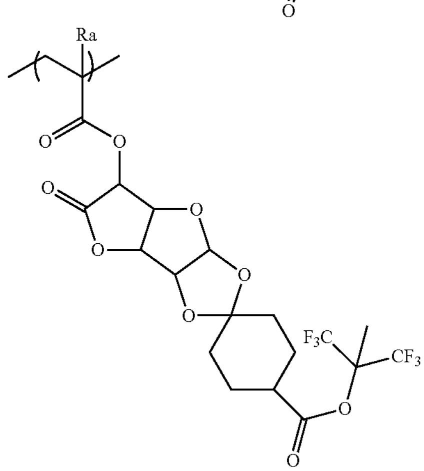
-continued
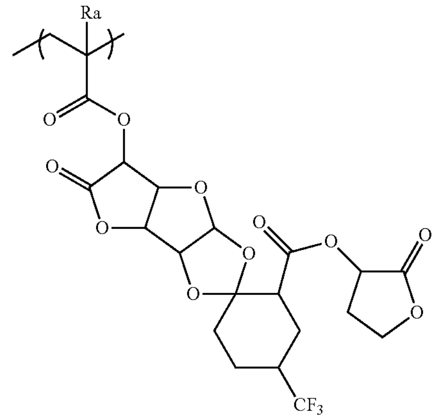
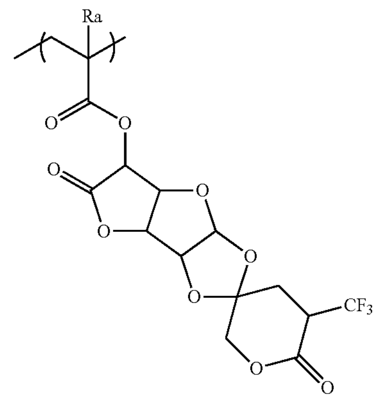
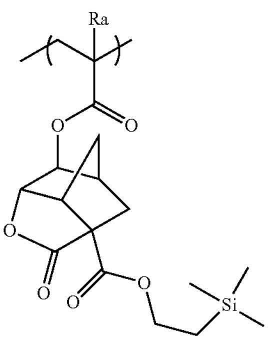
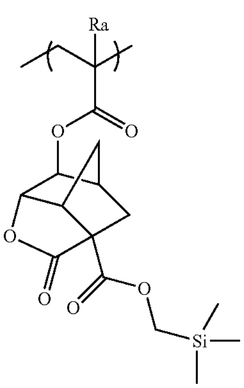

-continued
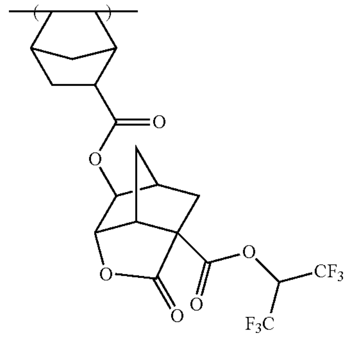
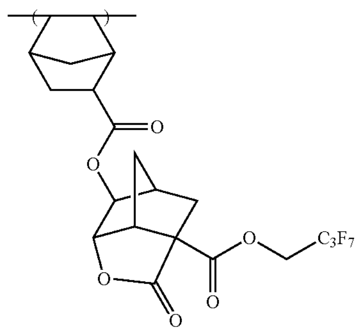
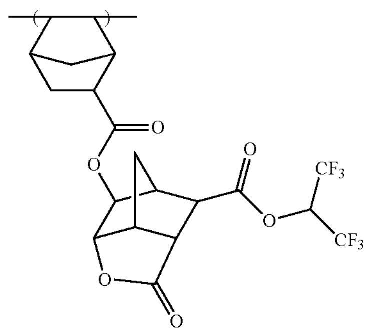
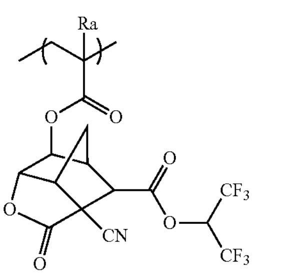
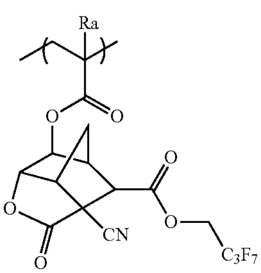
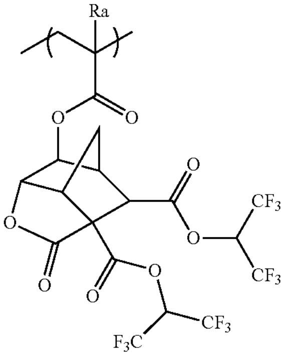
-continued
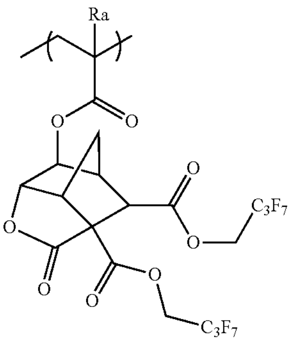
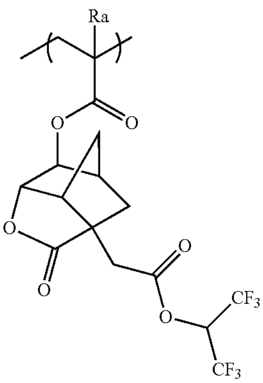
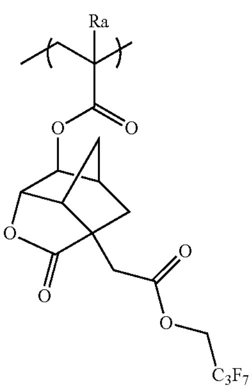
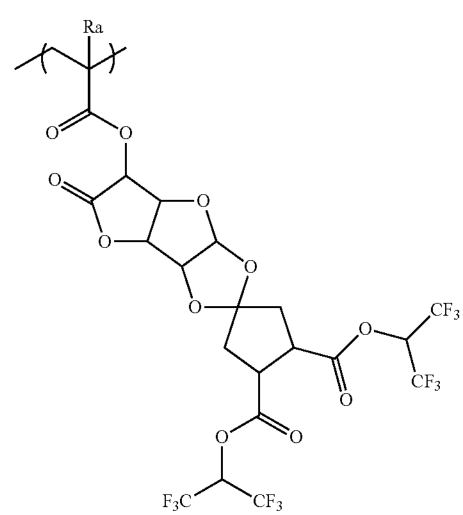

-continued
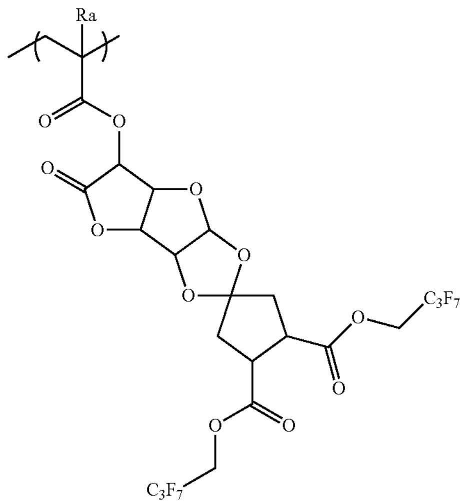
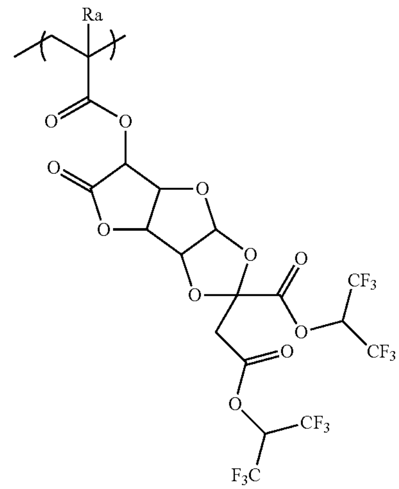
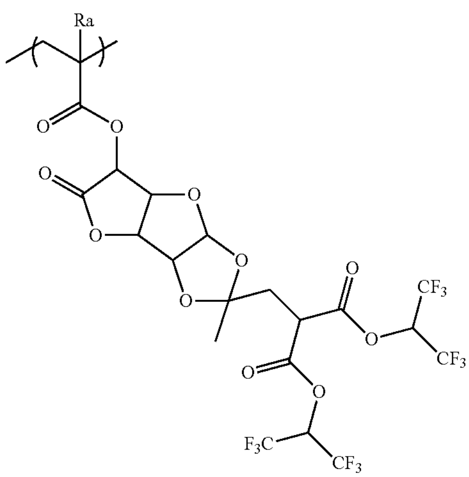
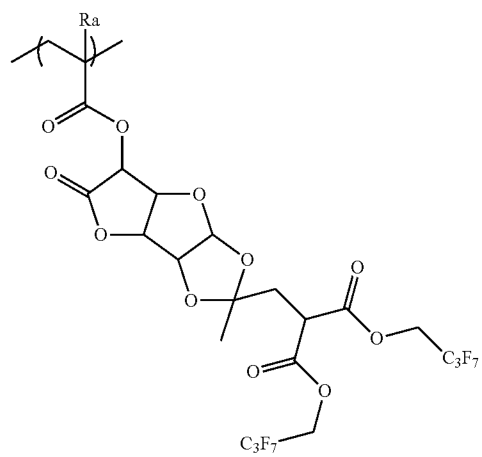
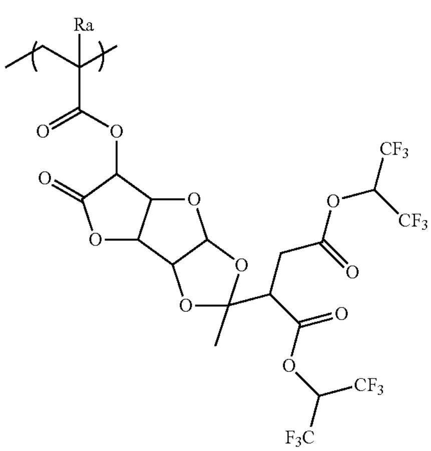
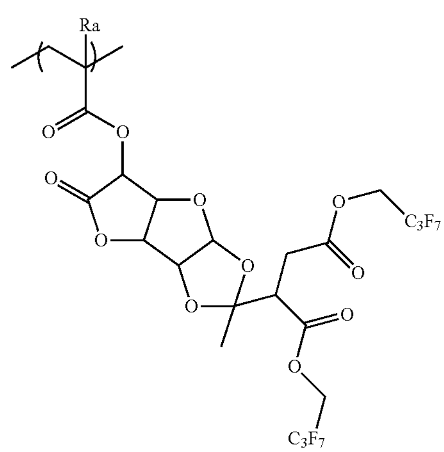

-continued

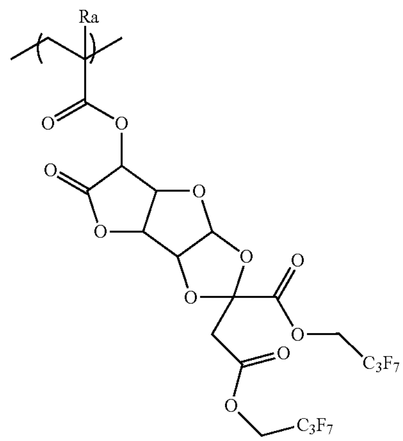

The content of the repeating unit (c) containing at least one polarity conversion group, based on all the repeating units of the hydrophobic resin, is preferably in the range of 10 to 100 mol %, more preferably 20 to 100 mol %, further more preferably 30 to 100 mol % and most preferably 40 to 100 mol %.

When the hydrophobic resin comprises a repeating unit simultaneously containing on its one side chain at least two polarity conversion groups and at least either a fluorine atom or a silicon atom, the content of this repeating unit, based on all the repeating units of the hydrophobic resin, is preferably in the range of 10 to 100 mol %, more preferably 20 to 100 mol %, further more preferably 30 to 100 mol % and most preferably 40 to 100 mol %.

When the hydrophobic resin comprises both a repeating unit containing at least two polarity conversion groups but containing neither a fluorine atom nor a silicon atom and a repeating unit containing at least either a fluorine atom or a silicon atom, the preferred contents of these repeating units are as follows. Namely, the content of the former repeating unit, based on all the repeating units of the hydrophobic resin, is preferably in the range of 10 to 90 mol %, more preferably 15 to 85 mol %, further more preferably 20 to 80 mol % and most preferably 25 to 75 mol %. The content of the latter repeating unit, based on all the repeating units of the hydrophobic resin, is preferably in the range of 10 to 90 mol %, more preferably 15 to 85 mol %, further more preferably 20 to 80 mol % and most preferably 25 to 75 mol %.

When the hydrophobic resin comprises a repeating unit in which at least two polarity conversion groups are introduced in its one side chain while at least either a fluorine atom or a silicon atom is introduced in its another side chain within the same repeating unit, the content of this repeating unit is preferably in the range of 10 to 100 mol %, more preferably 20 to 100 mol %, further more preferably 30 to 100 mol % and most preferably 40 to 100 mol %.

The hydrophobic resin comprising the repeating unit (c) containing at least one polarity conversion group may further comprise another repeating unit. As this other repeating unit, there can be mentioned, for example, those set forth above as the repeating units that can be contained in the hydrophobic resin.

Preferred forms of other repeating units that may be introduced in the hydrophobic resin containing a polarity conversion group are as follows.

(cy1) repeating unit that contains a fluorine atom and/or a silicon atom, being stable in an acid and poorly soluble or insoluble in an alkali developer, (cy2) repeating unit that contains neither a fluorine atom nor a silicon atom, being stable in an acid and poorly soluble or insoluble in an alkali developer, (cy3) repeating unit that contains a fluorine atom and/or a silicon atom, having a polar group other than the aforementioned groups (x) and (z), and (cy4) repeating unit that contains neither a fluorine atom nor a silicon atom, having a polar group other than the aforementioned groups (x) and (z).

The expression "poorly soluble or insoluble in an alkali developer" with respect to the repeating units (cy1) and (cy2) means that the repeating units (cy1) and (cy2) contain neither an alkali-soluble group nor a group that produces an alkali-soluble group by the action of an acid or an alkali developer (for example, an acid-decomposable group or a polarity conversion group).

It is preferred for the repeating units (cy1) and (cy2) to have an alicyclic hydrocarbon structure having no polar group.

As the repeating units (cy1) and (cy2), there can be mentioned the repeating units of general formulae (VI) to (VIII) set forth above as the repeating units that can be introduced in the hydrophobic resin. Specific examples thereof are also the same.

Further, as the repeating units (cy1) and (cy2), there can be mentioned the repeating units of general formula (CII-AB) set forth above as the repeating units that can be introduced in the hydrophobic resin. Specific examples thereof are also the same.

It is preferred for the repeating units (cy3) and (cy4) to be repeating units each having a hydroxyl group or a cyano group as a polar group. This increases the affinity to developers. The repeating units each having a hydroxyl group or a cyano group are preferably repeating units with an alicyclic hydrocarbon structure substituted with a hydroxyl group or a cyano group. The alicyclic hydrocarbon structure of the alicyclic hydrocarbon structure substituted with a hydroxyl group or a cyano group is preferably an adamantyl group, a diadamantyl group or a norbornyl group. As preferred alicyclic hydrocarbon structures substituted with a hydroxyl group or a cyano group, there can be mentioned a monohydroxyadamantyl group, a dihydroxyadamantyl group, a monohydroxydiadamantyl group, a dihydroxydiadamantyl group, a cyanated norbornyl group and the like.

As the repeating units with the above atomic groups, there can be mentioned those of general formulae (CAIIa) to (CAIId) below.

(CAIIa)

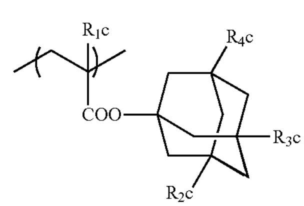

-continued (CAIIb)

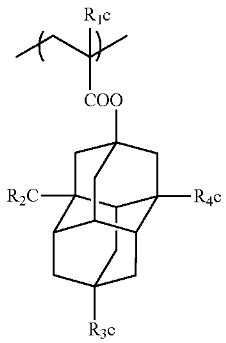

(CAIIc)

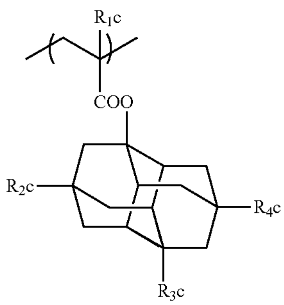

(CAIId)

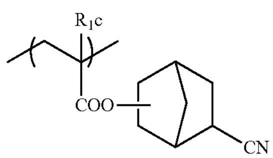

In general formulae (CAIIa) to (CAIId), $R_1c$ represents a hydrogen atom, a methyl group, a trifluoromethyl group or a hydroxymethyl group.

Each of $R_2c$ to $R_4c$ independently represents a hydrogen atom, a hydroxyl group or a cyano group, providing that at least one of the $R_2c$ to $R_4c$ represents a hydroxyl group or a cyano group.

Preferably, one or two of the $R_2c$ to $R_4c$ are hydroxyl groups and the remainder is a hydrogen atom. In general formula (CAIIa), more preferably, two of the $R_2c$ to $R_4c$ are hydroxyl groups and the remainder is a hydrogen atom.

Specific examples of the repeating units (cy3) and (cy4) will be shown below, which however in no way limit the scope of the present invention.

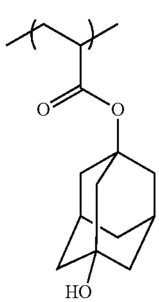

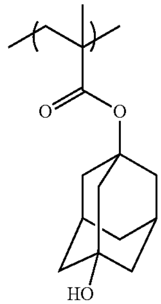

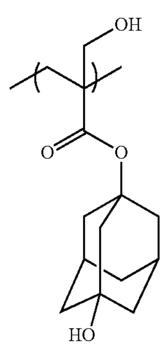

-continued

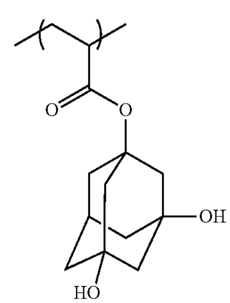

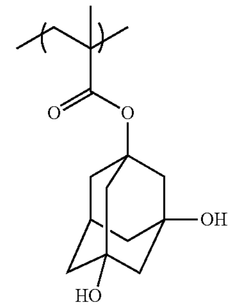

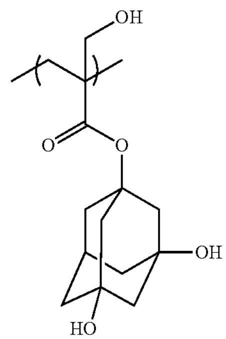

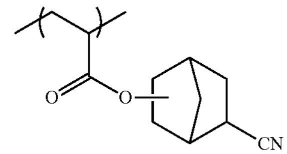

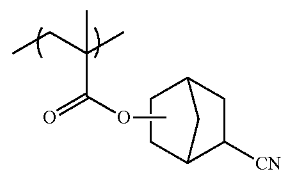

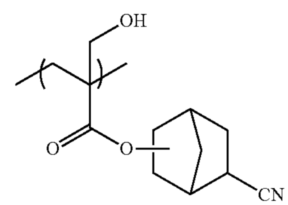

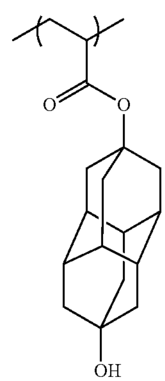

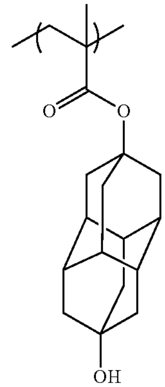

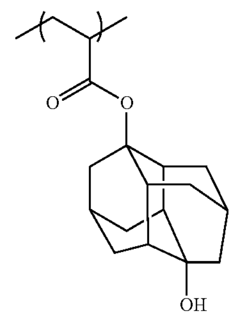

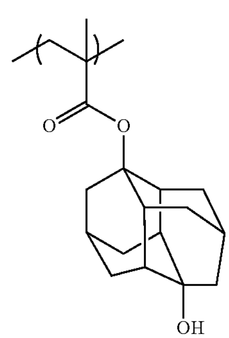

The content of the repeating units (cy1) to (cy4), based on all the repeating units of the resin comprising a repeating unit containing a polarity conversion group, is preferably in the range of 5 to 40 mol %, more preferably 5 to 30 mol % and further more preferably 10 to 25 mol %.

A plurality of repeating units (cy1) to (cy4) may be introduced in the hydrophobic resin.

When the hydrophobic resin (HR) has a fluorine atom, the content ratio of fluorine atom(s) is preferably in the range of 5 to 80 mass %, more preferably 10 to 80 mass %, based on the molecular weight of the hydrophobic resin (HR). The repeating unit containing a fluorine atom preferably exists in the hydrophobic resin (HR) in an amount of 10 to 100 mass %, more preferably 30 to 100 mass %, based on all the repeating units of the resin (HR).

When the hydrophobic resin (HR) has a silicon atom, the content ratio of silicon atom(s) is preferably in the range of 2 to 50 mass %, more preferably 2 to 30 mass %, based on the molecular weight of the hydrophobic resin (HR). The repeating unit containing a silicon atom preferably exists in the hydrophobic resin (HR) in an amount of 10 to 90 mass %, more preferably 20 to 80 mass %, based on all the repeating units of the resin (HR).

The weight average molecular weight of the hydrophobic resin (HR) in terms of standard polystyrene molecular weight is preferably in the range of 1000 to 100,000, more preferably 1000 to 50,000 and still more preferably 2000 to 15,000.

The rate of hydrolysis of the hydrophobic resin in an alkali developer is preferably 0.001 nm/sec or greater, more preferably 0.01 nm/sec or greater, further more preferably 0.1 nm/sec or greater and most preferably 1 nm/sec or greater.

Herein, the rate of hydrolysis of the hydrophobic resin in an alkali developer refers to the rate of decrease of the thickness of a film formed from the hydrophobic resin only in 23° C. TMAH solution (2.38 mass %).

The content of the hydrophobic resin (HR) in the actinic-ray- or radiation-sensitive resin composition can be appropriately regulated so that the receding contact angle of the film of the actinic-ray- or radiation-sensitive resin falls within the above-mentioned range. Based on the total solids of the actinic-ray- or radiation-sensitive resin composition, the content ratio is preferably in the range of 0.01-10 mass %, more preferably 0.1 to 9 mass % and further more preferably 0.5 to 8 mass %.

Impurities, such as metals, should naturally be of low quantity in the hydrophobic resin (HR), as described for the acid-decomposable resin. The content ratio of residual monomers and oligomer components is preferably 0 to 10 mass %, more preferably 0 to 5 mass % and still more preferably 0 to 1 mass %. Accordingly, there can be obtained a resist being free from a change of in-liquid foreign matter, sensitivity, etc. over time. From the viewpoint of resolving power, resist profile, side wall of resist pattern, roughness, etc., the molecular weight distribution (Mw/Mn, also referred to as the degree of dispersal) thereof is preferably in the range of 1 to 3, more preferably 1 to 2, still more preferably 1 to 1.8 and most preferably 1 to 1.5.

A variety of commercially available products can be used as the hydrophobic resin (HR), and also the resin can be synthesized in accordance with conventional methods (for example, radical polymerization). As general synthesizing methods, there can be mentioned, for example, a batch polymerization method in which a monomer species and an initiator are dissolved in a solvent and heated to thereby carry out polymerization, a dropping polymerization method in which a solution of monomer species and initiator is dropped into a hot solvent over a period of 1 to 10 hours, and the like. The dropping polymerization method is preferred. As a reaction solvent, there can be mentioned, for example, an ether such as tetrahydrofuran, 1,4-dioxane or diisopropyl ether, a ketone such as methyl ethyl ketone or methyl isobutyl ketone, an ester solvent such as ethyl acetate, an amide solvent such as dimethylformamide or dimethylacetamide, or the after-mentioned solvent capable of dissolving the composition of the present invention, such as propylene glycol monomethyl ether acetate (PGMEA), propylene glycol monomethyl ether (PGME) or cyclohexanone. Preferably, the polymerization is carried out with the use of the same solvent as that used in the photosensitive composition of the present invention. This would inhibit any particle generation during storage.

The polymerization reaction is preferably carried out in an atmosphere consisting of an inert gas, such as nitrogen or argon. In the initiation of polymerization, a commercially available radical initiator (azo initiator, peroxide, etc.) is used as the polymerization initiator. Among the radical initiators, an azo initiator is preferred, and azo initiators having an ester group, a cyano group and a carboxyl group are more preferred. As specific preferred initiators, there can be mentioned azobisisobutyronitrile, azobisdimethylvaleronitrile, dimethyl 2,2'-azobis(2-methylpropionate) and the like. The reaction concentration is in the range of 5 to 50 mass %, preferably 30 to 50 mass %. The reaction temperature is generally in the range of 10° to 150° C., preferably 30° to 120° C. and more preferably 60° to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc. and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to thereby precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents and the like. Of these, it is preferred to employ a solvent containing at least an alcohol (especially methanol or the like) or water as the precipitation or re-precipitation solvent.

The amount of precipitation or re-precipitation solvent used is generally in the range of 100 to 10,000 parts by mass, preferably 200 to 2000 parts by mass and more preferably 300 to 1000 parts by mass per 100 parts by mass of the polymer solution, according to intended efficiency, yield, etc.

The temperature at which the precipitation or re-precipitation is carried out is generally in the range of about 0° to 50° C., preferably about room temperature (for example, about 20° to 35° C.), according to efficiency and operation easiness. The operation of precipitation or re-precipitation can be carried out by a publicly known method, such as a batch or continuous method, with the use of a common mixing vessel, such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° to 100° C., preferably about 30° to 50° C. at ordinary pressure or reduced pressure (preferably reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing the resin solution (A) into contact with a solvent wherein the resin is poorly soluble or insoluble amounting to less than 10 times (preferably 5 times or less) the volume of the resin solution (A) to thereby precipitate a resin solid (step d) and separating the precipitated resin (step e).

Specific examples of the hydrophobic resins (HR) will be shown below. The following Table 2 shows the molar ratio of individual repeating units (corresponding to individual repeating units in order from the left), weight average molecular weight (Mw) and degree of dispersal (Mw/Mn) with respect to each of the resins.

(C-1)

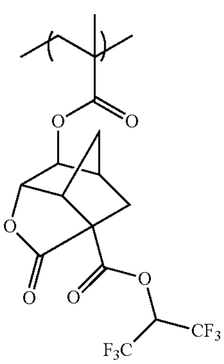

(C-2)

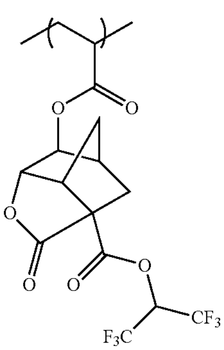

-continued (C-3)

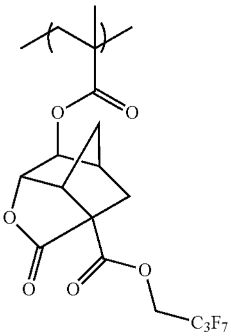

(C-4)

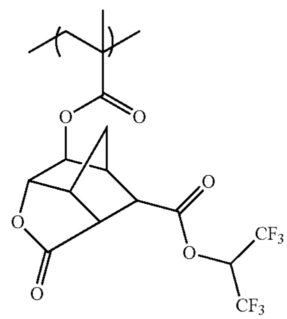

(C-5)

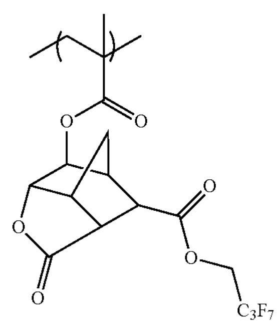

(C-6)

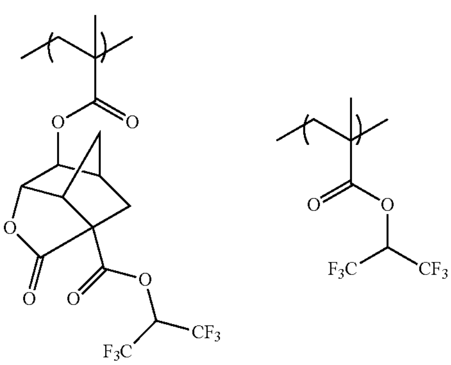

-continued
(C-7)
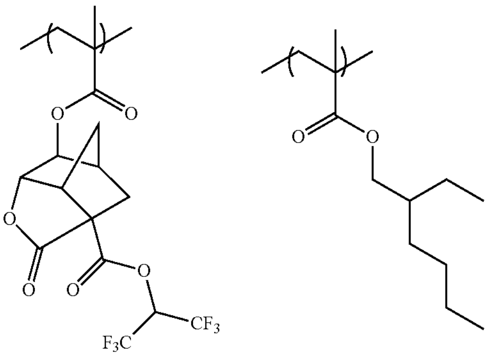
(C-8)
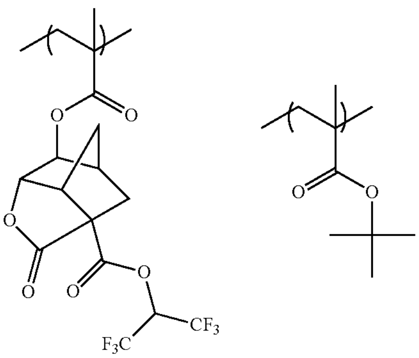
(C-9)
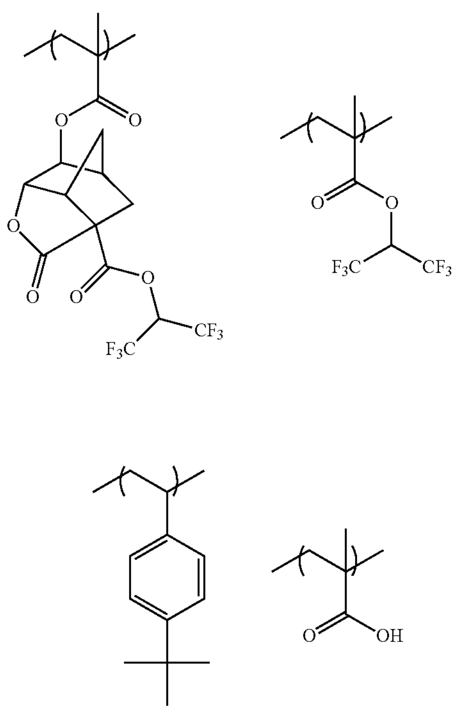
-continued
(C-10)
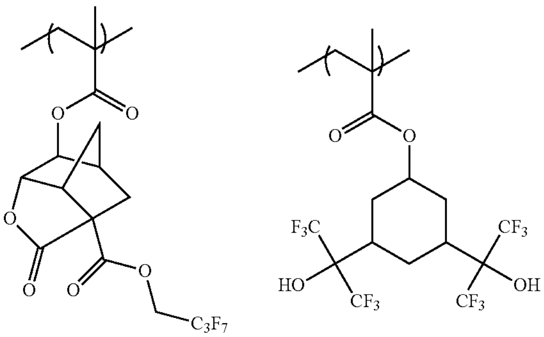
(C-11)
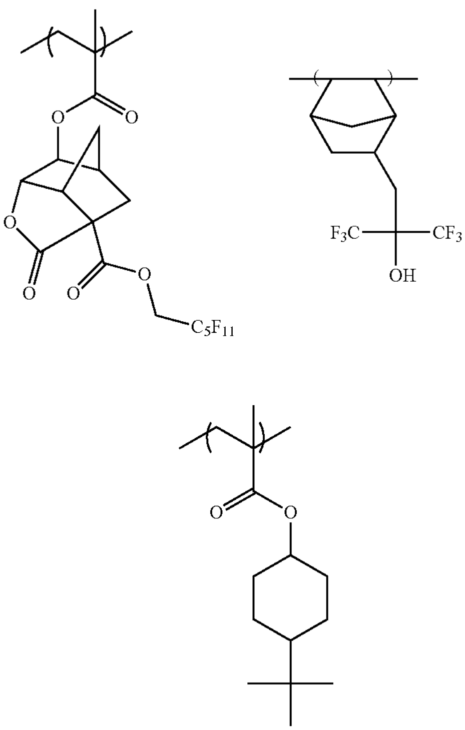
(C-12)
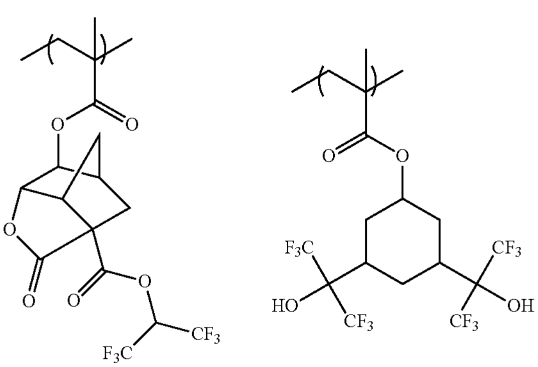

-continued
(C-13)
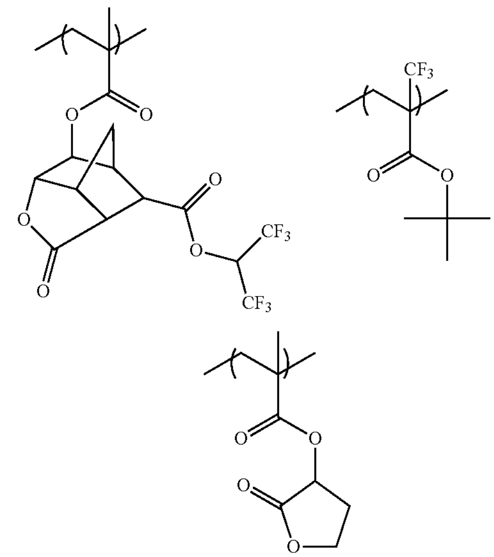
(C-14)
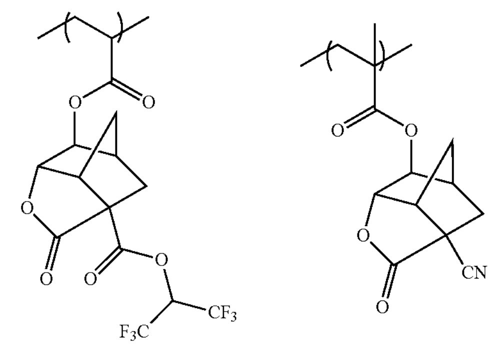
(C-15)
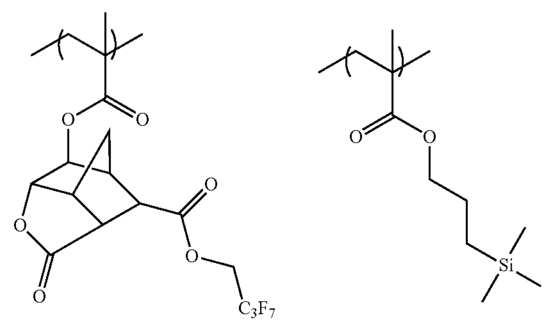
(C-16)
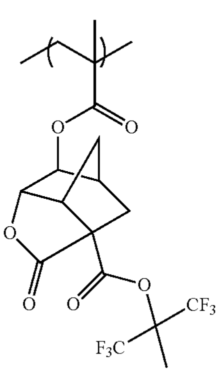
-continued
(C-17)
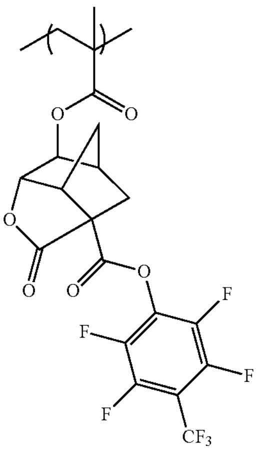
(C-18)
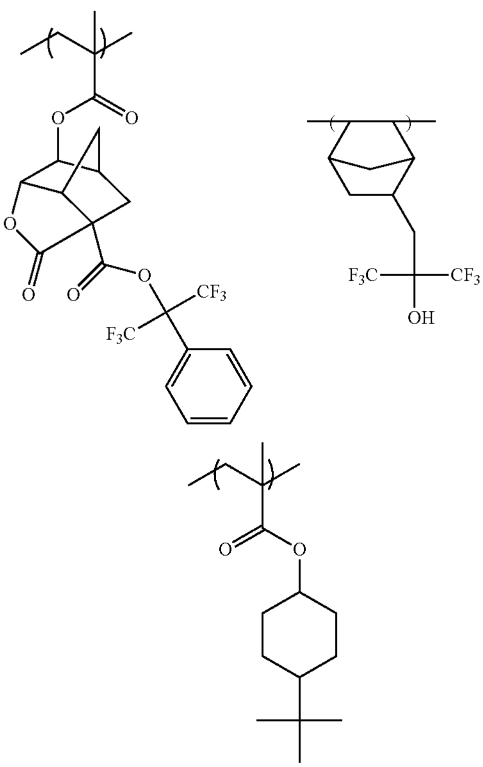
(C-19)
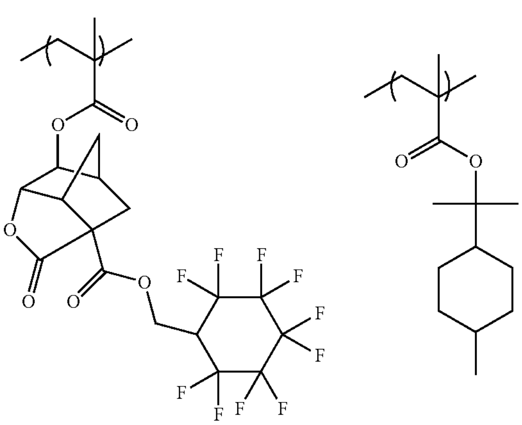

-continued
(C-20)
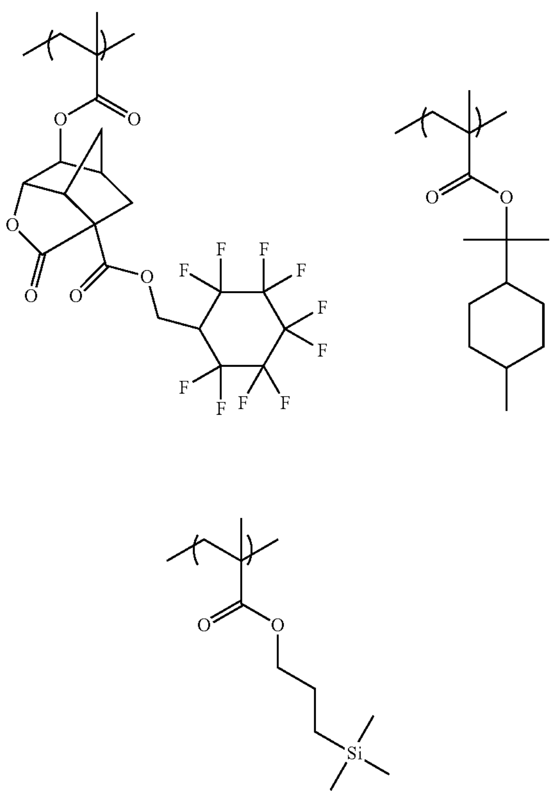
(C-21)
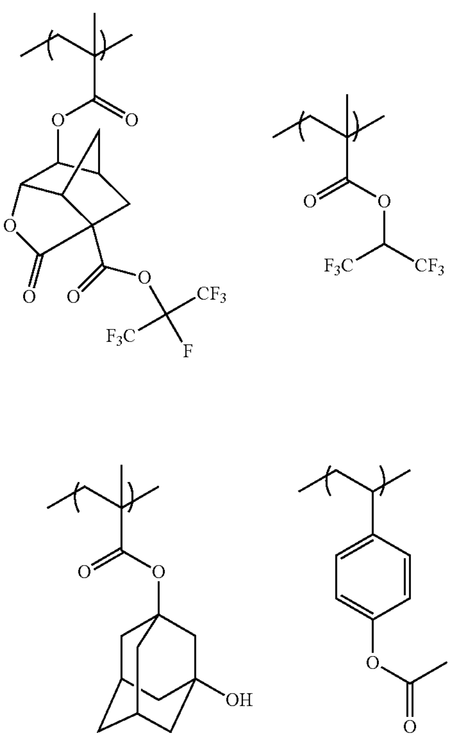
-continued
(C-22)
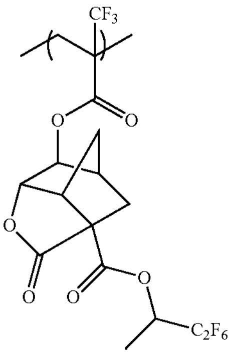
(C-23)
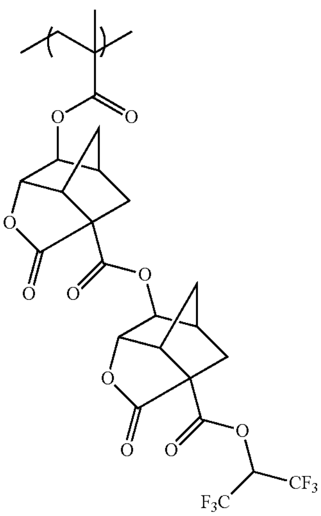
(C-24)
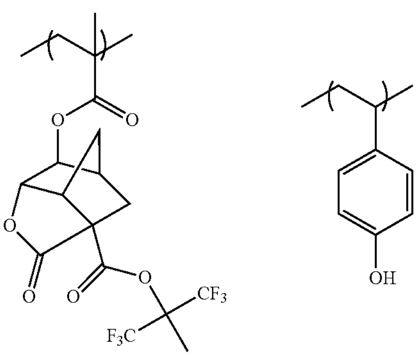
(C-25)
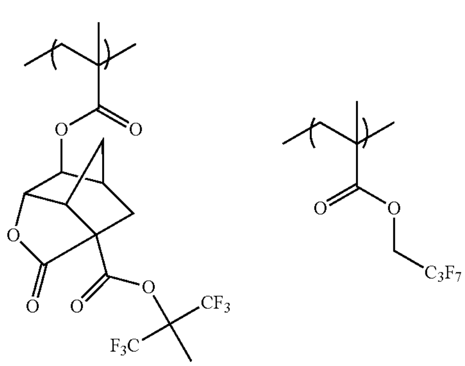

-continued
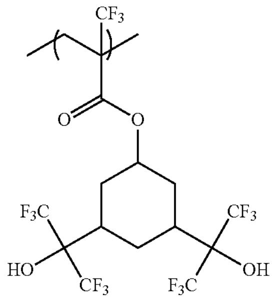
(C-26)
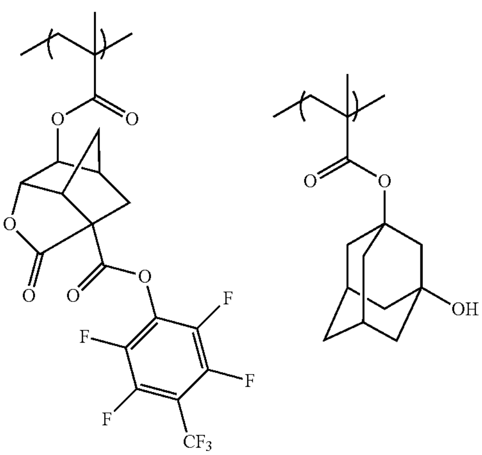
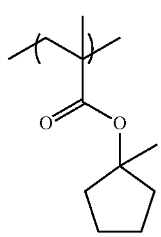
(C-27)
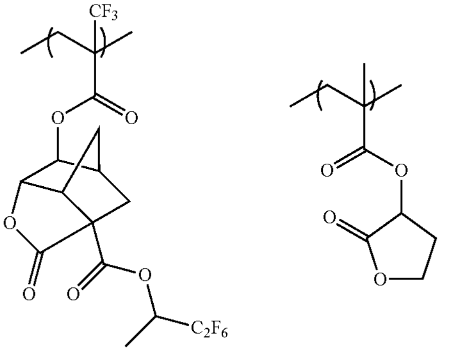
-continued
(C-28)
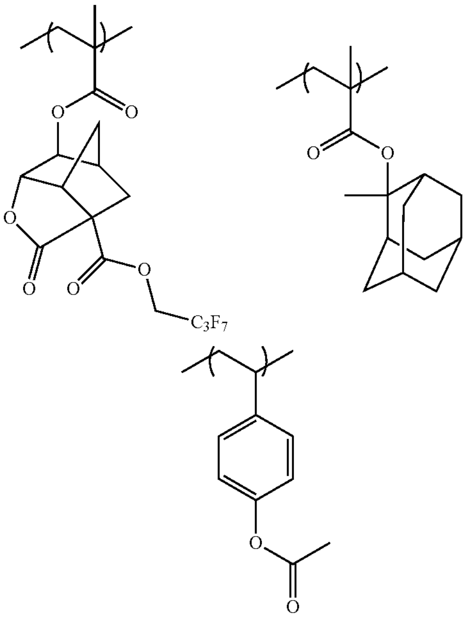
(C-29)
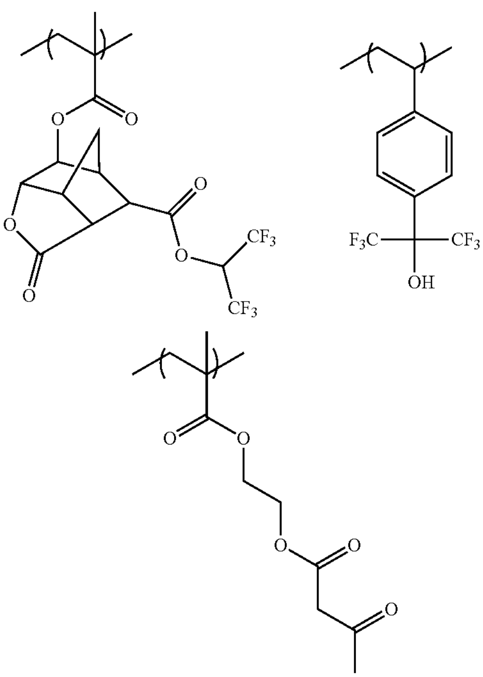
(C-30)
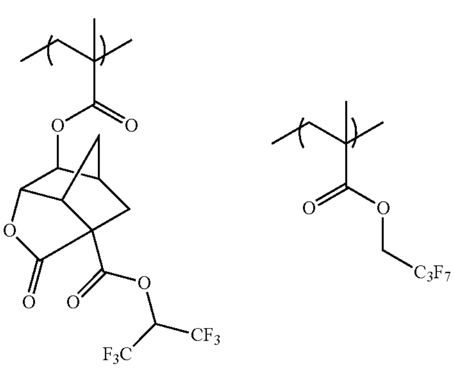

-continued
(C-31)
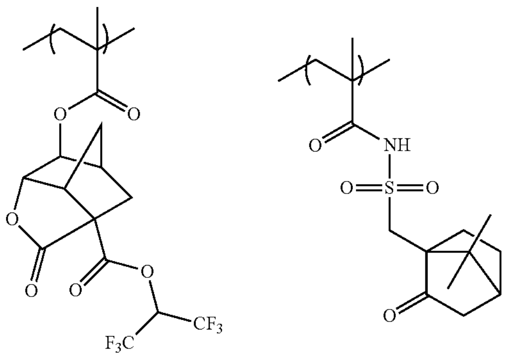
(C-32)
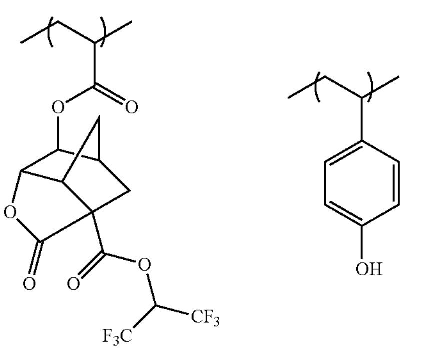
(C-33)
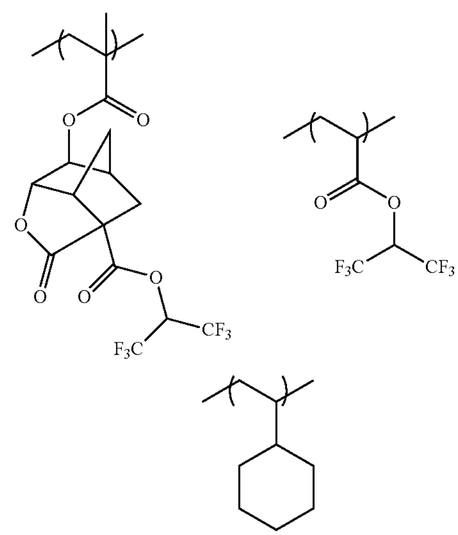
(C-34)
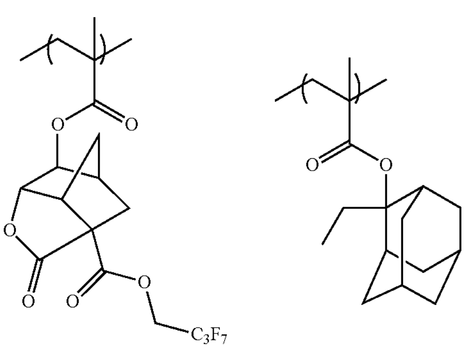
-continued
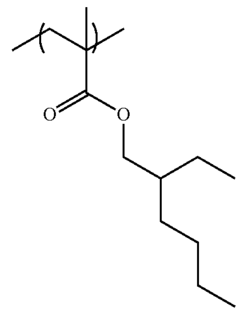
(C-35)
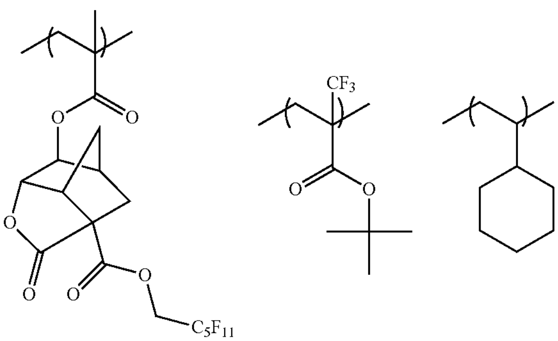
(C-36)
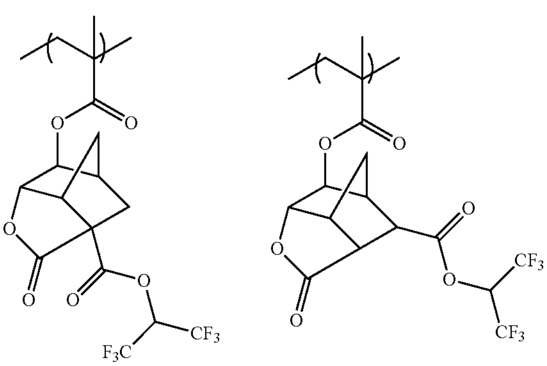
(C-37)
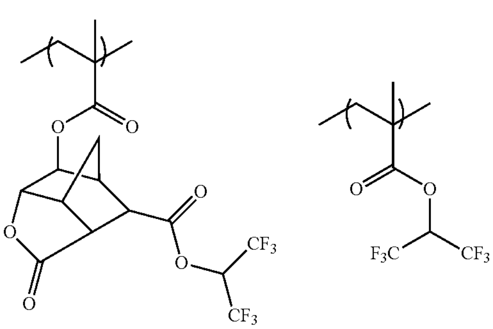

-continued
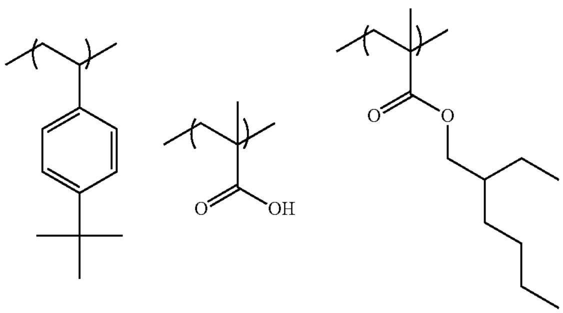
(C-38)
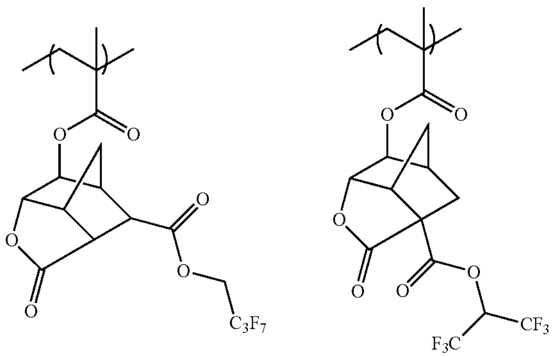
(C-39)
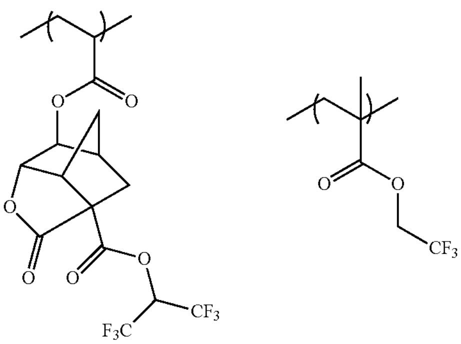
(C-40)
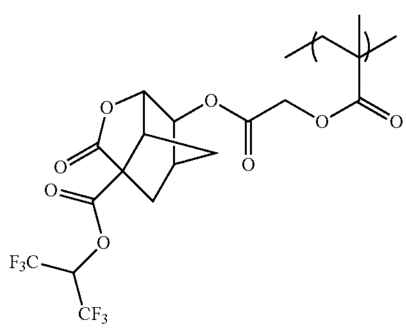
-continued
(C-41)
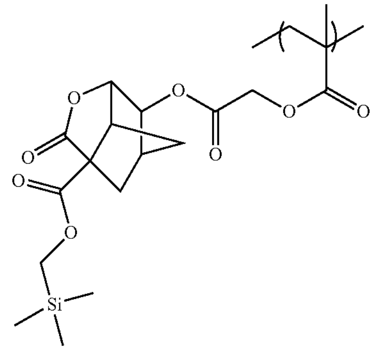
(C-42)
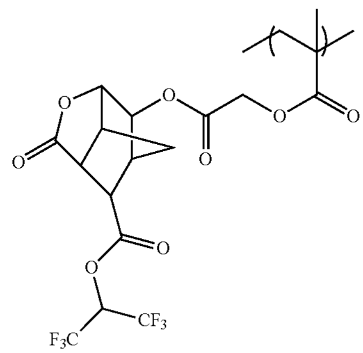
(C-43)
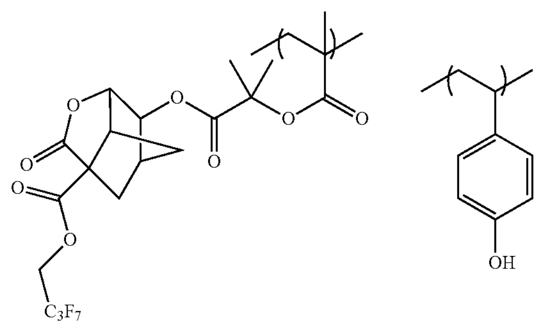
(C-44)
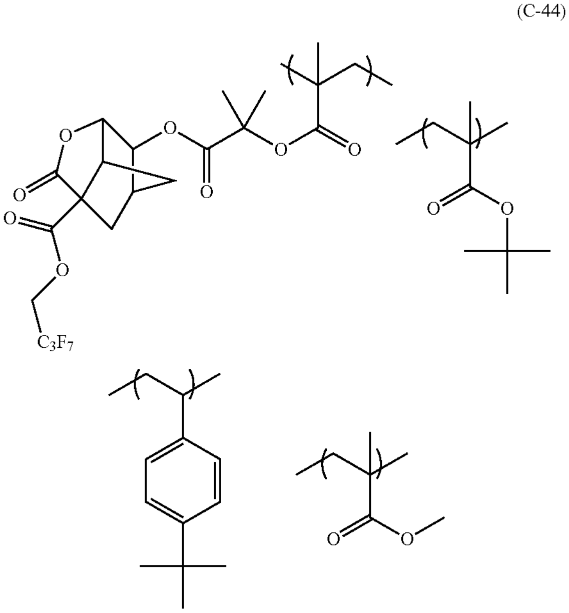

-continued
(C-45)
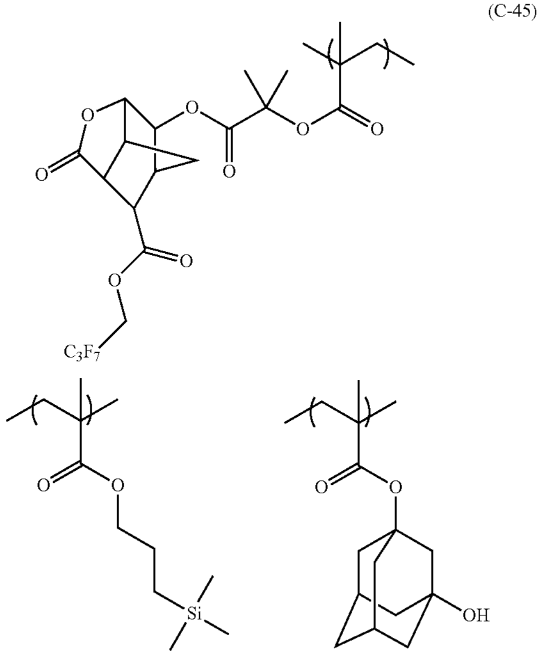
(C-46)
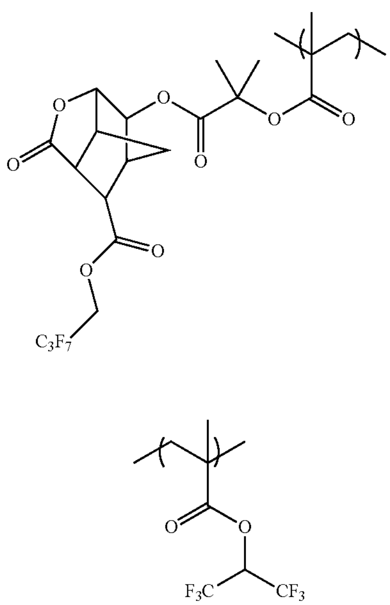
(C-47)
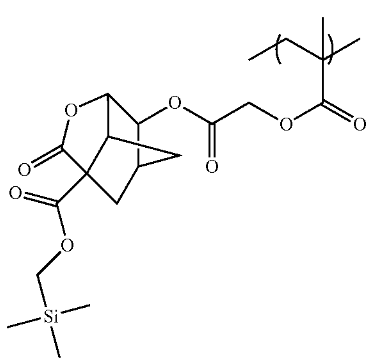
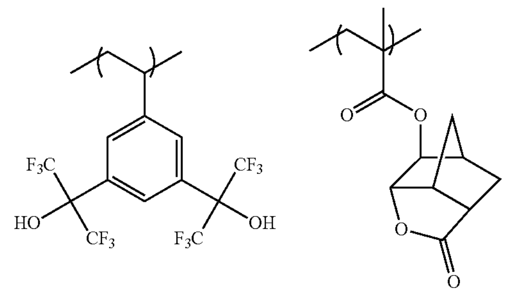
(C-48)
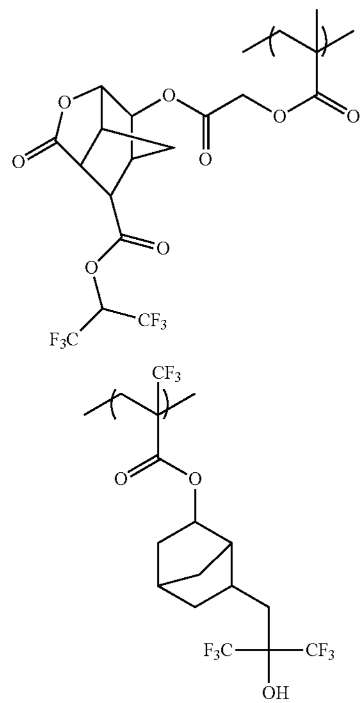
(C-49)
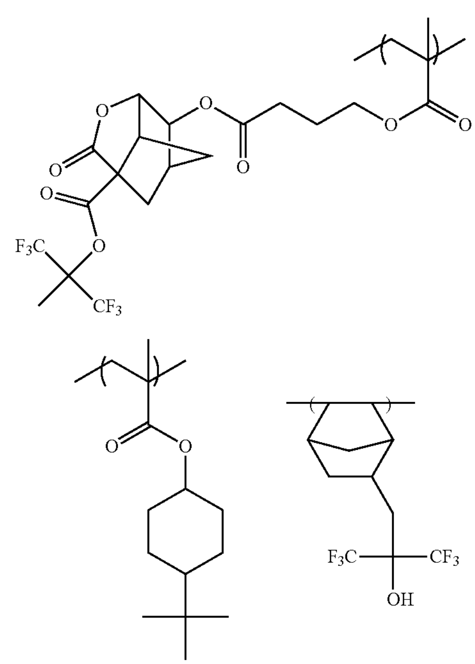

(C-50)
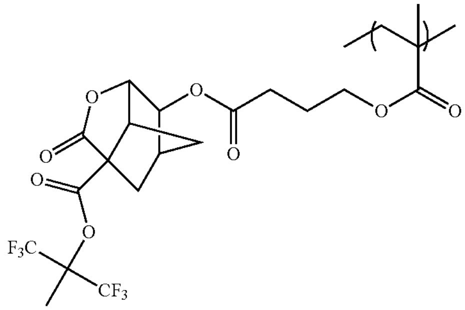
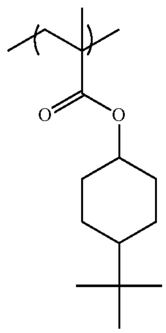
(C-51)
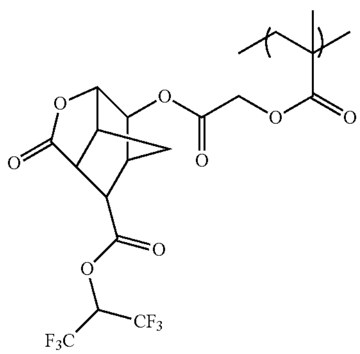
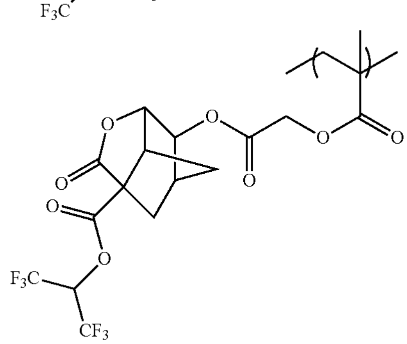
(C-52)
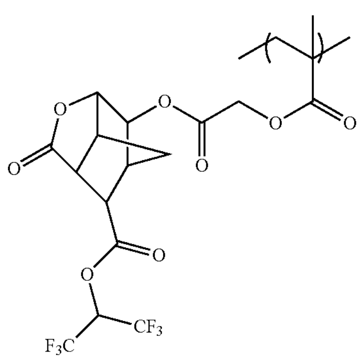
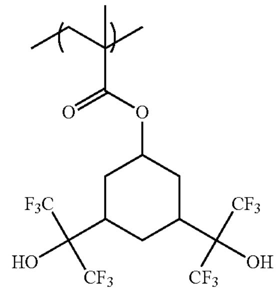
(C-53)
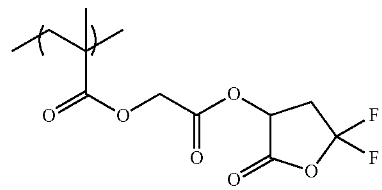
(C-54)
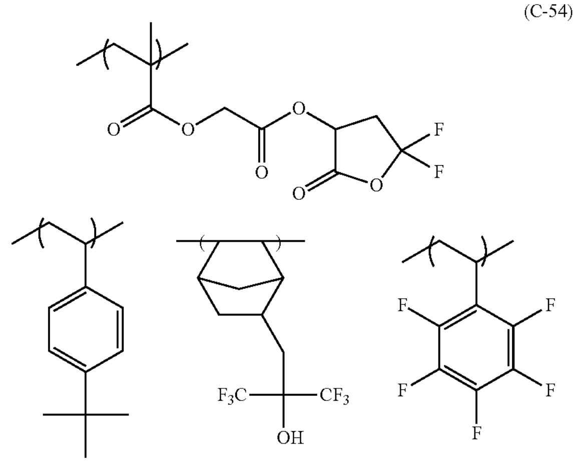
(C-55)
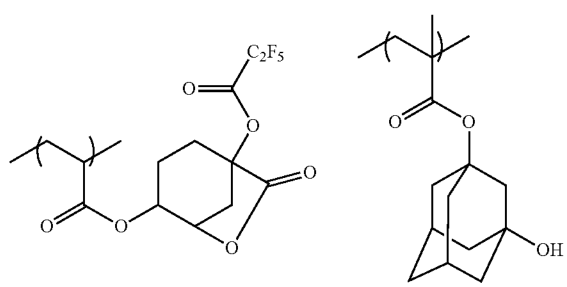
(C-56)
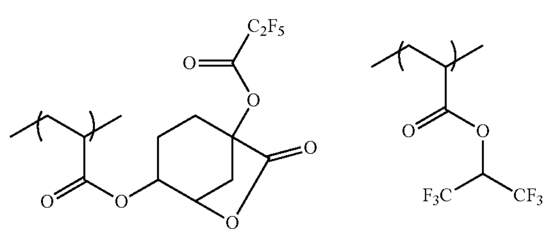

-continued
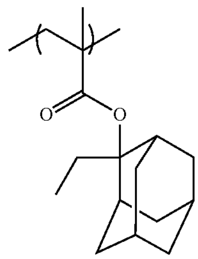
(C-57
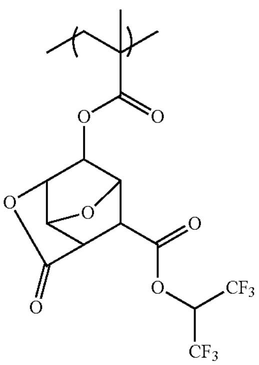
(C-58)
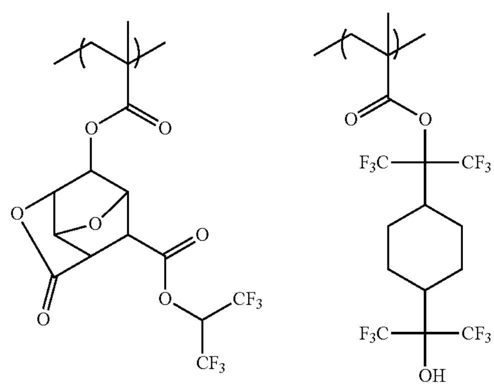
(C-59)
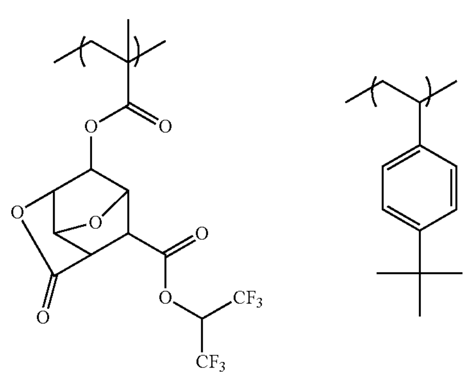
-continued
(C-60)
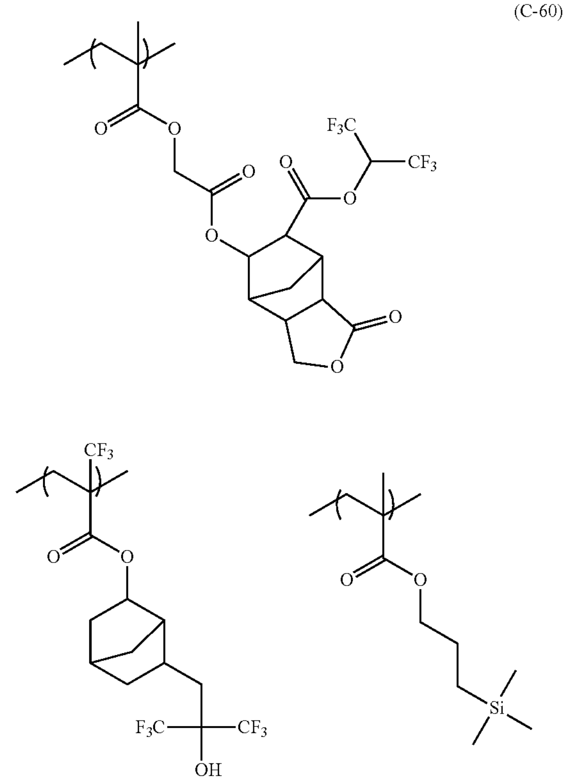
(C-61)
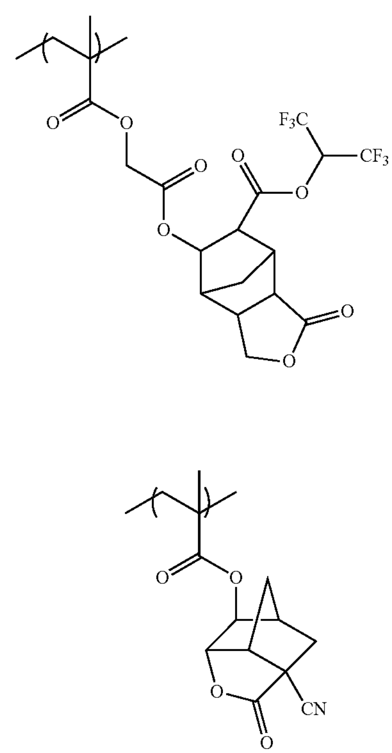

-continued
(C-62)
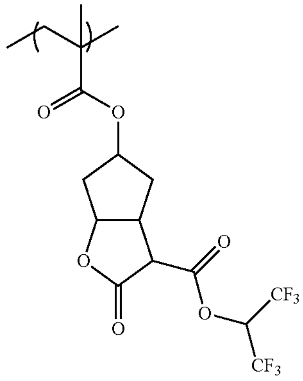
(C-63)
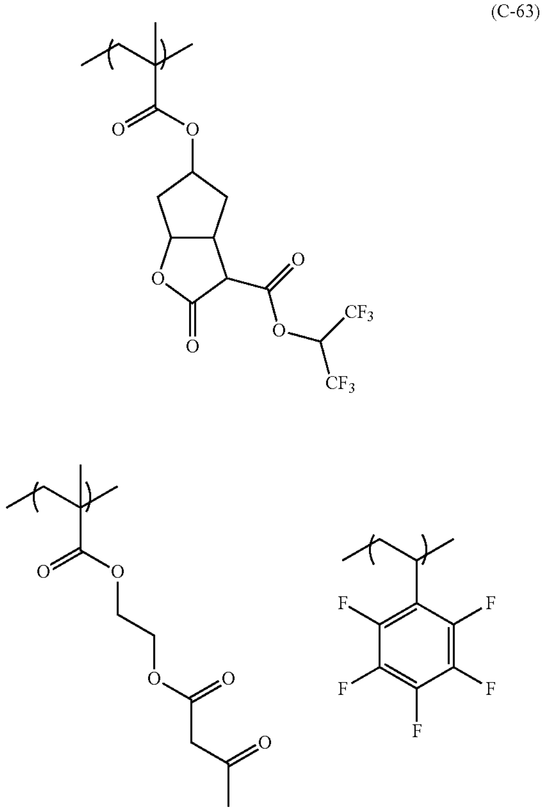
(C-64)
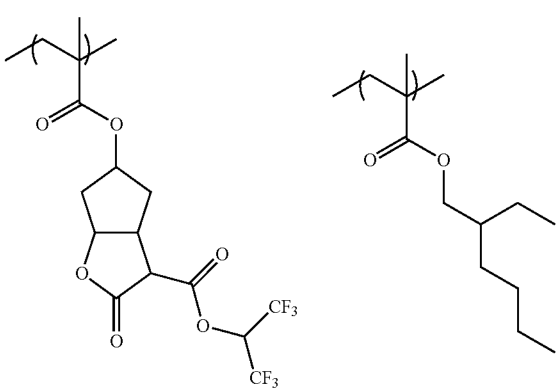
-continued
(C-65)
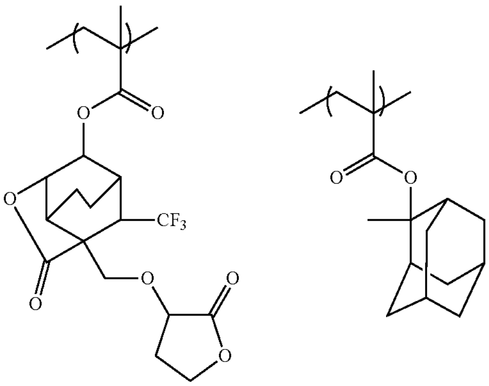
(C-66)
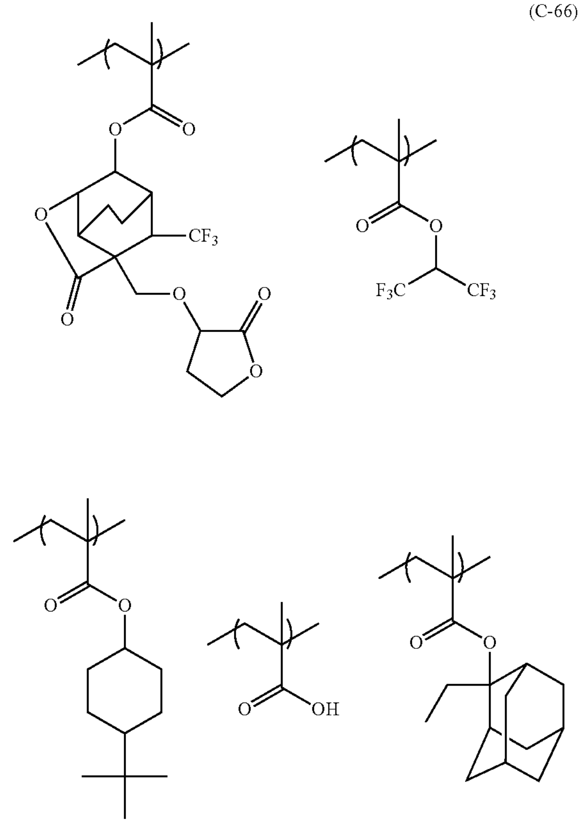
(C-67)
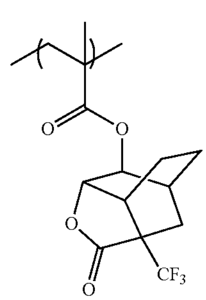

-continued
(C-68)
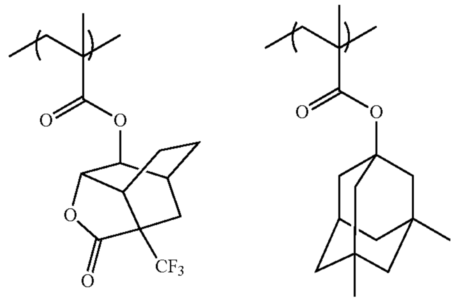
(C-69)
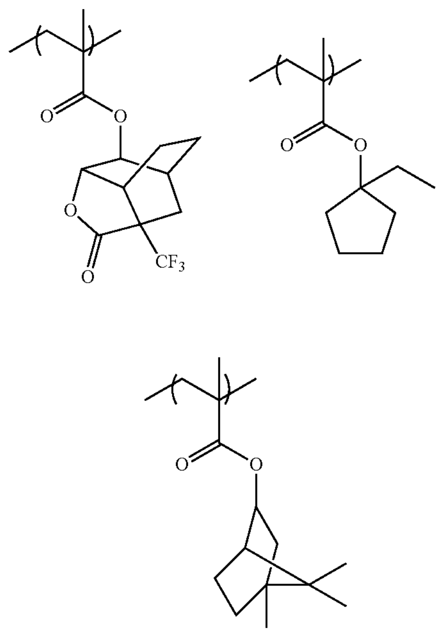
(C-70)
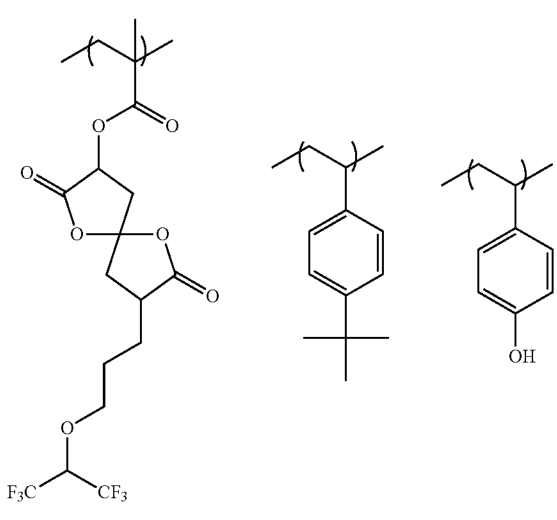
-continued
(C-71)
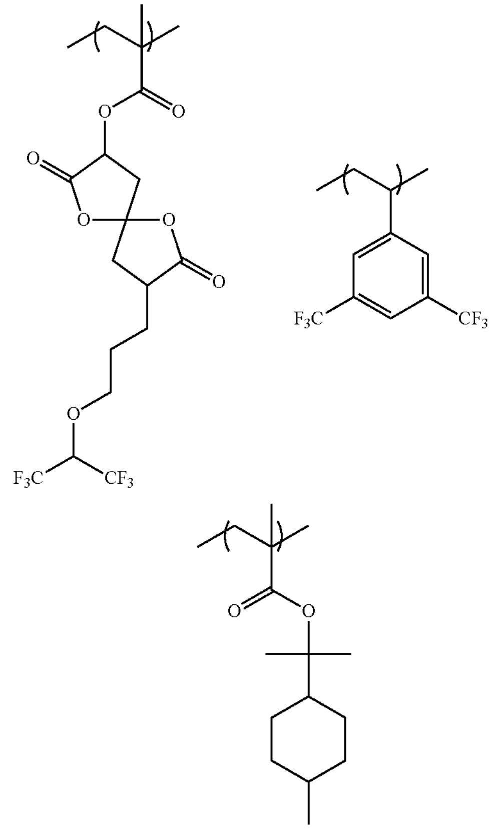
(C-72)
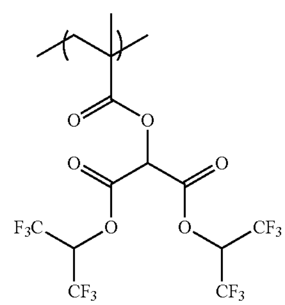
(C-73)
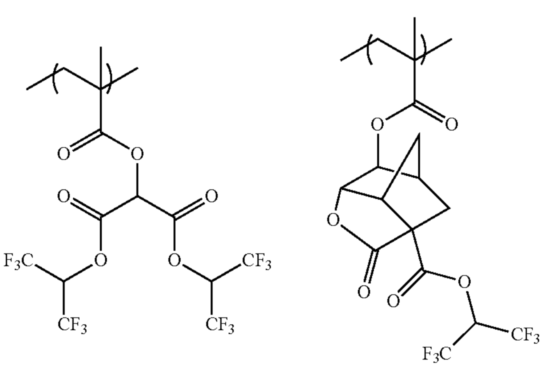

-continued
(C-74)
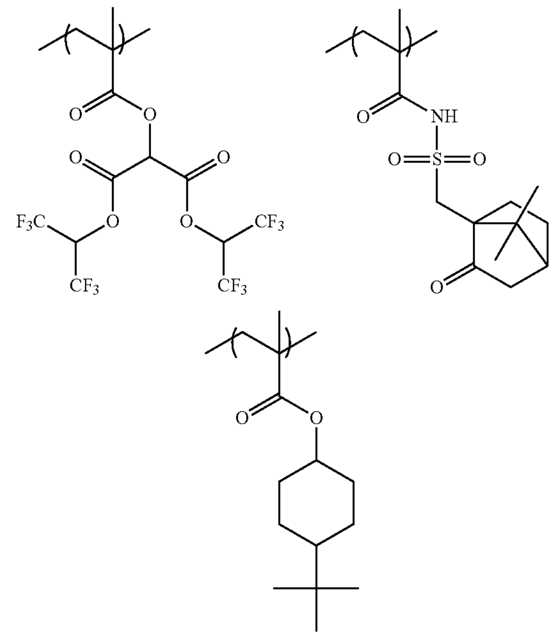
(C-75)
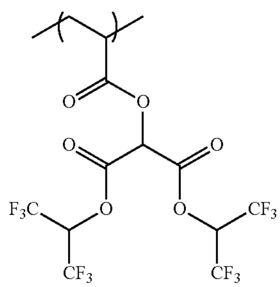
(C-76)
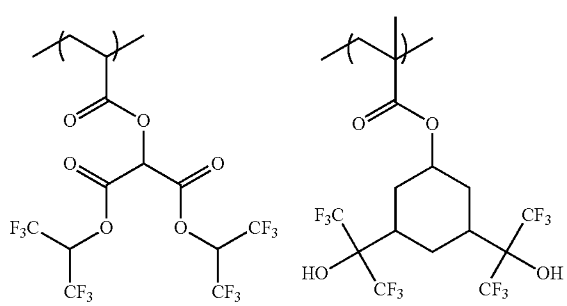
(C-77)
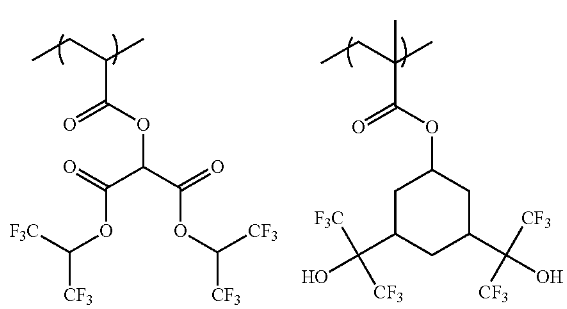
-continued
(C-78)
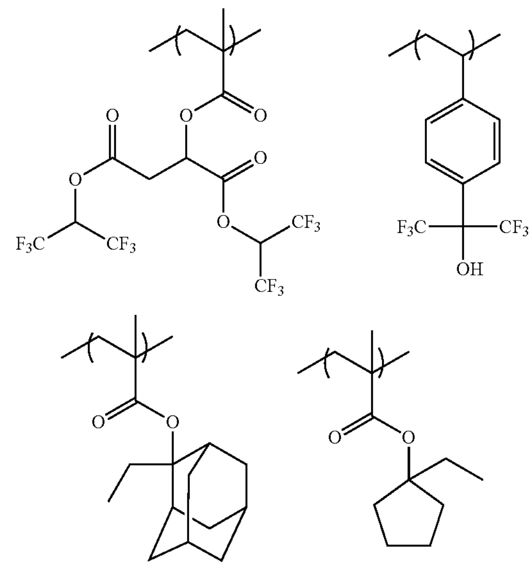
(C-79)
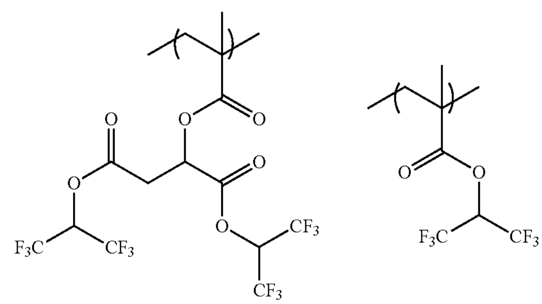
(C-80)
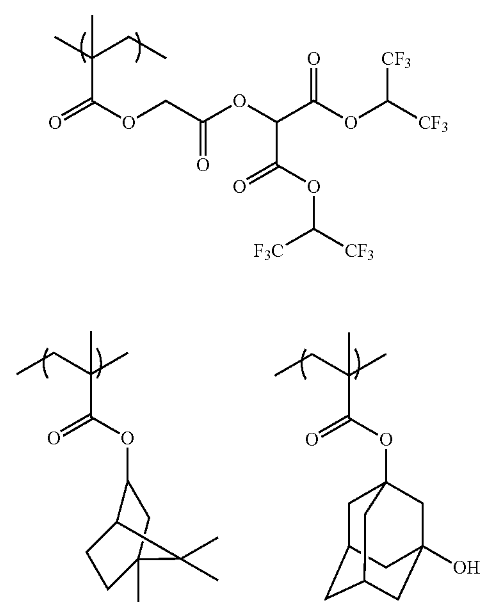

-continued
(C-81)
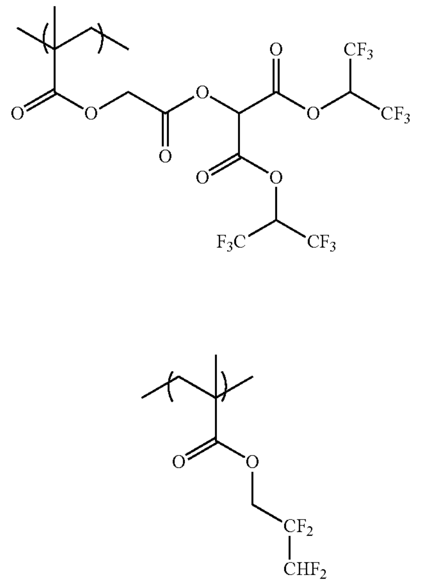
(C-82)
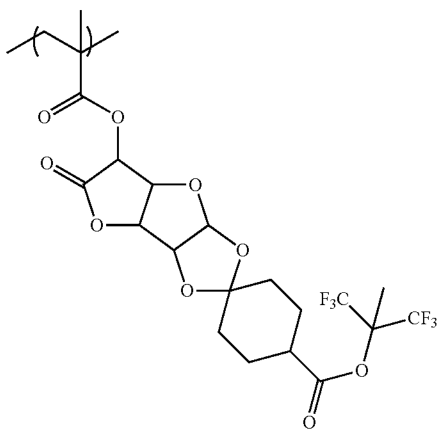
(C-83)
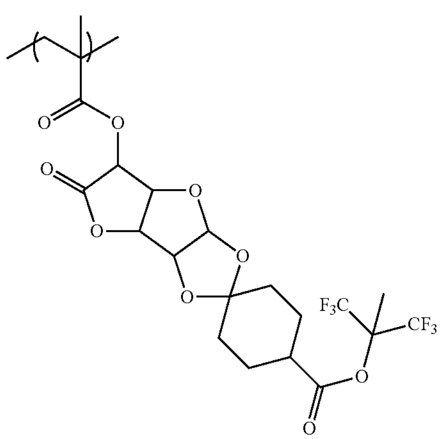
-continued
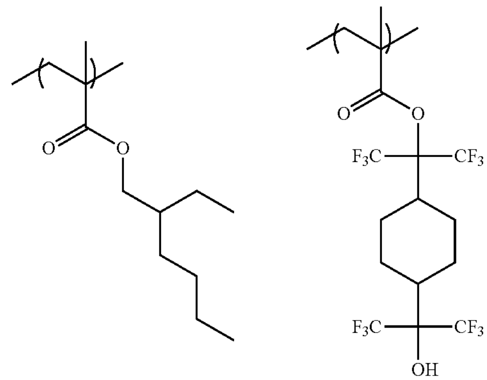
(C-84)
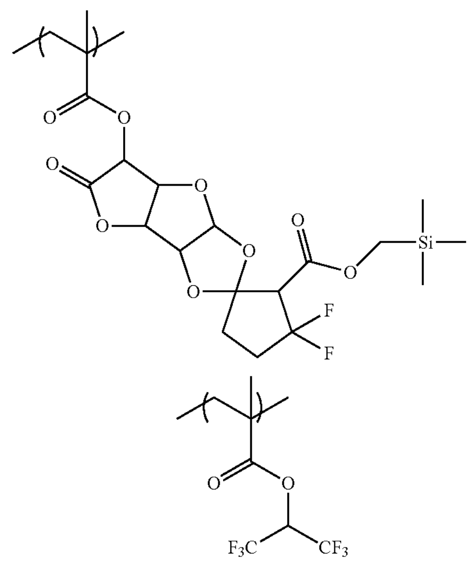
(C-85)
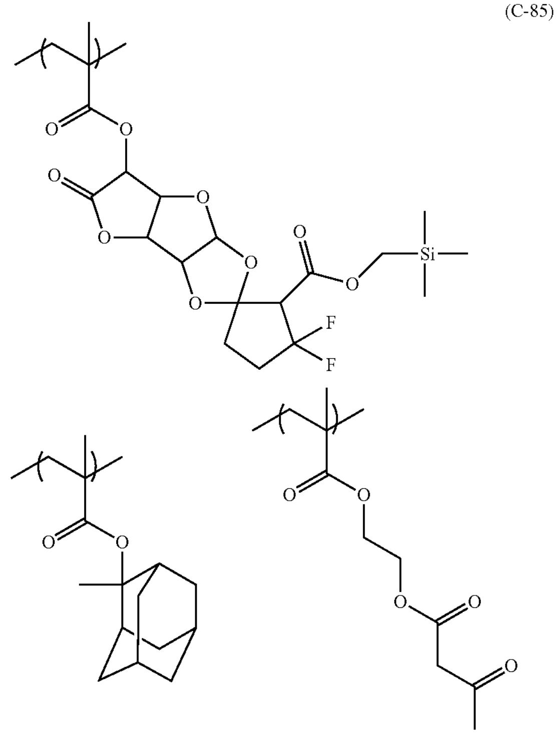

-continued
(C-86)
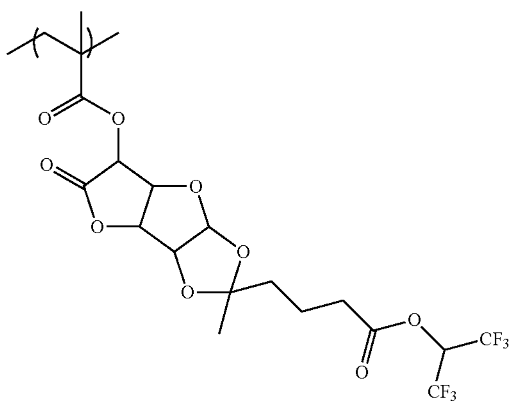
(C-87)
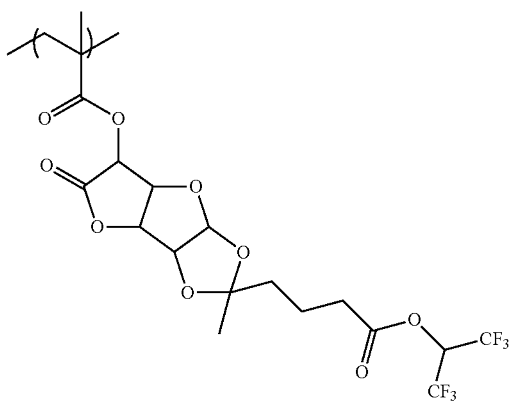
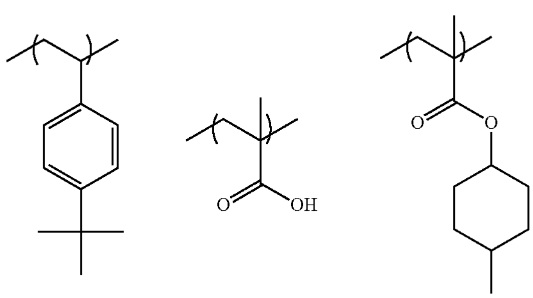
(C-88)
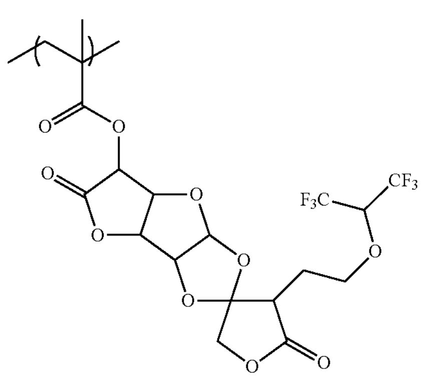
-continued
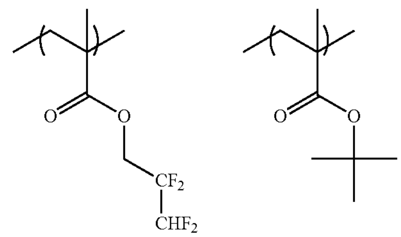
(C-89)
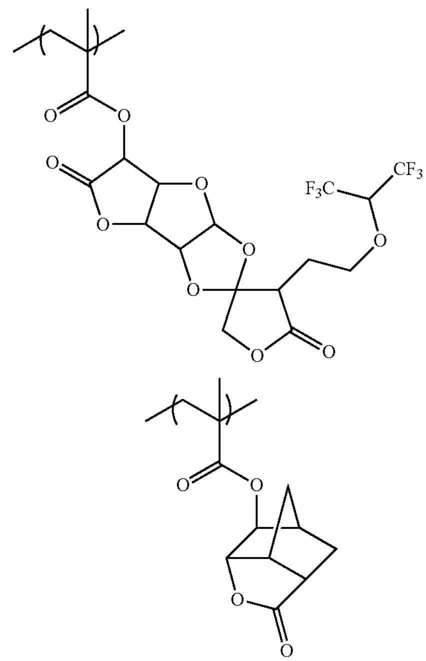
(C-90)
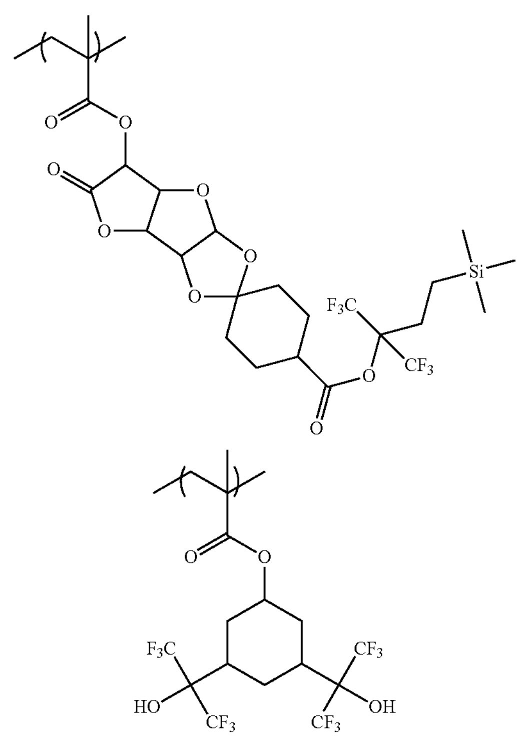

-continued
(C-91)
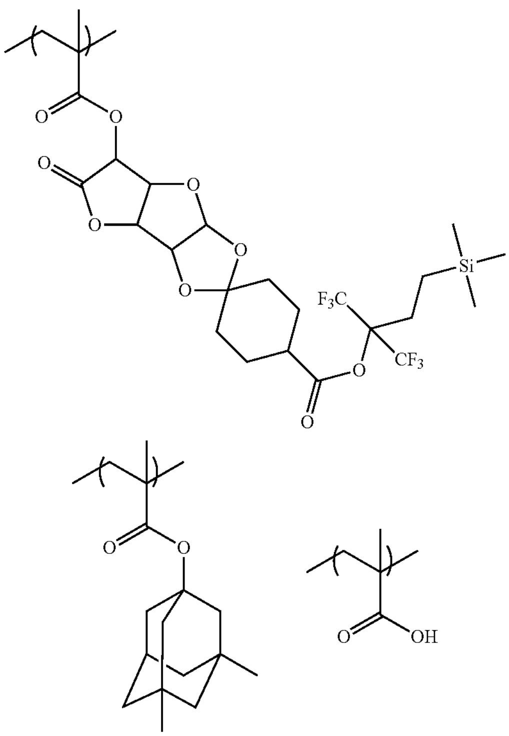
(C-92)
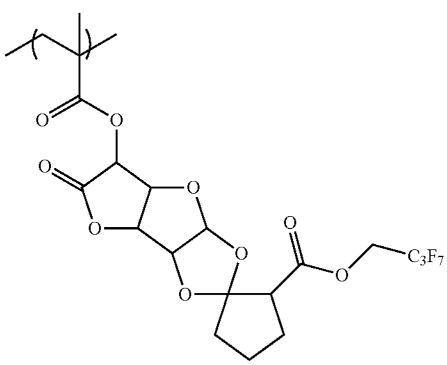
(C-93)
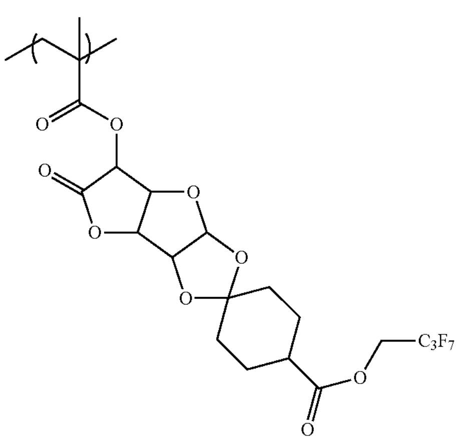
-continued
(C-94)
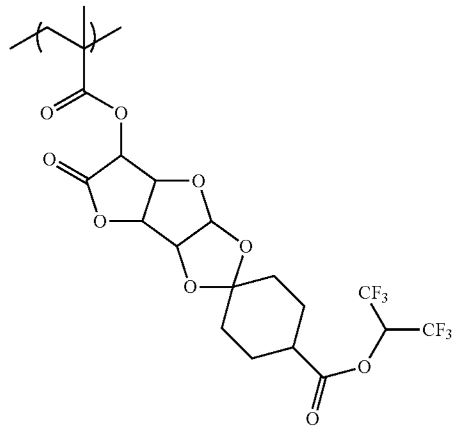
(C-95)
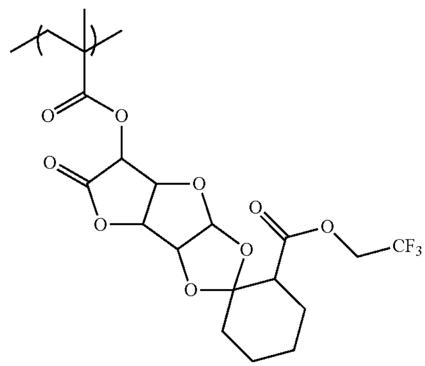
(C-96)
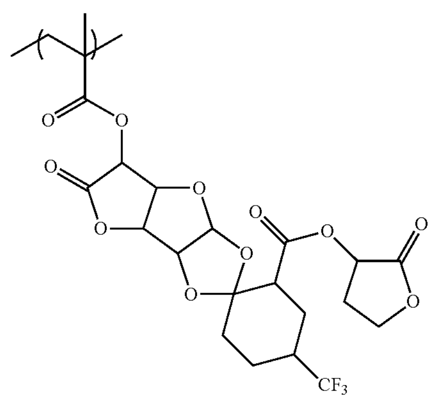
(C-97)
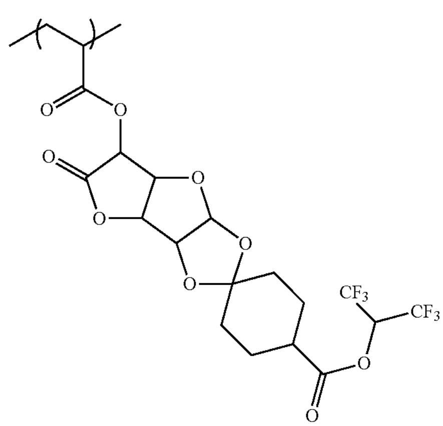

-continued
(C-98)
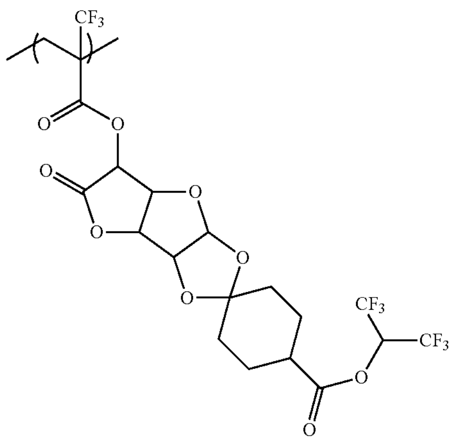
(C-99)
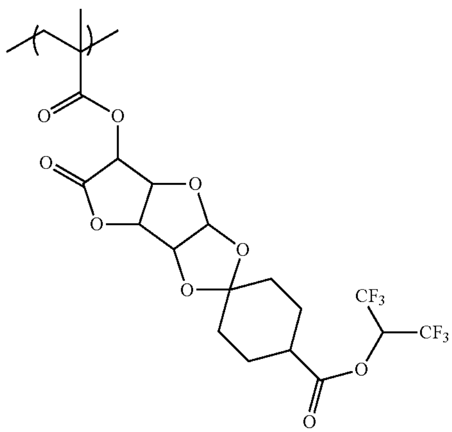
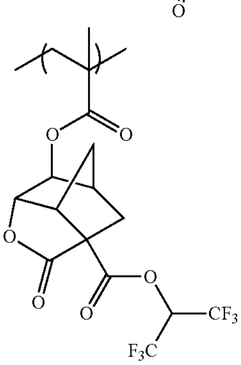
(C-100)
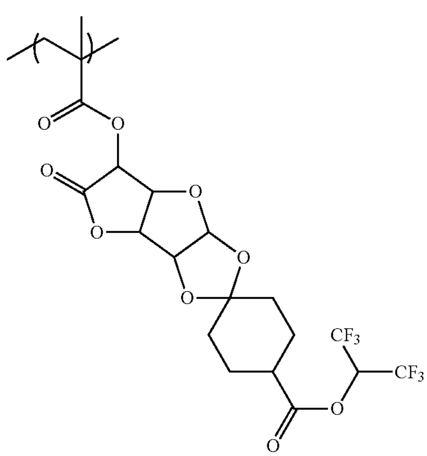
-continued
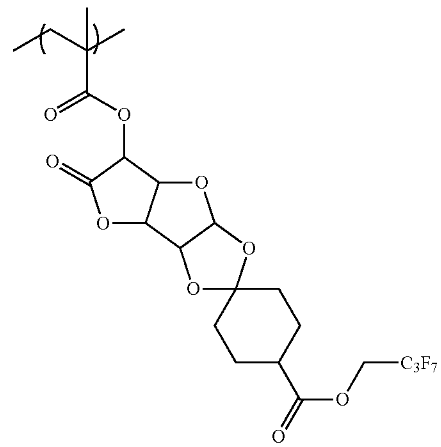
(C-101)
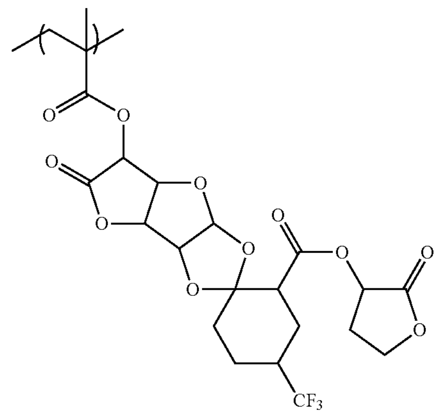
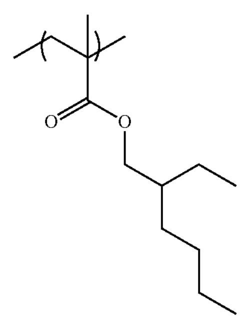
(C-102)
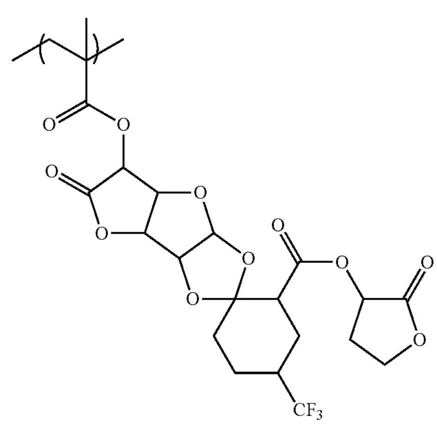

-continued
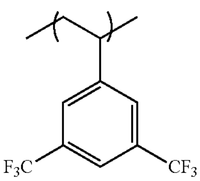
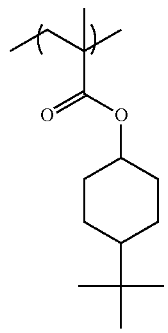
(C-103)
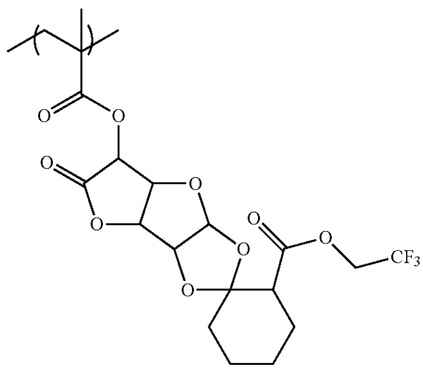
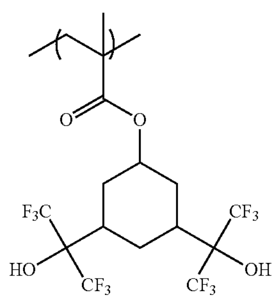
(C-104)
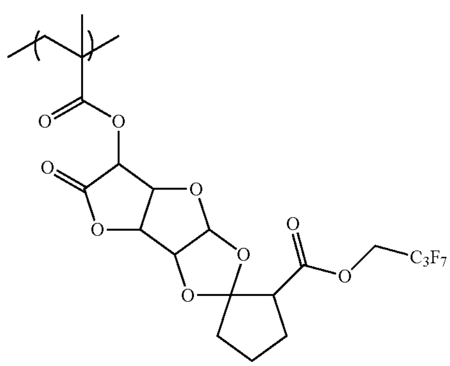
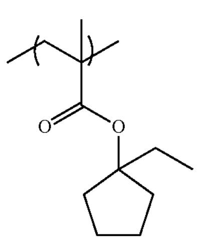
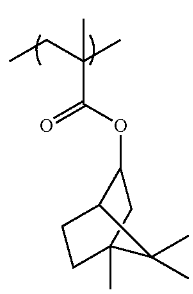
-continued
(C-105)
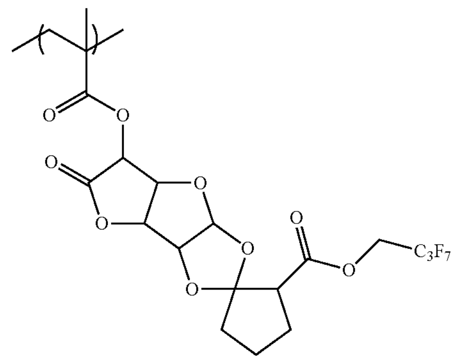
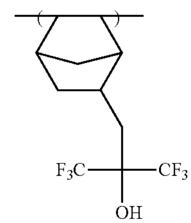
(C-106)
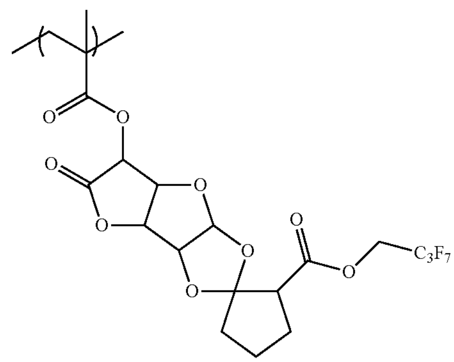
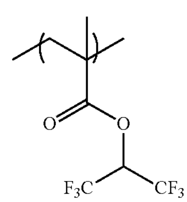
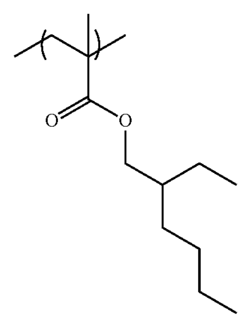
(C-107)
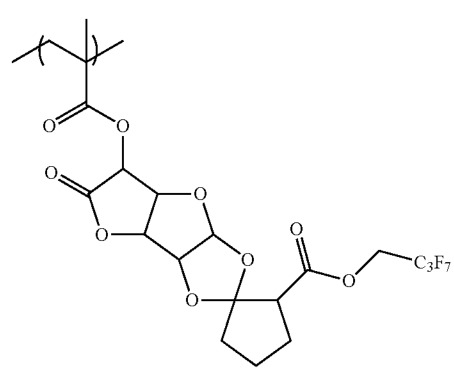

-continued
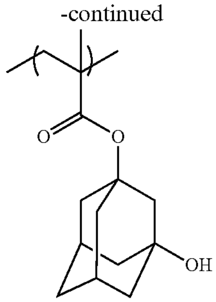
(C-108)
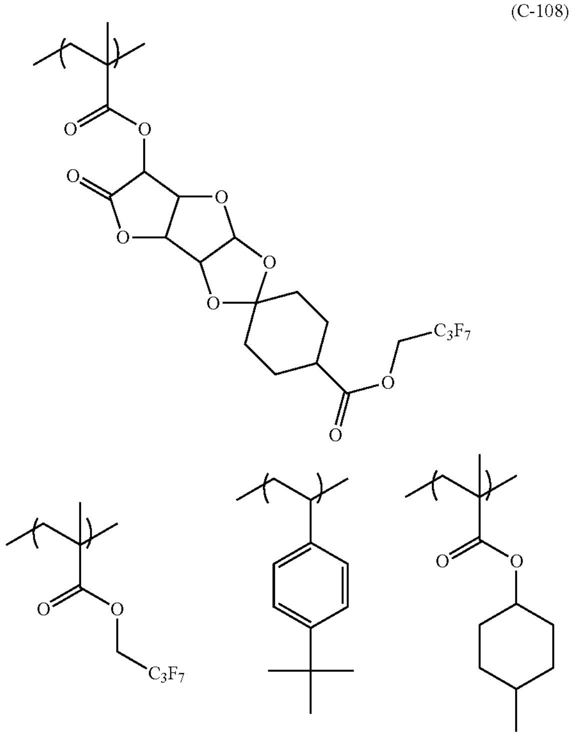
(C-109)
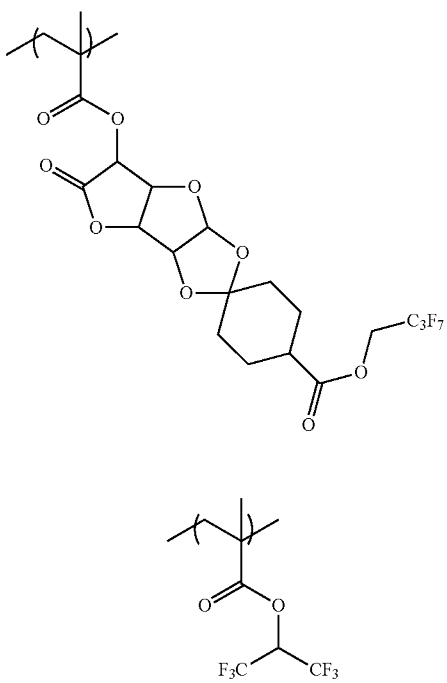
-continued
(C-110)
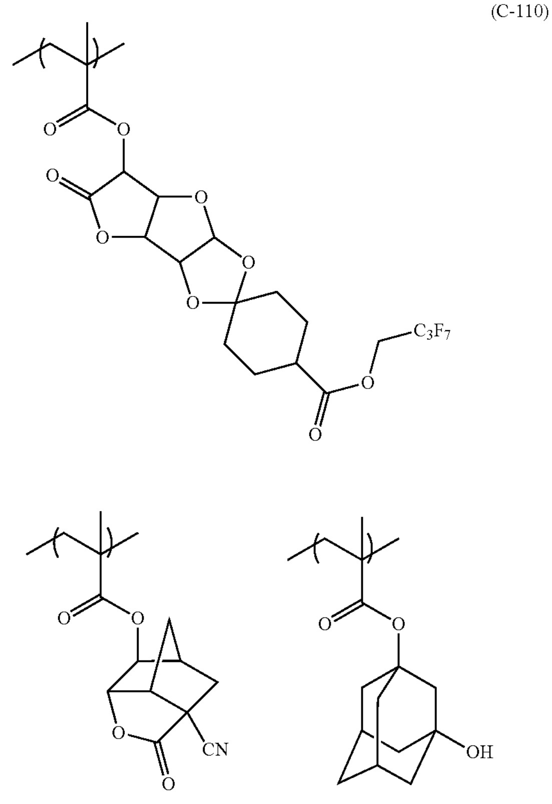
(C-111)
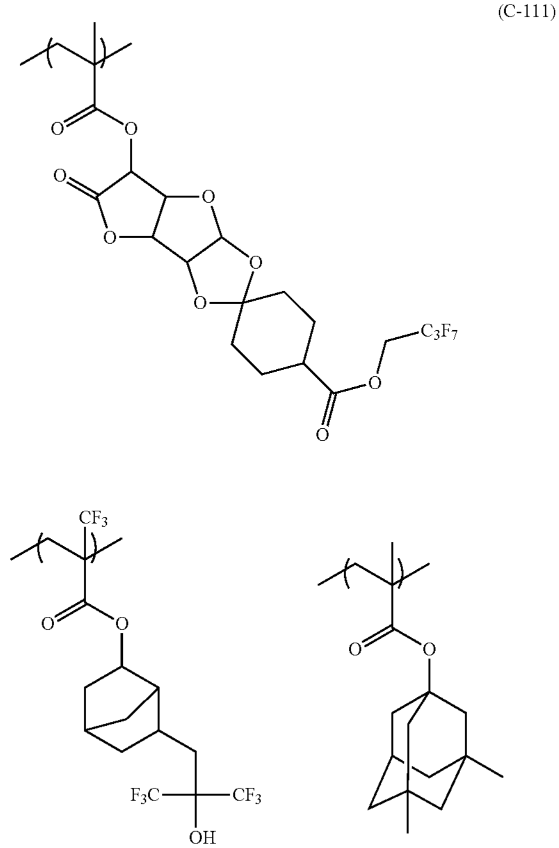

-continued
(C-112)
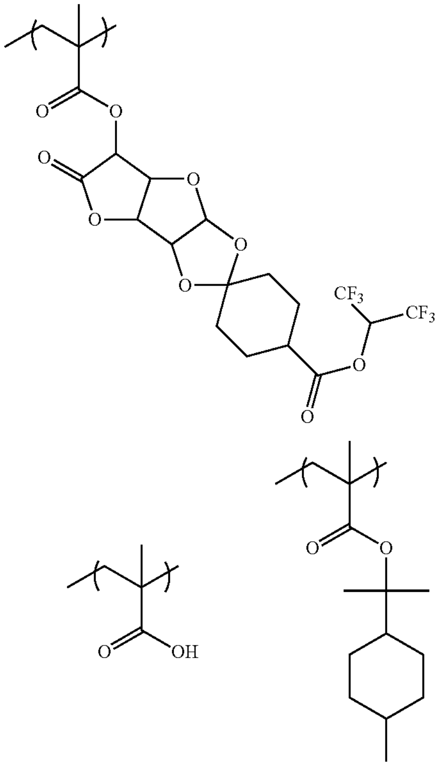
(C-113)
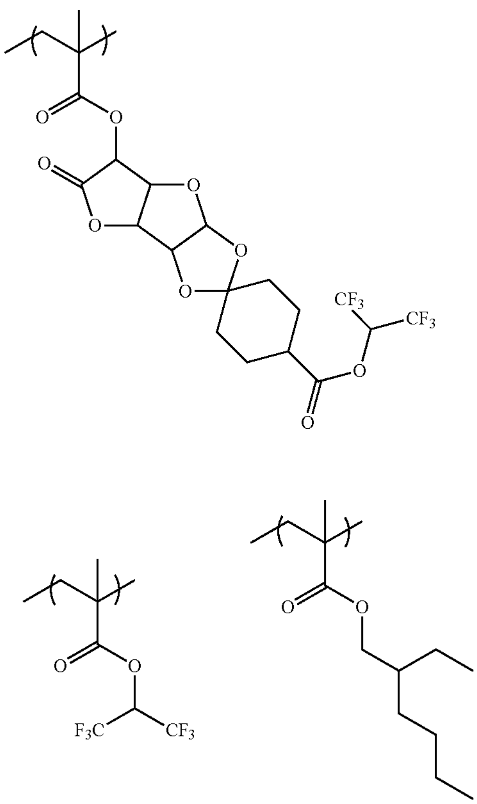
-continued
(C-114)
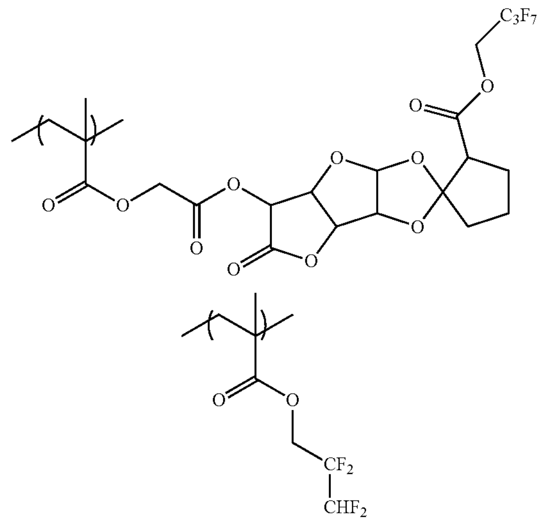
(C-115)
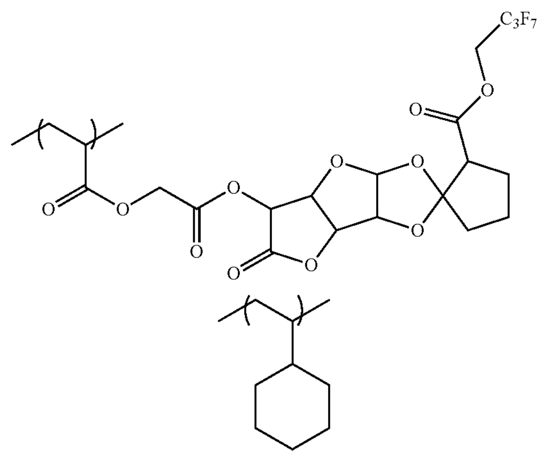
(C-116)
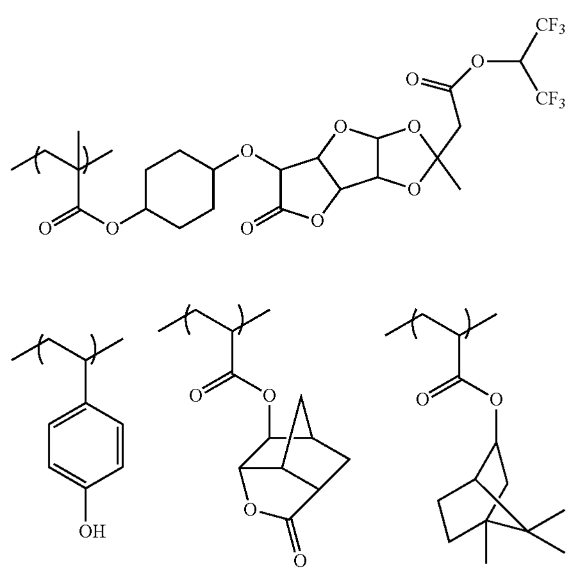

-continued
(C-117)
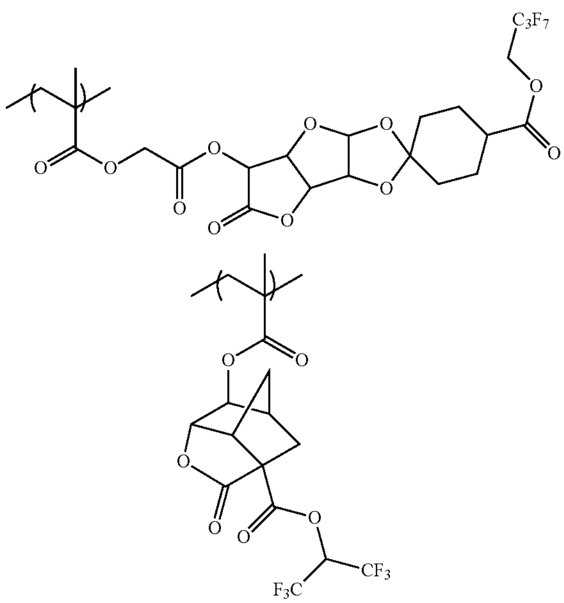
(C-118)
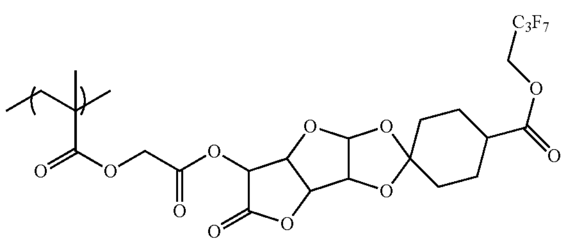
(C-119)
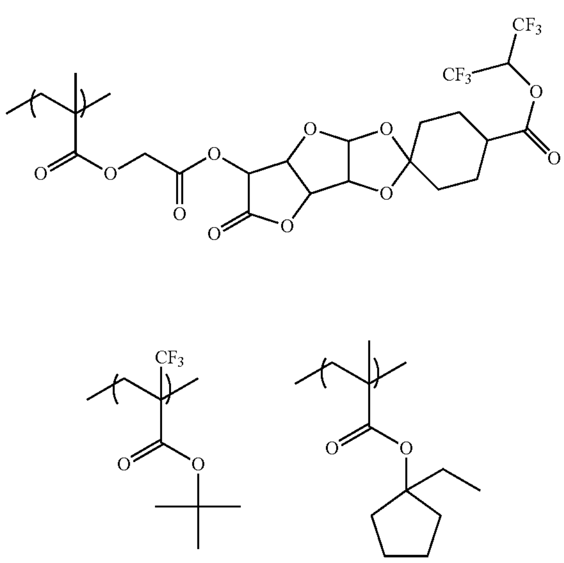
-continued
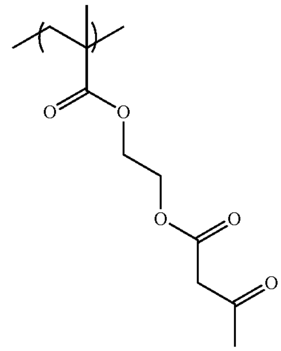
(C-120)
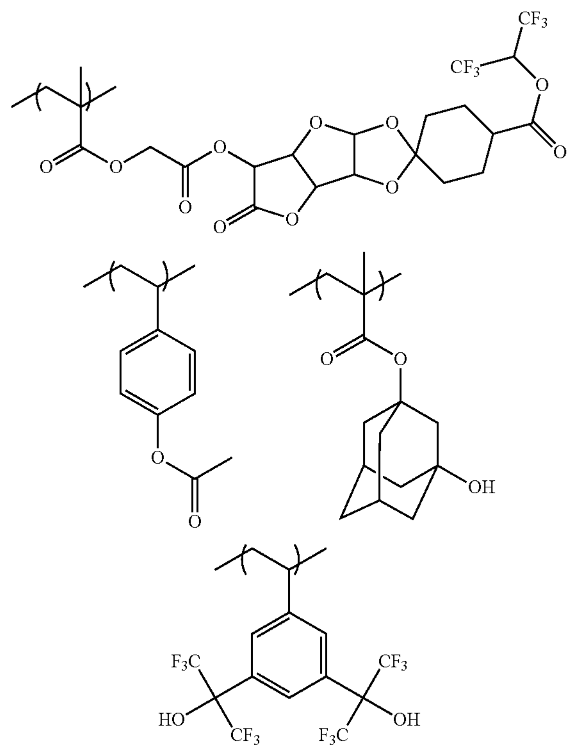
(C-121)
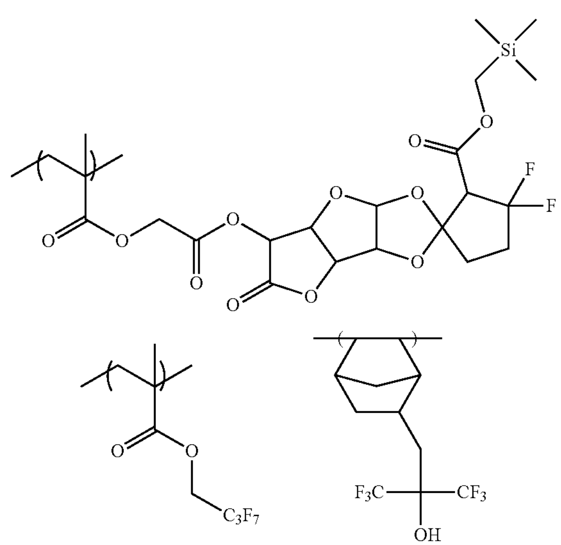

-continued
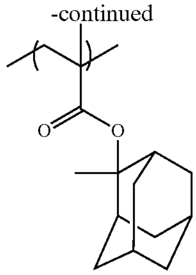
(C-122)
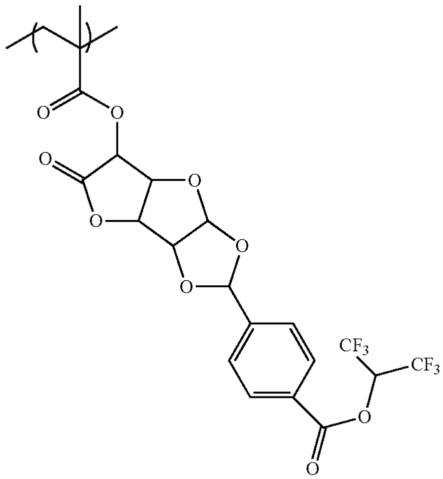
(C-123)
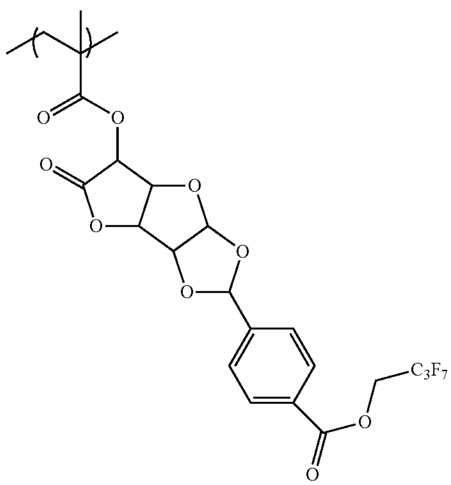
(C-124)
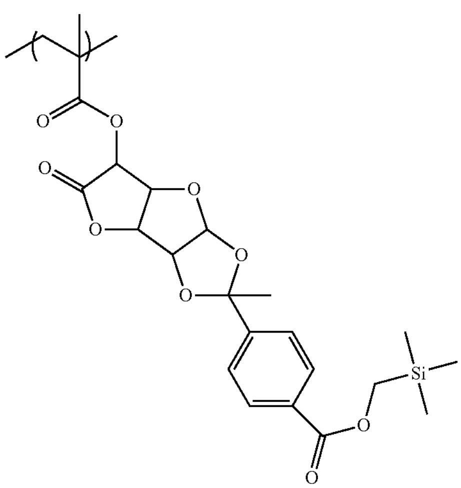
-continued
(C-125)
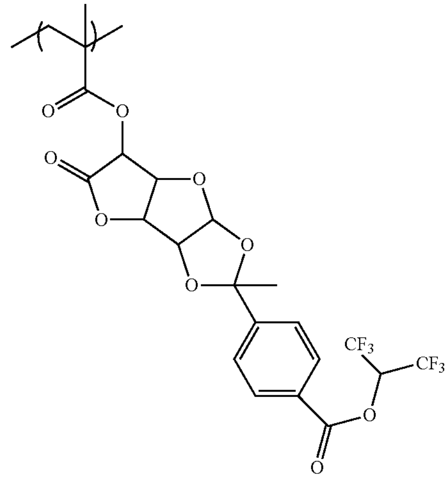
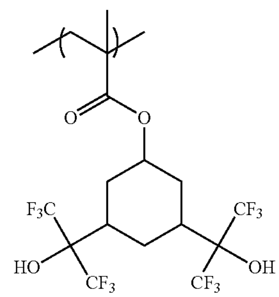
(C-126)
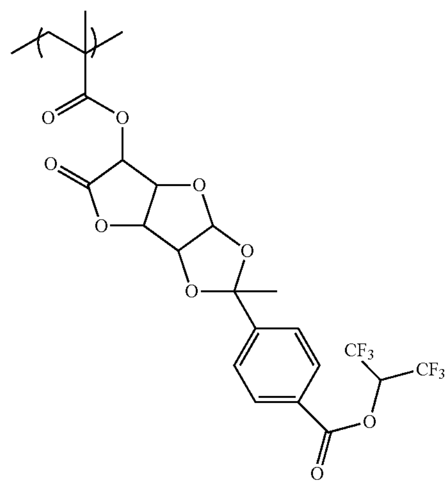
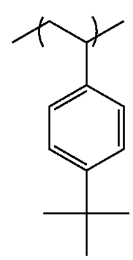

-continued
(C-127)
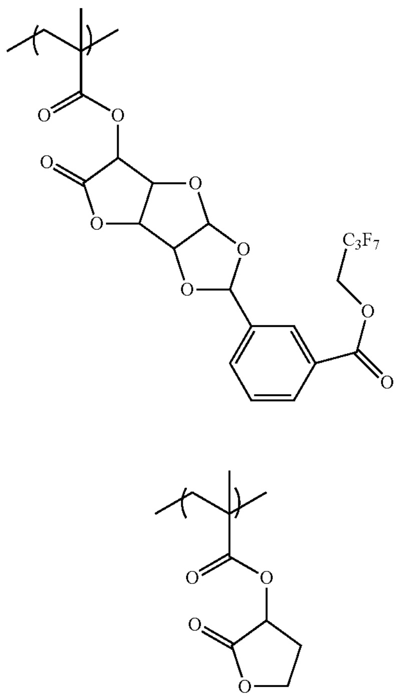
(C-128)
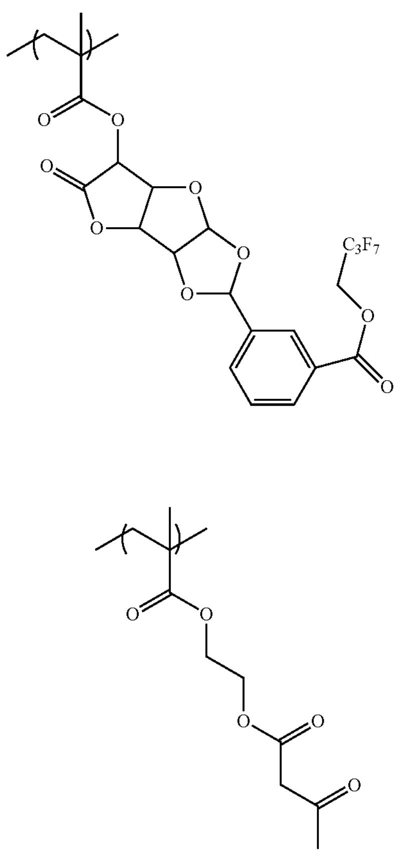
-continued
(C-129)
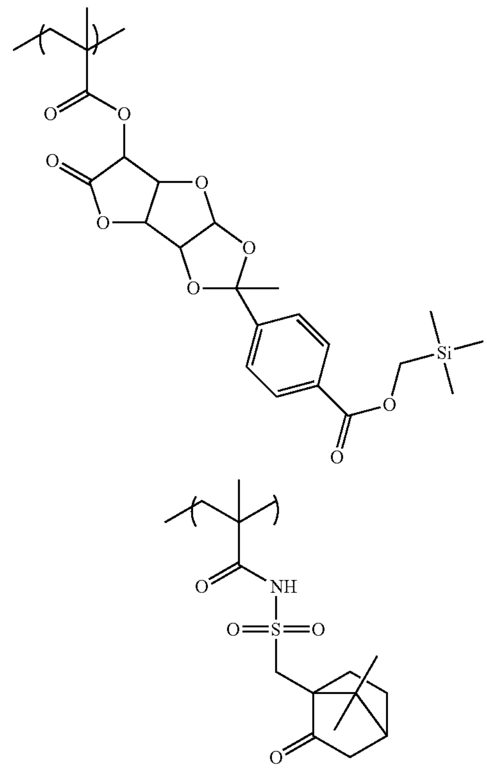
(C-130)
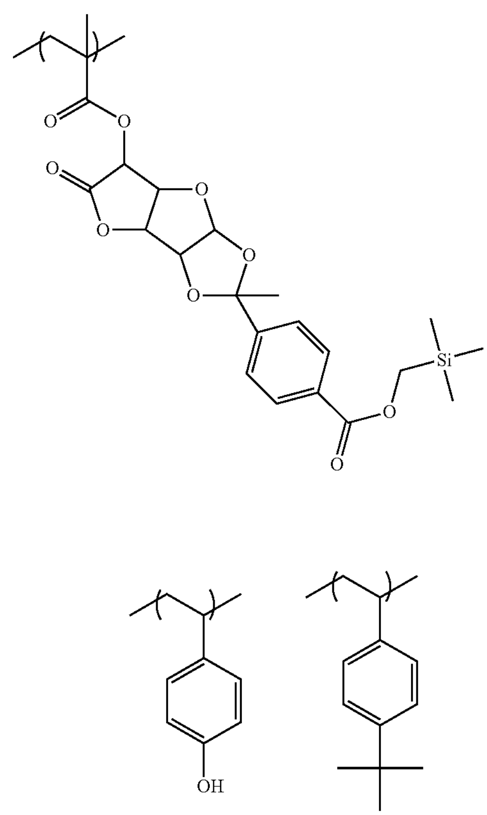

-continued
(C-131)
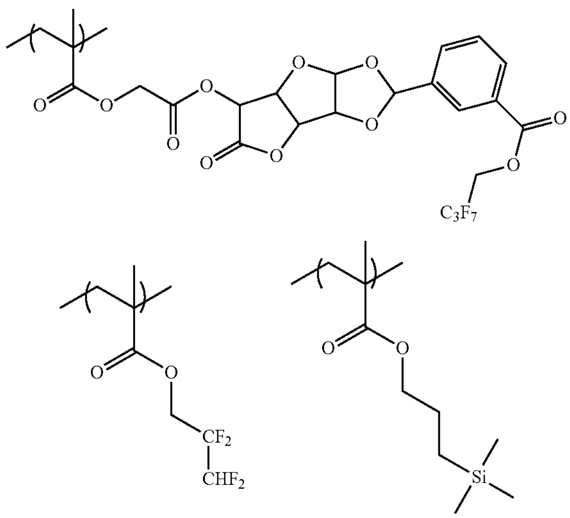
(C-132)
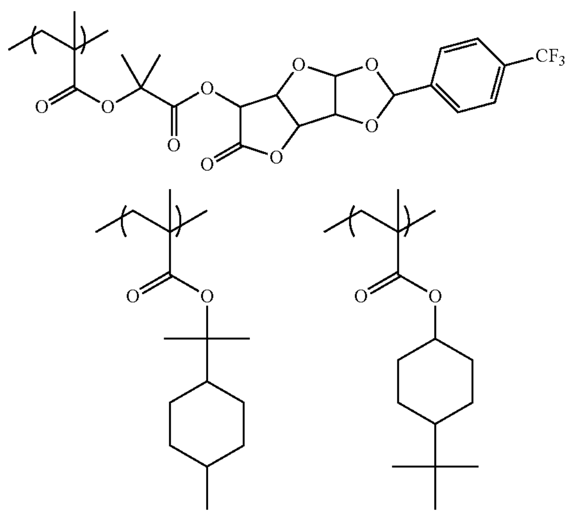
(C-133)
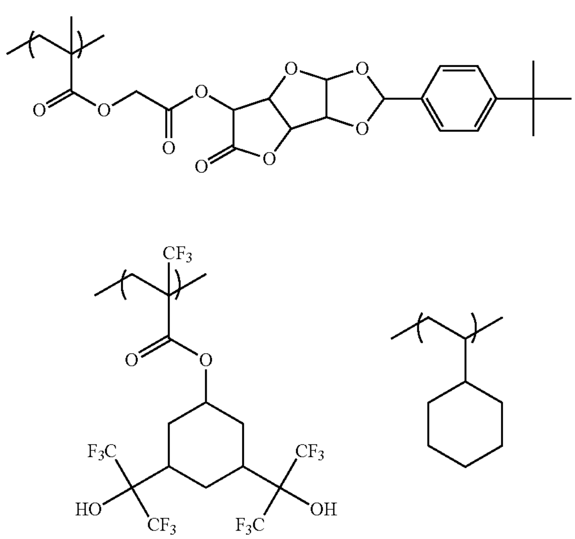
-continued
(C-134)
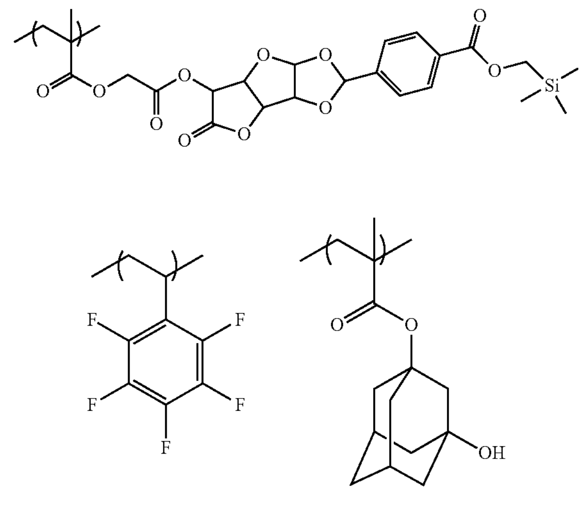
(C-135)
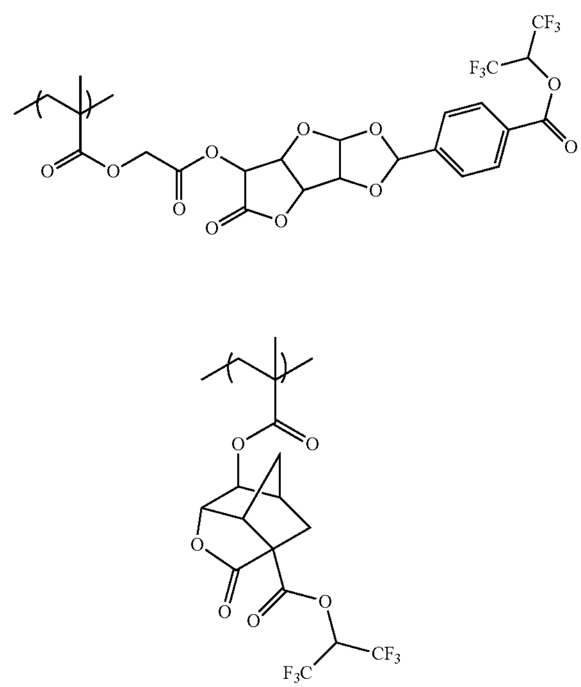
(C-136)
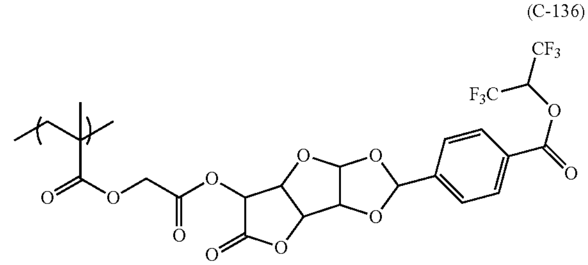

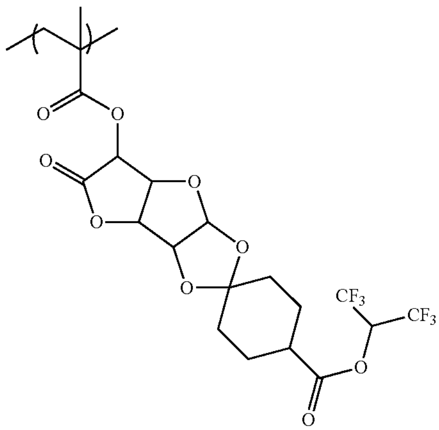
(C-137)
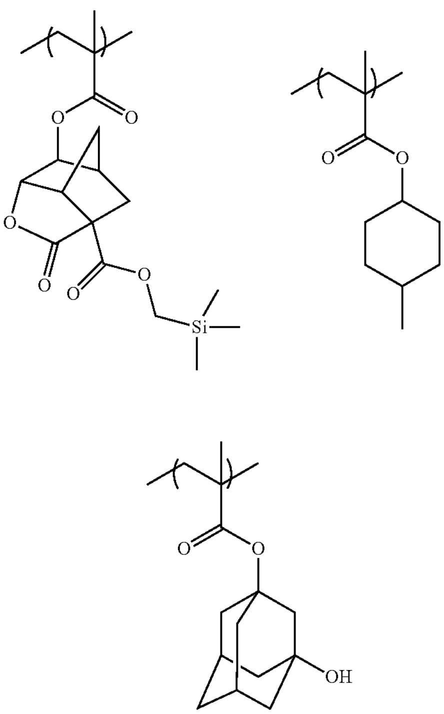
(C-138)
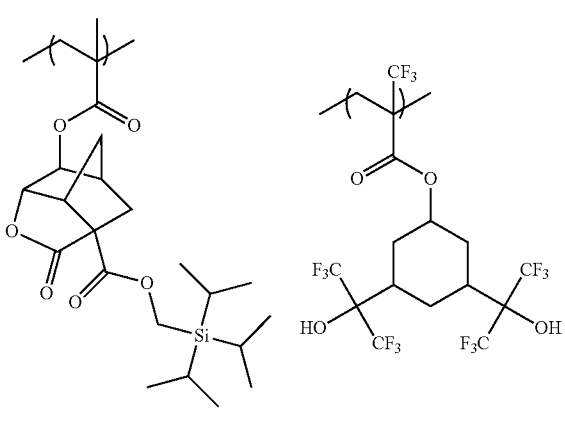
(C-139)
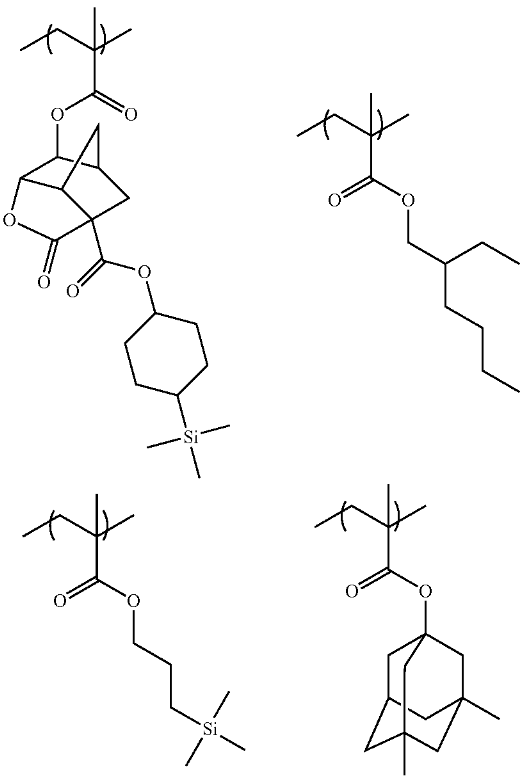
(C-140)
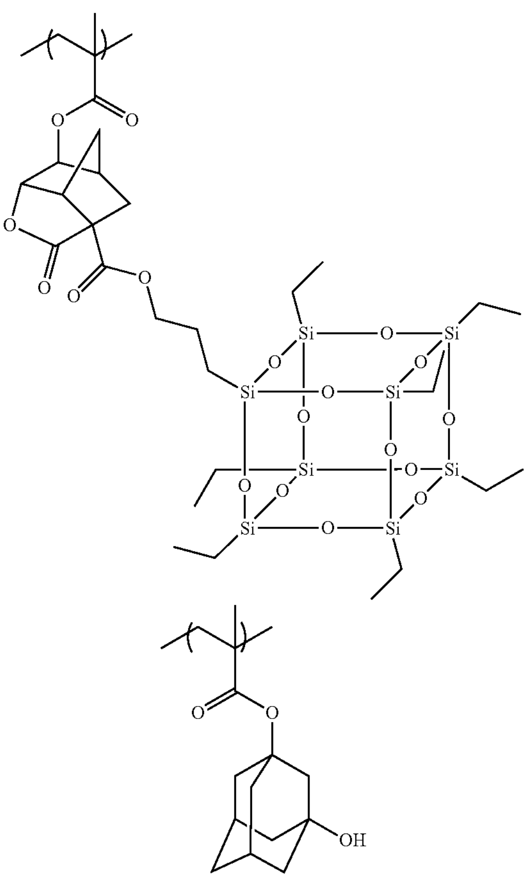

-continued
(C-141)
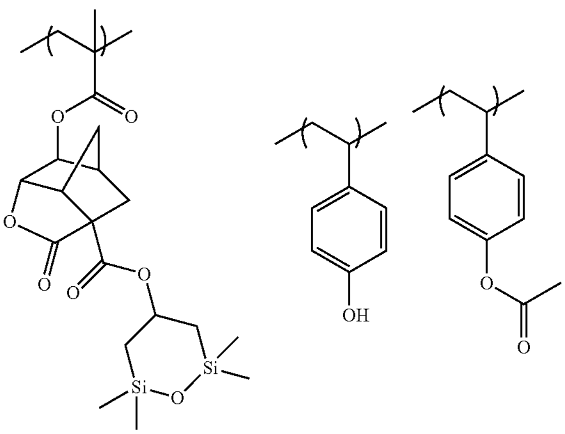
(C-142)
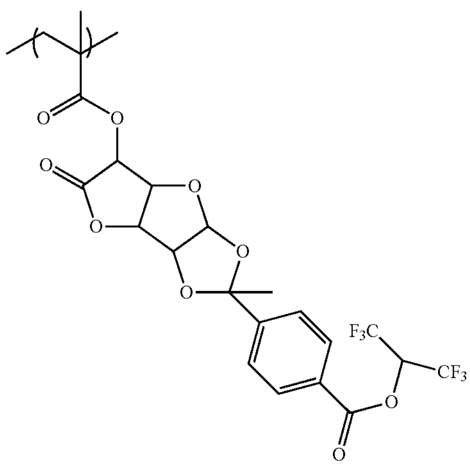
(C-143)
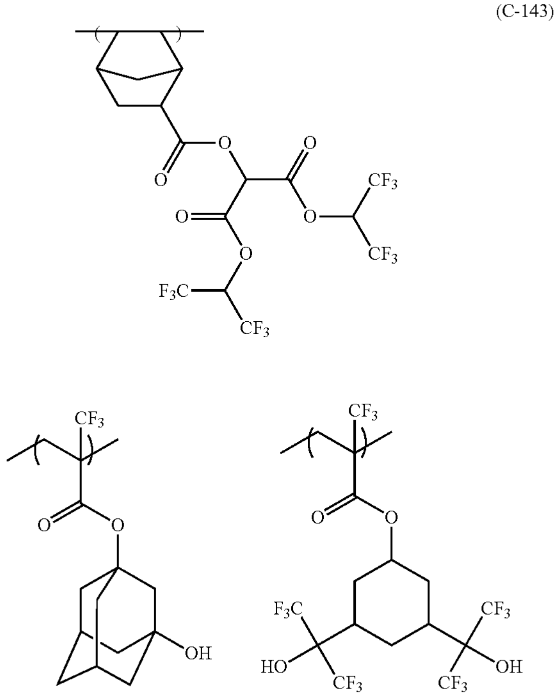
-continued
(C-144)
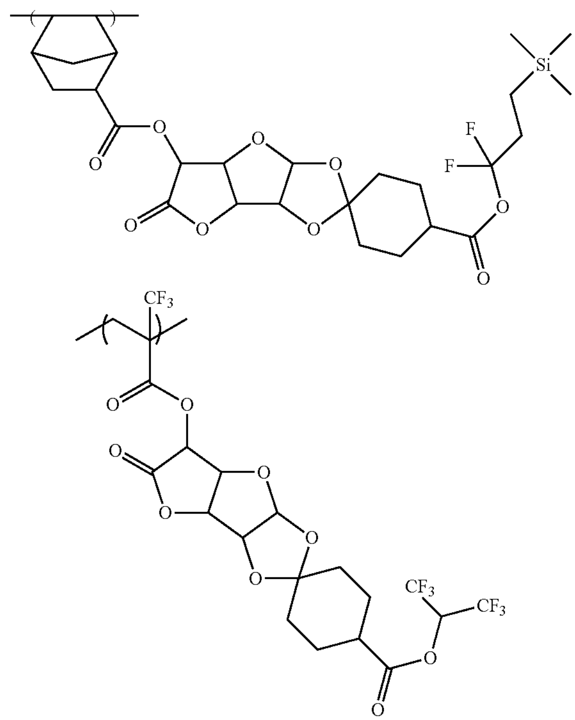
(C-145)
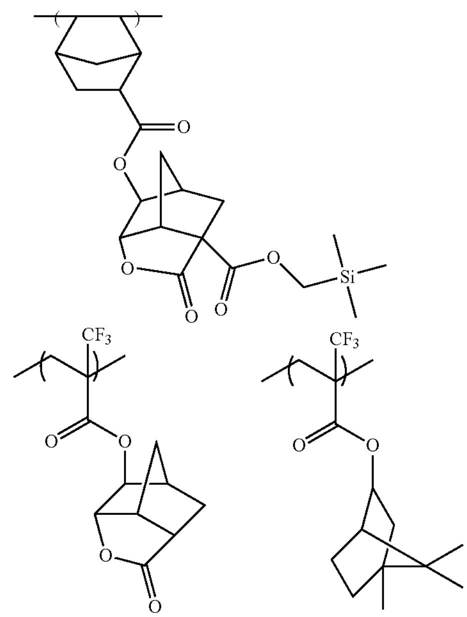
(C-146)
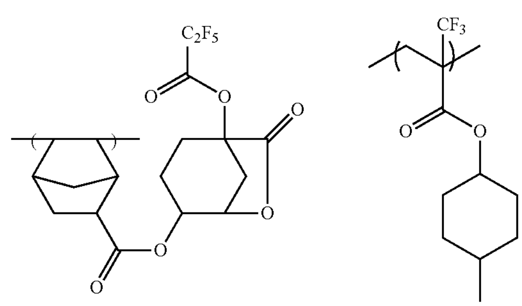

-continued
(C-147)
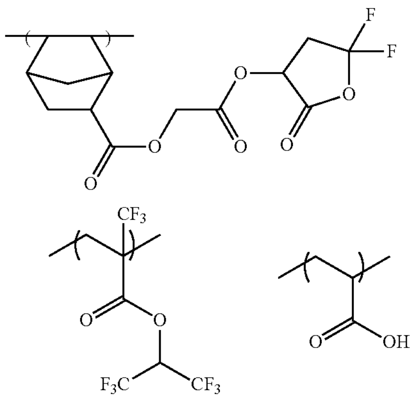
(C-148)
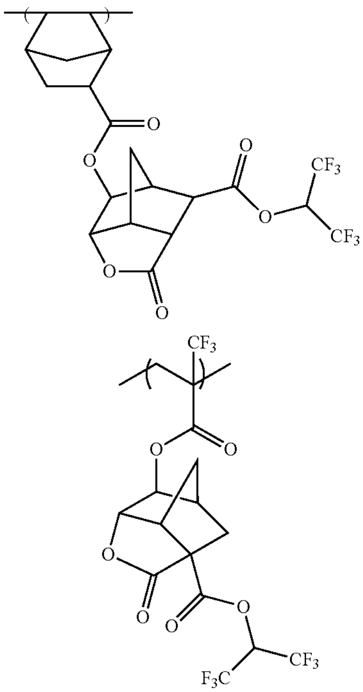
(C-149)
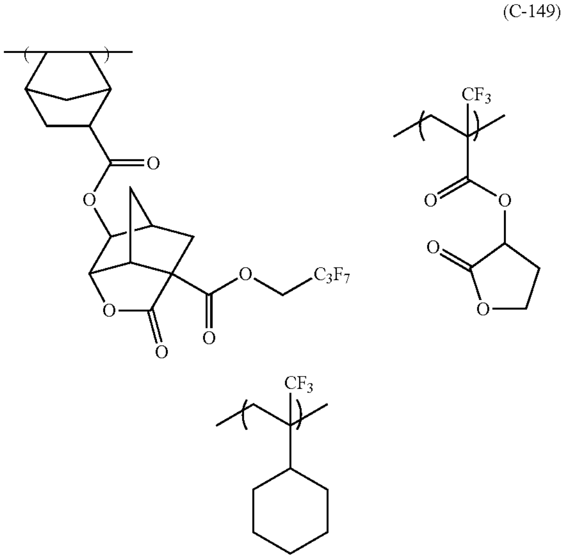
-continued
(C-150)
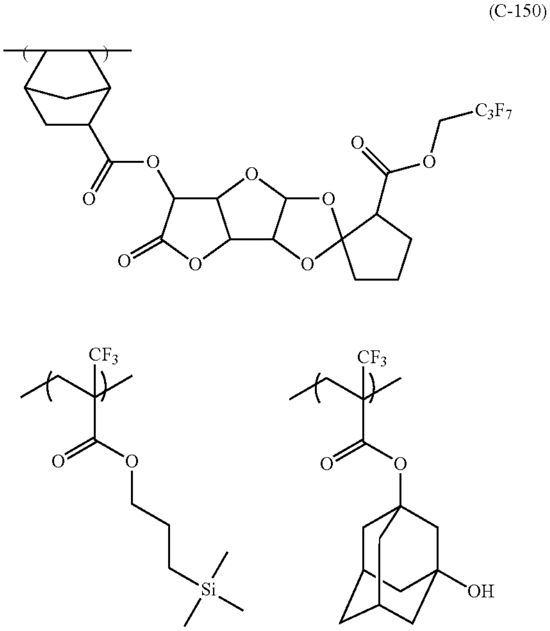
(C-151)
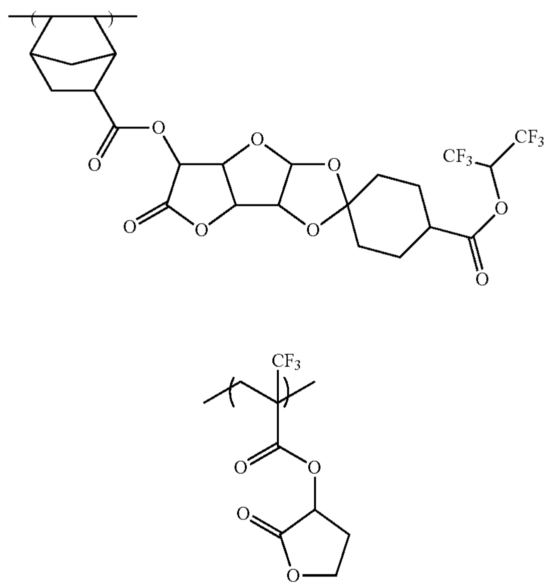
(C-152)
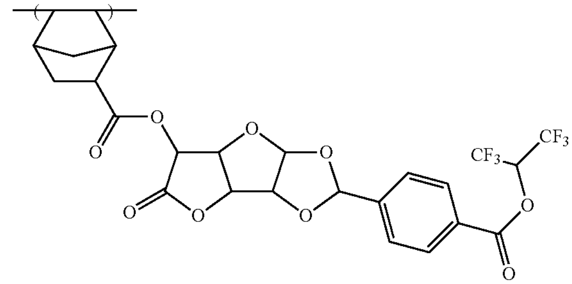

-continued
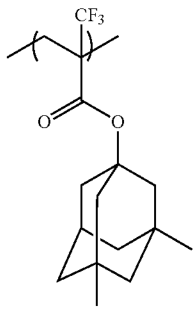
(C-153)
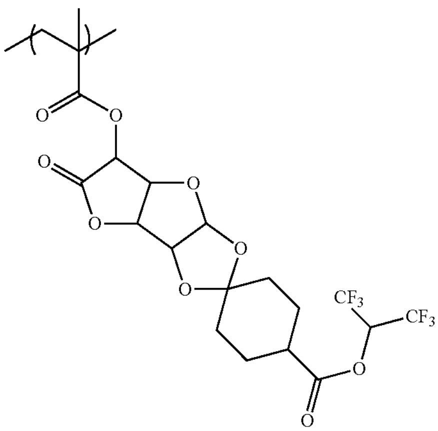
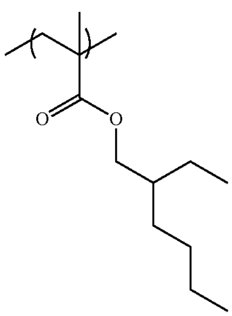
(C-154)
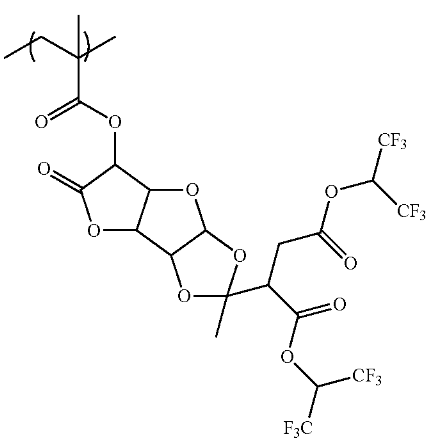
-continued
(C-155)
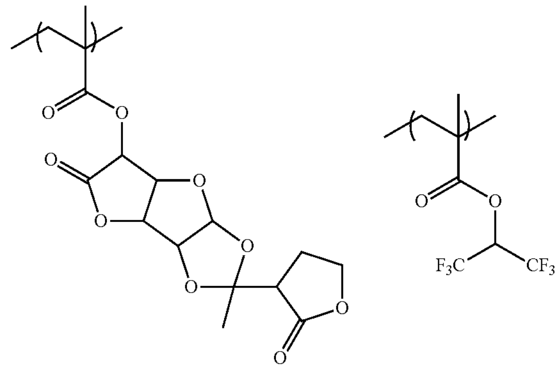
(C-156)
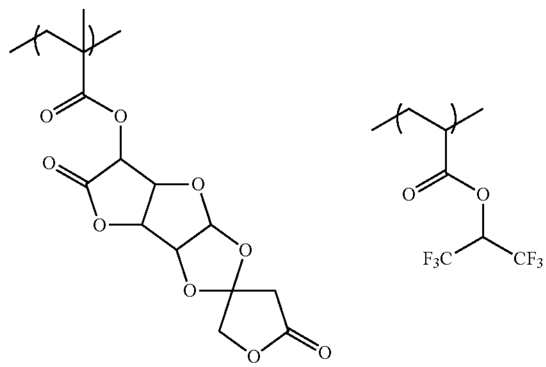
(C-157)
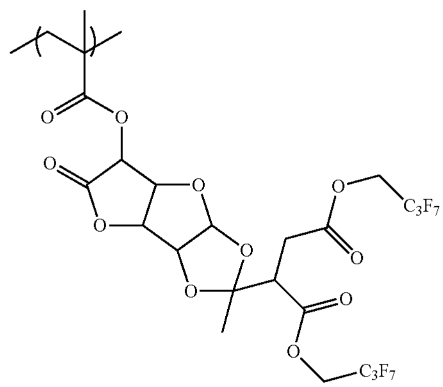
(C-158)
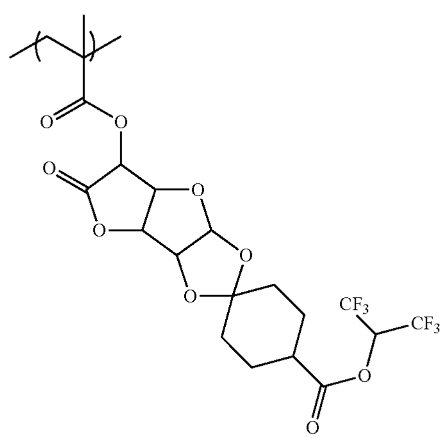

-continued
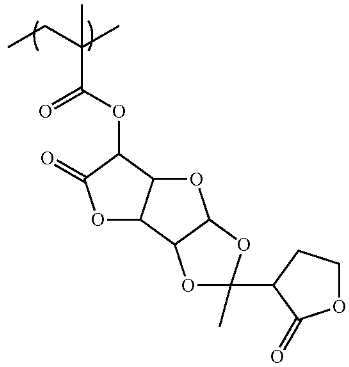
(C-159)
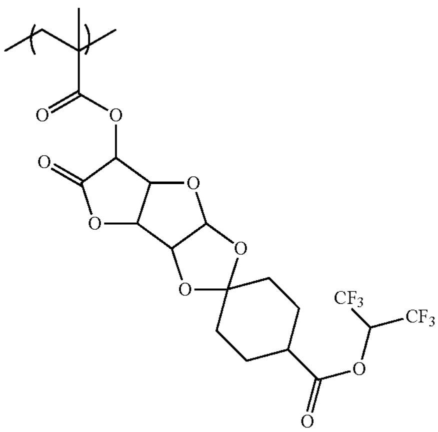
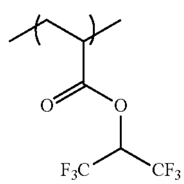
(C-160)
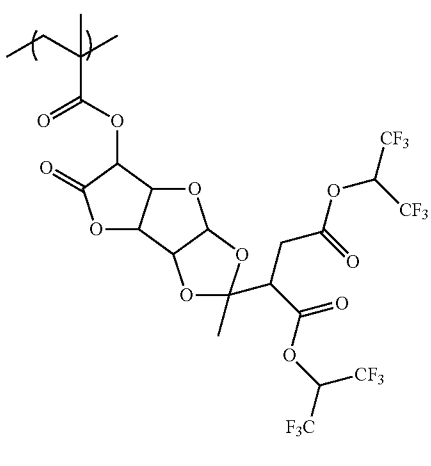
-continued
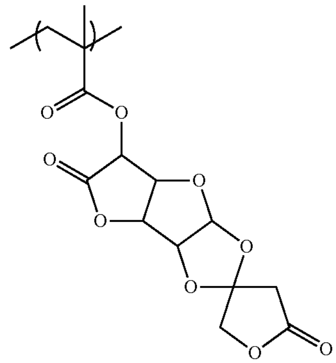
(C-161)
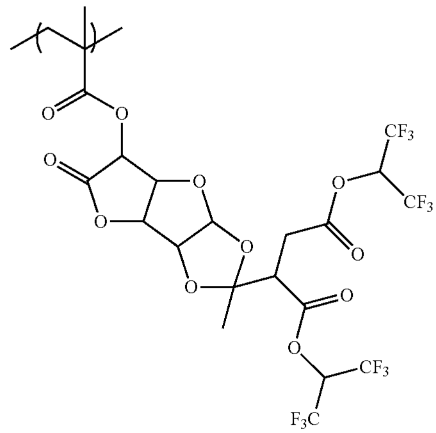
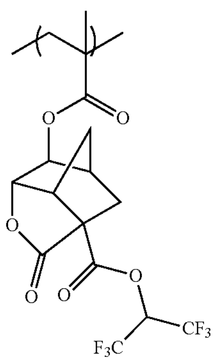
(C-162)
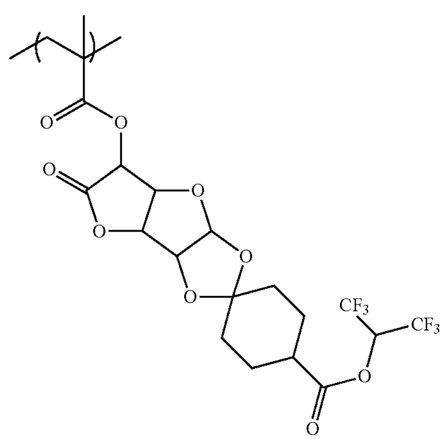

-continued
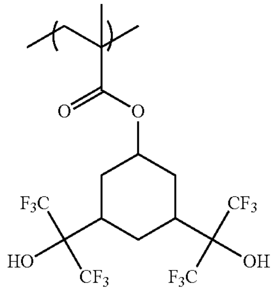
(C-163)
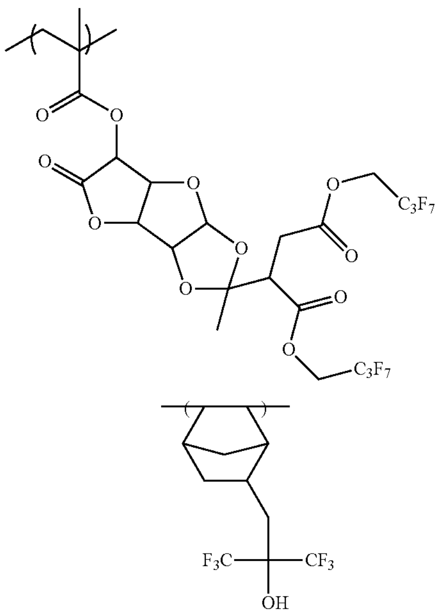
(C-164)
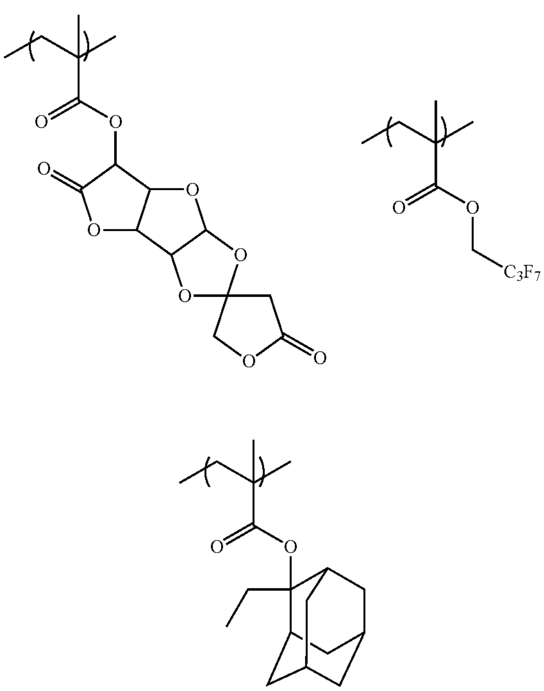
-continued
(C-165)
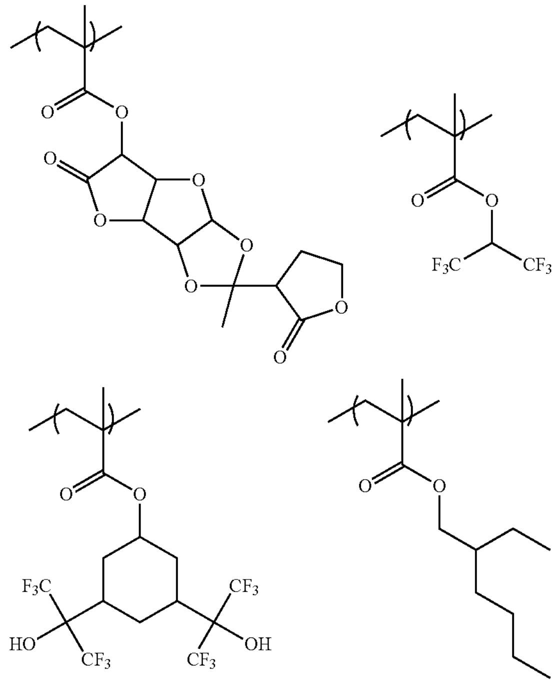
(C-166)
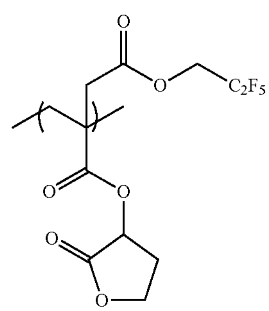
(C-167)
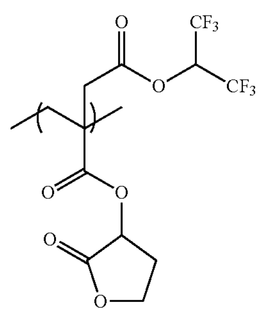
(C-168)
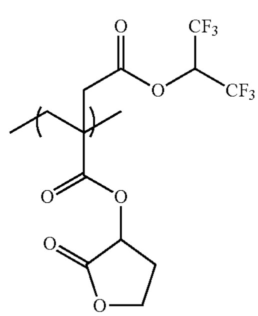
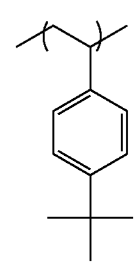

-continued
(C-169)
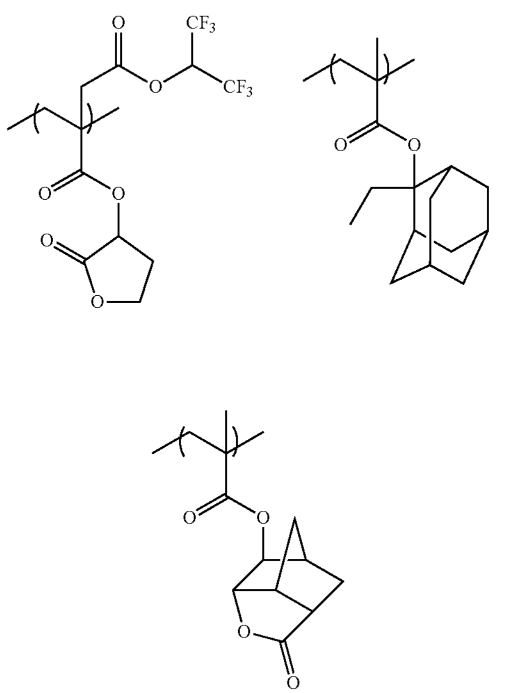
(C-170)
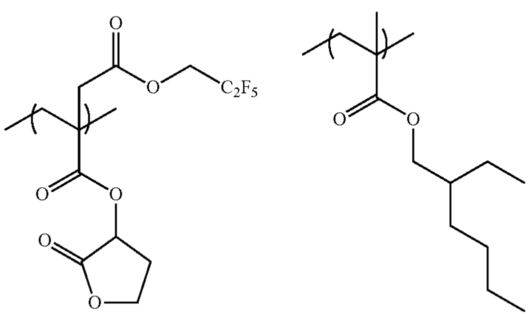
(C-171)
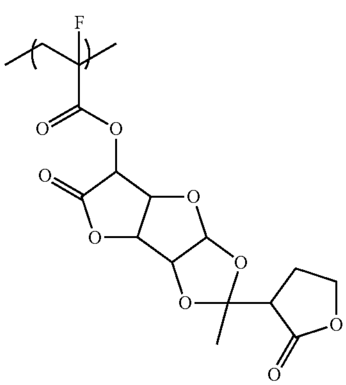
-continued
(C-172)
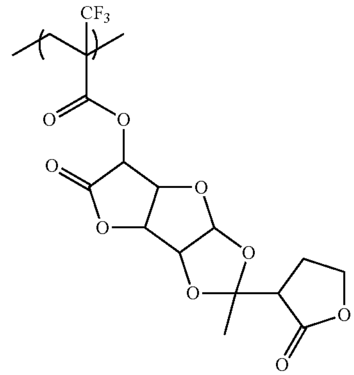
(C-173)
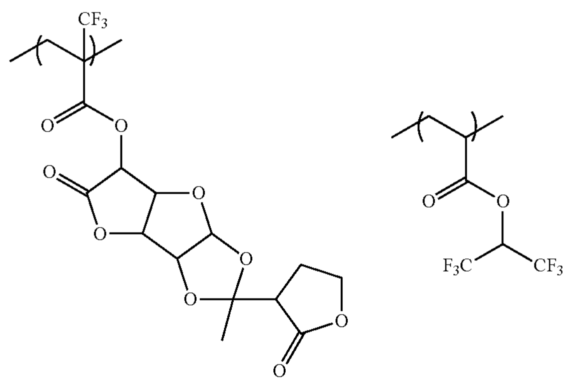
(C-174)
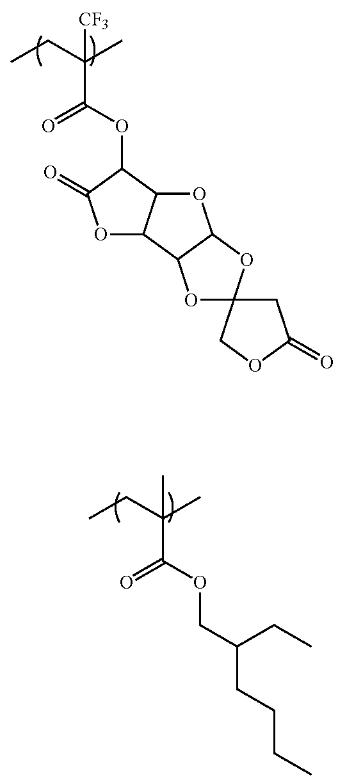

-continued
(C-175)
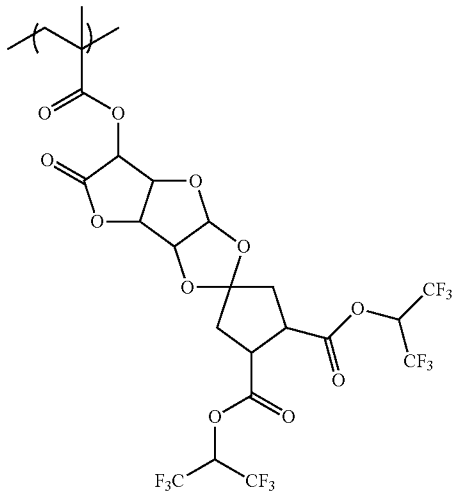
(C-176)
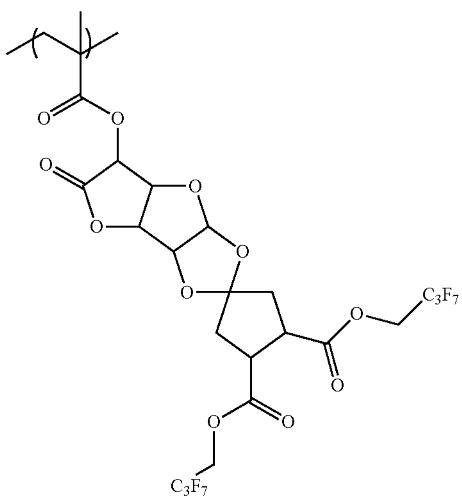
(C-177)
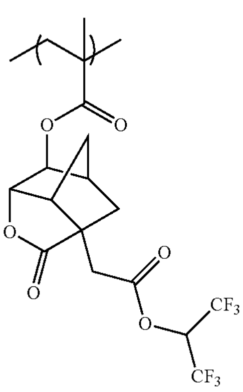
-continued
(C-178)
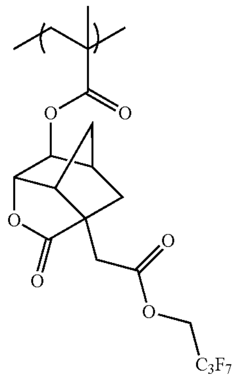
(C-179)
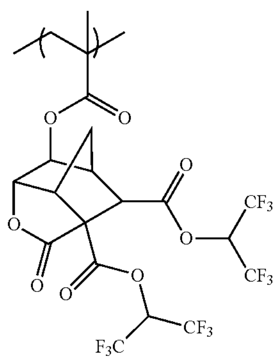
(C-180)
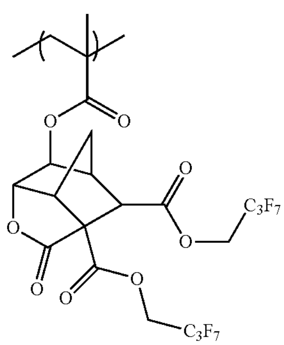
(C-181)
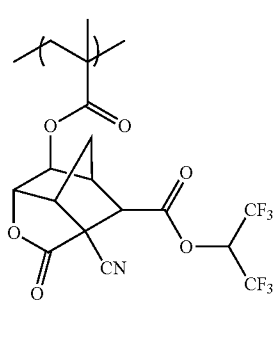

-continued
(C-182)
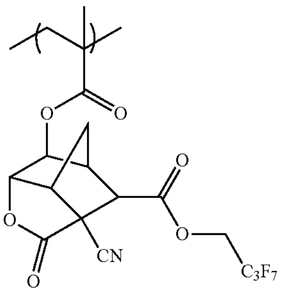
(C-183)
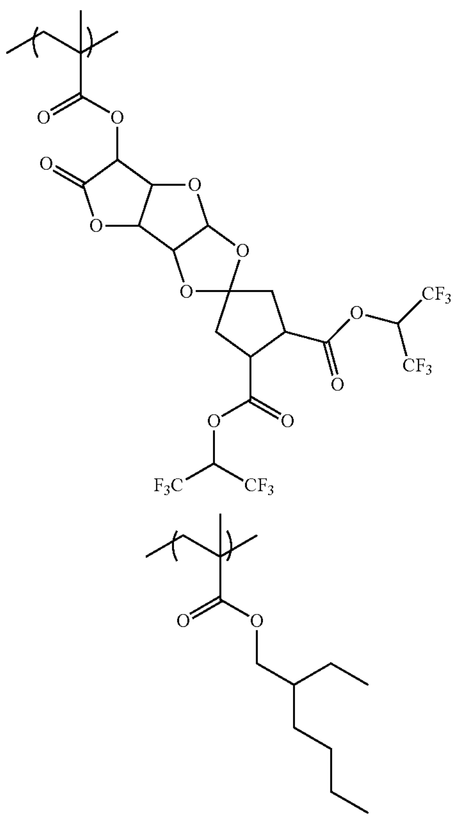
(C-184)
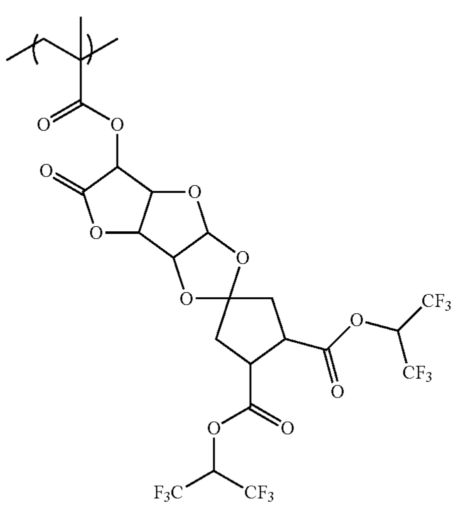
-continued
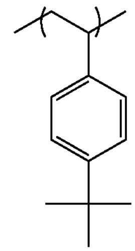
(C-185)
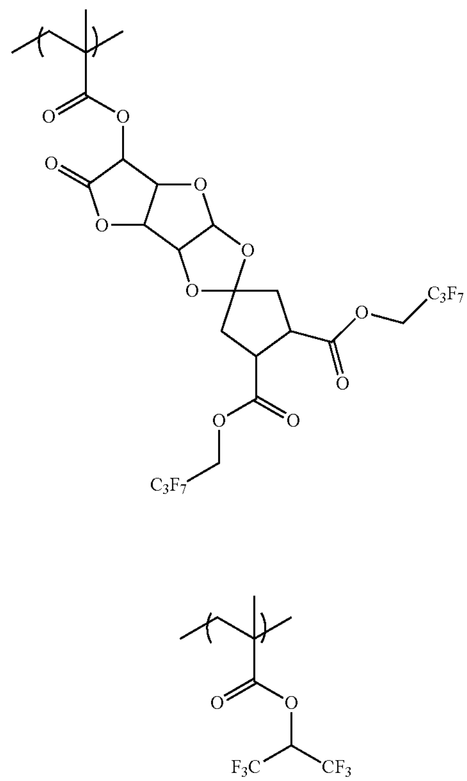
(C-186)
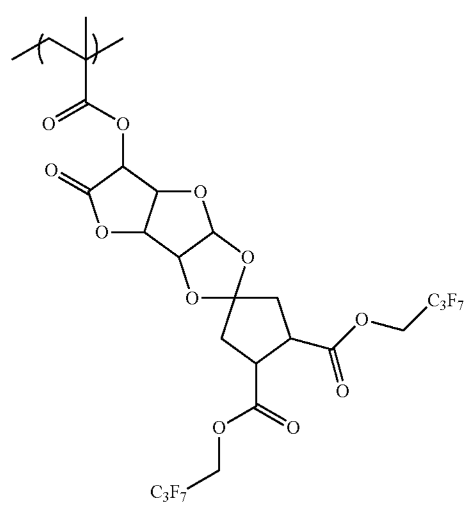

-continued
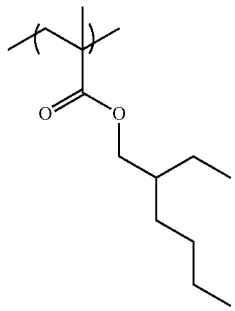
(C-187)
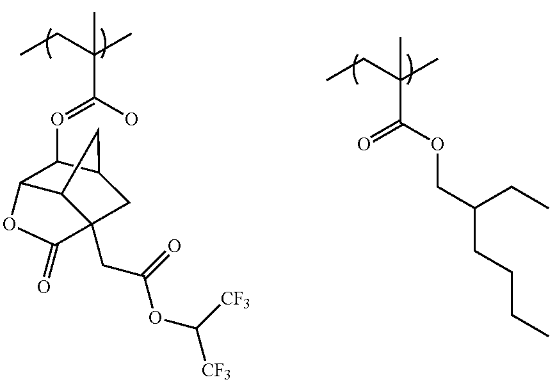
(C-188)
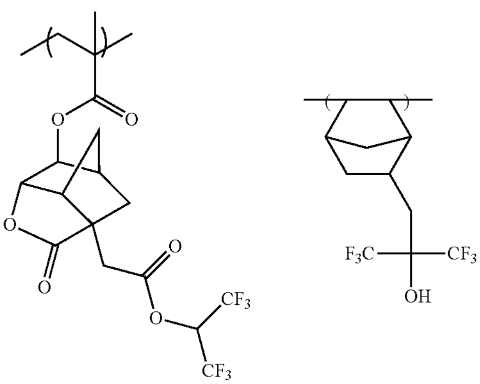
(C-189)
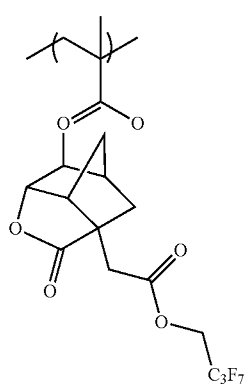
-continued
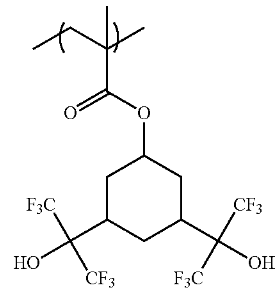
(C-190)
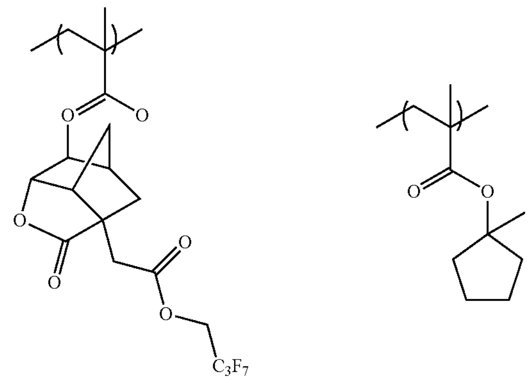
(C-191)
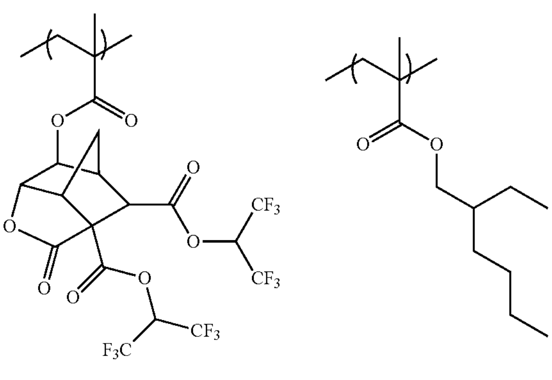
(C-192)
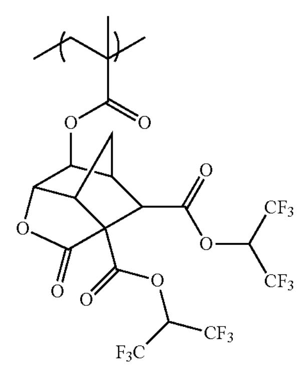

-continued
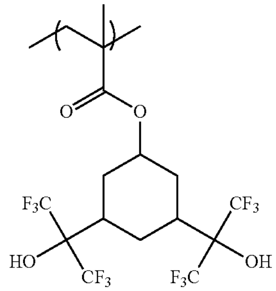
(C-193)
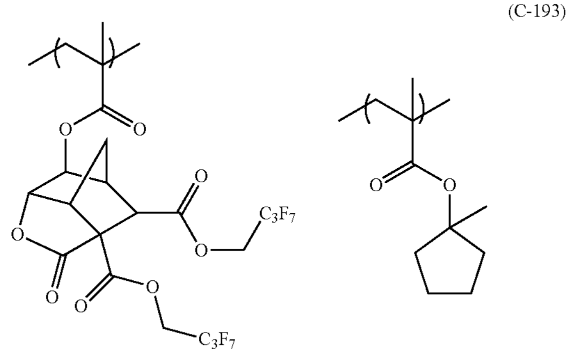
(C-194)
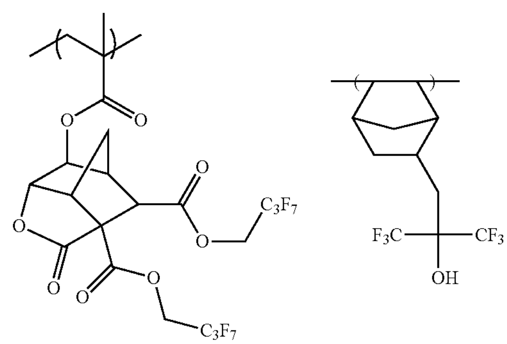
(C-195)
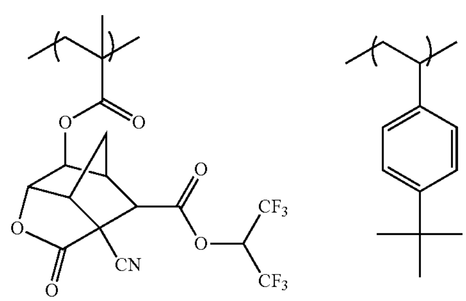
(C-196)
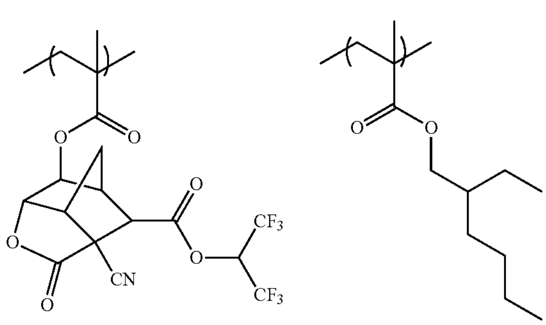
-continued
(C-197)
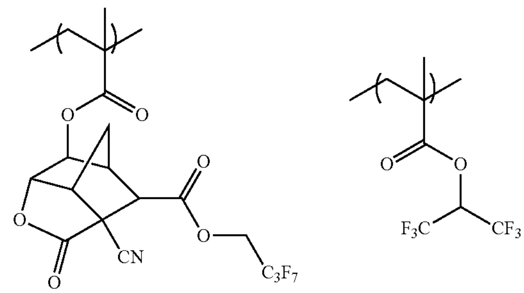
(C-198)
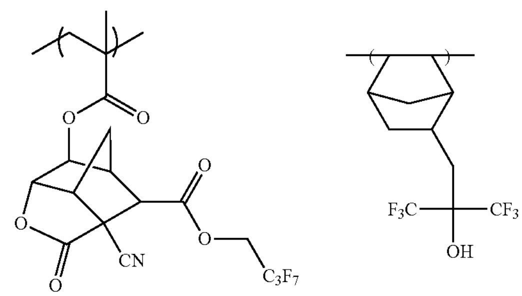
(C-199)
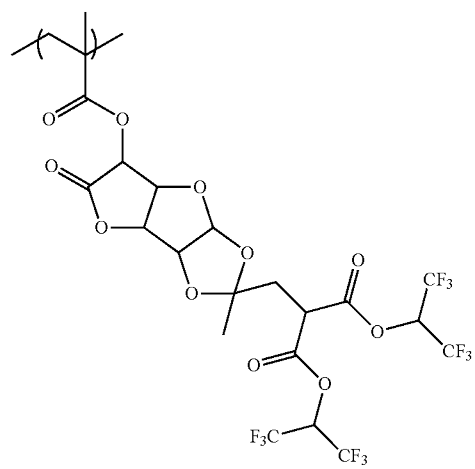
(C-200)
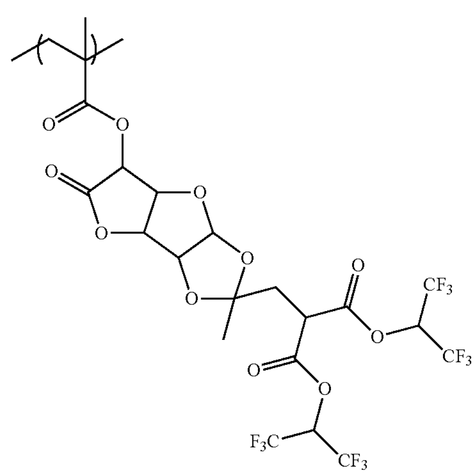

-continued
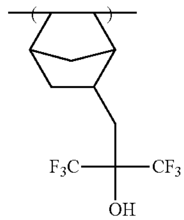
(C-201)
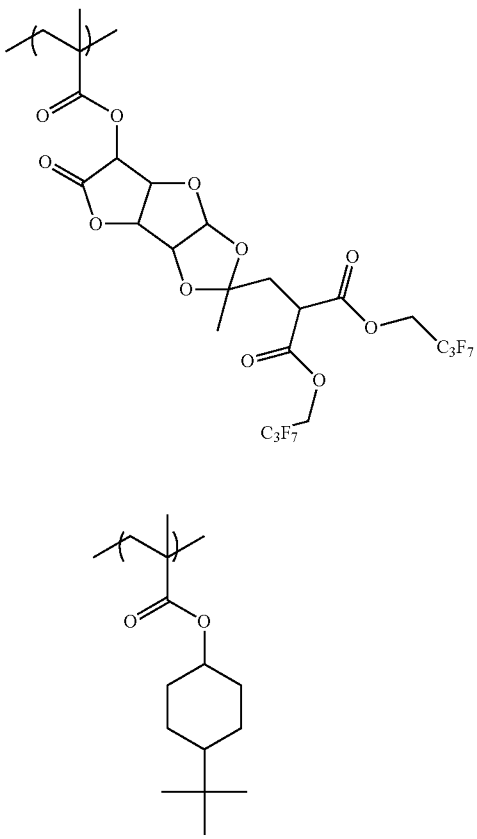
(C-202)
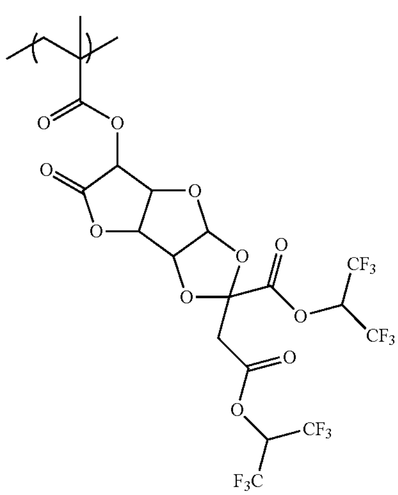
-continued
(C-203)
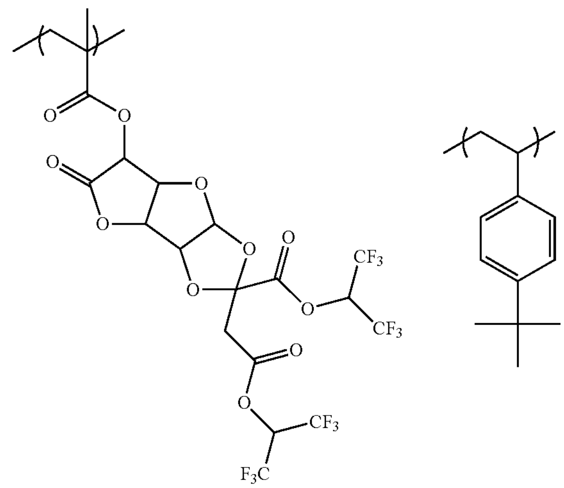
(C-204)
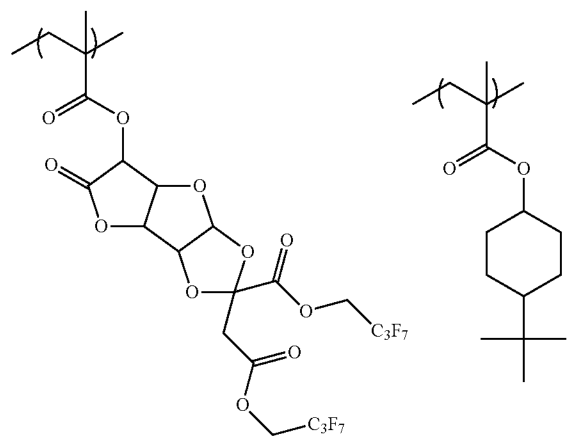
(C-205)
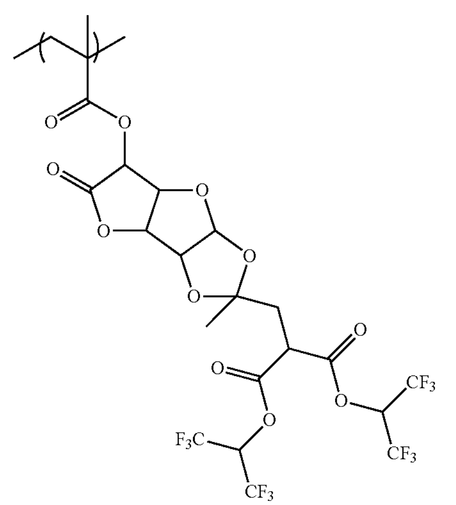

-continued
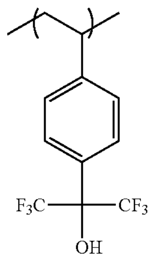
(C-206)
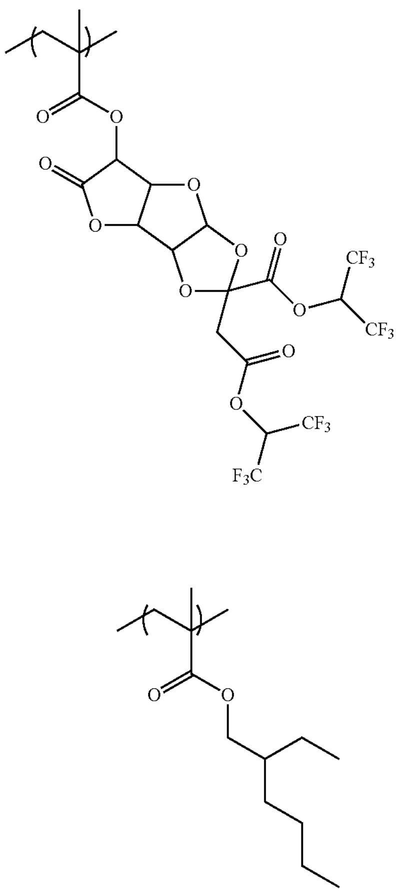
(C-207)
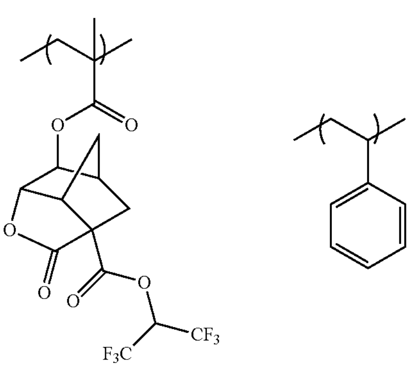
-continued
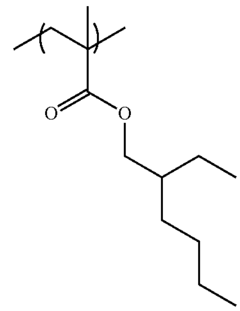
(C-208)
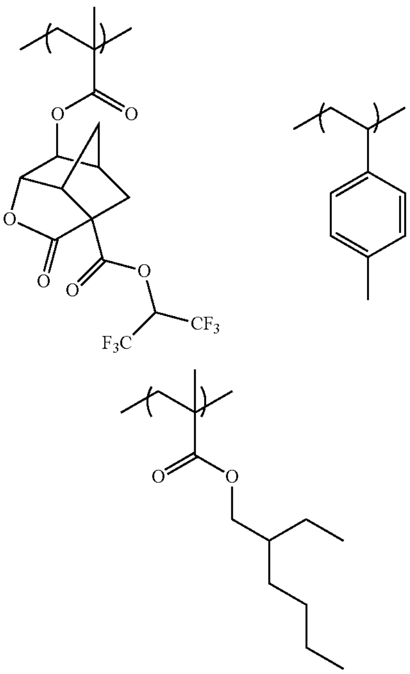
(C-209)
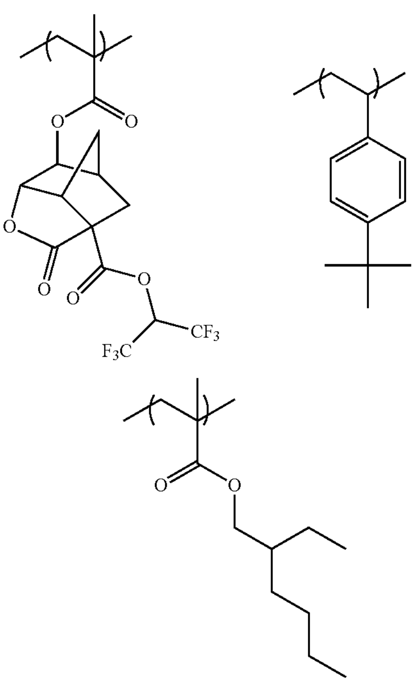

-continued
(C-210)
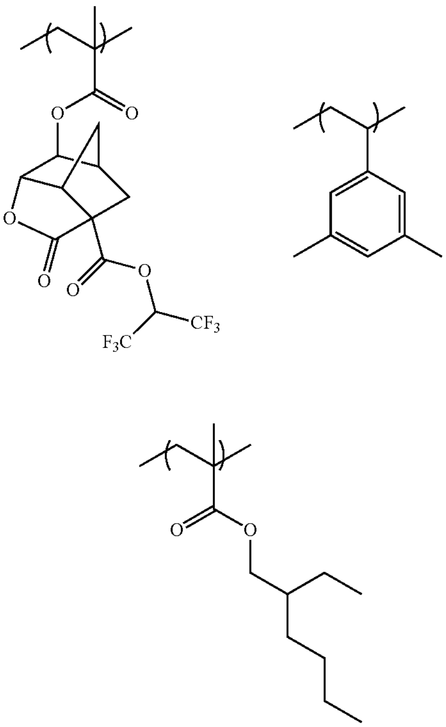
(C-211)
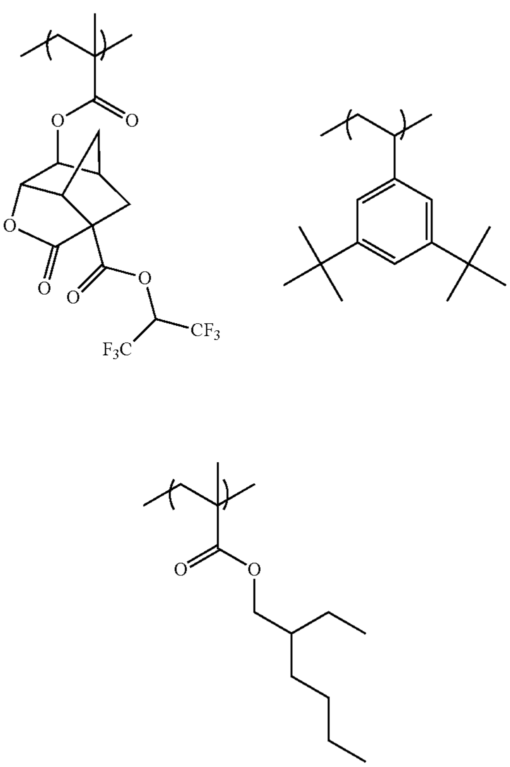
-continued
(C-212)
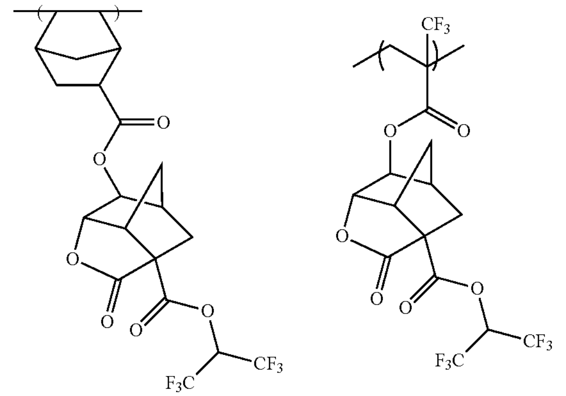
(C-213)
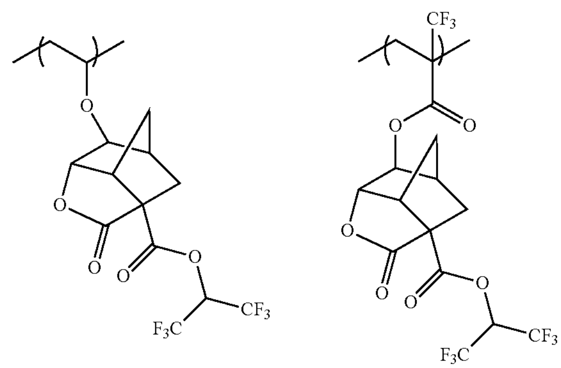
(C-214)
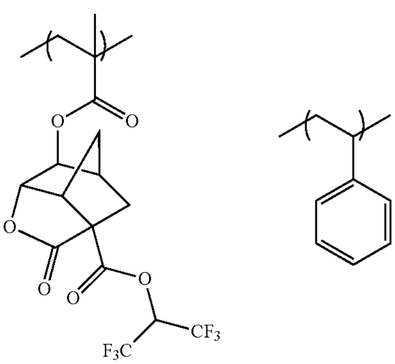
(C-215)
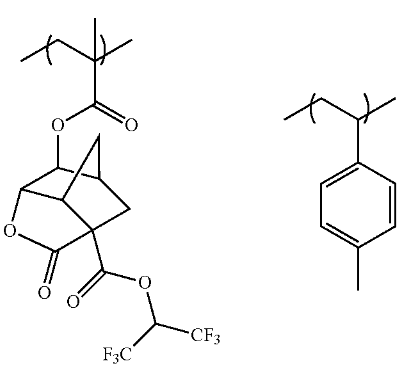

-continued
(C-216)
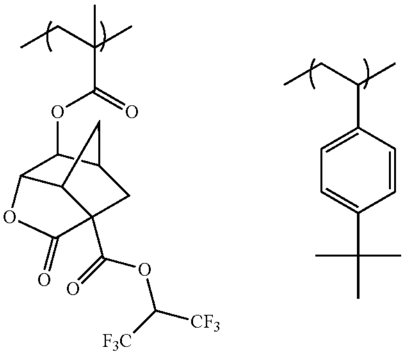
(C-217)
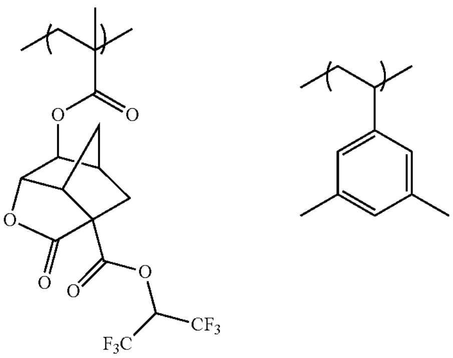
(C-218)
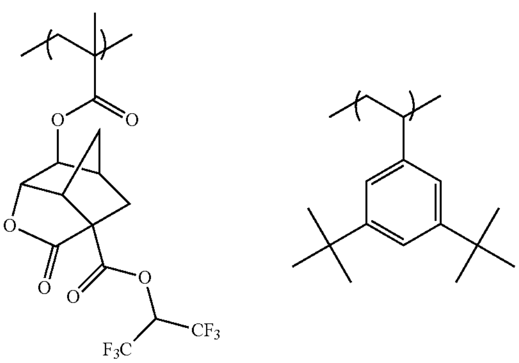
(C-219)
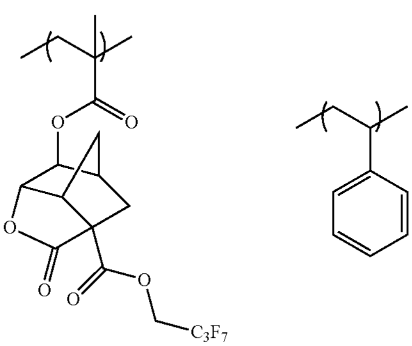
-continued
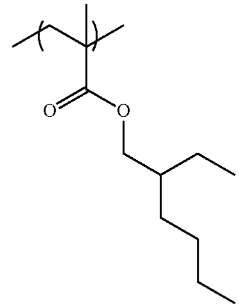
(C-220)
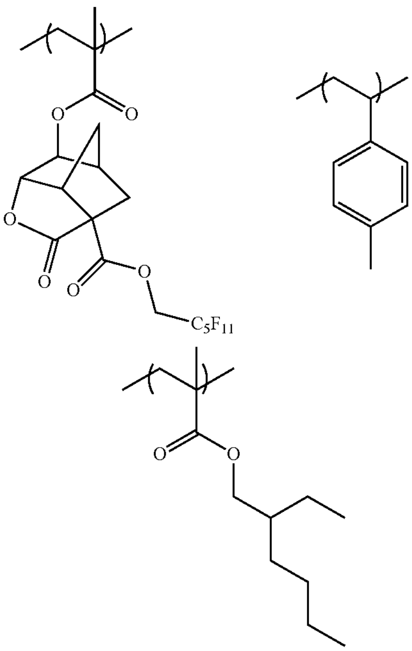
(C-221)
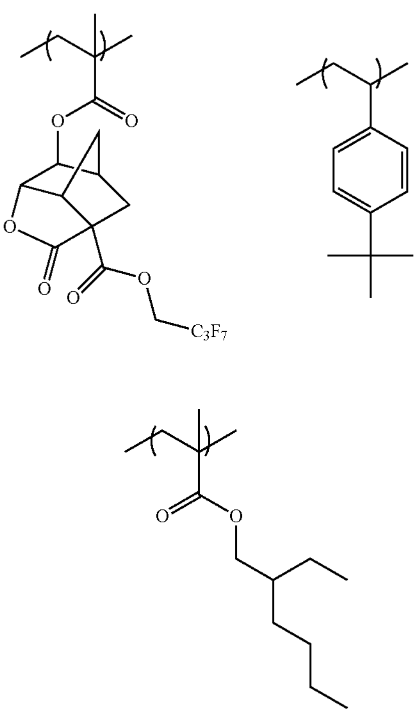

-continued
(C-222)
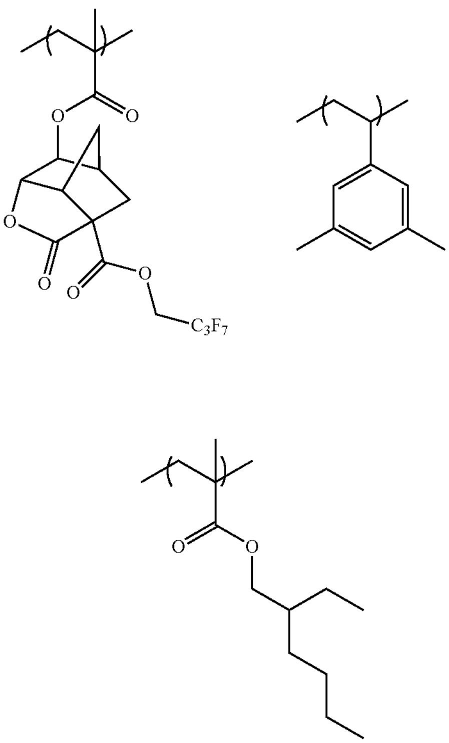
(C-223)
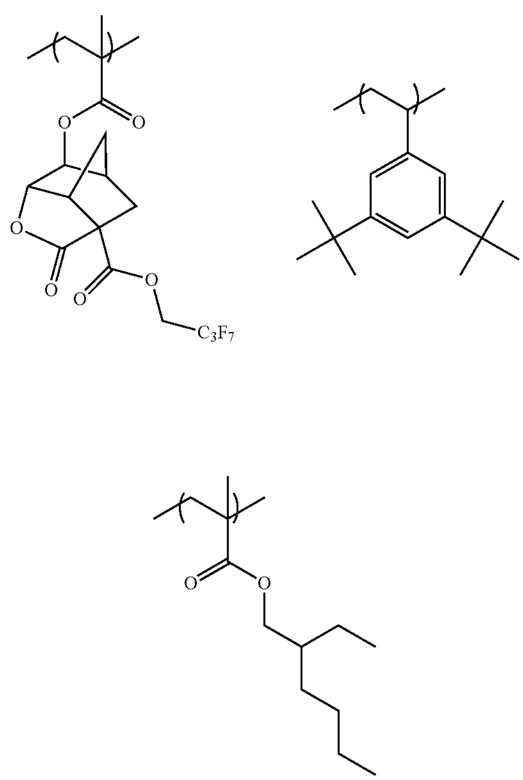
-continued
(C-224)
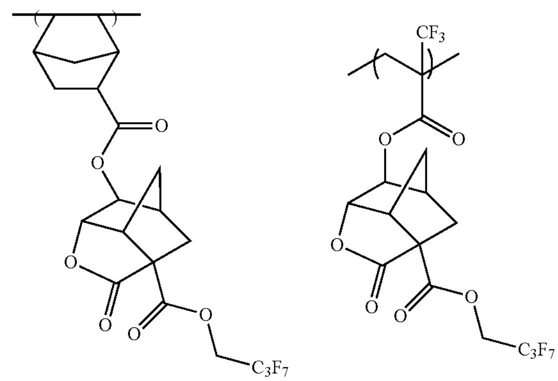
(C-225)
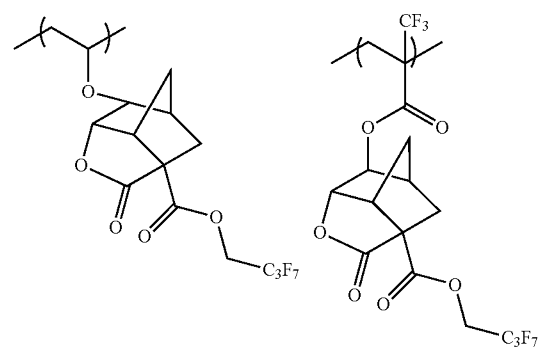
(C-226)
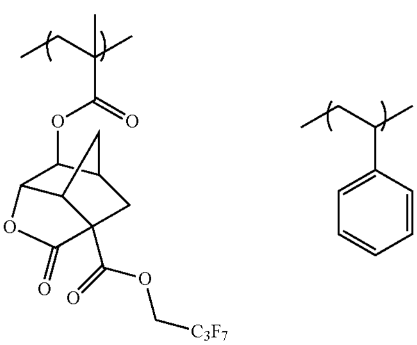
(C-227)
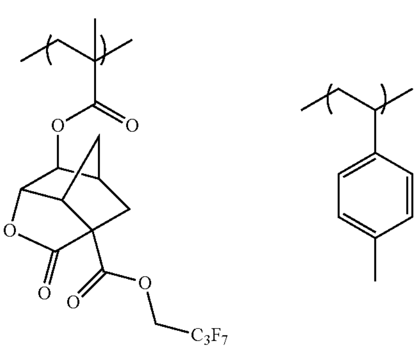

-continued
(C-228)
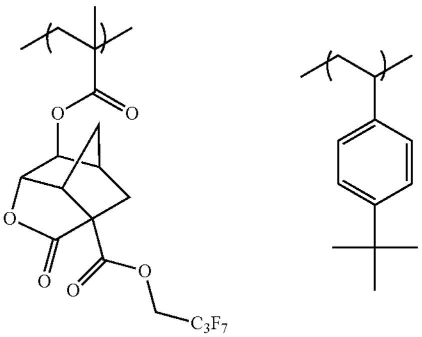
(C-229)
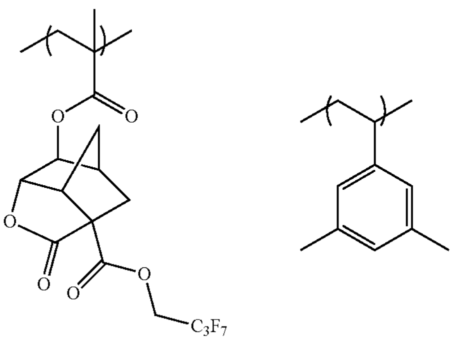
(C-230)
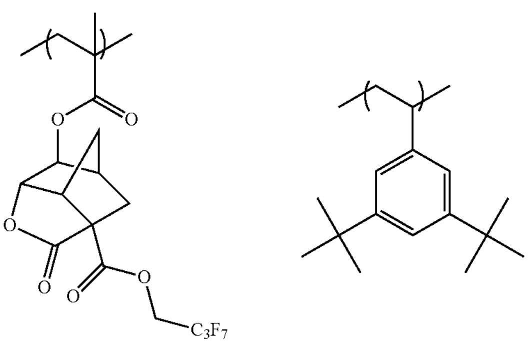
(C-231)
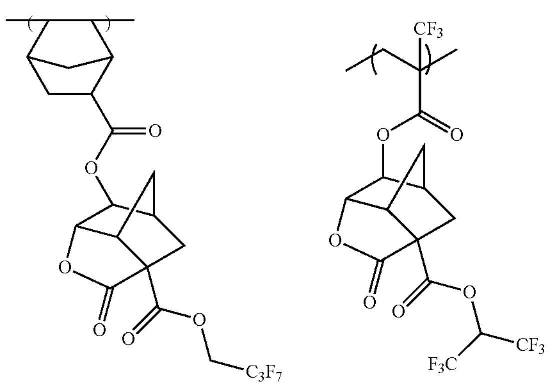
-continued
(C-232)
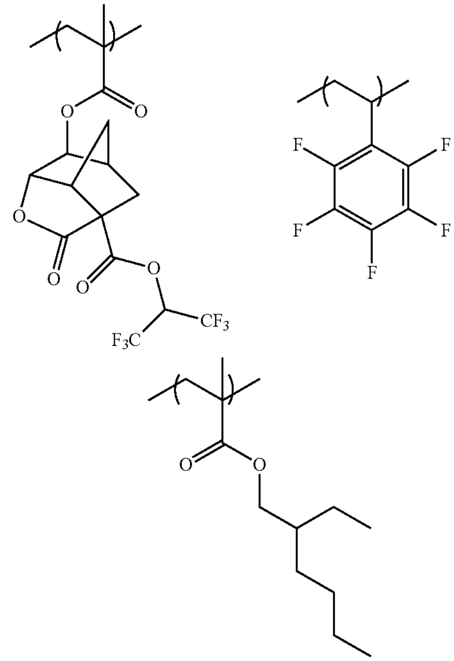
(C-233)
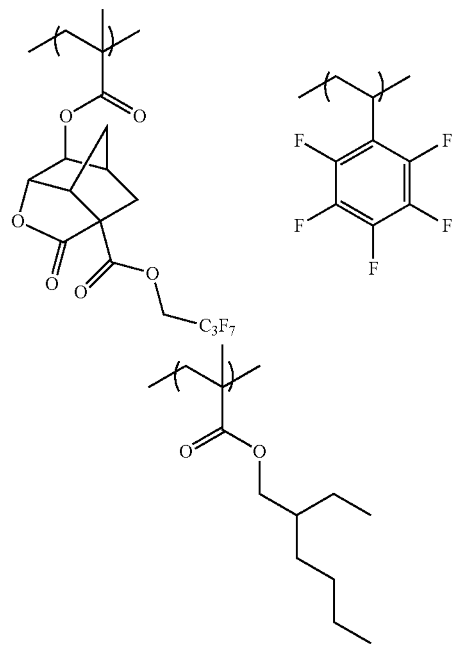
(C-234)
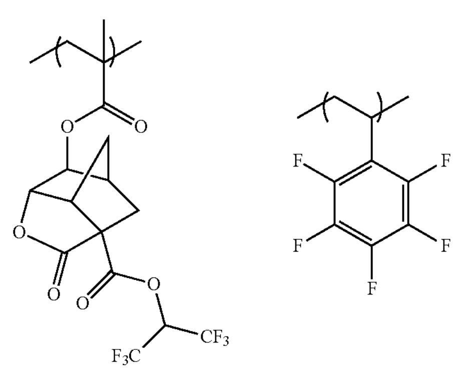

-continued
(C-235)
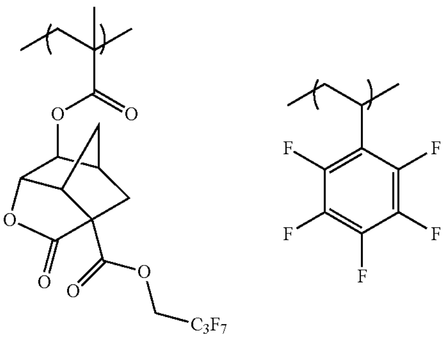
(C-236)
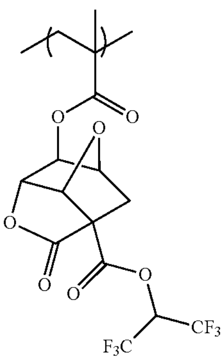
(C-237)
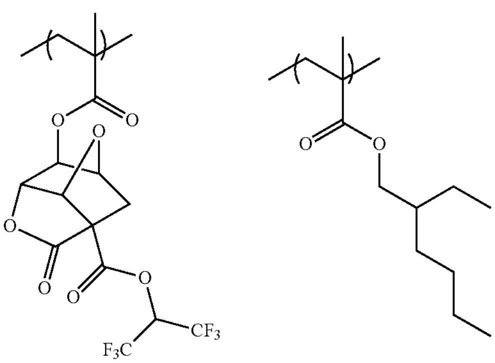
(C-238)
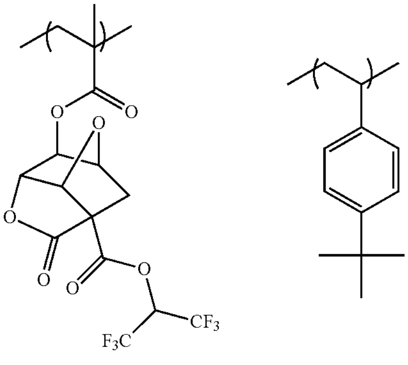
-continued
(C-239)
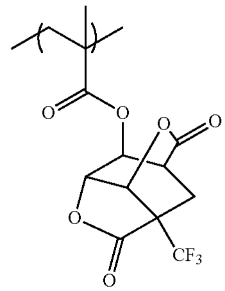
(C-240)
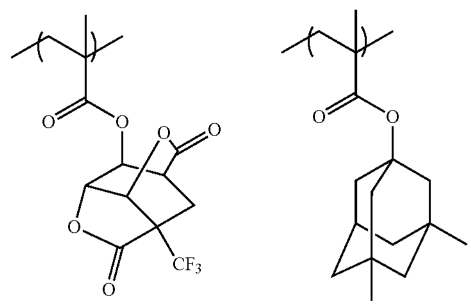
(C-241)
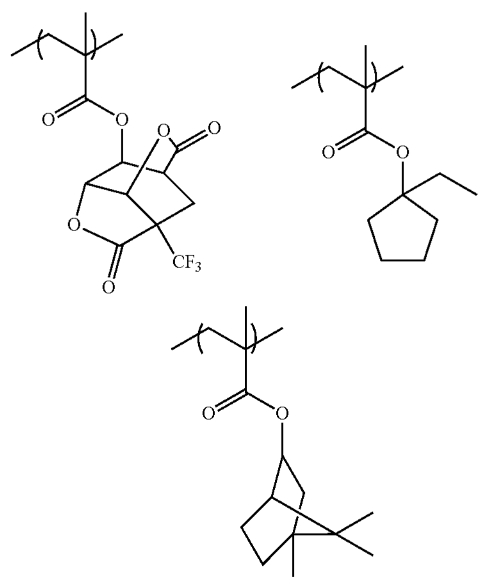
(C-242)
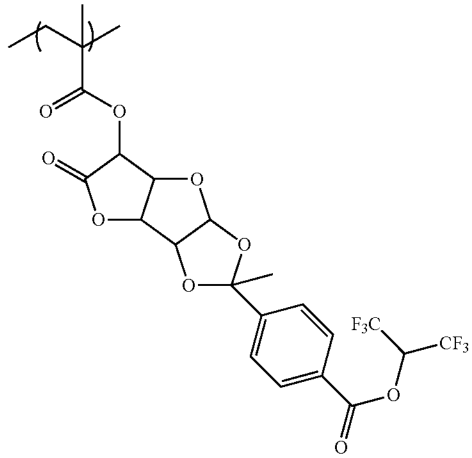

-continued
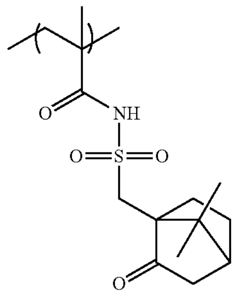
(C-243)
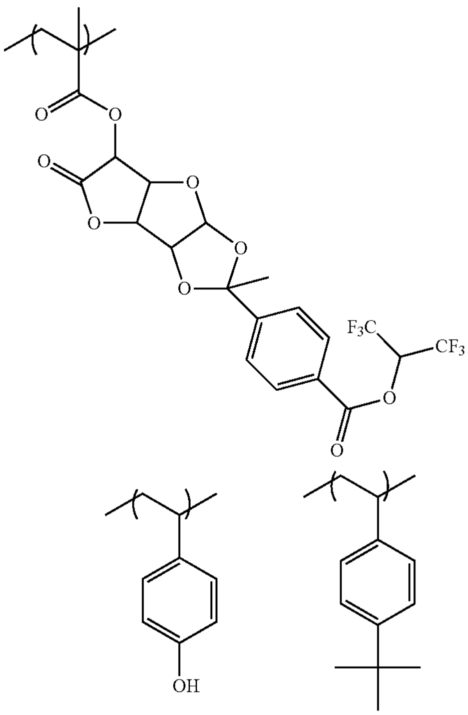
(C-244)
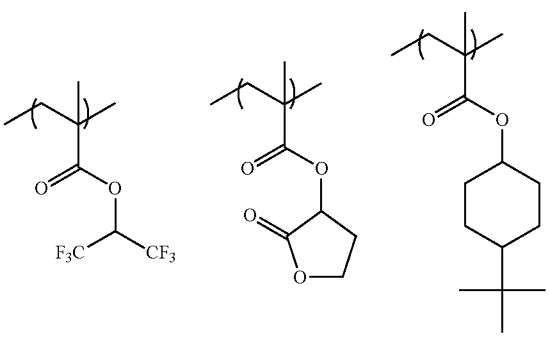
(C-245)
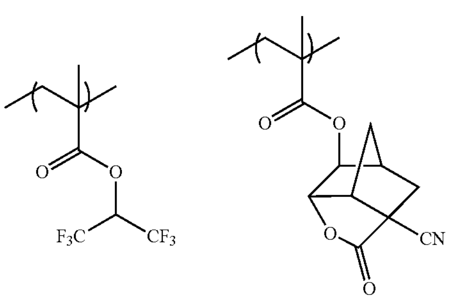
-continued
(C-246)
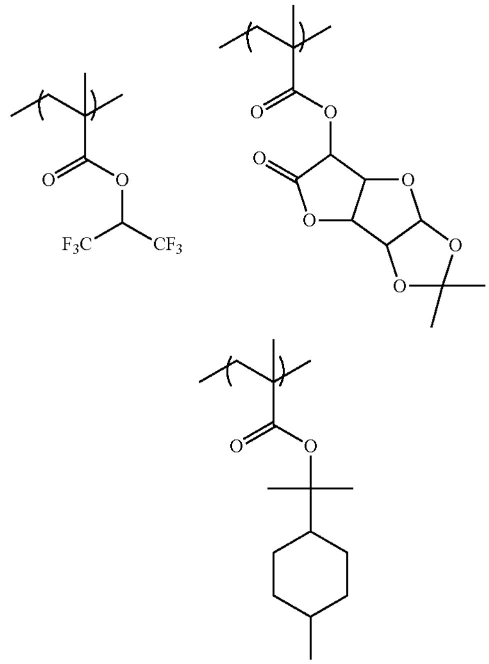
(C-247)
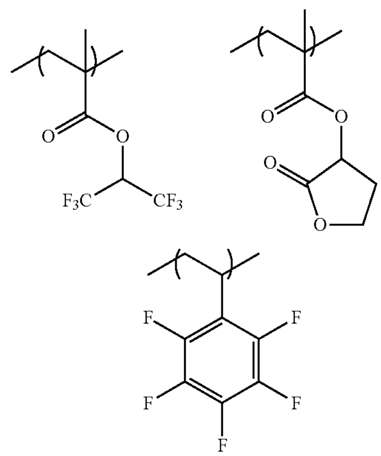
(C-248)
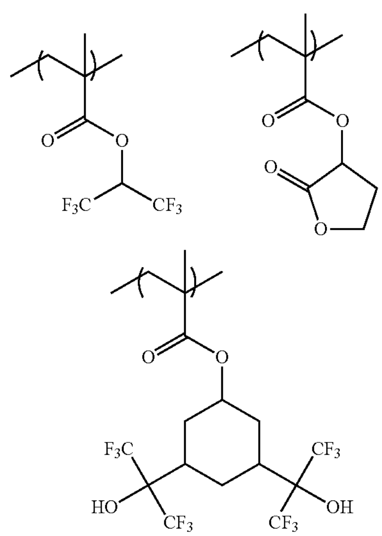

-continued
(C-249)
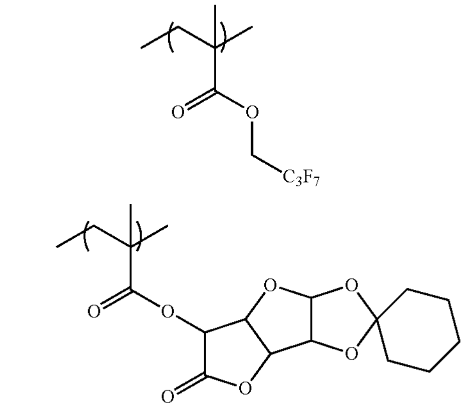
(C-250)
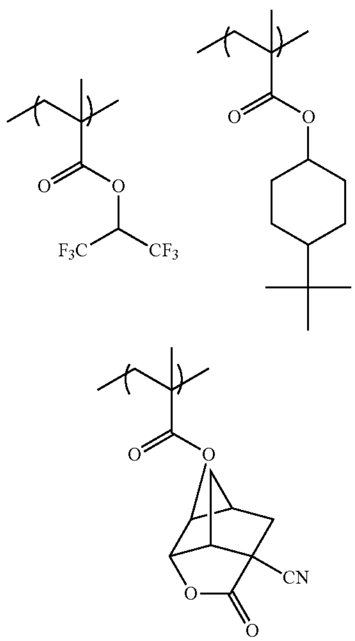
(C-251)
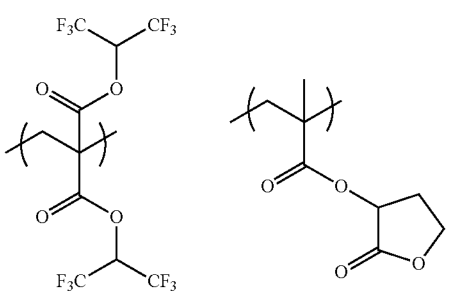
(C-252)
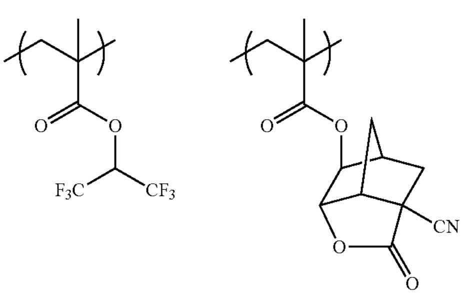
-continued
(C-253)
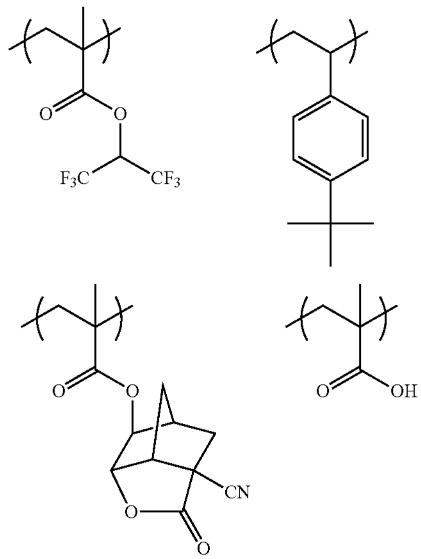
(C-254)
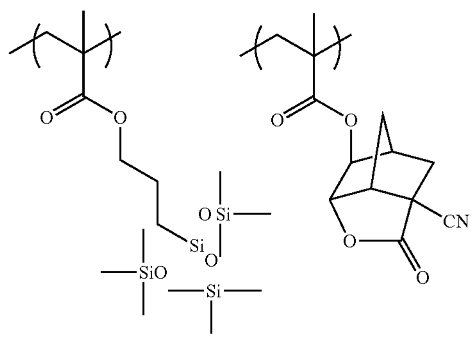
(C-255)
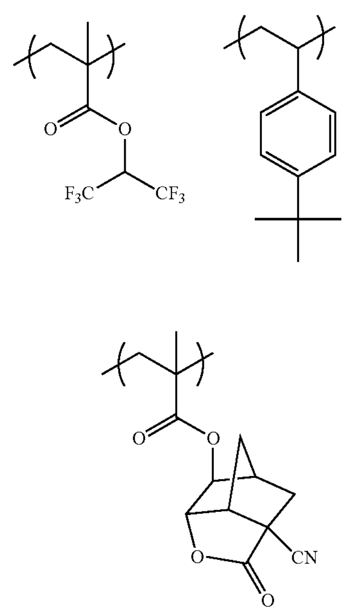

-continued
(C-256)
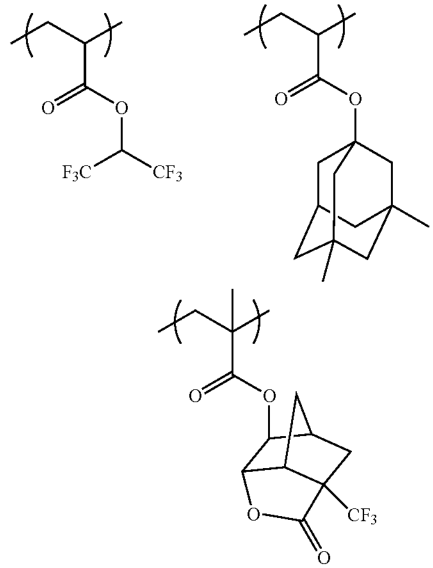
(C-257)
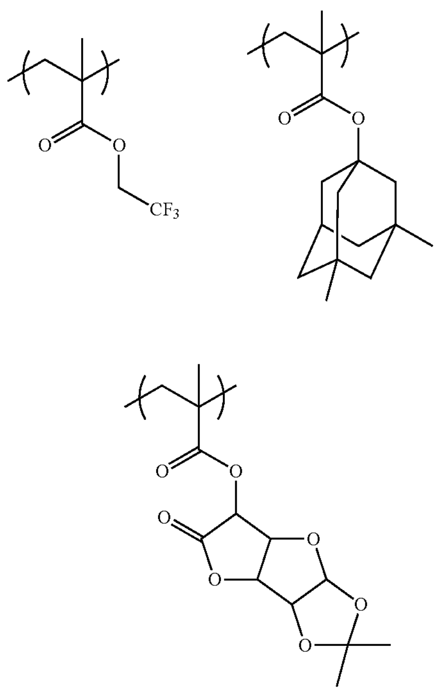
(C-258)
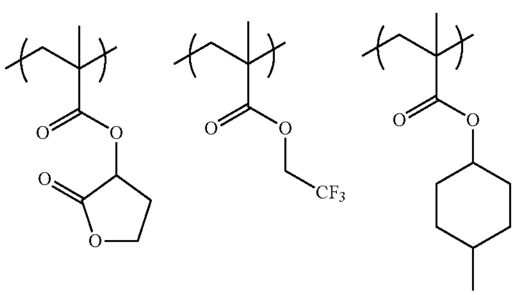
-continued
(C-259)
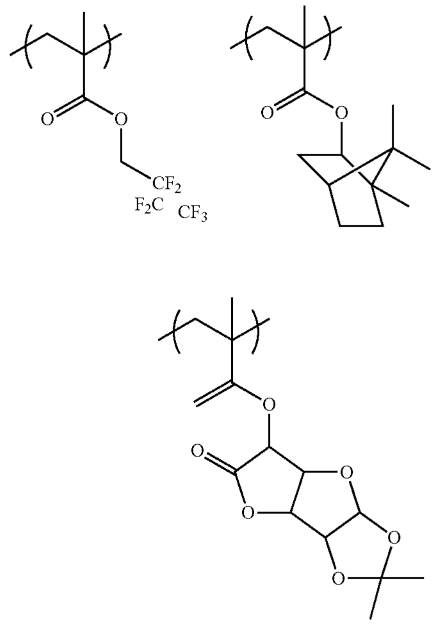
(C-260)
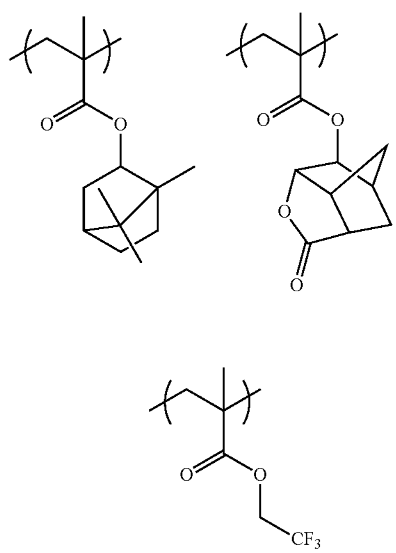
(C-261)
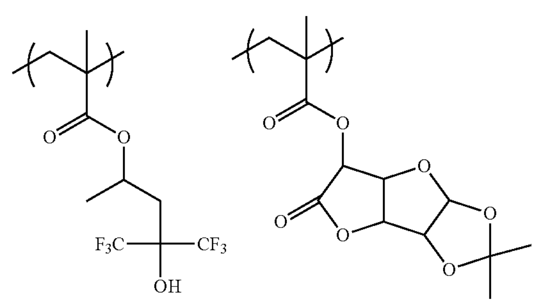

-continued
(C-262)
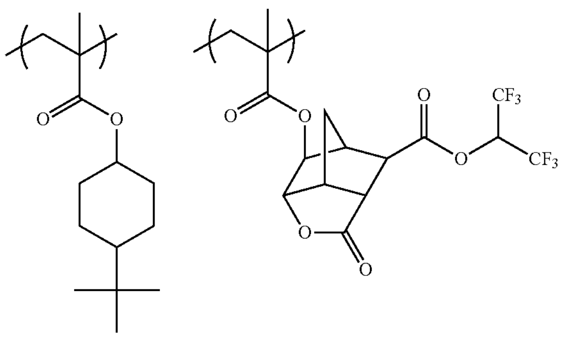
(C-263)
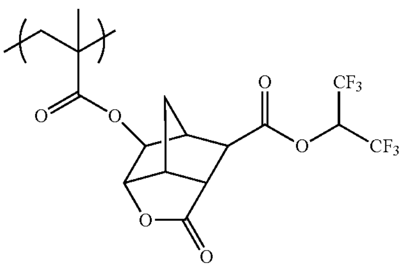
(C-264)
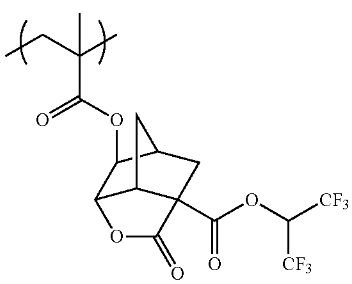
(C-265)
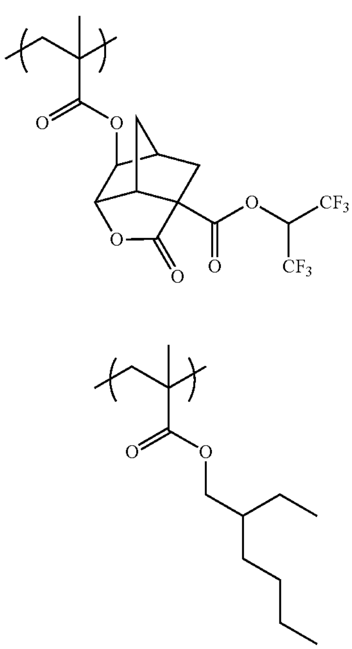
-continued
(C-266)
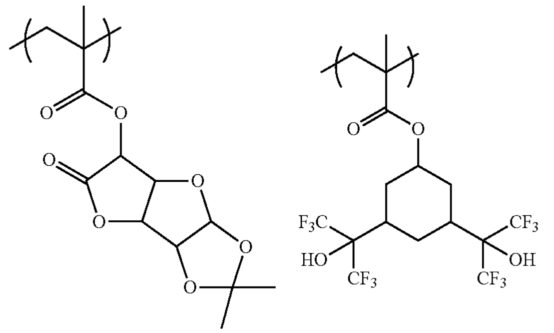
(C-267)
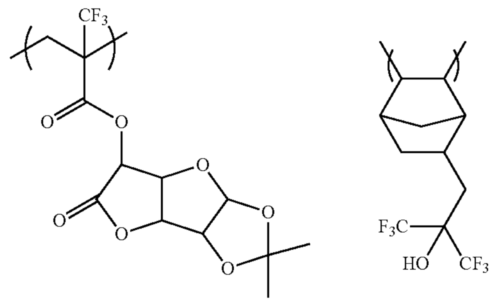
(C-268)
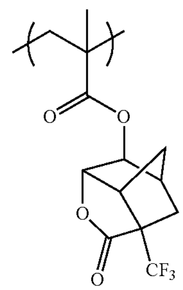
(C-269)
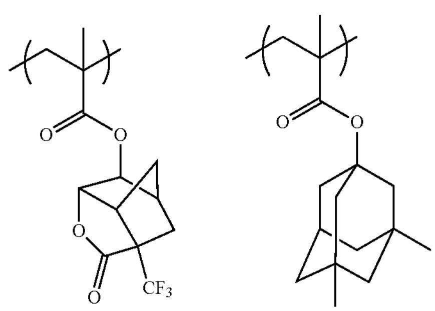
TABLE 2
| Resin | Composition | Mw | Mw/Mn |
|---|---|---|---|
| C-1 | 100 | 6000 | 1.5 |
| C-2 | 100 | 7500 | 1.4 |
| C-3 | 100 | 6000 | 1.4 |
| C-4 | 100 | 9000 | 1.5 |
| C-5 | 100 | 6000 | 1.4 |
| C-6 | 50/50 | 6500 | 1.4 |
| C-7 | 90/10 | 8000 | 1.4 |
| C-8 | 60/40 | 8000 | 1.3 |
| C-9 | 30/30/30/10 | 9500 | 1.4 |
| C-10 | 70/30 | 7000 | 1.4 |

TABLE 2-continued

| Resin | Composition | Mw | Mw/Mn |
|---|---|---|---|
| C-11 | 50/10/40 | 9000 | 1.6 |
| C-12 | 80/20 | 6000 | 1.4 |
| C-13 | 40/30/30 | 9500 | 1.4 |
| C-14 | 50/50 | 8000 | 1.4 |
| C-15 | 70/30 | 7000 | 1.4 |
| C-16 | 100 | 6000 | 1.4 |
| C-17 | 100 | 8000 | 1.4 |
| C-18 | 40/20/40 | 6000 | 1.4 |
| C-19 | 40/60 | 5000 | 1.5 |
| C-20 | 30/40/30 | 7000 | 1.4 |
| C-21 | 40/40/10/10 | 6000 | 1.4 |
| C-22 | 100 | 5500 | 1.4 |
| C-23 | 100 | 9500 | 1.5 |
| C-24 | 70/30 | 8500 | 1.4 |
| C-25 | 50/30/20 | 5000 | 1.4 |
| C-26 | 50/20/30 | 5500 | 1.4 |
| C-27 | 50/50 | 9000 | 1.5 |
| C-28 | 50/40/10 | 9000 | 1.4 |
| C-29 | 60/20/20 | 6500 | 1.4 |
| C-30 | 70/30 | 6500 | 1.4 |
| C-31 | 70/30 | 9000 | 1.5 |
| C-32 | 90/10 | 9000 | 1.5 |
| C-33 | 70/20/10 | 7000 | 1.4 |
| C-34 | 80/10/10 | 8500 | 1.5 |
| C-35 | 60/30/10 | 7500 | 1.4 |
| C-36 | 50/50 | 5000 | 1.5 |
| C-37 | 30/30/30/5/5 | 6000 | 1.5 |
| C-38 | 50/50 | 4500 | 1.4 |
| C-39 | 80/20 | 5000 | 1.4 |
| C-40 | 100 | 5000 | 1.4 |
| C-41 | 100 | 9000 | 1.5 |
| C-42 | 100 | 10000 | 1.5 |
| C-43 | 90/10 | 8500 | 1.4 |
| C-44 | 30/30/30/10 | 5500 | 1.4 |
| C-45 | 60/30/10 | 6500 | 1.4 |
| C-46 | 70/30 | 6500 | 1.4 |
| C-47 | 30/20/50 | 7000 | 1.4 |
| C-48 | 80/20 | 8000 | 1.5 |
| C-49 | 60/30/10 | 6000 | 1.4 |
| C-50 | 60/40 | 8000 | 1.5 |
| C-51 | 50/50 | 9500 | 1.4 |
| C-52 | 90/10 | 8000 | 1.5 |
| C-53 | 100 | 7000 | 1.5 |
| C-54 | 70/10/10/10 | 5500 | 1.4 |
| C-55 | 80/20 | 6500 | 1.4 |
| C-56 | 30/30/40 | 6000 | 1.4 |
| C-57 | 100 | 6000 | 1.4 |
| C-58 | 90/10 | 8000 | 1.4 |
| C-59 | 80/20 | 7000 | 1.5 |
| C-60 | 50/20/30 | 6000 | 1.4 |
| C-61 | 60/40 | 4500 | 1.5 |
| C-62 | 100 | 6500 | 1.4 |
| C-63 | 80/10/10 | 7000 | 1.5 |
| C-64 | 90/10 | 9000 | 1.5 |
| C-65 | 70/30 | 8000 | 1.4 |
| C-66 | 35/30/10/5/20 | 7000 | 1.4 |
| C-67 | 100 | 6500 | 1.4 |
| C-68 | 80/20 | 6500 | 1.4 |
| C-69 | 70/20/10 | 7000 | 1.4 |
| C-70 | 60/30/10 | 9000 | 1.5 |
| C-71 | 60/20/20 | 8000 | 1.4 |
| C-72 | 100 | 9500 | 1.5 |
| C-73 | 40/60 | 8000 | 1.4 |
| C-74 | 60/10/30 | 7000 | 1.5 |
| C-75 | 100 | 5500 | 1.5 |
| C-76 | 90/10 | 6500 | 1.4 |
| C-77 | 90/10 | 7500 | 1.3 |
| C-78 | 50/10/20/20 | 6000 | 1.5 |
| C-79 | 70/30 | 5000 | 1.3 |
| C-80 | 70/10/20 | 8500 | 1.5 |
| C-81 | 80/20 | 5500 | 1.3 |
| C-82 | 100 | 8000 | 1.3 |
| C-83 | 85/5/10 | 6500 | 1.4 |
| C-84 | 80/20 | 8000 | 1.5 |
| C-85 | 60/30/10 | 10000 | 1.5 |
| C-86 | 100 | 8000 | 1.5 |
| C-87 | 55/30/5/10 | 8000 | 1.3 |
| C-88 | 40/30/30 | 6000 | 1.3 |

TABLE 2-continued

| Resin | Composition | Mw | Mw/Mn |
|---|---|---|---|
| C-89 | 70/30 | 6500 | 1.3 |
| C-90 | 90/10 | 8000 | 1.5 |
| C-91 | 70/20/10 | 6500 | 1.5 |
| C-92 | 100 | 7000 | 1.4 |
| C-93 | 100 | 6000 | 1.5 |
| C-94 | 100 | 13000 | 1.4 |
| C-95 | 100 | 4000 | 1.4 |
| C-96 | 100 | 6000 | 1.5 |
| C-97 | 100 | 10000 | 1.4 |
| C-98 | 100 | 7500 | 1.5 |
| C-99 | 50/50 | 6500 | 1.4 |
| C-100 | 50/50 | 8500 | 1.4 |
| C-101 | 80/20 | 7000 | 1.3 |
| C-102 | 50/20/30 | 4500 | 1.3 |
| C-103 | 90/10 | 5500 | 1.3 |
| C-104 | 60/30/10 | 6000 | 1.5 |
| C-105 | 80/20 | 8000 | 1.3 |
| C-106 | 50/45/5 | 7500 | 1.4 |
| C-107 | 80/20 | 7000 | 1.5 |
| C-108 | 30/30/30/10 | 9000 | 1.6 |
| C-109 | 70/30 | 8000 | 1.3 |
| C-110 | 50/30/20 | 9000 | 1.4 |
| C-111 | 60/10/30 | 6000 | 1.5 |
| C-112 | 60/5/35 | 8000 | 1.5 |
| C-113 | 50/40/10 | 9500 | 1.5 |
| C-114 | 80/20 | 7000 | 1.5 |
| C-115 | 90/10 | 6000 | 1.2 |
| C-116 | 40/20/30/10 | 8000 | 1.3 |
| C-117 | 50/50 | 6000 | 1.5 |
| C-118 | 100 | 9500 | 1.4 |
| C-119 | 50/20/20/10 | 8000 | 1.5 |
| C-120 | 75/10/10/5 | 7000 | 1.3 |
| C-121 | 30/30/10/30 | 5500 | 1.3 |
| C-122 | 100 | 8000 | 1.3 |
| C-123 | 100 | 9500 | 1.5 |
| C-124 | 100 | 9000 | 1.6 |
| C-125 | 90/10 | 9500 | 1.3 |
| C-126 | 70/30 | 7500 | 1.5 |
| C-127 | 70/30 | 8000 | 1.3 |
| C-128 | 85/15 | 6000 | 1.5 |
| C-129 | 90/10 | 7000 | 1.6 |
| C-130 | 50/20/30 | 5000 | 1.3 |
| C-131 | 60/20/20 | 4000 | 1.4 |
| C-132 | 50/30/20 | 6500 | 1.4 |
| C-133 | 70/10/20 | 7000 | 1.4 |
| C-134 | 80/10/10 | 9000 | 1.4 |
| C-135 | 60/40 | 8000 | 1.5 |
| C-136 | 30/70 | 9000 | 1.4 |
| C-137 | 70/15/15 | 7500 | 1.5 |
| C-138 | 70/30 | 8000 | 1.4 |
| C-139 | 75/5/10/10 | 6000 | 1.5 |
| C-140 | 70/30 | 5500 | 1.5 |
| C-141 | 50/25/25 | 6500 | 1.4 |
| C-142 | 100 | 9000 | 1.6 |
| C-143 | 50/40/10 | 7000 | 1.4 |
| C-144 | 50/50 | 9000 | 1.4 |
| C-145 | 50/30/20 | 8000 | 1.4 |
| C-146 | 50/50 | 9000 | 1.5 |
| C-147 | 48/50/2 | 6000 | 1.4 |
| C-148 | 50/50 | 9000 | 1.5 |
| C-149 | 50/25/25 | 6000 | 1.4 |
| C-150 | 50/50 | 9500 | 1.5 |
| C-151 | 50/50 | 8000 | 1.5 |
| C-152 | 50/50 | 7000 | 1.4 |
| C-153 | 95/5 | 3000 | 1.4 |
| C-154 | 100 | 5000 | 1.4 |
| C-155 | 50/50 | 6000 | 1.5 |
| C-156 | 50/50 | 4000 | 1.5 |
| C-157 | 100 | 8000 | 1.4 |
| C-158 | 80/20 | 4500 | 1.4 |
| C-159 | 80/20 | 3500 | 1.4 |
| C-160 | 70/30 | 7000 | 1.4 |
| C-161 | 50/50 | 10000 | 1.3 |
| C-162 | 95/5 | 4500 | 1.4 |
| C-163 | 90/10 | 8500 | 1.4 |
| C-164 | 25/50/25 | 6000 | 1.5 |
| C-165 | 40/40/10/10 | 6500 | 1.4 |
| C-166 | 100 | 8000 | 1.4 |

TABLE 2-continued

| Resin | Composition | Mw | Mw/Mn |
|---|---|---|---|
| C-167 | 100 | 6500 | 1.4 |
| C-168 | 80/20 | 5000 | 1.3 |
| C-169 | 40/30/30 | 4500 | 1.5 |
| C-170 | 90/10 | 3000 | 1.4 |
| C-171 | 100 | 4500 | 1.4 |
| C-172 | 100 | 3500 | 1.4 |
| C-173 | 60/40 | 5000 | 1.4 |
| C-174 | 90/10 | 6000 | 1.4 |
| C-175 | 100 | 4000 | 1.5 |
| C-176 | 100 | 8000 | 1.4 |
| C-177 | 100 | 5000 | 1.4 |
| C-178 | 100 | 10000 | 1.5 |
| C-179 | 100 | 6000 | 1.4 |
| C-180 | 100 | 7000 | 1.3 |
| C-181 | 100 | 5500 | 1.4 |
| C-182 | 100 | 8000 | 1.3 |
| C-183 | 90/10 | 4500 | 1.4 |
| C-184 | 80/20 | 6000 | 1.4 |
| C-185 | 70/30 | 5500 | 1.6 |
| C-186 | 85/15 | 8500 | 1.4 |
| C-187 | 90/10 | 3000 | 1.3 |
| C-188 | 70/30 | 4500 | 1.4 |
| C-189 | 75/25 | 6500 | 1.4 |
| C-190 | 55/45 | 8500 | 1.3 |
| C-191 | 90/10 | 5500 | 1.4 |
| C-192 | 75/25 | 9000 | 1.4 |
| C-193 | 70/30 | 10000 | 1.5 |
| C-194 | 70/30 | 5000 | 1.4 |
| C-195 | 80/20 | 7000 | 1.4 |
| C-196 | 85/15 | 4500 | 1.4 |
| C-197 | 80/20 | 3500 | 1.5 |
| C-198 | 75/25 | 6000 | 1.4 |
| C-199 | 100 | 5000 | 1.4 |
| C-200 | 80/20 | 6000 | 1.4 |
| C-201 | 80/20 | 8000 | 1.5 |
| C-202 | 100 | 4500 | 1.5 |
| C-203 | 70/30 | 3500 | 1.4 |
| C-204 | 80/20 | 10000 | 1.4 |
| C-205 | 80/20 | 7000 | 1.4 |
| C-206 | 90/10 | 4000 | 1.4 |
| C-207 | 80/15/5 | 10000 | 1.4 |
| C-208 | 85/10/5 | 5000 | 1.5 |
| C-209 | 90/8/2 | 13000 | 1.5 |
| C-210 | 85/10/5 | 6000 | 1.5 |
| C-211 | 90/8/2 | 8000 | 1.4 |
| C-212 | 50/50 | 12000 | 1.5 |
| C-213 | 50/50 | 8000 | 1.3 |
| C-214 | 85/15 | 6500 | 1.5 |
| C-215 | 85/15 | 4000 | 1.5 |
| C-216 | 90/10 | 7500 | 1.6 |
| C-217 | 90/10 | 3500 | 1.5 |
| C-218 | 95/5 | 5500 | 1.4 |
| C-219 | 85/10/5 | 5000 | 1.5 |
| C-220 | 88/10/2 | 13000 | 1.4 |
| C-221 | 90/8/2 | 12000 | 1.5 |
| C-222 | 90/8/2 | 11000 | 1.4 |
| C-223 | 90/8/2 | 9000 | 1.5 |
| C-224 | 50/50 | 6000 | 1.5 |
| C-225 | 50/50 | 8000 | 1.5 |
| C-226 | 80/20 | 4500 | 1.3 |
| C-227 | 85/15 | 8500 | 1.6 |
| C-228 | 90/10 | 10000 | 1.4 |
| C-229 | 90/10 | 3500 | 1.5 |
| C-230 | 95/5 | 4500 | 1.5 |
| C-231 | 50/50 | 4000 | 1.5 |
| C-232 | 80/18/2 | 6000 | 1.5 |
| C-233 | 90/8/2 | 9500 | 1.5 |
| C-234 | 80/20 | 6500 | 1.4 |
| C-235 | 90/10 | 8000 | 1.5 |
| C-236 | 100 | 8000 | 1.5 |
| C-237 | 95/5 | 4500 | 1.5 |
| C-238 | 90/10 | 10000 | 1.5 |
| C-239 | 100 | 6500 | 1.4 |
| C-240 | 80/20 | 6500 | 1.4 |
| C-241 | 70/20/10 | 7000 | 1.4 |
| C-242 | 90/10 | 7000 | 1.6 |
| C-243 | 50/20/30 | 5000 | 1.3 |
| C-244 | 40/30/30 | 5000 | 1.4 |
| C-245 | 60/40 | 6000 | 1.4 |
| C-246 | 40/20/40 | 7000 | 1.4 |
| C-247 | 40/30/30 | 8000 | 1.5 |
| C-248 | 40/30/30 | 9500 | 1.5 |
| C-249 | 60/40 | 9500 | 1.5 |
| C-250 | 40/40/20 | 7500 | 1.4 |
| C-251 | 80/20 | 9000 | 1.5 |
| C-252 | 80/20 | 9000 | 1.5 |
| C-253 | 40/30/15/15 | 7000 | 1.4 |
| C-254 | 60/40 | 8500 | 1.4 |
| C-255 | 50/30/20 | 8000 | 1.4 |
| C-256 | 30/30/40 | 9500 | 1.5 |
| C-257 | 30/50/20 | 8000 | 1.3 |
| C-258 | 30/50/20 | 8000 | 1.3 |
| C-259 | 40/40/20 | 6500 | 1.4 |
| C-260 | 50/30/20 | 6000 | 1.4 |
| C-261 | 80/20 | 8500 | 1.5 |
| C-262 | 20/80 | 10000 | 1.5 |
| C-263 | 100 | 8500 | 1.5 |
| C-264 | 100 | 6000 | 1.4 |
| C-265 | 90/10 | 8000 | 1.4 |
| C-266 | 30/70 | 9000 | 1.6 |
| C-267 | 50/50 | 4000 | 1.3 |
| C-268 | 100 | 6500 | 1.4 |
| C-269 | 80/20 | 6500 | 1.4 |

It is both appropriate to use a single type of hydrophobic resin alone and use two or more types of hydrophobic resins in combination. For example, the hydrophobic resin containing a polarity conversion group is preferably used in combination with a hydrophobic resin (CP) different from the mentioned resin which contains at least either a fluorine atom or a silicon atom.

When the resin containing a polarity conversion group and the resin (CP) are contained in the composition, uneven localization of the resin containing a polarity conversion group and the resin (CP) occurs. When water is used as a liquid immersion medium, upon film formation, there can be increased the receding contact angle of the surface of the resist film with reference to water. Accordingly, the immersion water tracking property of the film can be enhanced. The content of the resin (CP) can be appropriately regulated so that the receding contact angle of the film after bake but before exposure falls within the range of preferably 60 to 90°. Based on the total solids of the actinic-ray- or radiation-sensitive resin composition, the content is preferably in the range of 0.01 to 10 mass %, more preferably 0.01 to 5 mass %, further more preferably 0.01 to 4 mass % and most preferably 0.01 to 3 mass %.

As mentioned above, the resin (CP) is unevenly localized in a surface. However, as different from surfactants, it is not always necessary for the resin to have a hydrophilic group in its molecule. The resin is not needed to contribute to the uniform mixing of polar and nonpolar substances.

In the resin (CP) having at least either a fluorine atom or a silicon atom, the fluorine atom and silicon atom may be introduced in the principal chain of the resin or may be introduced in a side chain of the resin by substitution.

It is preferred for the resin (CP) to be a resin containing, as a partial structure having a fluorine atom, an alkyl group having a fluorine atom, a cycloalkyl group having a fluorine atom or an aryl group having a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a cycloalkyl group of a single ring or multiple rings having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing fluorine atoms, cycloalkyl groups containing fluorine atoms and aryl groups containing fluorine atoms, there can be mentioned the groups of general formulae (F2) to (F4) given above with respect to the above-mentioned resin. These groups in no way limit the scope of the present invention.

In the present invention, it is preferred for the groups of general formulae (F2) to (F4) to be contained in (meth)acrylate repeating units.

It is preferred for the resin (CP) to be a resin containing, as a partial structure having a silicon atom, an alkylsilyl structure (especially a trialkylsilyl group) or a cyclosiloxane structure.

As the alkylsilyl structure and cyclosiloxane structure, there can be mentioned, for example, any of the groups of general formulae (CS-1) to (CS-3) mentioned above with respect to the hydrophobic resin (CP) or the like.

Moreover, the resin (CP) may have at least one group selected from among the following groups (x) and (z):

(x) an alkali soluble group, and (z) a group that is decomposed by the action of an acid.

As these groups, there can be mentioned, for example, those mentioned above with respect to the above-mentioned resin.

As specific examples of resin (CP), there can be mentioned, for example, (HR-1) to (HR-65) given above.

At the time of irradiation with actinic rays or radiation, exposure (liquid immersion exposure) may be carried out after filling the interstice between resist film and lens with a liquid (liquid immersion medium, liquid for liquid immersion) of refractive index higher than that of air. This would bring about an enhancement of resolving power. Any liquid with a refractive index higher than that of air can be employed as the liquid immersion medium. Preferably, pure water is employed.

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferred to use water from not only the above viewpoints but also the viewpoints of easy procurement and easy handling.

Further, from the viewpoint of refractive index increase, use can be made of a medium of 1.5 or higher refractive index. Such a medium may be an aqueous solution or an organic solvent.

In the use of water as a liquid for liquid immersion, a slight proportion of additive (liquid) that would not dissolve the resist film on a wafer and would be negligible with respect to its influence on an optical coat for an under surface of lens element may be added in order to not only decrease the surface tension of water but also increase a surface activating power. The additive is preferably an aliphatic alcohol with a refractive index approximately equal to that of water, for example, methyl alcohol, ethyl alcohol, isopropyl alcohol or the like. The addition of an alcohol with a refractive index approximately equal to that of water is advantageous in that even when the alcohol component is evaporated from water to thereby cause a change of content concentration, the change of refractive index of the liquid as a whole can be minimized. On the other hand, when a substance being opaque in 193 nm rays or an impurity whose refractive index is greatly different from that of water is mixed therein, the mixing would invite a distortion of optical image projected on the resist film. Accordingly, it is preferred to use distilled water as the liquid immersion water. Furthermore, use may be made of pure water having been filtered through an ion exchange filter or the like.

Desirably, the electrical resistance of the water is 18.3 MQcm or higher, and the TOC (organic matter concentration) thereof is 20 ppb or below. Prior deaeration of the water is desired.

Raising the refractive index of the liquid for liquid immersion would enable an enhancement of lithography performance. From this viewpoint, an additive suitable for refractive index increase may be added to the water, or heavy water ($D_2O$) may be used in place of water.

For the prevention of direct contact of a film with a liquid for liquid immersion, a film that is highly insoluble in the liquid for liquid immersion (hereinafter also referred to as a “top coat”) may be provided between the film produced from the composition of the present invention and the liquid for liquid immersion. The functions to be fulfilled by the top coat are applicability to an upper layer portion of the resist, transparency in radiation of especially 193 nm and being highly insoluble in the liquid for liquid immersion. Preferably, the top coat does not mix with the resist and is uniformly applicable to an upper layer of the resist.

From the viewpoint of 193 nm transparency, the top coat preferably consists of a polymer not abundantly containing an aromatic moiety. As such, there can be mentioned, for example, a hydrocarbon polymer, an acrylic ester polymer, polymethacrylic acid, polyacrylic acid, polyvinyl ether, a siliconized polymer, a fluoropolymer or the like. The aforementioned hydrophobic resins also find appropriate application in the top coat. From the viewpoint of contamination of an optical lens by leaching of impurities from the top coat into the liquid for liquid immersion, it is preferred to reduce the amount of residual monomer components of the polymer contained in the top coat.

At the detachment of the top coat, use may be made of a developer, or a separate peeling agent may be used. The peeling agent preferably consists of a solvent having a lower permeation into the film. Detachability by an alkali developer is preferred from the viewpoint of simultaneous attainment of the detachment step with the development processing step for the film. The top coat is preferred to be acidic from the viewpoint of detachment with the use of an alkali developer. However, from the viewpoint of non-intermixability with the film, the top coat may be neutral or alkaline.

The less the difference in refractive index between the top coat and the liquid for liquid immersion, the higher the resolving power. In an ArF excimer laser (wavelength: 193 nm), when water is used as the liquid for liquid immersion, the top coat for ArF liquid immersion exposure preferably has a refractive index close to that of the liquid for liquid immersion. From the viewpoint of approximation of the refractive index to that of the liquid for liquid immersion, it is preferred for the top coat to contain a fluorine atom. From the viewpoint of transparency and refractive index, it is preferred to reduce the thickness of the film.

Preferably, the top coat does not mix with the film and also does not mix with the liquid for liquid immersion. From this viewpoint, when the liquid for liquid immersion is water, it is preferred for the solvent used in the top coat to be highly insoluble in the solvent used in the positive resist composition and be a non-water-soluble medium. When the liquid for liquid immersion is an organic solvent, the top coat may be soluble or insoluble in water.

The composition employable for the pattern forming method according to the present invention may further contain a solvent, a basic compound, a surfactant, a carboxylic acid onium salt, a dissolution inhibiting compound and/or other additives.

(Solvent)

The composition employable for the pattern forming method according to the present invention may further contain a solvent.

As the solvent, an organic solvent such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate and an alkyl pyruvate can be exemplified.

As alkylene glycol monoalkyl ether carboxylates, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate can be exemplified.

As alkylene glycol monoalkyl ethers, propylene glycol monomethyl ether, propylene glycol monoethyl ether, propylene glycol monopropyl ether, propylene glycol monobutyl ether, ethylene glycol monomethyl ether, and ethylene glycol monoethyl ether can be exemplified.

As alkyl lactates, methyl lactate, ethyl lactate, propyl lactate and butyl lactate can be exemplified.

As alkyl alkoxypropionates, ethyl 3-ethoxypropionate, methyl 3-methoxypropionate, methyl 3-ethoxypropionate, and ethyl 3-methoxypropionate can be exemplified.

As cyclolactones, β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone can be exemplified.

As optionally cyclized monoketone compounds, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone can be exemplified.

As alkylene carbonates, propylene carbonate, vinylene carbonate, ethylene carbonate, and butylene carbonate can be exemplified.

As alkyl alkoxyacetates, acetic acid 2-methoxyethyl ester, acetic acid 2-ethoxyethyl ester, acetic acid 2-(2-ethoxyethoxy)ethyl ester, acetic acid 3-methoxy-3-methylbutyl ester, and acetic acid 1-methoxy-2-propyl ester can be exemplified.

As alkyl pyruvates, methyl pyruvate, ethyl pyruvate and propyl pyruvate can be exemplified.

As a preferably employable solvent, a solvent having a boiling point measured at ordinary temperature under ordinary pressure of 130° C. or above can be mentioned. As the solvent, cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester, and propylene carbonate can be exemplified.

These solvents may be used either individually or in combination. When in the latter case, a mixed solvent consisting of a mixture of a solvent having a hydroxy group in its structure and a solvent having no hydroxy group may be used as the organic solvent.

As the solvent having a hydroxy group, an alkylene glycol monoalkyl ether and ethyl lactate can be exemplified. Of these, propylene glycol monomethyl ether, and ethyl lactate are especially preferred.

As the solvent having no hydroxy group, an alkylene glycol monoalkyl ether acetate, an alkylalkoxypropionate, a monoketone compound optionally with a ring structure, a cyclic lactone, and an alkyl acetate can be exemplified. Of these, a propylene glycol monomethyl ether acetate, an ethylehoxypropionate, a 2-heptanone, a γ-butyl lactone, a cyclohexanone, or a butyl acetate is more preferred, and a propylene glycol monomethyl ether acetate, an ethylehoxypropionate, or a 2-heptanone is especially preferred.

When employing a mixed solvent consisting of a mixture of a solvent having a hydroxy group in its structure and a solvent having no hydroxy group, the mass ratio between them is preferably in the range of 1/99 to 99/1, more preferably 10/90 to 90/10, and further more preferably 20/80 to 60/40.

The mixed solvent containing 50 mass % or more of a solvent having no hydroxyl group is especially preferred from the viewpoint of uniform applicability.

It is preferred for the solvent to be a mixed solvent consisting of two or more solvents and to contain propylene glycol monomethyl ether acetate.

(Basic Compound)

The composition employable for the pattern forming method according to the present invention may further contain a basic compound. As preferred basic compounds, the compounds having the structures represented by the following formulae (A) to (E) can be exemplified.

(A)

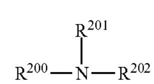

(B)

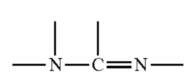

(C)

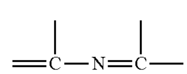

(D)

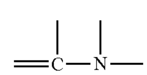

-continued (E)

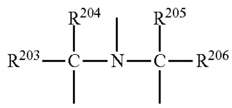

In the general formulae (A) and (E), $R^{200}$, $R^{201}$ and $R^{202}$ each independently represents a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded to each other to form a ring.

$R^{203}$, $R^{204}$, $R^{205}$ and $R^{206}$ each independently represents an alkyl group having 1 to 20 carbon atoms.

With respect to the above alkyl group, as a preferred substituted alkyl group, an aminoalkyl group having 1 to 20 carbon atoms, a hydroxyalkyl group having 1 to 20 carbon atoms, and a cyanoalkyl group having 1 to 20 carbon atoms can be exemplified. More preferably, the alkyl groups are unsubstituted.

As preferred basic compounds, guanidine, aminopyrrolidine, pyrazole, pyrazoline, piperazine, aminomorpholine, aminoalkylmorpholine and piperidine can be exemplified. As more preferred compounds, those with an imidazole structure, a diazabicyclo structure, an onium hydroxide structure, an onium carboxylate structure, a trialkylamine structure, an aniline structure or a pyridine structure, alkylamine derivatives having a hydroxy group and/or an ether bond, and aniline derivatives having a hydroxy group and/or an ether bond can be exemplified.

As the compounds with an imidazole structure, imidazole, 2,4,5-triphenylimidazole, benzimidazole, and 2-phenylbenzoimidazole can be exemplified.

As the compounds with a diazabicyclo structure, 1,4-diazabicyclo[2,2,2]octane, 1,5-diazabicyclo[4,3,0]non-5-ene, and 1,8-diazabicyclo[5,4,0]undec-7-ene can be exemplified.

As the compounds with an onium hydroxide structure, tetrabutylammonium hydroxide, triarylsulfonium hydroxide, phenacylsulfonium hydroxide, and sulfonium hydroxides having a 2-oxoalkyl group, such as triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide can be exemplified.

As the compounds with an onium carboxylate structure, those having a carboxylate at the anion moiety of the compounds with an onium hydroxide structure, such as acetate, adamantane-1-carboxylate, and perfluoroalkyl carboxylate can be exemplified.

As the compounds with a trialkylamine structure, tri(n-butyl)amine and tri(n-octyl)amine can be exemplified.

As the aniline compounds, 2,6-diisopropylaniline, N,N-dimethylaniline, N,N-dibutylaniline, and N,N-dihexylaniline can be exemplified.

As the alkylamine derivatives having a hydroxy group and/or an ether bond, ethanolamine, diethanolamine, triethanolamine, N-phenyldiethanolamine, and tris(methoxyethoxyethyl)amine can be exemplified.

As the aniline derivatives having a hydroxy group and/or an ether bond, N,N-bis(hydroxyethyl)aniline can be exemplified.

As preferred basic compounds, an amine compound having a phenoxy group, an ammonium salt compound having a phenoxy group, an amine compound having a sulfonic ester group, and an ammonium salt compound having a sulfonic ester group can further be exemplified.

In these compounds, it is preferred for at least one alkyl group to be bonded to a nitrogen atom. More preferably, an oxygen atom is contained in the chain of the alkyl group, thereby forming an oxyalkylene group. With respect to the number of oxyalkylene groups in each molecule, one or more is preferred, three to nine more preferred, and four to six further more preferred. Of these oxyalkylene groups, the groups of the formulae $—CH_2CH_2O—$, $—CH(CH_3)CH_2O—$ and $—CH_2CH_2CH_2O—$ are especially preferred.

As specific examples of these compounds, there can be mentioned, for example, the compounds (C1-1) to (C3-3) given as examples in section [0066] of US Patent Application Publication No. 2007/0224539 A.

The total amount of basic compound used based on the solid contents of the actinic ray-sensitive or radiation-sensitive resin composition is generally in the range of 0.001 to 10 mass %, preferably 0.01 to 5 mass %.

The molar ratio of the total amount of acid generators to the total amount of basic compounds is preferably in the range of 2.5 to 300, more preferably 5.0 to 200 and further more preferably 7.0 to 150. When this molar ratio is extremely lowered, the possibility of sensitivity and/or resolution deterioration is invited. On the other hand, when the molar ratio is extremely raised, any pattern thickening might occur during the period between exposure and postbake.

(Surfactant)

The composition employable for the pattern forming method according to the present invention may further contain a surfactant. The composition according to the present invention when containing the above surfactant would, in the use of an exposure light source of 250 nm or below, especially 220 nm or below, realize favorable sensitivity and resolving power and produce a resist pattern with less adhesion and development defects.

It is especially preferred to use a fluorinated and/or siliconized surfactant as the surfactant.

As fluorinated and/or siliconized surfactants, there can be mentioned, for example, those described in section [0276] of US Patent Application Publication No. 2008/0248425. Further, as useful commercially available surfactants, fluorinated surfactants or siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS) can be exemplified. Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). In particular, polymers each having a fluoroaliphatic group derived from such a fluoroaliphatic compound may be used as the surfactant. The fluorinated aliphatic compound can be synthesized by the process described in JP-A-2002-90991.

The polymer having a fluorinated aliphatic group is preferably a copolymer from a monomer having a fluorinated aliphatic group and a poly(oxyalkylene) acrylate and/or poly (oxyalkylene) methacrylate, in which copolymer may have an irregular distribution or may result from block copolymerization.

As the poly(oxyalkylene) group, a poly(oxyethylene) group, a poly(oxypropylene) group, and a poly(oxybutylene) group can be exemplified. Further, use can be made of a unit having alkylene groups of different chain lengths in a single chain, such as poly(oxyethylene-oxypropylene-oxyethylene block concatenation) or poly(oxyethylene-oxypropylene block concatenation).

Moreover, the copolymer from a monomer having a fluorinated aliphatic group and a poly(oxyalkylene) acrylate (or methacrylate) is not limited to two-monomer copolymers and may be a three or more monomer copolymer obtained by simultaneous copolymerization of two or more different monomers having a fluorinated aliphatic group, two or more different poly(oxyalkylene) acrylates (or methacrylates), etc.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene) acrylate (or methacrylate), a copolymer from an acrylate (or methacrylate) having a $C_6F_{13}$ group, poly(oxyethylene) acrylate (or methacrylate) and poly(oxypropylene) acrylate (or methacrylate), a copolymer from an acrylate (or methacrylate) having a $C_8F_{17}$ group and a poly(oxyalkylene) acrylate (or methacrylate), a copolymer from an acrylate (or methacrylate) having a $C_8F_{17}$ group, poly(oxyethylene) acrylate (or methacrylate) and poly(oxypropylene) acrylate (or methacrylate), or the like.

Further, use may be made of surfactants other than the fluorinated and/or siliconized surfactants, described in section [0280] of US Patent Application Publication No. 2008/0248425.

These surfactants may be used either individually or in combination.

When the composition employable for the pattern forming method according to the present invention contains the surfactant, the total amount thereof used based on the total solids of the composition is preferably in the range of 0.0001 to 2 mass %, more preferably 0.0001 to 1.5 mass %, and most preferably 0.0005 to 1 mass %.

(Carboxylic Acid Onium Salt)

The composition employable for the pattern forming method according to the present invention may further contain a carboxylic acid onium salt. Accordingly, there would be achieved securement of the transparency in 220 nm or shorter light, enhancement of the sensitivity and resolving power, and improvement of the iso/dense dependency and exposure margin.

Preferred carboxylic acid onium salt is a sulfonium salt and an iodonium salt. In particular, the especially preferred anion moiety thereof is a linear or branched alkylcarboxylate anion, and monocyclic or polycyclic cycloalkylcarboxylate anion each having 1 to 30 carbon atoms. A more preferred anion moiety is an anion of carboxylic acid wherein the alkyl group or the cycloalkyl group is partially or wholly fluorinated (hereinafter also called as fluorinated carboxylic acid anion). The alkyl or cycloalkyl chain may contain an oxygen atom.

As the fluorinated carboxylic acid anion, any of the anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid can be exemplified.

When the composition employable for the pattern forming method according to the present invention contains the carboxylic acid onium salt, the total amount thereof used based on the total solids of the composition is preferably in the range of 0.1 to 20 mass %, more preferably 0.5 to 10 mass %, and most preferably 1 to 7 mass %.

(Dissolution Inhibiting Compound)

The composition employable for the pattern forming method according to the present invention may further contain a dissolution inhibiting compound. Here the "dissolution inhibiting compound" means compound having 3000 or less molecular weight that is decomposed by the action of an acid to increase the solubility in an alkali developer.

From the viewpoint of preventing lowering of the transmission at the wavelength of 220 nm or shorter, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure can be the same as described earlier.

When the composition according to the present invention is exposed to a KrF excimer laser or irradiated with electron beams, preferred use is made of one having a structure resulting from substitution of the phenolic hydroxy group of a phenol compound with an acid-decomposable group. The phenol compound preferably contains 1 to 9 phenol skeletons, more preferably 2 to 6 phenol skeletons.

When the composition employable for the pattern forming method according to the present invention contains the dissolution inhibiting compound, the total amount thereof used based on the total solids of the composition is preferably in the range of 3 to 50 mass %, and more preferably 5 to 40 mass %.

Specific examples of the dissolution inhibiting compound will be shown below.

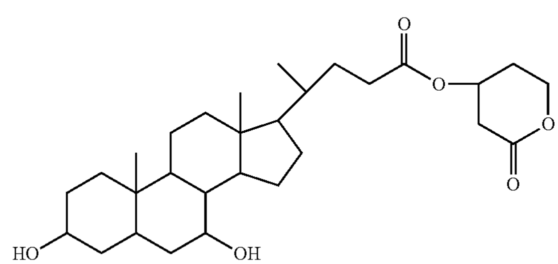

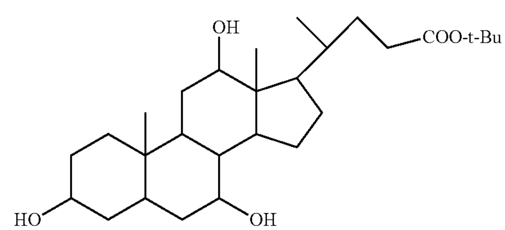

-continued

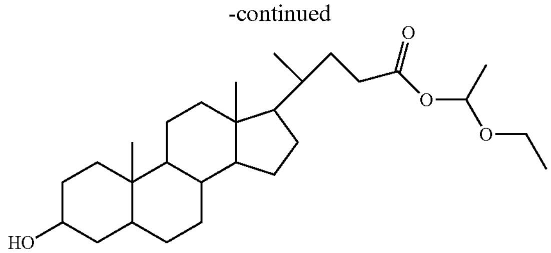

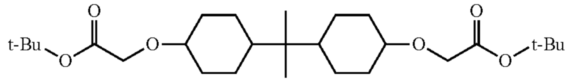

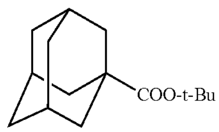

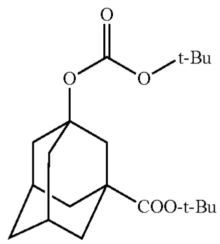

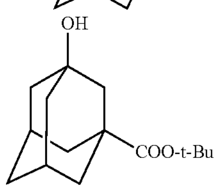

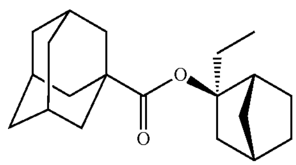

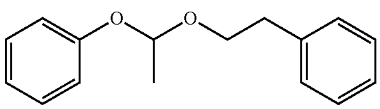

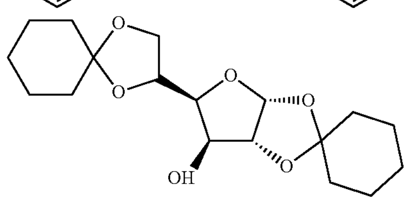

(Other Additives)

The composition employable for the pattern forming method according to the present invention may further contain a dye, a plasticizer, a photosensitizer, a light absorber, and/or a compound capable of increasing the solubility in a developer (for example, a phenolic compound of 1000 or less molecular weight or a carboxylated alicyclic or aliphatic compound), etc.

The above phenolic compound of 1000 or less molecular weight can be easily synthesized by persons of ordinary skill in the art while consulting the processes described in, for example, JP-As 4-122938 and 2-28531, U.S. Pat. No. 4,916,210, and EP 219294.

As the nonlimiting examples of the carboxylated alicyclic or aliphatic compound, a carboxylic acid derivative of steroid structure such as cholic acid, deoxycholic acid or lithocholic acid, an adamantanecarboxylic acid derivative, adamantanedicarboxylic acid, cyclohexanecarboxylic acid, and cyclohexanedicarboxylic acid can be exemplified.

[Method of Forming Pattern]

The pattern forming method according to the present invention will now be explained.

As stated, the pattern forming method comprises (1) forming a film from an actinic-ray- or radiation-sensitive resin composition, (2) exposing the film to light, and (3) developing the exposed film using a TMAH solution whose concentration is less than 2.38 mass %. Each of these steps will be explained below.

<Step (1): Formation of a Film>

When forming a film using the composition according to the present invention, the thickness thereof is preferably in the range of 30-250 nm, and more preferably in the range of 30-200 nm. If so, the resolution can be enhanced. The films with the above thickness can be produced by regulating the solid content of the composition so as to fall within an appropriate range, thereby adjusting the viscosity of the composition and thus enhancing the coatability and film formability thereof.

The total solids concentration of the actinic ray-sensitive or radiation-sensitive resin composition is generally in the range of 1 to 10 mass %, preferably 1 to 8.0 mass %, and more preferably 1.0 to 6.0 mass %.

The composition according to the present invention is typically used as follows. That is, the above components are dissolved in a given organic solvent, preferably the above mixed solvent, and filtered and applied onto a given support. The pore size of the filter for the filtration is 0.1 μm or less, preferably 0.05 μm or less, and more preferably 0.03 μm or less. The filter medium for the filtration is preferably made of a polytetrafluoroethylene, polyethylene or nylon.

The obtained composition is applied onto, for example, a substrate (e.g., silicon/silicon dioxide coating, silicon nitride or chromium-vapor-deposited quartz substrate or the like) for use in the production of precision integrated circuit elements, etc. by means of a spinner, a coater or the like. The thus applied composition is dried, thereby forming an actinic-ray- or radiation-sensitive film (hereinafter also referred to as a photosensitive film). The application of the composition to the substrate can be preceded by the application of a heretofore known antireflection film.

As the anti-reflection film, use can be made of not only an inorganic film of titanium, titanium oxide, titanium nitride, chromium oxide, carbon, amorphous silicon or the like but also an organic film composed of a light absorber and a polymer material. Also, as the organic anti-reflection film, use can be made of commercially available organic anti-reflection films, such as the DUV30 Series and DUV40 Series produced by Brewer Science Inc. and AR-2, AR-3 and AR-5 produced by Shipley Co., Ltd.

<Step (2): Exposure>

The resultant photosensitive film is exposed to actinic rays or radiation. As the actinic rays or radiation, infrared rays, visible light, ultraviolet rays, far ultraviolet rays, extreme ultraviolet rays, X-rays, and electron beams can be exemplified. Among them, preferred use is made of far ultraviolet rays with wavelength of preferably 250 nm or less, more preferably 220 nm or less, and still more preferably 1 to 200 nm, such as a KrF excimer laser (248 nm), an ArF excimer laser (193 nm) and an $F_2$ excimer laser (157 nm), EUV (13 nm), X-rays, and electron beams. More preferred use is made of an ArF excimer laser, an $F_2$ excimer laser, EUV, and electron beams.

A liquid immersion exposure may be carried out for the photosensitive film. Namely, the film may be exposed to actinic rays or radiation under the conditions that the space between the film and a lens is filled with a liquid whose refractive index is higher than that of air. If so, an enhanced resolution can be attained.

<Step (3): Development>

Subsequently, the exposed film is developed. Baking (heating) may be carried out between the steps of exposure and development. Employing the baking step may make it possible to obtain a better pattern.

An alkali developer is used for developing the exposed film. In the pattern forming method according to the present invention, a tetramethylammonium hydroxide (TMAH) solution whose concentration is less than 2.38 mass % is employed. This can make it possible to form a pattern with less scum and watermark defects compared to the case of employing a TMAH solution whose concentration is 2.38 mass % or more.

The reason why it its possible to form a pattern with less scum and watermark defects by employing a TMAH solution whose concentration is less than 2.38 mass % is not quite clear. However, the inventors speculate the reason as follows. That is, a developer with usual concentration makes the dissolution rate of the resin too high, resulting in the irregularity of the dissolution of the resin. On the contrary, use of diluted developer makes the dissolution of the resin more appropriate.

The concentration of the TMAH solution used as an alkali developer is preferably in the range of 0.0238 mass % to 1.19 mass %, more preferably in the range of 0.0476 mass % to 0.476 mass %, and further more preferably in the range of 0.0952 mass % to 0.238 mass %. When the concentration is too low, pattern profile may deteriorate due to inadequate removal of the exposed region of the film. When the concentration is too high, scum and watermark defect performance may deteriorate.

According to necessity, an appropriate amount of surfactant can be added to the developer.

The surfactant is not particularly limited. For example, use can be made of any of ionic and nonionic fluorinated and/or siliconized surfactants. As such fluorinated and/or siliconized surfactants, there can be mentioned, for example, those described in JP-A's S62-36663, S61-226746, S61-226745, S62-170950, 563-34540, H7-230165, H8-62834, H9-54432 and H9-5988 and U.S. Pat. Nos. 5,405,720, 5,360,692, 5,529,881, 5,296,330, 5,436,098, 5,576,143, 5,294,511 and 5,824,451. Nonionic surfactants are preferred. Using a nonionic fluorinated surfactant or siliconized surfactant is more preferred. The amount of surfactant used is generally in the range of 0.001 to 5 mass %, preferably 0.005 to 2 mass % and further more preferably 0.01 to 0.5 mass % based on the whole amount of the developer.

As the development method, use can be made of, for example, a method in which the substrate is dipped in a tank filled with a developer for a given period of time (dip method), a method in which a developer is puddled on the surface of the substrate by its surface tension and allowed to stand still for a given period of time to thereby effect development (puddle method), a method in which a developer is sprayed onto the surface of the substrate (spray method), or a method in which a developer is continuously discharged onto the substrate being rotated at a given speed while scanning a developer discharge nozzle at a given speed (dynamic dispense method).

The pattern forming method according to the present invention may further comprises a step of rinsing after the step of developing. Pure water can be used as rinse liquid. Before the use, an appropriate amount of surfactant may be added thereto. The development operation or rinse operation may be followed by the operation for removing any developer or rinse liquid adhering onto the pattern by the use of a supercritical fluid.

EXAMPLES

The present invention will now be described in greater detail with reference to Examples, which however in no way limit the scope of the present invention.

<Acid-Decomposable Resin>

Monomers used for the syntheses of the acid-decomposable resins are as follows.

(LM-1)

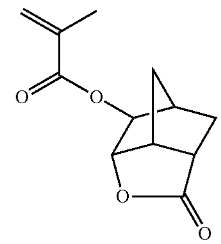

(LM-2)

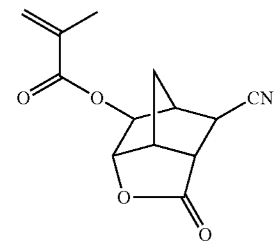

(LM-3)

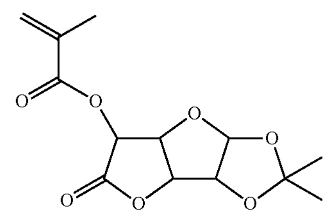

(LM-4)

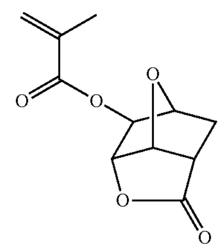

(LM-5)

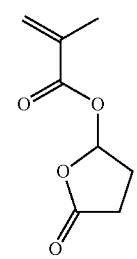

(LM-6)

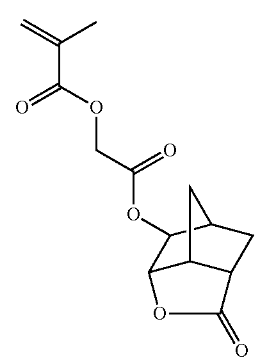

-continued
(LM-7)
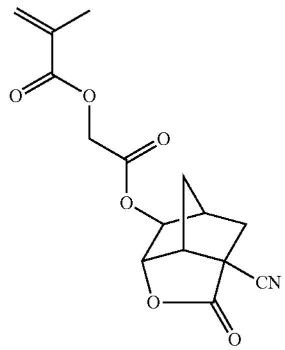
(LM-8)
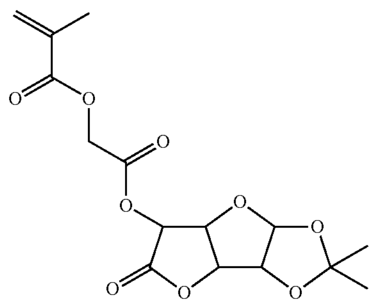
(LM-9)
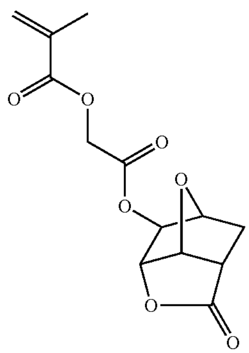
(IM-1)
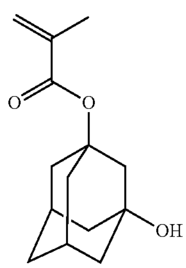
(IM-2)
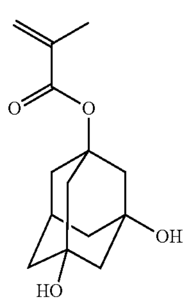
-continued
(PM-1)
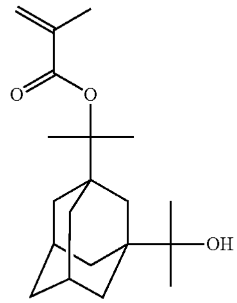
(PM-2)
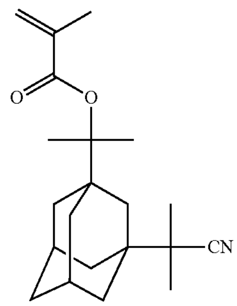
(PM-3)
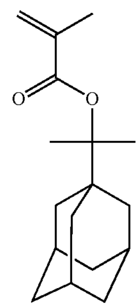
(PM-4)
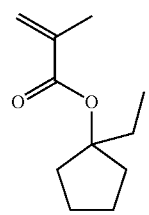
(PM-5)
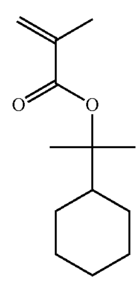
(PM-6)
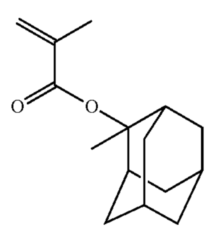

-continued (PM-7)

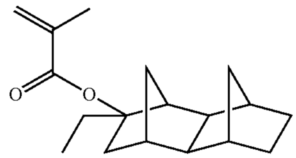

(AM-1)

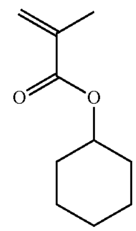

(AM-2)

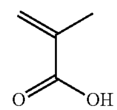

(AM-3)

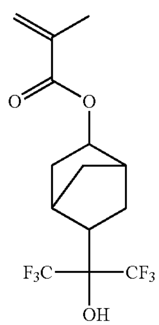

(AM-4)

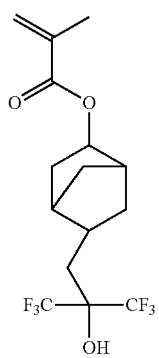

(AM-5)

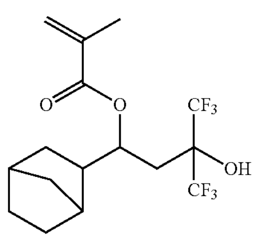

Synthetic Example 1

Synthesis of Resin (A-1)

In a nitrogen stream, 8.8 g of cyclohexanone was placed in a three-necked flask, and then heated to 80° C. A solution in which 8.5 g of (LM-1), 2.2 g of (IM-1), 9.0 g of (PM-4), and 13 mol % (based on the monomers) of polymerization initiator V-60 (produced by Wako Pure Chemical Industries, Ltd.) was dissolved in 79 g of cyclohexanone was added into the flask. After the completion of the dropping, reaction was continued at 80° C. for 2 hours. The thus obtained reaction liquid was allowed to stand still to cool and was dropped into a mixed liquid consisting of 900 mL of methanol and 100 mL of water over a period of 20 minutes. The thus precipitated powder was collected by filtration and dried, thereby obtaining 18 g of a resin (A-1). The molar ratio of each of repeating units was 39/10/51; the weight average molecular weight in terms of standard polystyrene molecular weight as measured by GPC was 7500, and the dispersity (Mw/Mn) was 1.54.

Synthetic Example 2

Synthesis of Resin (A-2) to (A-20)

Resins (A-2) to (A-20) was synthesized in the same manner as in the synthetic example 1, except that the kinds and amounts of monomers was changed.

Table 3 given below indicates the component ratios (mol %, corresponding to shown individual repeating units in order from the left), weight average molecular weight and dispersity with respect to each of the resins (A-1) to (A-20).

TABLE 3

| Resins | LM | IM | PM | | AM | Molar Ratio | Mw | Mw/Mn |
|---|---|---|---|---|---|---|---|---|
| A-1 | LM-1 | IM-1 | PM-4 | — | — | 39/10/51 | 7500 | 1.54 |
| A-2 | LM-6 | IM-1 | PM-4 | — | — | 39/10/51 | 7800 | 1.53 |
| A-3 | LM-2 | IM-2 | PM-3 | — | AM-2 | 40/19/32/9 | 6100 | 1.52 |
| A-4 | LM-3 | IM-2 | PM-4 | PM-6 | — | 42/10/29/19 | 7000 | 1.49 |
| A-5 | LM-4 | IM-2 | PM-4 | PM-5 | — | 40/10/11/39 | 6800 | 1.56 |
| A-6 | LM-5 | IM-1 | PM-7 | — | AM-3 | 39/11/42/8 | 6900 | 1.51 |
| A-7 | LM-6 | IM-2 | PM-5 | PM-1 | — | 51/9/22/18 | 7000 | 1.53 |
| A-8 | LM-7 | IM-1 | PM-4 | PM-1 | — | 41/11/28/20 | 6100 | 1.60 |
| A-9 | LM-8 | IM-1 | PM-6 | — | — | 41/19/40 | 8000 | 1.53 |
| A-10 | LM-9 | IM-1 | PM-2 | — | AM-1 | 38/11/41/10 | 8100 | 1.55 |
| A-11 | LM-3 | IM-2 | PM-1 | — | — | 48/8/44 | 7500 | 1.53 |
| A-12 | LM-6 | IM-1 | PM-4 | — | — | 50/19/31 | 8000 | 1.53 |
| A-13 | LM-6 | IM-2 | PM-6 | — | — | 43/18/39 | 6900 | 1.57 |
| A-14 | LM-7 | IM-2 | PM-3 | — | AM-1 | 37/11/42/10 | 7000 | 1.53 |
| A-15 | LM-4 | IM-1 | PM-5 | — | — | 43/11/46 | 8500 | 1.56 |
| A-16 | LM-8 | IM-2 | PM-7 | — | AM-4 | 49/10/32/9 | 6000 | 1.55 |
| A-17 | LM-9 | IM-1 | PM-4 | PM-2 | — | 40/11/40/9 | 6200 | 1.53 |
| A-18 | LM-4 | IM-1 | PM-4 | PM-1 | — | 41/9/29/21 | 6300 | 1.60 |
| A-19 | LM-8 | IM-2 | PM-4 | PM-3 | — | 39/10/10/41 | 6800 | 1.52 |
| A-20 | LM-5 | IM-1 | PM-7 | — | AM-5 | 31/11/48/10 | 7000 | 1.56 |

<Acid Generator>

Acid generators employed for examples was selected from the aforementioned compounds (b1) to (B34), (z1) to (Z70), and the following (d1) and (d2).

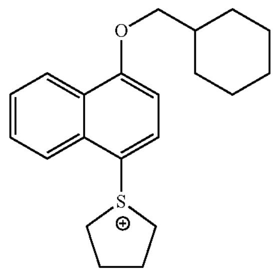

-continued

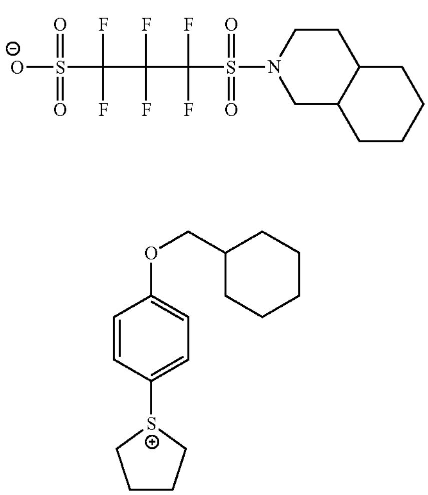

d2

-continued d1

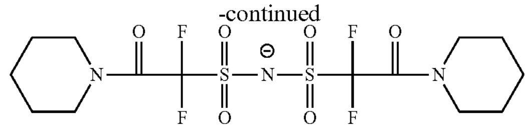

Synthetic Example 21

Compound d1

Compound d1 was synthesized along with the following route.

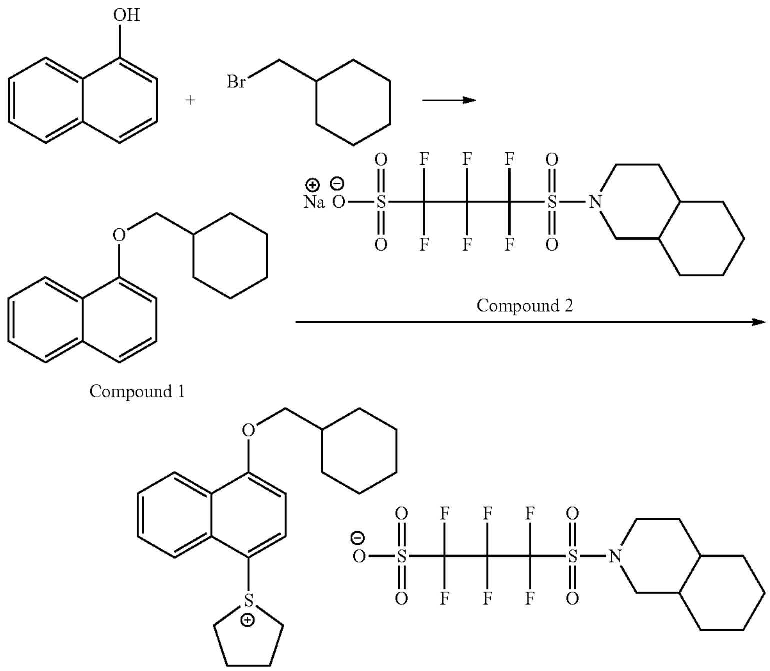

d1

(Synthesis of Compound 1)

In a three-necked flask, 20 g of bromomethylcyclohezane and 12.5 g of 1-naphtol was dissolved in 300 g of nmP. Subsequently, 12 g of potassium carboxylate and 14 g of potassium iodide was added to the obtained solution. Then the solution was heated at 120° C. over the period of 2 hours. 300 g of water was added to the solution, and an extraction using 100 g of hexane was carried out three times. Obtained organic layers was mixed and washed with 100 g of 1N NaOH solution for one time, with 100 g of water for one time, and then with 100 g of Brine for one time. The washed was then condensed. 13 g of compound 1 was thus obtained.

(Synthesis of Compound 2)

Compound 2 was synthesized referring to the method described in JP-A-2005-266799.

(Synthesis of Compound d1)

In a three-necked flask, 13.1 g of compound 1 was dissolved into 65 g of Eaton reagent. After that, 5.7 g of tetramethylene sulfoxide was dropped into the solution while stirring. The resulting solution was stirred for 3 hours. The solution was poured into 240 g of water. Then 25 g of compound 2 and 50 g of chloroform was also added.

After the separation of an organic layer, extraction from water layer using 50 g of chloroform was carried out for two times. Obtained organic layers was mixed, washed for two times, and condensed. The obtained crude product was recrystallized using 20 g of ethyl acetate. 22 g of compound d1 was thus obtained.

Synthetic Example 22

Compound d2

Compound d2 was synthesized in the same manner as explained for compound d1.

<Basic Compound>

Employed for examples were as follows.

N-1: N,N-dibutylaniline,

N-2: N,N-dihexylaniline,

N-3: 2,6-diisopropylaniline,

N-4: tri-n-octylamine,

N-5: N,N-dihydroxylethylaniline,

N-6: 2,4,5-triphenylimidazole,

N-7: tris(methoxyethoxyethyl)amine, and

N-8: 2-[2-{2-(2,2-dimethoxy-phenoxyethoxy)ethyl}-bis-(2-methoxyethyl)]-amine.

<Hydrophobic Resin>

Hydrophobic resins employed for examples was selected from aforementioned (HR-1) to (HR-65) and (C-1) to (C-269).

Synthetic Example 23

Resin (C-7)

The monomers corresponding to the repeating units shown below were charged in a molar ratio of 90/10 and dissolved in PGMEA, thereby obtaining 450 g of a solution of 15 mass % solid content. Thereafter, 1 mol % of polymerization initiator V-60 produced by Wako Pure Chemical Industries, Ltd. was added to the solution. The resultant mixture was dropped into 50 g of PGMEA heated at 100° C. in a nitrogen atmosphere over a period of 6 hours. After the completion of the dropping, the reaction liquid was agitated for two hours. After the completion of the reaction, the reaction liquid was cooled to room temperature and crystallized in 5 liters of methanol. The thus precipitated white powder was collected by filtration. Thus, desired resin (C-7) was recovered.

The polymer component ratio determined by NMR was 90/10. The weight average molecular weight thereof in terms of standard polystyrene molecular weight determined by GPC measurement was 8000, and the molecular weight dispersity thereof was 1.40.

(C-7)

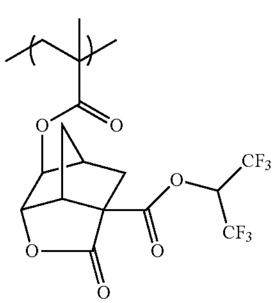

-continued

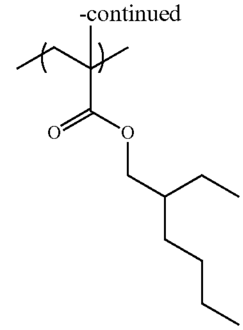

The aforementioned resins (C-1) to (C-6) and (C-8) to (C-269) was synthesized in the same manner as in the synthetic example 23. Each of these resins has molar ratio, weight average molecular weight, and dispersity as shown in the Table 2 above.

<Surfactant and Solvent>

As surfactants, the followings were employed.

W-1: Megafac F176 (produced by Dainippon Ink & Chemicals, Inc.; fluorinated),

W-2: Megafac R08 (produced by Dainippon Ink & Chemicals, Inc.; fluorinated and siliconized), W-3: Polysiloxane polymer KP-341 (produced by Shin-Etsu Chemical Co., Ltd.; siliconized)

W-4: Troy Sol S-366 (produced by Troy Chemical Co., Ltd.; fluorinated),

W-5: PF656 (produced by OMNOVA; fluorinated), and

W-6: PF6320 (produced by OMNOVA; fluorinated).

As solvents, the followings were employed.

SL-1: cyclohexanone,

SL-2: propylene glycol monomethylether acetate (PGMEA),

SL-3: ethyl lactate,

SL-4: propylene glycol monomethyl ether (PGME),

SL-5: γ-butylolactone, and

SL-6: propylene carbonate.

<Preparation of Resist Solution>

The components indicated in Table 4 below were dissolved in the solvents indicated in the same table, thereby obtaining solutions of 4.5 mass % solid content. The thus obtained solutions were passed through a polyethylene filter of 0.1 μm pore size, thereby obtaining positive resist compositions.

<Pattern Formation: Liquid-Immersion Exposure>

Resist pattern was formed by a liquid-immersion exposure method.

Specifically, an organic antireflection film ARC29A (produced by Nissan Chemical Industries, Ltd.) was applied onto a silicon wafer and baked at 205° C. for 60 seconds, thereby forming a 78 nm thick antireflection film on the silicon wafer. Each of the above prepared resist solutions was applied thereonto and baked at 100° C. for 60 seconds, thereby forming a 30 nm thick resist film.

Each of the obtained resist films was patternwise exposed using a mask of 65 nm line size and 1:1 line:space by means of an ArF excimer laser liquid immersion scanner (manufactured by ASML, XT1700i, NA 1.20, C-Quad, outer sigma 0.981, inner sigma 0.895, XY deflection). Ultrapure water was used as the liquid for liquid immersion.

Immediately after the exposure, the film was heated on a hot plate at 100° C. for 60 seconds, then cooled to room temperature. Subsequently, the film was developed at 23° C. for 30 seconds using a TMAH solution whose concentration is listed in Table 4. Then the film was rinsed using pure water over the period of 30 seconds, was post-baked at 90° C. for 90 seconds, thus obtaining a line pattern.

<Evaluation on Scums>

Cross-sectional SEM was obtained for the obtained line pattern using "S-4800" manufactured by Hitachi High Tech, and residues on the space part was observed. Evaluation criteria was as follows.

X (insufficient): scum was observed and at least part of the adjacent patterns were connected, Δ (fair): scum was observed but the adjacent patterns were not connected, and ○ (good): scum was not observed.

<Evaluation on Watermark Defects>

Distribution of defects in the obtained line pattern on the wafer was detected by means of an instrument KLA-2360 manufactured by KLA Corporation. Shape of defects was then observed by means of SEMVision manufactured by AMAT Corporation.

FIG. 1 is a SEM picture showing an example of watermark defect. The watermark defect shown in FIG. 1 is a circular defect whose diameter is about 1 μm to 5 μm.

For the wafer of circle shape with 300 mm diameter, the number of watermark defects as shown in FIG. 1 was counted. Watermark defect performance was thus evaluated.

The results of the above evaluations are shown in Table 4 below.

TABLE 4

| | Composition | | | | | | | Results | |
|---|---|---|---|---|---|---|---|---|---|
| Examples | Resin (parts by mass) | Acid generator (parts by mass) | Basic compound (parts by mass) | Surfactant (parts by mass) | Hydrophobic esin (parts by mass) | Solvent (parts by mass) | The concentration of developer | scum | The number of watermark defects |
| Comp.1 | A-1(84.25) | b1(12.0) | N-3(0.15) | W-1(0.50) | | SL-2(1900) | 2.38 | x | 200 |
| Comp.2 | A-1(84.25) | b1(12.0) | N-3(0.15) | W-1(0.50) | | SL-2(1900) | 0.238 | x | 236 |
| Comp.3 | A-1(84.25) | b1(12.0) | N-3(0.15) | W-1(0.50) | C-7(3.0) | SL-2(1900) | 2.38 | x | 230 |
| Ex.1 | A-1(84.25) | b1(12.0) | N-3(0.15) | W-1(0.50) | C-7(3.0) | SL-2(1900) | 0.238 | ○ | 2 |
| Ex.2 | A-1(84.25) | b1(12.0) | N-3(0.15) | W-1(0.50) | C-7(3.0) | SL-2(1900) | 0.0119 | Δ | 20 |
| Ex.3 | A-1(84.25) | b1(12.0) | N-3(0.15) | W-1(0.50) | C-7(3.0) | SL-2(1900) | 0.0238 | ○ | 15 |
| Ex.4 | A-1(84.25) | b1(12.0) | N-3(0.15) | W-1(0.50) | C-7(3.0) | SL-2(1900) | 0.0476 | ○ | 3 |
| Ex.5 | A-1(84.25) | b1(12.0) | N-3(0.15) | W-1(0.50) | C-7(3.0) | SL-2(1900) | 0.476 | ○ | 4 |
| Ex.6 | A-1(84.25) | b1(12.0) | N-3(0.15) | W-1(0.50) | C-7(3.0) | SL-2(1900) | 1.19 | ○ | 13 |
| Ex.7 | A-2(84.25) | b1(12.0) | N-3(0.15) | W-1(0.50) | C-7(3.0) | SL-2(1900) | 1.785 | Δ | 21 |
| Ex.8 | A-3(85.12) | b5(11.2) | N-3(0.15) | W-2(0.50) | C-109(2.5) | SL-2/SL-6/SL-8(1354/531/15) | 0.238 | Δ | 15 |
| Ex.9 | A-4(80.85) | b7(15.2) | N-1(0.10) | W-6(0.50) | C-119(3.3) | SL-1/SL-5(1140/760) | 0.0476 | Δ | 20 |
| Ex.10 | A-5(76.8) | b9(17.5) | N-3/N-5(0.05/0.05) | W-1(0.50) | C-8(5.0) | SL-2/SL-4(1140/760) | 0.476 | ○ | 15 |
| Ex.11 | A-6(79.08) | b13/b15(7.2/8.0) | N-8(0.10) | W-6(0.50) | C-66(4.8) | SL-2/SL-5(1656/244) | 0.238 | ○ | 18 |
| Ex.12 | A-7(79.05) | b17(11.5) | N-1/N-3(0.15/0.05) | W-1(0.50) | C-72(8.0) | SL-1/SL-6/SL-8(1641/244/15) | 0.0476 | Δ | 11 |
| Ex.13 | A-8(80.55) | b21(13.0) | N-3(0.15) | W-4(0.50) | C-1/C-8(4.8/1.0) | SL-1/SL-6/SL-7(1438/442/20) | 0.476 | ○ | 19 |
| Ex.14 | A-9(81.48) | b23/b24(7.3/5.8) | N-1/N-2(0.12/0.10) | W-1(0.50) | C-110(4.7) | SL-1/SL-6(1641/259) | 0.238 | Δ | 18 |
| Ex.15 | A-10(79.78) | b27(15.3) | N-6(0.15) | W-4(0.50) | C-79(3.5) | SL-3/SL-4(1438/462) | 0.0476 | Δ | 11 |
| Ex.16 | A-11(82.15) | b29(14.3) | N-3(0.15) | W-1(0.50) | C-6(2.8) | SL-2(1900) | 0.476 | Δ | 9 |
| Ex.17 | A-12(80.95) | b2/b6(5.7/8.5) | N-1/N-3(0.15/0.05) | W-1(0.50) | C-61(4.1) | SL-2/SL-4(1140/760) | 0.238 | ○ | 2 |
| Ex.18 | A-13(83.35) | b8/b11(6.0/7.0) | N-3(0.15) | W-1(0.50) | C-7/HR-24(3.0/0.5) | SL-2(1900) | 0.0476 | Δ | 8 |
| Ex.19 | A-14(86.75) | b1/z5(5.5/3.5) | N-8(0.10) | W-1(0.50) | C-137(3.5) | SL-2/SL-4(1140/760) | 0.476 | ○ | 9 |
| Ex.20 | A-15(84.95) | b2/z23(8.0/2.0) | N-3(0.15) | | C-2(4.3) | SL-2(1900) | 0.238 | ○ | 13 |
| Ex.21 | A-16(84.95) | b5/z63(6.0/5.0) | N-3(0.15) | | C-9(3.3) | SL-2/SL-4(1140/760) | 0.0476 | Δ | 20 |
| Ex.22 | A-17(79.95) | b12/z64(10.0/4.0) | N-1/N-3(0.15/0.05) | W-1(0.50) | HR-24(0.6) | SL-2/SL-4(1140/760) | 0.476 | ○ | 15 |
| Ex.23 | A-18(84.35) | b17/z55(8.2/2.5) | N-3(0.15) | W-1(0.50) | C-56(4.2) | SL-2/SL-4(1140/760) | 0.238 | ○ | 5 |
| Ex.24 | A-19(85.25) | b24/z1(4.1/7.3) | N-1/N-3(0.15/0.05) | W-1(0.50) | C-94(2.6) | SL-2(1900) | 0.0476 | ○ | 7 |
| Ex.25 | A-20(80.95) | b29/z2(11.5/3.2) | | W-1(0.50) | HR-24/HR-26(0.6/1.0) | SL-2/SL-4(1140/760) | 0.476 | ○ | 9 |
| Ex.26 | A-1/A-2(42.00/42.25) | b1(12.0) | N-2(0.05) | W-1(0.50) | C-7(3.0) | SL-2/SL-4(1140/760) | 0.238 | ○ | 15 |
| Ex.27 | A-1(84.25) | b1(12.0) | N-4(0.05) | W-1(0.50) | C-7/HR-24(2.8/0.2) | SL-2/SL-4(1140/760) | 0.0476 | ○ | 14 |
| Ex.28 | A-1(86.25) | d1(11.8) | | W-1(0.50) | C-7/HR-24(2.8/0.2) | SL-2(1900) | 0.476 | ○ | 19 |
| Ex.29 | A-1(83.25) | d2(12.1) | N-1/N-3(0.15/0.05) | W-1(0.50) | C-7/HR-24(2.8/0.2) | SL-2(1900) | 0.238 | ○ | 17 |
| Ex.30 | A-1(84.25) | d1/z5(5.8/3.2) | N-3(0.15) | W-1(0.50) | C-7/HR-24(2.8/0.2) | SL-2(1900) | 0.0476 | Δ | 11 |
| Ex.31 | A-1(84.25) | d2/z5(5.4/3.6) | N-3(0.15) | W-1(0.50) | C-7/HR-24(2.8/0.2) | SL-2(1900) | 0.476 | Δ | 17 |
| Ex.32 | A-1(84.25) | b1(12.0) | N-6(0.15) | W-1(0.50) | HR-24(0.5) | SL-2(1900) | 0.238 | Δ | 60 |
| Ex.33 | A-1(84.25) | b1(12.0) | N-1/N-3(0.15/0.05) | W-1(0.50) | HR-1(0.4) | SL-2(1900) | 0.238 | Δ | 45 |
| Ex.34 | A-1(84.25) | b1(12.0) | N-1/N-3(0.15/0.05) | W-1(0.50) | HR-2(0.3) | SL-2(1900) | 0.238 | Δ | 35 |
| Ex.35 | A-1(84.25) | b1(12.0) | N-3(0.15) | W-1(0.50) | HR-10(0.8) | SL-2(1900) | 0.238 | Δ | 30 |
| Ex.36 | A-1(84.25) | b1(12.0) | N-3(0.15) | W-1(0.50) | C-7(3.0) | SL-2(1900) | 0.123 | ○ | 1 |
| Ex.37 | A-1(84.25) | b1(12.0) | N-3(0.15) | W-1(0.50) | C-7(3.0) | SL-2(1900) | 0.0952 | ○ | 2 |
| Ex.38 | A-1(84.25) | b1(12.0) | N-3(0.15) | W-1(0.50) | C-245(3.0) | SL-2(1900) | 0.0238 | Δ | 50 |
| Ex.39 | A-1(84.25) | b1(12.0) | N-3(0.15) | W-1(0.50) | C-155(3.0) | SL-2(1900) | 0.0238 | Δ | 30 |

As shown in Table 4, employing the methods according to the working examples decreased scums and watermark defects compared to the methods according to the comparable examples.

What is claimed is:

1. A method of forming a pattern, comprising:

forming a film from an actinic-ray- or radiation-sensitive resin composition comprising a resin (A) that exhibits an increased solubility in an alkali developer when acted on by an acid, a compound (B) that generates an acid when exposed to actinic rays or radiation, and a resin (C) containing at least one of a fluorine atom and a silicon atom;

exposing the film to light; and developing the exposed film using a tetramethylammonium hydroxide solution whose concentration is within a range of 0.0119 mass % to 1.785 mass %.

2. The method according to claim 1, the resin (C) comprising a repeating unit containing a group that is decomposed by an action of an alkali developer, resulting in an increase of solubility in the alkali developer.

3. The method according to claim 1, the resin (C) comprising a repeating unit containing two or more groups that are decomposed by an action of an alkali developer, resulting in an increase of solubility in the alkali developer.

4. The method according to claim 1, the resin (C) comprising a repeating unit containing at least one of a fluorine atom and a silicon atom and a group that is decomposed by an action of an alkali developer, resulting in an increase of solubility in the alkali developer.

5. The method according to claim 1, the resin (C) comprising a repeating unit containing an alkali soluble group.

6. The method according to claim 1, the resin (C) comprising a repeating unit containing a group that is decomposed by the action of an acid.

7. The method according to claim 1, wherein a content of the resin (C) based on the total solids of the composition falls within the range of 0.01-10 mass %.

8. The method according to claim 1, the resin (A) comprising a repeating unit containing a lactone structure.

9. The method according to claim 1, the resin (A) comprising a repeating unit containing a monocyclic or polycyclic acid-decomposable group.

10. The method according to claim 1, the composition further comprising a basic compound.

11. The method according to claim 1, the composition further comprising a surfactant.

12. The method according to claim 1, wherein the film is exposed through a liquid for liquid immersion.

13. The method according to claim 1, wherein the resin (A) contains a repeating unit of the following general formula (I):

(I)

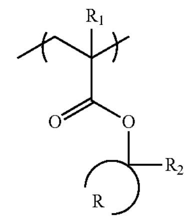

wherein $R_1$ represents a hydrogen atom, an optionally substituted methyl group or any of the groups of the formula —$CH_2$—$R_9$, $R_9$ representing a monovalent organic group, $R_2$ represents an alkyl group or a cycloalkyl group, and R represents an atomic group required for forming an alicyclic structure in cooperation with a carbon atom.

14. The method according to claim 1, wherein the resin (A) contains a repeating unit of the following general formula (II):

(II)

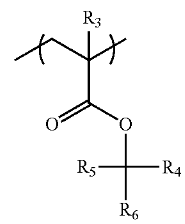

wherein $R_3$ represents a hydrogen atom, an optionally substituted methyl group or any of the groups of the formula —$CH_2$—$R_9$, $R_9$ representing a monovalent organic group, Each of $R_4$, $R_5$ and $R_6$ independently represents an alkyl group or a cycloalkyl group, and R represents an atomic group required for forming an alicyclic structure in cooperation with a carbon atom.

15. The method according to claim 1, wherein the resin (A) contains no aromatic group.

16. The method according to claim 1, wherein the resin (A) contains a hydroxystyrene repeating unit.

17. The method according to claim 1, wherein the light is an extreme ultraviolet ray.

18. The method according to claim 1, wherein the concentration of the tetramethylammonium hydroxide solution is within a range of 0.0238 mass % to 1.19 mass %.

19. The method according to claim 1, wherein the concentration of the tetramethylammonium hydroxide solution is within a range of 0.0476 mass % to 0.476 mass %.

20. The method according to claim 1, wherein the concentration of the tetramethylammonium hydroxide solution is within a range of 0.0952 mass % to 0.238 mass %.

* * * * *